(12) United States Patent
Nakano et al.

(10) Patent No.: US 12,255,227 B2
(45) Date of Patent: Mar. 18, 2025

(54) SIC SEMICONDUCTOR DEVICE

(71) Applicant: ROHM CO., LTD., Kyoto (JP)

(72) Inventors: Yuki Nakano, Kyoto (JP); Masaya Ueno, Kyoto (JP); Sawa Haruyama, Kyoto (JP); Yasuhiro Kawakami, Kyoto (JP); Seiya Nakazawa, Kyoto (JP); Yasunori Kutsuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/172,830

(22) Filed: Feb. 22, 2023

(65) Prior Publication Data
US 2023/0223433 A1 Jul. 13, 2023

Related U.S. Application Data

(63) Continuation of application No. 17/265,453, filed as application No. PCT/JP2019/031451 on Aug. 8, 2019, now Pat. No. 11,621,319.

(30) Foreign Application Priority Data

Aug. 10, 2018 (JP) ................. 2018-151453
Aug. 10, 2018 (JP) ................. 2018-151454

(51) Int. Cl.
*H01L 29/04* (2006.01)
*H01L 21/04* (2006.01)
(Continued)

(52) U.S. Cl.
CPC ........ *H01L 29/045* (2013.01); *H01L 21/0465* (2013.01); *H01L 21/761* (2013.01);
(Continued)

(58) Field of Classification Search
CPC . H01L 29/045; H01L 21/0465; H01L 21/761; H01L 21/78; H01L 29/0623;
(Continued)

(56) References Cited

U.S. PATENT DOCUMENTS 10,797,145 B2  10/2020 Nakano et al.
2014/0001679 A1  1/2014 Okuma et al.
(Continued)

FOREIGN PATENT DOCUMENTS

JP  2012-004316 A  1/2012
JP  2012146876      8/2012
(Continued)

OTHER PUBLICATIONS

Japanese Office Action issued Feb. 15, 2024 in corresponding Japanese Patent Application No. 2022-132066, 6 pages.
(Continued)

Primary Examiner — Cuong B Nguyen
(74) Attorney, Agent, or Firm — XSENSUS LLP

(57) ABSTRACT

An SiC semiconductor device includes an SiC semiconductor layer including an SiC monocrystal that is constituted of a hexagonal crystal and having a first main surface as a device surface facing a c-plane of the SiC monocrystal and has an off angle inclined with respect to the c-plane, a second main surface at a side opposite to the first main surface, and a side surface facing an a-plane of the SiC monocrystal and has an angle less than the off angle with respect to a normal to the first main surface when the normal is 0°.

19 Claims, 53 Drawing Sheets

(51) Int. Cl.
    *H01L 21/761*     (2006.01)
    *H01L 21/78*     (2006.01)
    *H01L 29/06*     (2006.01)
    *H01L 29/16*     (2006.01)
    *H01L 29/66*     (2006.01)
    *H01L 29/872*     (2006.01)

(52) U.S. Cl.
    CPC .......... *H01L 21/78* (2013.01); *H01L 29/0623* (2013.01); *H01L 29/1608* (2013.01); *H01L 29/6606* (2013.01); *H01L 29/872* (2013.01)

(58) Field of Classification Search
    CPC ............. H01L 29/1608; H01L 29/6606; H01L 29/872; H01L 27/0727; H01L 29/8611; H01L 2221/68327; H01L 2224/0603; H01L 21/6836; H01L 23/3171; H01L 23/4824; H01L 29/0619; H01L 29/0696; H01L 29/0878; H01L 29/1095; H01L 29/34; H01L 29/407; H01L 29/41766; H01L 29/42368; H01L 29/42376; H01L 29/4933; H01L 29/66068; H01L 29/7805; H01L 29/7811; H01L 29/7813; H01L 21/02378; H01L 29/1604; H01L 29/161–167; H01L 21/02167; H01L 21/02529; B23K 26/53; C23C 16/325
    See application file for complete search history.

(56) References Cited

U.S. PATENT DOCUMENTS

| | | |
|---|---|---|
| 2016/0163549 A1 | 6/2016 | Okuma et al. |
| 2017/0053831 A1 | 2/2017 | Hirata et al. |

FOREIGN PATENT DOCUMENTS

| | | |
|---|---|---|
| JP | 2012146878 | 8/2012 |
| JP | 2015216140 | 12/2015 |
| JP | 2016042595 | 3/2016 |
| JP | 2016207908 | 12/2016 |
| JP | 2017-38066 A | 2/2017 |
| JP | 2017028145 | 2/2017 |
| JP | 2017041482 | 2/2017 |
| JP | 2017135245 | 8/2017 |
| JP | 2017-174969 A | 9/2017 |
| JP | 2018-110165 A | 7/2018 |
| JP | 2018-117016 A | 7/2018 |
| WO | 2016/162987 A1 | 10/2016 |
| WO | 2016204126 | 12/2016 |
| WO | 2018/139557 A1 | 8/2018 |

OTHER PUBLICATIONS

JP Notice of Reasons for Refusal issued Sep. 21, 2023, in corresponding Application No. JP2022-132065, 6pp.
JP Notice of Reasons for Refusal issued Sep. 21, 2023, in corresponding Application No. JP2022-132066, 8pp.
International Search Report and Written Opinion issued for International Patent Application No. PCT/JP2019/031451, Date of mailing: Sep. 10, 2019, 12 pages including English translation of Search Report.
International Preliminary Report on Patentability issued for International Patent Application No. PCT/JP2019/031451, Date of mailing: Feb. 25, 2021, 16 pages including English translation.
Office Action issued Aug. 1, 2024 in corresponding Japanese Patent Application No. 2022-132066.
Office Action issued Sep. 5, 2024 in corresponding Japanese Patent Application No. 2023-206936.
Office Action issued Jan. 30, 2025 in corresponding Japanese Patent Application No. 2022-132066.

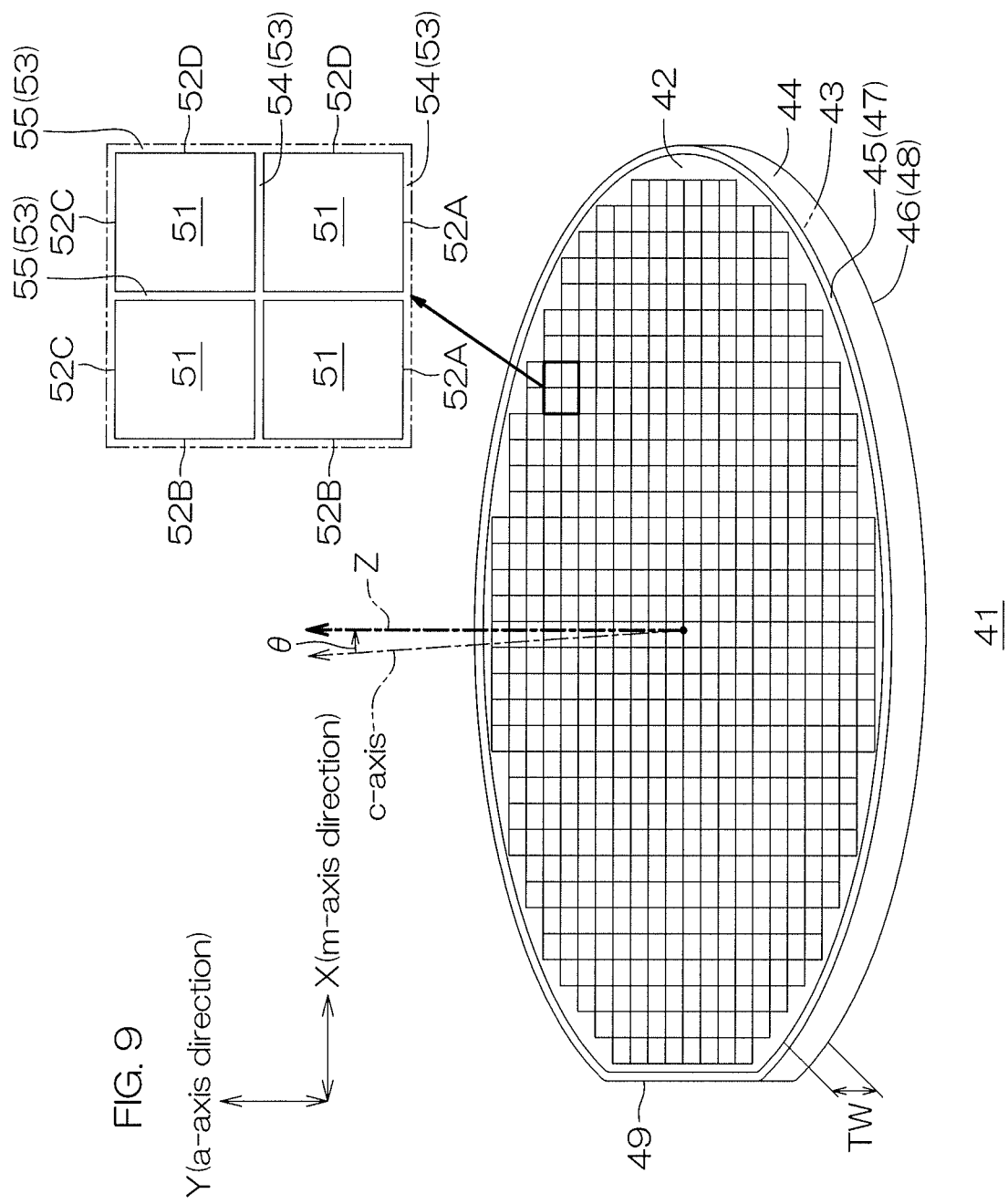

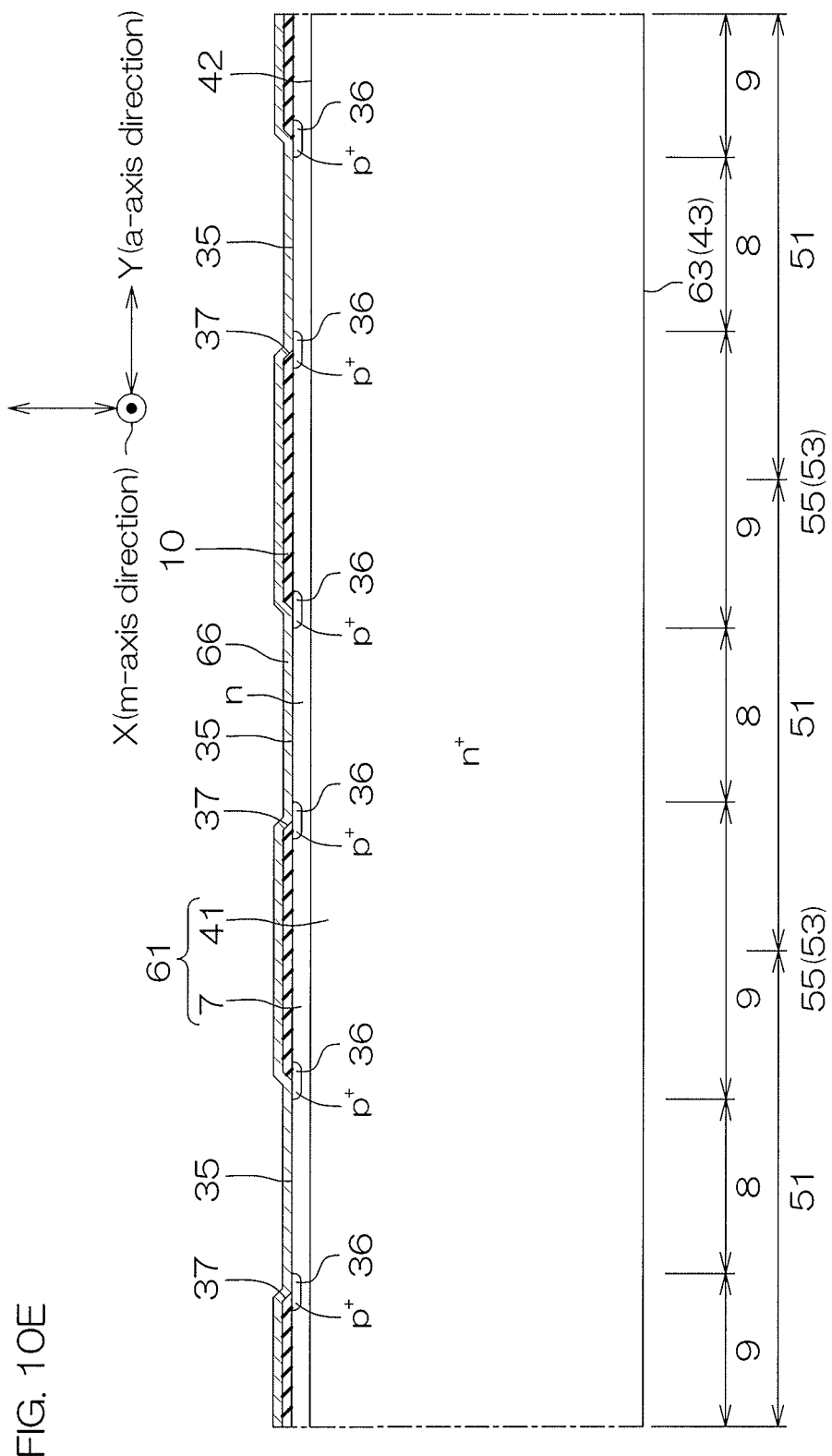

SIC SEMICONDUCTOR DEVICE

TECHNICAL FIELD

The present invention relates to an SiC semiconductor device.

BACKGROUND ART

A method for processing an SiC semiconductor wafer called a stealth dicing method has come to be noted in recent years. With the stealth dicing method, after laser light is selectively irradiated onto the SiC semiconductor wafer, the SiC semiconductor wafer is cut along the portion irradiated with the laser light. According to this method, the SiC semiconductor wafer, which has a comparatively high hardness, can be cut without using a cutting member such as a dicing blade, etc., and therefore a manufacturing time can be shortened.

Patent Literature 1 discloses a method for manufacturing an SiC semiconductor device that uses the stealth dicing method. With the manufacturing method of Patent Literature 1, a plurality of SiC semiconductor layers are cut out from the SiC semiconductor wafer having a predetermined off angle. Two side surfaces facing a-planes of an SiC monocrystal in SiC semiconductor layer become inclined surfaces oriented along a c-axis of the SiC monocrystal.

CITATION LIST

Patent Literature

Patent Literature 1: Japanese Patent Application Publication No. 2016-207908

SUMMARY OF INVENTION

Technical Problem

The SiC semiconductor device is mounted on a connection object, such as a lead frame or a mounting substrate, etc., using a semiconductor assembly apparatus. A step of transferring the SiC semiconductor device in the semiconductor assembly apparatus is performed, for example, by a pickup nozzle that suctions and holds a main surface of the SiC semiconductor layer. With the SiC semiconductor device according to Patent Literature 1, suction by the pickup nozzle may be obstructed by the inclined surface of the SiC semiconductor layer and a pickup error may occur.

One preferred embodiment of the present invention provides an SiC semiconductor device that enables pickup error to be suppressed in a semiconductor assembly apparatus.

Solution to Problem

One preferred embodiment of the present invention provides an SiC semiconductor device including an SiC semiconductor layer including an SiC monocrystal that is constituted of a hexagonal crystal and having a first main surface as a device surface facing a c-plane of the SiC monocrystal and has an off angle inclined with respect to the c-plane, a second main surface at a side opposite to the first main surface, and a side surface facing an a-plane of the SiC monocrystal and has an angle less than the off angle with respect to a normal to the first main surface when the normal is 0°.

According to this SiC semiconductor device, pickup error in a semiconductor assembly apparatus can be suppressed.

One preferred embodiment of the present invention provides an SiC semiconductor device including an SiC semiconductor layer including an SiC monocrystal that is constituted of a hexagonal crystal and having a first main surface as a device surface facing a c-plane of the SiC monocrystal and has an off angle inclined with respect to the c-plane, a second main surface at a side opposite to the first main surface, and a side surface that is facing an a-plane of the SiC monocrystal and has an inclined portion inclined in a direction of an opposite side with respect to a c-axis of the SiC monocrystal from a normal to the first main surface.

According to this SiC semiconductor device, the inclined portion inclined in the direction toward the opposite side with respect to the c-axis in the side surface of the SiC semiconductor layer enables reduction of a forming region of an inclined surface extending along the c-axis. Pickup error in a semiconductor assembly apparatus can thereby be suppressed.

The aforementioned as well as yet other objects, features, and effects of the present invention will be made clear by the following description of the preferred embodiments, with reference to the accompanying drawings.

BRIEF DESCRIPTION OF DRAWINGS

FIG. 9 is a perspective view showing an SiC semiconductor wafer used in manufacturing the SiC semiconductor device shown in FIG. 3.

DESCRIPTION OF EMBODIMENTS

An SiC (silicon carbide) monocrystal constituted of a hexagonal crystal is applied in the preferred embodiments of the present invention. The SiC monocrystal constituted of the hexagonal crystal has a plurality of polytypes including a 2H (hexagonal)-SiC monocrystal, a 4H—SiC monocrystal, and a 6H—SiC monocrystal in accordance with cycle of atomic arrangement. Although, in the preferred embodiments of the present invention, examples where a 4H—SiC monocrystal is applied shall be described, this does not exclude other polytypes from the present invention.

Figure 1:
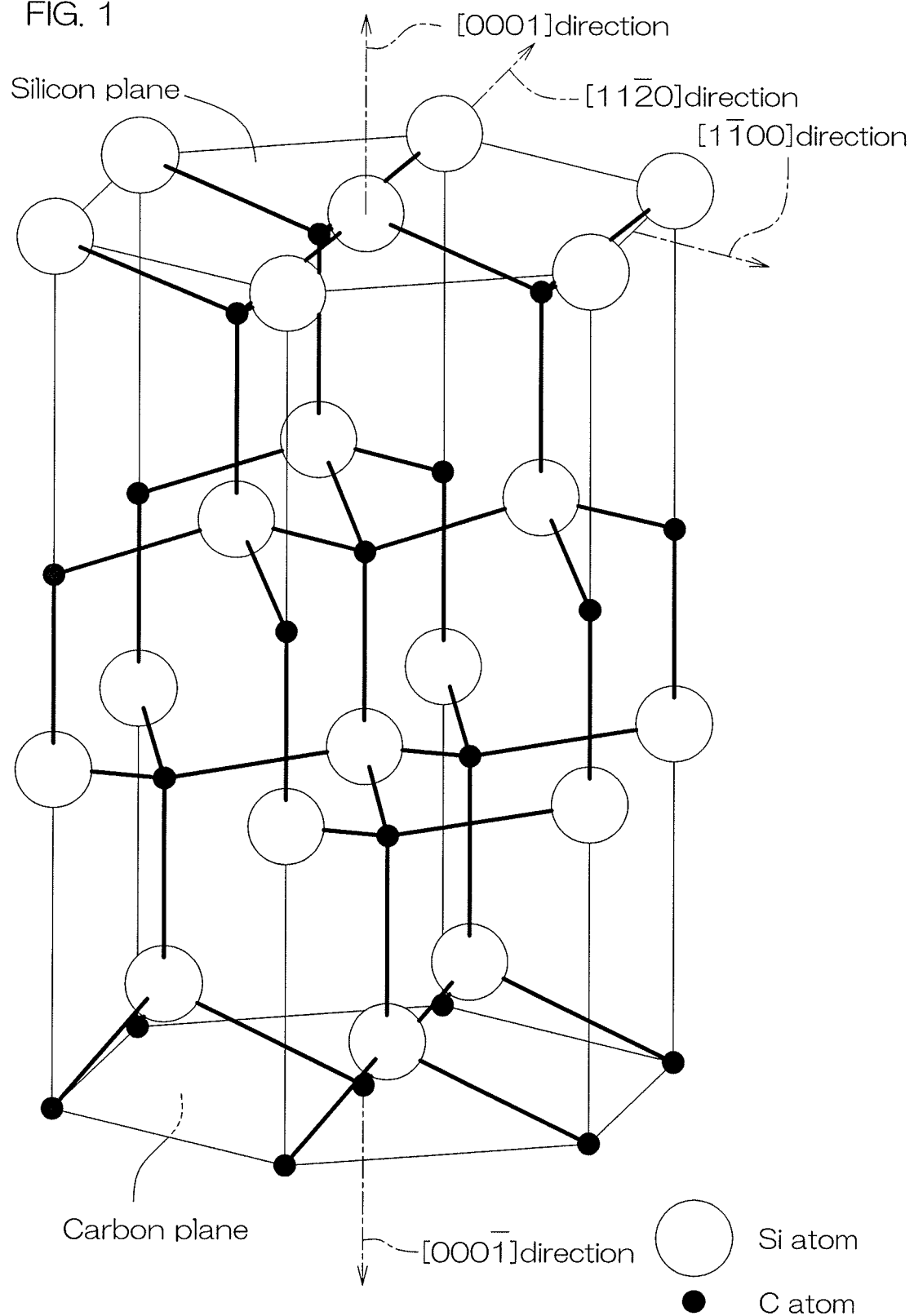
FIG. 1 is a diagram of a unit cell of a 4H—SiC monocrystal to be applied to preferred embodiments of the present invention.
Figure 2:
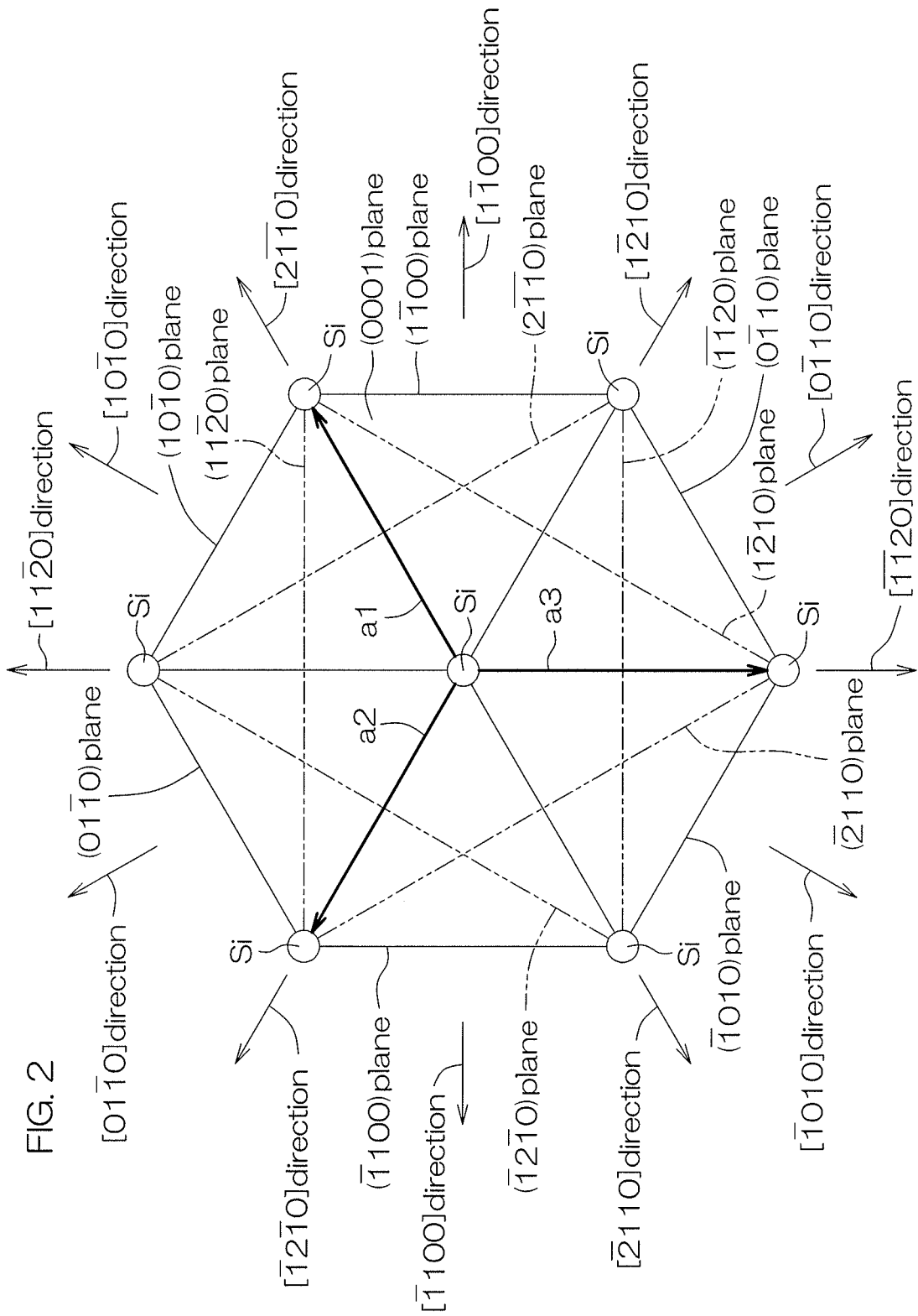
FIG. 2 is a plan view of a silicon plane of the unit cell shown in FIG. 1.

The crystal structure of the 4H—SiC monocrystal shall now be described. FIG. 1 is a diagram of a unit cell of the 4H—SiC monocrystal to be applied to preferred embodiments of the present invention (hereinafter referred to simply as the "unit cell"). FIG. 2 is a plan view of a silicon plane of the unit cell shown in FIG. 1.

Referring to FIG. 1 and FIG. 2, the unit cell includes tetrahedral structures in each of which four C atoms are bonded to a single Si atom in a tetrahedral arrangement (regular tetrahedral arrangement) relationship. The unit cell has an atomic arrangement in which the tetrahedral structures are stacked in a four-period. The unit cell has a hexagonal prism structure having a regular hexagonal silicon plane, a regular hexagonal carbon plane, and six side planes connecting the silicon plane and the carbon plane.

The silicon plane is an end plane terminated by Si atoms. At the silicon plane, a single Si atom is positioned at each of six vertices of a regular hexagon and a single Si atom is positioned at a center of the regular hexagon. The carbon plane is an end plane terminated by C atoms. At the carbon plane, a single C atom is positioned at each of six vertices of a regular hexagon and a single C atom is positioned at a center of the regular hexagon.

The crystal planes of the unit cell are defined by four coordinate axes (a1, a2, a3, and c) including an a1-axis, an a2-axis, an a3-axis, and a c-axis. Of the four coordinate axes, a value of a3 takes on a value of −(a1+a2). The crystal planes of the 4H—SiC monocrystal shall be described below based on the silicon plane as an example of an end plane of a hexagonal crystal.

In a plan view of viewing the silicon plane from the c-axis, the a1-axis, the a2-axis, and the a3-axis are respectively set along directions of arrangement of the nearest neighboring Si atoms (hereinafter referred to simply as the "nearest atom directions") based on the Si atom positioned at the center. The a1-axis, the a2-axis, and the a3-axis are set to be shifted by 120° each in conformance to the arrangement of the Si atoms.

The c-axis is set in a normal direction to the silicon plane based on the Si atom positioned at the center. The silicon plane is a (0001) plane. The carbon plane is a (000-1) plane. The side planes of the hexagonal prism include six crystal planes oriented along the nearest atom directions in the plan view of viewing the silicon plane from the c-axis. More specifically, the side planes of the hexagonal prism include the six crystal planes each including two nearest neighboring Si atoms in the plan view of viewing the silicon plane from the c-axis.

In the plan view of viewing the silicon plane from the c-axis, the side planes of the unit cell include a (1-100) plane, a (0-110) plane, a (−1010) plane, a (−1100) plane, a (01-10) plane, and a (10-10) plane in clockwise order from a tip of the a1-axis.

Diagonal planes of the unit cell not passing through the center include six crystal planes oriented along intersecting directions intersecting the nearest atom directions in the plan view of viewing the silicon plane from the c-axis. When viewed on a basis of the Si atom positioned at the center, the nearest atom direction intersecting directions are orthogonal directions to the nearest atom directions. More specifically, the diagonal planes of the unit cell not passing through the center include the six crystal planes that each include two Si atoms that are not nearest neighbors.

In the plan view of viewing the silicon plane from the c-axis, the diagonal planes of the unit cell not passing through the center include a (11-20) plane, a (1-210) plane, a (−2110) plane, a (−1-120) plane, a (−12-10) plane, and a (2-1-10) plane.

The crystal directions of the unit cell are defined by directions normal to the crystal planes. A normal direction to the (1-100) plane is a [1-100] direction. A normal direction to the (0-110) plane is a [0-110] direction. A normal direction to the (−1010) plane is a [−1010] direction. A normal direction to the (−1100) plane is a [−1100] direction. A normal direction to the (01-10) plane is a [01-10] direction. A normal direction to the (10-10) plane is a [10-10] direction.

A normal direction to the (11-20) plane is a [11-20] direction. A normal direction to the (1-210) plane is a [1-210] direction. A normal direction to the (−2110) plane is a [−2110] direction. A normal direction to the (−1-120) plane is a [−1-120] direction. A normal direction to the (−12-10) plane is a [−12-10] direction. A normal direction to the (2-1-10) plane is a [2-1-10] direction.

The hexagonal prism is six-fold symmetrical and has equivalent crystal planes and equivalent crystal directions every 60°. For example, the (1-100) plane, the (0-110) plane, the (−1010) plane, the (−1100) plane, the (01-10) plane, and the (10-10) plane form equivalent crystal planes. Also, the (11-20) plane, the (1-210) plane, the (−2110) plane, the (−1-120) plane, the (−12-10) plane, and the (2-1-10) plane form equivalent crystal planes.

Also, the [1-100] direction, the [0-110] direction, the [−1010] direction, the [−1100] direction, the [01-10] direction, and the [10-10] direction form equivalent crystal directions. Also, the [11-20] direction, the [1-210] direction, the [−2110] direction, the [−1-120] direction, the [−12-10] direction, and the [2-1-10] direction form equivalent crystal directions.

The c-axis is a [0001] direction ([000-1] direction). The a1-axis is the [2-1-10] direction ([−2110] direction). The a2-axis is the [−12-10] direction ([1-210] direction). The a3-axis is the [−1-120] direction ([11-20] direction).

The [0001] direction and the [000-1] direction are referred to as the c-axis. The (0001) plane and the (000-1) plane are referred to as c-planes. The [11-20] direction and the [−1-120] direction are referred to as an a-axis. The (11-20) plane and the (−1-120) plane are referred to as a-planes. The [1-100] direction and the [−1100] direction are referred to as an m-axis. The (1-100) plane and the (−1100) plane are referred to as m-planes.

Figure 3:
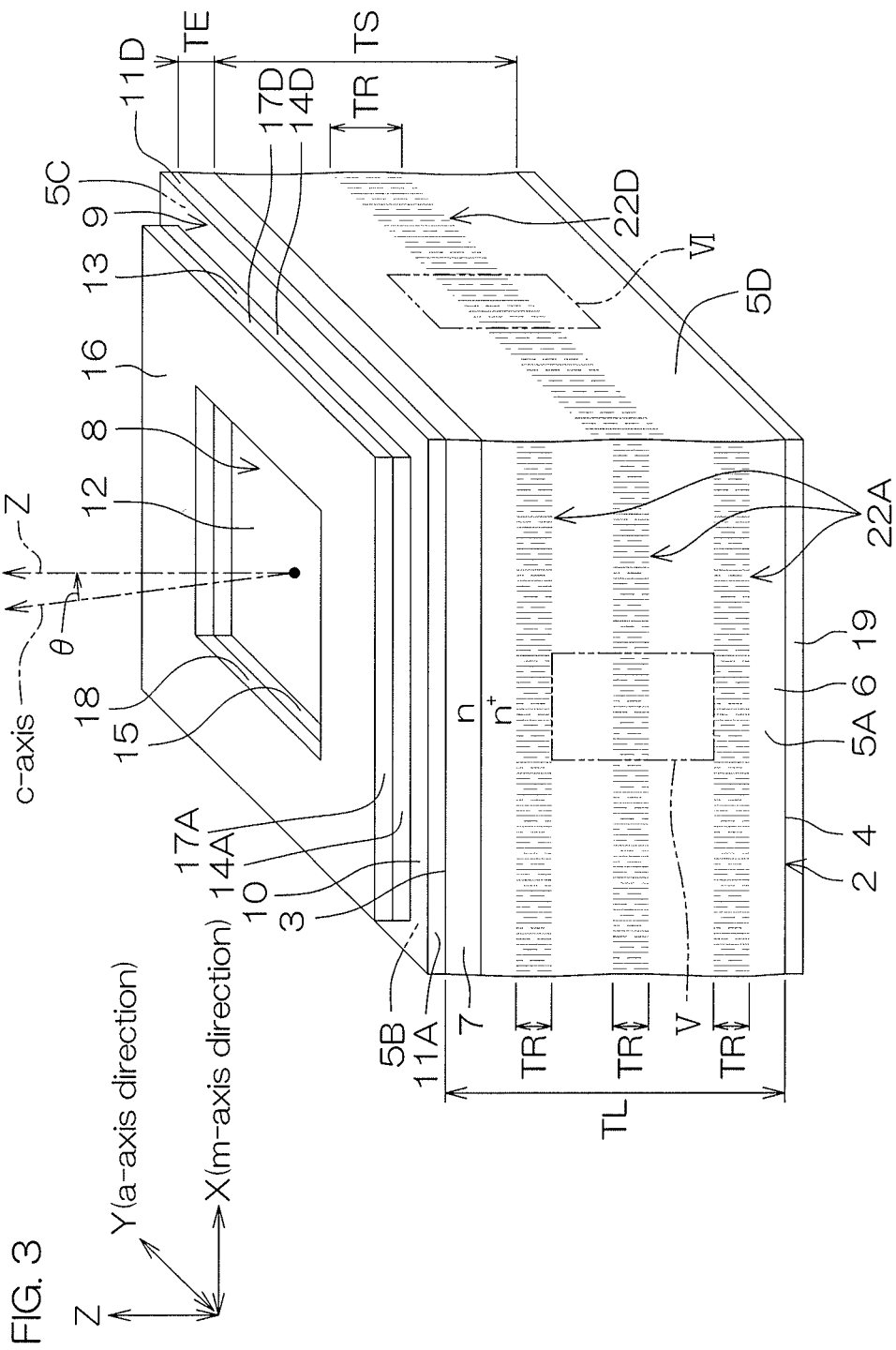
FIG. 3 is a perspective view as viewed from one angle of an SiC semiconductor device according to a first preferred embodiment of the present invention and is a perspective view showing a first configuration example of modified lines.
Figure 4:
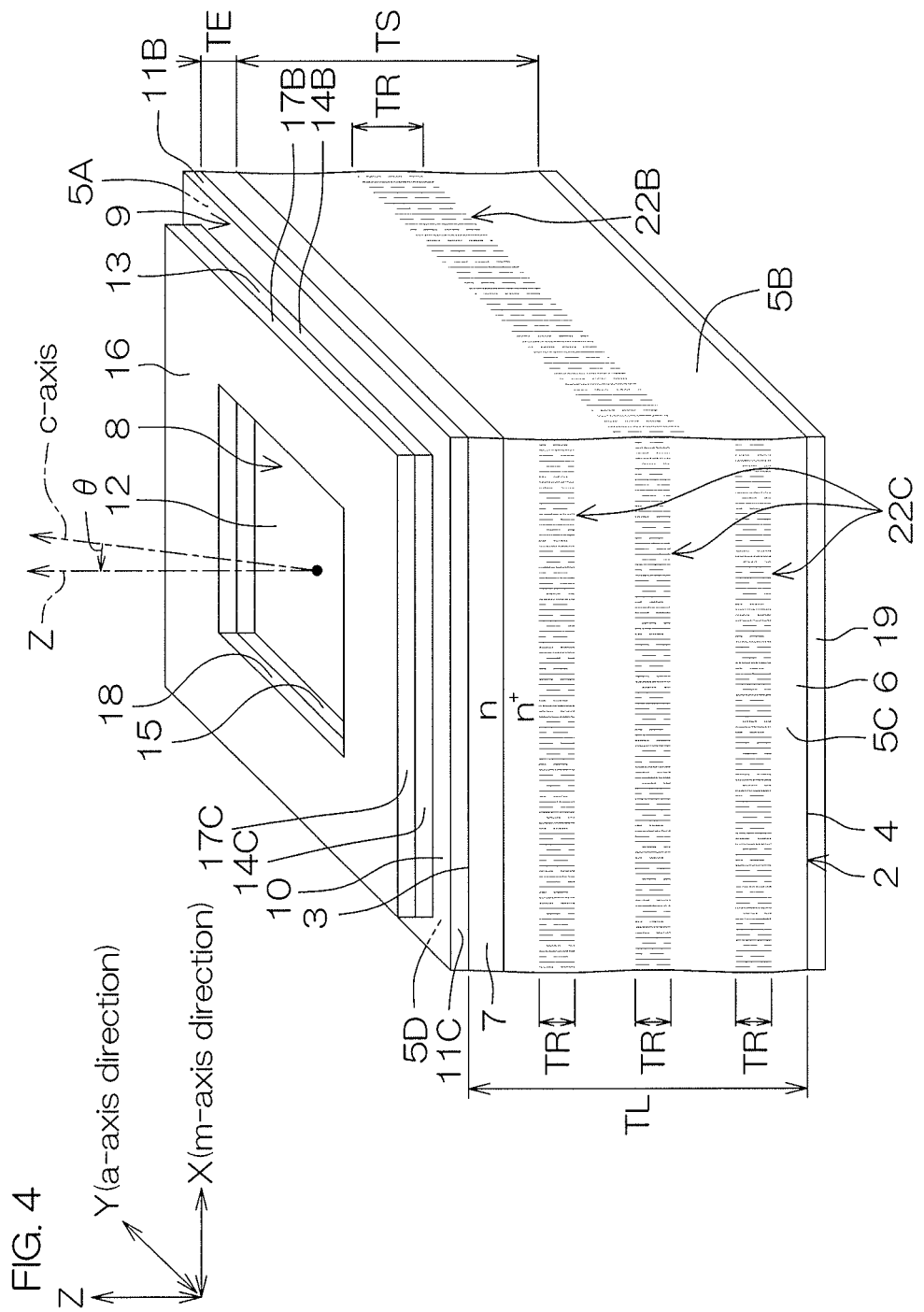
FIG. 4 is a perspective view as viewed from another angle of the SiC semiconductor device shown in FIG. 3.
Figure 5:
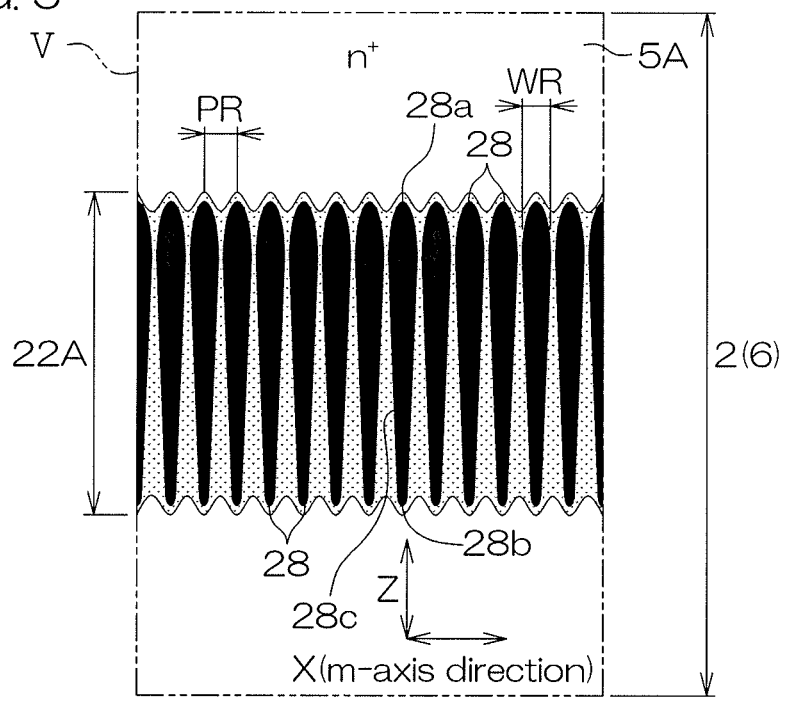
FIG. 5 is an enlarged view of a region V shown in FIG. 3.
Figure 6:
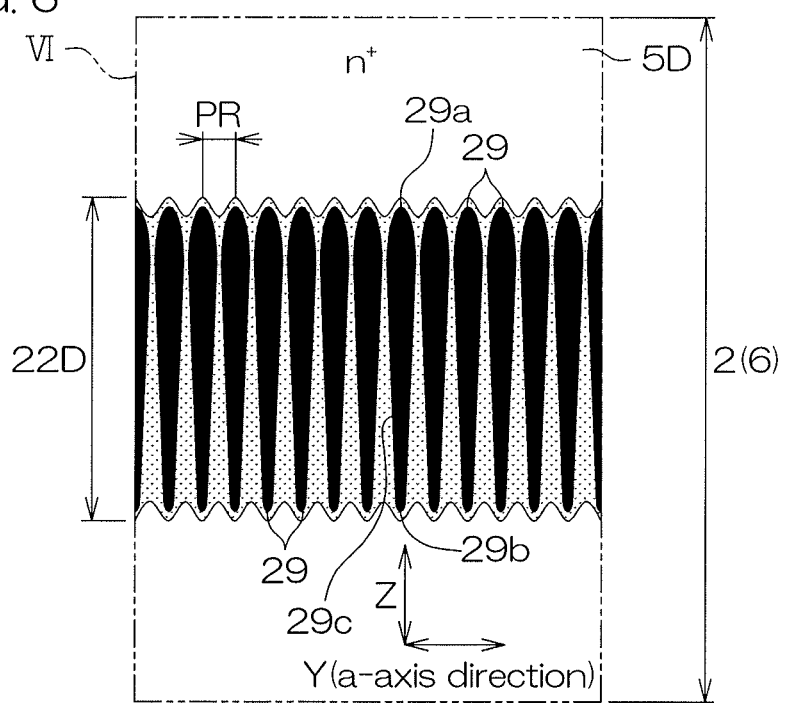
FIG. 6 is an enlarged view of a region VI shown in FIG. 3.
Figure 7:
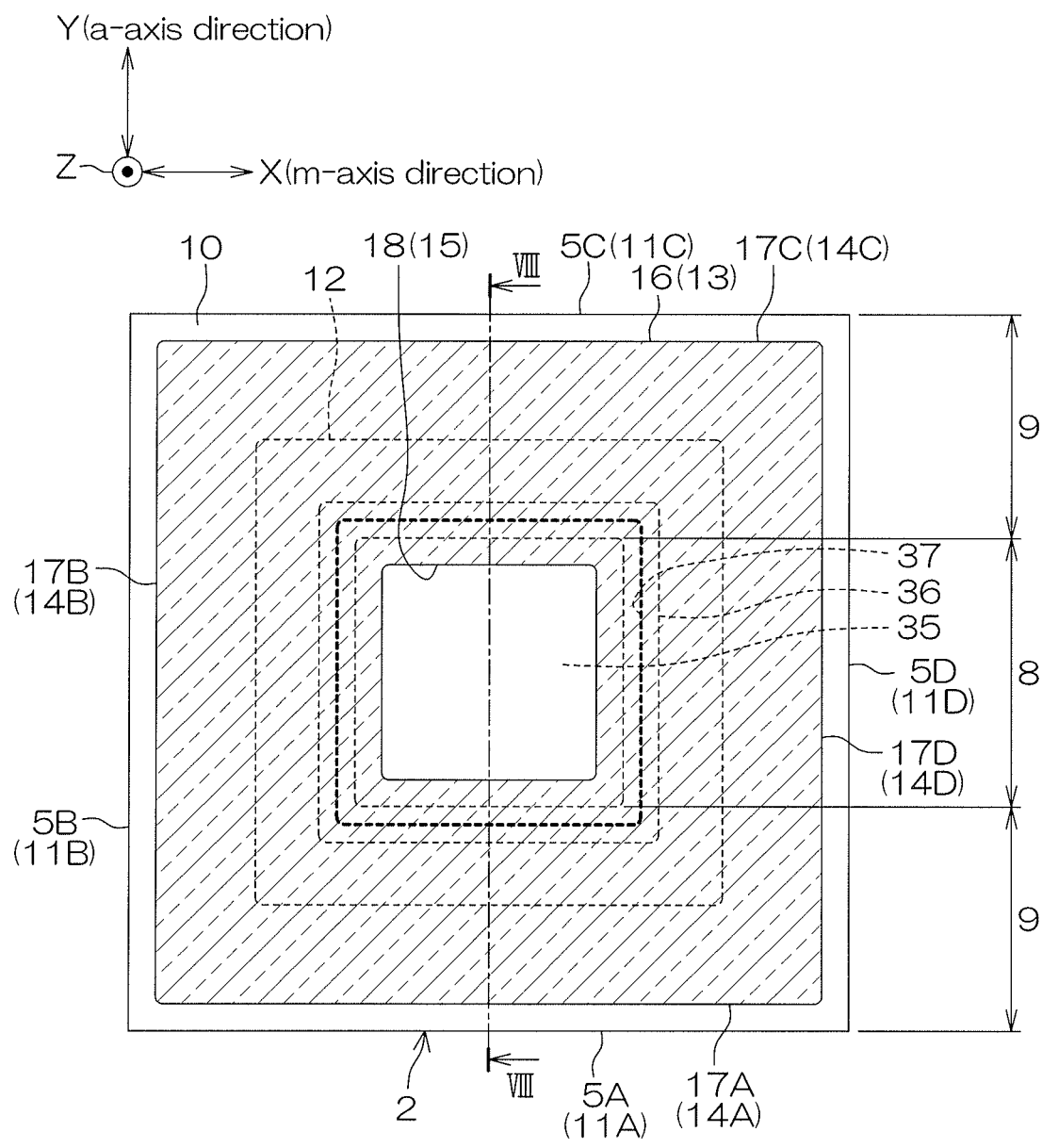
FIG. 7 is a plan view of the SiC semiconductor device shown in FIG. 3.
Figure 8:
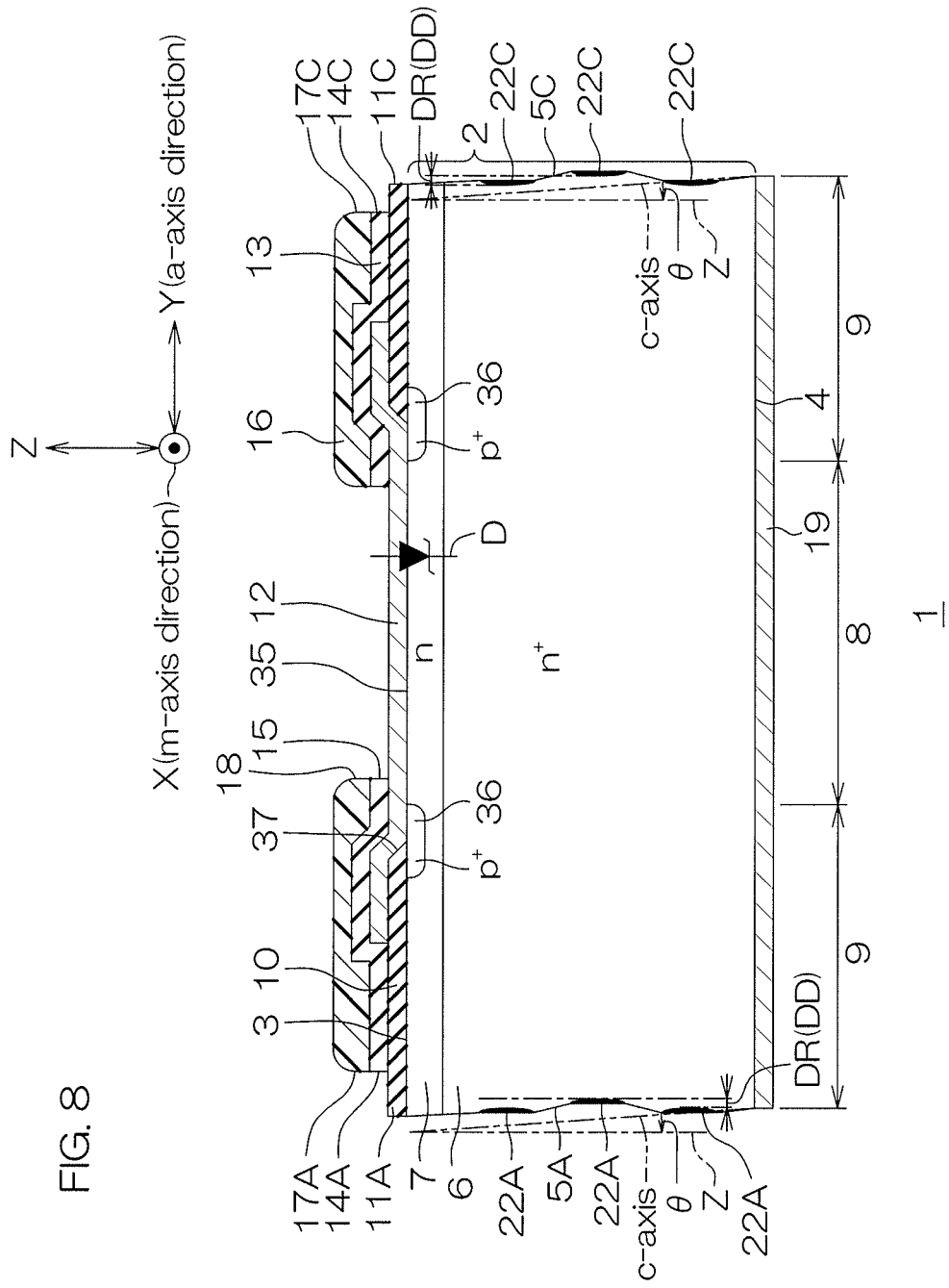
FIG. 8 is a sectional view taken along line VIII-VIII shown in FIG. 7.

FIG. 3 is a perspective view as viewed from one angle of an SiC semiconductor device 1 according to a first preferred embodiment of the present invention and is a perspective view showing a first configuration example of modified lines 22A to 22D. FIG. 4 is a perspective view as viewed from another angle of the SiC semiconductor device 1 shown in FIG. 3. FIG. 5 is an enlarged view of a region V shown in FIG. 3. FIG. 6 is an enlarged view of a region VI shown in FIG. 3. FIG. 7 is a plan view of the SiC semiconductor device 1 shown in FIG. 3. FIG. 8 is a sectional view taken along line VIII-VIII shown in FIG. 7.

Referring to FIG. 3 to FIG. 8, the SiC semiconductor device 1 includes an SiC semiconductor layer 2. The SiC semiconductor layer 2 includes a 4H-SiC monocrystal as an example of an SiC monocrystal constituted of a hexagonal crystal. The SiC semiconductor layer 2 is formed in a chip shape of rectangular parallelepiped shape.

The SiC semiconductor layer 2 has a first main surface 3 at one side, a second main surface 4 at another side, and side surfaces 5A, 5B, 5C, and 5D connecting the first main surface 3 and the second main surface 4. The first main surface 3 and the second main surface 4 are formed in quadrilateral shapes (square shapes here) in a plan view as viewed in a normal direction Z thereof (hereinafter referred to simply as "plan view").

The first main surface 3 is a device surface in which a functional device (semiconductor element) is formed. The second main surface 4 is constituted of a ground surface having grinding marks. The side surfaces 5A to 5D are each constituted of a smooth cleavage surface facing a crystal plane of the SiC monocrystal. The side surfaces 5A to 5D are free from a grinding mark.

A thickness TL of the SiC semiconductor layer 2 may be not less than 40 μm and not more than 200 μm. The thickness TL may be not less than 40 μm and not more than 60 μm, not less than 60 μm and not more than 80 μm, not less than 80 μm and not more than 100 μm, not less than 100 μm and not more than 120 μm, not less than 120 μm and not more than 140 μm, not less than 140 μm and not more than 160 μm, not less than 160 μm and not more than 180 μm, or not less than 180 μm and not more than 200 μm. The thickness TL is preferably not less than 60 μm and not more than 150 μm.

In this embodiment, the first main surface 3 and the second main surface 4 face the c-planes of the SiC monocrystal. The first main surface 3 faces the (0001) plane (silicon plane). The second main surface 4 faces the (000-1) plane (carbon plane) of the SiC monocrystal.

The first main surface 3 and the second main surface 4 have an off angle θ inclined at an angle of not more than 10° in the [11-20] direction with respect to the c-planes of the SiC monocrystal. The normal direction Z is inclined by just the off angle θ with respect to the c-axis ([0001] direction) of the SiC monocrystal.

The off angle θ may be not less than 0° and not more than 5.0°. The off angle θ may be set in an angular range of not less than 0° and not more than 1.0°, not less than 1.0° and not more than 1.5°, not less than 1.5° and not more than 2.0°, not less than 2.0° and not more than 2.5°, not less than 2.5° and not more than 3.0°, not less than 3.0° and not more than 3.5°, not less than 3.5° and not more than 4.0°, not less than 4.0° and not more than 4.5°, or not less than 4.5° and not more than 5.0°. The off angle θ preferably exceeds 0°. The off angle θ may be less than 4.0°.

The off angle θ may be set in an angular range of not less than 3.0° and not more than 4.5°. In this case, the off angle θ is preferably set in an angular range of not less than 3.0° and not more than 3.5°, or not less than 3.5° and not more than 4.0°. The off angle θ may be set in an angular range of not less than 1.5° and not more than 3.0°. In this case, the off angle θ is preferably set in an angular range of not less than 1.5° and not more than 2.0°, or not less than 2.0° and not more than 2.5°.

Lengths of the side surfaces 5A to 5D may each be not less than 0.5 mm and not more than 10 mm. Surface areas of the side surfaces 5A to 5D are equal to each other in this embodiment. If the first main surface 3 and the second main surface 4 are formed in rectangular shapes in plan view, the surface areas of the side surfaces 5A and 5C may be less than the surface areas of the side surfaces 5B and 5D or may exceed the surface areas of the side surfaces 5B and 5D.

In this embodiment, the side surface 5A and the side surface 5C extend in a first direction X and oppose each other in a second direction Y intersecting the first direction X. In this embodiment, the side surface 5B and the side surface 5D extend in the second direction Y and oppose each other in the first direction X. More specifically, the second direction Y is orthogonal to the first direction X.

In this embodiment, the first direction X is set to the m-axis direction ([1-100] direction) of the SiC monocrystal. The second direction Y is set to the a-axis direction ([11-20] direction) of the SiC monocrystal.

The side surface 5A and the side surface 5C are formed by the a-planes of the SiC monocrystal and oppose each other in the a-axis direction. The side surface 5A is formed by the (-1-120) plane of the SiC monocrystal. The side surface 5C is formed by the (11-20) plane of the SiC monocrystal.

The side surface 5A and the side surface 5C each have an angle θa less than the off angle θ (θa<θ) with respect to the normal to the first main surface 3 when a normal to the first main surface 3 is 0°. More specifically, the angle Ga is not less than 0° and less than the off angle θ (0°≤θa<θ). The angle Ga may be defined by an angle that a line connecting a peripheral edge point of the first main surface 3 and a peripheral edge point of the second main surface 4 forms with the normal to first main surface 3 in sectional view.

The side surface 5B and the side surface 5D are formed by the m-planes of the SiC monocrystal and oppose each other in the m-axis direction. The side surface 5B is formed by the (-1100) plane of the SiC monocrystal. The side surface 5D is formed by the (1-100) plane of the SiC monocrystal. The side surface 5B and the side surface 5D extend in plane shapes along the normal to the first main surface 3. More specifically, the side surface 5B and the side surface 5D are formed substantially perpendicular to the first main surface 3 and the second main surface 4.

In this embodiment, the SiC semiconductor layer 2 has a laminated structure that includes an $n^+$ type SiC semiconductor substrate 6 and an n type SiC epitaxial layer 7. The second main surface 4 of the SiC semiconductor layer 2 is formed by the SiC semiconductor substrate 6. The first main surface 3 of the SiC semiconductor layer 2 is formed by the SiC epitaxial layer 7. The side surfaces 5A to 5D of the SiC semiconductor layer 2 are formed by the SiC semiconductor substrate 6 and the SiC epitaxial layer 7.

An n type impurity concentration of the SiC epitaxial layer 7 is not more than an n type impurity concentration of the SiC semiconductor substrate 6. More specifically, the n type impurity concentration of the SiC epitaxial layer 7 is less than the n type impurity concentration of the SiC semiconductor substrate 6. The n type impurity concentration of the SiC semiconductor substrate 6 may be not less than $1.0 \times 10^{18}$ cm$^{-3}$ and not more than $1.0 \times 10^{21}$ cm$^{-3}$. The n type impurity concentration of the SiC epitaxial layer 7 may be not less than $1.0 \times 10^{15}$ cm$^{-3}$ and not more than $1.0 \times 10^{8}$ cm$^{-3}$.

A thickness TS of the SiC semiconductor substrate 6 may be not less than 40 μm and not more than 150 μm. The thickness TS may be not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, not less than 90 μm and not more than 100 μm, not less than 100 μm and not more than 110 μm, not less than 110 μm and not more than 120 μm, not less than 120 μm and not more than 130 μm, not less than 130 μm and not more than 140 μm, or not less than 140 μm and not more than 150 μm. The thickness TS is preferably not less than 40 μm and not more than 130 μm. By thinning the SiC semiconductor substrate 6, a current path is shortened and reduction of resistance value can thus be achieved.

A thickness TE of the SiC epitaxial layer 7 may be not less than 1 μm and not more than 50 μm. The thickness TE may be not less than 1 μm and not more than 5 μm, not less than 5 μm and not more than 10 μm, not less than 10 μm and not more than 15 μm, not less than 15 μm and not more than 20 μm, not less than 20 μm and not more than 25 μm, not less than 25 μm and not more than 30 μm, not less than 30 μm and not more than 35 μm, not less than 35 μm and not more than 40 μm, not less than 40 μm and not more than 45 μm, or not less than 45 μm and not more than 50 μm. The thickness TE is preferably not less than 5 μm and not more than 15 μm.

The SiC semiconductor layer 2 includes an active region 8 and an outer region 9. The active region 8 is a region in which a Schottky barrier diode D is formed as an example of a functional device. In plan view, the active region 8 is formed in a central portion of the SiC semiconductor layer 2 at intervals toward an inner region from the side surfaces 5A to 5D of the SiC semiconductor layer 2. In plan view, the active region 8 is formed in a quadrilateral shape having four sides parallel to the four side surfaces 5A to 5D.

The outer region 9 is a region at an outer side of the active region 8. The outer region 9 is formed in a region between the side surfaces 5A to 5D and peripheral edges of the active region 8. The outer region 9 is formed in an endless shape (a quadrilateral annular shape in this embodiment) surrounding the active region 8 in plan view.

The SiC semiconductor device 1 includes a main surface insulating layer 10 formed on the first main surface 3. The main surface insulating layer 10 selectively covers the active region 8 and the outer region 9. The main surface insulating layer 10 may have a single layer structure constituted of a silicon oxide ($SiO_2$) layer or a silicon nitride (SiN) layer. The main surface insulating layer 10 may have a laminated structure that includes a silicon oxide layer and a silicon nitride layer. The silicon oxide layer may be formed on the silicon nitride layer. The silicon nitride layer may be formed on the silicon oxide layer. In this embodiment, the main surface insulating layer 10 has a single layer structure constituted of a silicon oxide layer.

The main surface insulating layer 10 has insulating side surfaces 11A, 11B, 11C, and 11D exposed from the side surfaces 5A to 5D of the SiC semiconductor layer 2. The insulating side surfaces 11A to 11D are continuous to the side surfaces 5A to 5D. The insulating side surfaces 11A to 11D are formed flush with the side surfaces 5A to 5D. The insulating side surfaces 11A to 11D are constituted of cleavage surfaces.

A thickness of the main surface insulating layer 10 may be not less than 1 μm and not more than 50 μm. The thickness of the main surface insulating layer 10 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 1 includes a first main surface electrode layer 12 formed on the main surface insulating layer 10. In plan view, the first main surface electrode layer 12 is formed in the central portion of the SiC semiconductor layer 2 at intervals toward the inner region from the side surfaces 5A to 5D.

The SiC semiconductor device 1 includes a passivation layer 13 (insulating layer) formed on the main surface insulating layer 10. The passivation layer 13 may have a single layer structure constituted of a silicon oxide layer or a silicon nitride layer. The passivation layer 13 may have a laminated structure that includes a silicon oxide layer and a silicon nitride layer. The silicon oxide layer may be formed on the silicon nitride layer. The silicon nitride layer may be formed on the silicon oxide layer. In this embodiment, the passivation layer 13 has a single layer structure constituted of a silicon nitride layer.

The passivation layer 13 includes four side surfaces 14A, 14B, 14C, and 14D. In plan view, the side surfaces 14A to 14D of the passivation layer 13 are formed at intervals toward the inner region from the side surfaces 5A to 5D of the SiC semiconductor layer 2. In plan view, the passivation layer 13 exposes a peripheral edge portion of the first main surface 3. The passivation layer 13 exposes the main surface insulating layer 10. The side surfaces 14A to 14D of the passivation layer 13 may be formed flush with the side surfaces 5A to 5D of the SiC semiconductor layer 2.

The passivation layer 13 includes a sub pad opening 15 that exposes a portion of the first main surface electrode layer 12 as a pad region. The sub pad opening 15 is formed in a quadrilateral shape having four sides parallel to the side surfaces 5A to 5D in plan view.

A thickness of the passivation layer 13 may be not less than 1 μm and not more than 50 μm. The thickness of the passivation layer 13 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 1 includes a resin layer 16 (insulating layer) formed on the passivation layer 13. The resin layer 16, with the passivation layer 13, forms a single insulating laminated structure (insulating layer). In FIG. 7, the resin layer 16 is shown with hatching.

The resin layer 16 may include a negative type or positive type photosensitive resin. In this embodiment, the resin layer 16 includes a polybenzoxazole as an example of a positive type photosensitive resin. The resin layer 16 may include a polyimide as an example of a negative type photosensitive resin.

The resin layer 16 includes four resin side surfaces 17A, 17B, 17C, and 17D. In plan view, the resin side surfaces 17A to 17D of the resin layer 16 are formed at intervals toward the inner region from the side surfaces 5A to 5D of the SiC semiconductor layer 2. In plan view, the resin layer 16 exposes the peripheral edge portion of the first main surface 3. The resin layer 16, together with the passivation layer 13, exposes the main surface insulating layer 10. In this embodiment, the resin side surfaces 17A to 17D of the resin layer 16 are formed flush with the side surfaces 14A to 14D of the passivation layer 13.

The resin side surfaces 17A to 17D of the resin layer 16, with the side surfaces 5A to 5D of the SiC semiconductor layer 2, demarcate a dicing street. In this embodiment, the side surfaces 14A to 14D of the passivation layer 13 also demarcate the dicing street. According to the dicing street, it is made unnecessary to physically cut the resin layer 16 and the passivation layer 13 when cutting out the SiC semiconductor device 1 from a single SiC semiconductor wafer. The SiC semiconductor device 1 can thereby be cut out smoothly from the single SiC semiconductor wafer. Also, insulation distances from the side surfaces 5A to 5D can be increased.

A width of the dicing street may be not less than 1 μm and not more than 25 μm. The width of the dicing street may be not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

The resin layer 16 includes a pad opening 18 that exposes a portion of the first main surface electrode layer 12 as a pad region. The pad opening 18 is formed in a quadrilateral shape having four sides parallel to the side surfaces 5A to 5D in plan view.

The pad opening 18 is in communication with the sub pad opening 15. Inner walls of the pad opening 18 are formed flush with inner walls of the sub pad opening 15. The inner walls of the pad opening 18 may be positioned toward the side surface 5A to 5D sides with respect to the inner walls of the sub pad opening 15. The inner walls of the pad opening 18 may be positioned toward the inner region of the SiC semiconductor layer 2 with respect to the inner walls of the sub pad opening 15. The resin layer 16 may cover the inner walls of the sub pad opening 15.

A thickness of the resin layer 16 may be not less than 1 μm and not more than 50 μm. The thickness of the resin layer 16 may be not less than 1 μm and not more than 10 μm, not less than 10 μm and not more than 20 μm, not less than 20

μm and not more than 30 μm, not less than 30 μm and not more than 40 μm, or not less than 40 μm and not more than 50 μm.

The SiC semiconductor device 1 includes a second main surface electrode layer 19 formed on the second main surface 4 of the SiC semiconductor layer 2. The second main surface electrode layer 19 forms an ohmic contact with the second main surface 4 (SiC semiconductor substrate 6).

The SiC semiconductor device 1 includes a plurality of modified lines 22A to 22D (modified layers) formed at the side surfaces 5A to 5D. The modified lines 22A to 22D are not formed in the main surface insulating layer 10, the passivation layer 13 and the resin layer 16. The modified lines 22A to 22D include the modified lines 22A formed at the side surface 5A, the modified line 22B formed at the side surface 5B, the modified lines 22C formed at the side surface 5C, and the modified line 22D formed at the side surface 5D.

The modified lines 22A and 22C are respectively formed at the a-planes of the SiC monocrystal. The modified lines 22A are formed in plurality (two layers or more; three layers in this embodiment) at the side surface 5A. The modified lines 22C are formed in plurality (two layers or more; three layers in this embodiment) at the side surface 5C. The numbers of layers of the modified lines 22A and 22C are preferably not less than two layers and not more than six layers.

The modified lines 22B and 22D are respectively formed at the m-planes of the SiC monocrystal. The modified line 22B is formed in one layer or a plurality (two layers or more; one layer in this embodiment) at the side surface 5B. The modified line 22D is formed in one layer or a plurality (two layers or more; one layer in this embodiment) at the side surface 5D. The numbers of layers of the modified lines 22B and 22D are preferably not more than the numbers of layers of the modified lines 22A and 22C. The numbers of layers of the modified lines 22B and 22D are more preferably less than the numbers of layers of the modified lines 22A and 22C.

The modified lines 22A to 22D include regions of layer form in which portions of the SiC monocrystal forming the side surfaces 5A to 5D are modified to be of a property differing from the SiC monocrystal. The modified lines 22A to 22D include the regions that are modified to be of the property differing in density, refractive index, mechanical strength (crystal strength), or other physical characteristic from the SiC monocrystal. The modified lines 22A to 22D may include at least one layer among a melted-and-rehardened layer, a defect layer, a dielectric breakdown layer, and a refractive index change layer.

The melted-and-rehardened layer is a layer in which a portion of the SiC semiconductor layer 2 is melted and thereafter hardened again. The defect layer is a layer that includes a hole, fissure, etc., formed in the SiC semiconductor layer 2. The dielectric breakdown layer is a layer in which a portion of the SiC semiconductor layer 2 has undergone dielectric breakdown. The refractive index change layer is a layer in which a portion of the SiC semiconductor layer 2 is changed to a refractive index differing from the SiC monocrystal.

The modified lines 22A to 22D extend in band shapes along tangential directions to the first main surface 3. The tangential directions to the first main surface 3 are directions orthogonal to the normal direction Z. The tangential directions include the first direction X (the m-axis direction of the SiC monocrystal) and the second direction Y (the a-axis direction of the SiC monocrystal).

Referring to FIG. 3 and FIG. 8, the plurality of modified lines 22A are each formed in a band shape extending rectilinearly along the m-axis direction at the side surface 5A. The plurality of modified lines 22A are formed shifted from each other in the normal direction Z.

The plurality of modified lines 22A may be mutually overlapped in the normal direction Z. The plurality of modified lines 22A are preferably formed at intervals in the normal direction Z. Each of the plurality of modified lines 22A has a thickness TR in the normal direction Z. The thicknesses TR of the plurality of modified lines 22A may be mutually equal or may be mutually different.

Among the plurality of modified lines 22A, the modified line 22A at the first main surface 3 side is formed at an interval toward the second main surface 4 side from the first main surface 3. The modified line 22A at the first main surface 3 side exposes a surface layer portion of the first main surface 3 from the side surface 5A. Among the plurality of modified lines 22A, the modified line 22A at the second main surface 4 side is formed at an interval toward the first main surface 3 side from the second main surface 4. The modified line 22A at the second main surface 4 side exposes a surface layer portion of the second main surface 4 from the side surface 5A.

The plurality of modified lines 22A are formed in the SiC semiconductor substrate 6. The plurality of modified lines 22A are formed at intervals toward the second main surface 4 side from a boundary between the SiC semiconductor substrate 6 and the SiC epitaxial layer 7. The plurality of modified lines 22A thereby expose the SiC epitaxial layer 7 at the surface layer portion of the first main surface 3.

The side surface 5A facing the a-plane of the SiC monocrystal has a physical property of cleaving with the c-axis of the SiC monocrystal as a cleavage direction. Therefore, when the plurality of modified lines 22A are formed along the c-axis of the SiC monocrystal or the normal direction Z, the side surface 5A becomes an inclined surface oriented along the c-axis of the SiC monocrystal.

Thus, in this embodiment, one or a plurality (one in this embodiment) of inclined portions inclined in a direction of an opposite side (the side surface 5C side) with respect to the c-axis of the SiC monocrystal from the normal to the first main surface 3 in the a-axis direction is or are introduced into the side surface 5A. The opposite direction with respect to the c-axis is, more specifically, a direction between the normal direction Z and the a-axis direction (the [11-20] direction) of the SiC monocrystal.

In this embodiment, the inclined portion directed toward the opposite side (the side surface 5C side) with respect to the c-axis of the SiC monocrystal is introduced into the side surface 5A by the plurality of modified lines 22A that are formed shifted from each other in the a-axis direction of the SiC monocrystal in sectional view. One or a plurality of inclined portions oriented along the c-axis of the SiC monocrystal is or are also formed in the side surface 5A. A forming region of the inclined portions directed toward the c-axis is reduced by the inclined portion directed toward the opposite side with respect to the c-axis of the SiC monocrystal.

Along the normal direction Z, the plurality of modified lines 22A are formed shifted alternately to one side (the [11-20] direction side) and another side (the [-1-120] direction side) in the a-axis direction in sectional view. In a case where four or more layers of the modified lines 22A are formed at the side surface 5A, it is not necessary for all of the modified lines 22A to be formed alternately shifted to the one side and the other side in the a-axis direction. The plurality of modified lines 22A preferably include portions formed alternately shifted to the one side and the other side in the a-axis direction.

The plurality of modified lines 22A are preferably formed in a mode where a straight line connecting any two layers of the modified lines 22A intersects at least the normal to the first main surface 3. A straight line connecting any two layers of the modified lines 22A preferably intersects the c-axis of the SiC monocrystal. A straight line connecting any two layers of the modified lines 22A preferably intersects the normal to the first main surface 3 and the c-axis of the SiC monocrystal.

The plurality of modified lines 22A preferably include one layer or a plurality of modified lines 22A formed shifted to an inner side (the [11-20] direction side) of the SiC semiconductor layer 2 in the a-axis direction with respect to the modified line 22A at the second main surface 4 side.

In this embodiment, the middle modified line 22A is formed shifted to the inner side of the SiC semiconductor layer 2 with respect to the modified line 22A at the second main surface 4 side. An inclined portion directed toward the opposite side with respect to the c-axis of the SiC monocrystal is formed in a region between the middle modified line 22A and the modified line 22A at the second main surface 4 side. A straight line connecting the middle modified line 22A and the modified line 22A at the second main surface 4 side intersects the normal to the first main surface 3 and the c-axis of the SiC monocrystal.

The plurality of modified lines 22A preferably include one layer or a plurality of modified lines 22A formed shifted to the inner side (the [11-20] direction side) of the SiC semiconductor layer 2 in the a-axis direction with respect to the modified line 22A at the first main surface 3 side.

In this embodiment, the middle modified line 22A is formed shifted to the inner side of the SiC semiconductor layer 2 with respect to the modified line 22A at the first main surface 3 side. An inclined portion directed toward the c-axis of the SiC monocrystal is formed in a region between the middle modified line 22A and the modified line 22A at the first main surface 3 side. A straight line connecting the middle modified line 22A and the modified line 22A at the first main surface 3 side intersects the normal to the first main surface 3. The straight line connecting the middle modified line 22A and the modified line 22A at the first main surface 3 side may extend along the c-axis of the SiC monocrystal or may intersect the c-axis of the SiC monocrystal.

When three or more layers of the modified lines 22A are thus formed, the plurality of modified lines 22A preferably include one layer or a plurality of modified lines 22A formed shifted to the inner side (the [11-20] direction side) of the SiC semiconductor layer 2 with respect to a straight line connecting any two layers of the modified lines 22A. In this embodiment, the middle modified line 22A is formed shifted to the inner side of the SiC semiconductor layer 2 with respect to a straight line connecting the modified line 22A at the first main surface 3 side and the modified line 22A at the second main surface 4 side.

A distance DR in the a-axis direction of two mutually adjacent modified lines 22A may exceed 0 μm and be not more than 20 μm. The distance DR may exceed 0 μm and be not more than 5 μm, be not less than 5 μm and not more than 10 μm, be not less than 10 μm and not more than 15 μm, or be not less than 15 μm and not more than 20 μm.

A farthest distance DD in the a-axis direction of the plurality of modified lines 22A may exceed 0 μm and be not more than 40 μm. The farthest distance DD is the distance between the modified line 22A positioned at an outermost side and the modified line 22A positioned at an innermost side in the a-axis direction.

The farthest distance DD may exceed 0 μm and be not more than 5 μm, be not less than 5 μm and not more than 10 μm, be not less than 10 μm and not more than 15 μm, be not less than 15 μm and not more than 20 μm, be not less than 20 μm and not more than 25 μm, be not less than 25 μm and not more than 30 μm, be not less than 30 μm and not more than 35 μm, be not less than 35 μm and not more than 40 μm, be not less than 40 μm and not more than 45 μm, or be not less than 45 μm and not more than 50 μm. The farthest distance DD may be equal to the distance DR.

The distance DR is preferably of a value less than $TL \times \tan \theta$ using the off angle $\theta$ and the thickness TL of the SiC semiconductor layer 2 ($0 < DR < TL \times \tan \theta$). Also, the farthest distance DD is preferably of a value less than $TL \times \tan \theta$ ($0 < DD < TL \times \tan \theta$). Preferably, in this case, three or more layers of the modified lines 22A are formed.

The side surface 5A has a raised portion formed by the plurality of modified lines 22A. Apex portions and a base portion of the raised portion of the side surface 5A are formed by the plurality of modified lines 22A. In this embodiment, the apex portions of the raised portions are formed by the modified line 22A at the first main surface 3 side and the modified line 22A at the second main surface 4 side, and the base portion of the raised portions is formed by the middle modified line 22A. The side surface 5A is formed at an angular position between the c-axis of the SiC monocrystal and the normal to the first main surface 3 as a whole while having the raised portions.

Referring to FIG. 4, the modified line 22B is formed in a band shape extending rectilinearly along the a-axis direction at the side surface 5B. The modified line 22B has a thickness TR in the normal direction Z. The modified line 22B is formed at an interval toward the second main surface 4 side from the first main surface 3. The modified line 22B exposes a surface layer portion of the first main surface 3 from the side surface 5B. The modified line 22B is formed at an interval toward the first main surface 3 side from the second main surface 4. The modified line 22B exposes a surface layer portion of the second main surface 4 from the side surface 5B.

The modified line 22B is formed in the SiC semiconductor substrate 6. The modified line 22B is formed at an interval toward the second main surface 4 side from a boundary between the SiC semiconductor substrate 6 and the SiC epitaxial layer 7. The modified line 22B thereby exposes the SiC epitaxial layer 7 at the surface layer portion of the first main surface 3.

A plurality of modified lines 22B may be formed at the side surface 5B. In this case, the plurality of modified lines 22B are formed shifted from each other in the normal direction Z. The plurality of modified lines 22B may be mutually overlapped in the normal direction Z. The plurality of modified lines 22B are preferably formed at intervals in the normal direction Z. The thicknesses TR of the plurality of modified lines 22B may be mutually equal or may be mutually different.

Referring to FIG. 4 and FIG. 8, the plurality of modified lines 22C are each formed in a band shape extending rectilinearly along the m-axis direction at the side surface 5C. The plurality of modified lines 22C are formed shifted from each other in the normal direction Z.

The plurality of modified lines 22C may be mutually overlapped in the normal direction Z. The plurality of modified lines 22C are preferably formed at intervals in the normal direction Z. Each of the plurality of modified lines 22C has a thickness TR in the normal direction Z. The thicknesses TR of the plurality of modified lines 22C may be mutually equal or may be mutually different.

Among the plurality of modified lines 22C, the modified line 22C at the first main surface 3 side is formed at an interval toward the second main surface 4 side from the first main surface 3. The modified line 22C at the first main surface 3 side exposes a surface layer portion of the first main surface 3 from the side surface 5C. Among the plurality of modified lines 22C, the modified line 22C at the second main surface 4 side is formed at an interval toward the first main surface 3 side from the second main surface 4. The modified line 22C at the second main surface 4 side exposes a surface layer portion of the second main surface 4 from the side surface 5C.

The plurality of modified lines 22C are formed in the SiC semiconductor substrate 6. The plurality of modified lines 22C are formed at intervals toward the second main surface 4 side from a boundary between the SiC semiconductor substrate 6 and the SiC epitaxial layer 7. The plurality of modified lines 22C thereby expose the SiC epitaxial layer 7 at the surface layer portion of the first main surface 3.

The side surface 5C facing the a-plane of the SiC monocrystal has a physical property of cleaving with the c-axis of the SiC monocrystal as a cleavage direction. Therefore, when the plurality of modified lines 22C are formed along the c-axis of the SiC monocrystal or the normal direction Z, the side surface 5C becomes an inclined surface oriented along the c-axis of the SiC monocrystal.

Thus, in this embodiment, one or a plurality (one in this embodiment) of inclined portions inclined in the direction of the opposite side (side opposite to the side surface 5A) with respect to the c-axis of the SiC monocrystal from the normal to the first main surface 3 is or are introduced into the side surface 5C. The opposite direction with respect to the c-axis is, more specifically, the direction between the normal direction Z and the a-axis direction (the [11-20] direction) of the SiC monocrystal.

In this embodiment, the inclined portion directed toward the opposite side (side opposite to the side surface 5A) with respect to the c-axis of the SiC monocrystal is introduced into the side surface 5C by the plurality of modified lines 22C that are formed shifted from each other in the a-axis direction of the SiC monocrystal in sectional view. One or a plurality of inclined portions oriented along the c-axis of the SiC monocrystal is or are also formed in the side surface 5C. A forming region of the inclined portions directed toward the c-axis is reduced by the inclined portion directed toward the opposite side with respect to the c-axis of the SiC monocrystal.

Along the normal direction Z, the plurality of modified lines 22C are formed shifted alternately to one side (the [11-20] direction side) and another side (the [−1-120] direction side) in the a-axis direction in sectional view. In a case where four or more layers of the modified lines 22C are formed at the side surface 5C, it is not necessary for all of the modified lines 22C to be formed alternately shifted to the one side and the other side in the a-axis direction. The plurality of modified lines 22C preferably include portions formed alternately shifted to the one side and the other side in the a-axis direction.

The plurality of modified lines 22C are preferably formed in a mode where a straight line connecting any two layers of the modified lines 22C intersects at least the normal to the first main surface 3. A straight line connecting any two layers of the modified lines 22C preferably intersects the c-axis of the SiC monocrystal. A straight line connecting any two layers of the modified lines 22C preferably intersects the normal to the first main surface 3 and the c-axis of the SiC monocrystal.

The plurality of modified lines 22C preferably include one layer or a plurality of modified lines 22C formed shifted to an outer side (the [11-20] direction side) of the SiC semiconductor layer 2 in the a-axis direction with respect to the modified line 22C at the second main surface 4 side.

In this embodiment, the middle modified line 22C is formed shifted to the outer side of the SiC semiconductor layer 2 with respect to the modified line 22C at the second main surface 4 side. An inclined portion directed toward the opposite side with respect to the c-axis of the SiC monocrystal is formed in a region between the middle modified line 22C and the modified line 22C at the second main surface 4 side. A straight line connecting the middle modified line 22C and the modified line 22C at the second main surface 4 side intersects the normal to the first main surface 3 and the c-axis of the SiC monocrystal.

The plurality of modified lines 22C preferably include one layer or a plurality of modified lines 22C formed shifted to the outer side (the [11-20] direction side) of the SiC semiconductor layer 2 in the a-axis direction with respect to the modified line 22C at the first main surface 3 side.

In this embodiment, the middle modified line 22C is formed shifted to the outer side of the SiC semiconductor layer 2 with respect to the modified line 22C at the first main surface 3 side. An inclined portion directed toward the c-axis of the SiC monocrystal is formed in a region between the middle modified line 22C and the modified line 22C at the first main surface 3 side. A straight line connecting the middle modified line 22C and the modified line 22C at the first main surface 3 side intersects the normal to the first main surface 3. The straight line connecting the middle modified line 22C and the modified line 22C at the first main surface 3 side may extend along the c-axis of the SiC monocrystal or may intersect the c-axis of the SiC monocrystal.

When three or more layers of the modified lines 22C are thus formed, the plurality of modified lines 22C preferably include one layer or a plurality of modified lines 22C formed shifted to the outer side (the [11-20] direction side) of the SiC semiconductor layer 2 with respect to a straight line connecting any two layers of the modified lines 22A. In this embodiment, the middle modified line 22C is formed shifted to the outer side of the SiC semiconductor layer 2 with respect to a straight line connecting the modified line 22C at the first main surface 3 side and the modified line 22C at the second main surface 4 side.

A distance DR in the a-axis direction of two mutually adjacent modified lines 22C may exceed 0 μm and be not more than 20 μm. The distance DR may exceed 0 μm and be not more than 5 μm, be not less than 5 μm and not more than 10 μm, be not less than 10 μm and not more than 15 μm, or be not less than 15 μm and not more than 20 μm.

A farthest distance DD of the plurality of modified lines 22C may exceed 0 μm and be not more than 40 μm. The farthest distance DD is the distance between the modified line 22C positioned at an outermost side and the modified line 22C positioned at an innermost side in the a-axis direction.

The farthest distance DD may exceed 0 μm and be not more than 5 μm, be not less than 5 μm and not more than 10 μm, be not less than 10 μm and not more than 15 μm, be not less than 15 μm and not more than 20 μm, be not less than 20 μm and not more than 25 μm, be not less than 25 μm and not more than 30 μm, be not less than 30 μm and not more than 35 μm, be not less than 35 μm and not more than 40 μm, be not less than 40 μm and not more than 45 μm, or be not less than 45 μm and not more than 50 μm. The farthest distance DD may be equal to the distance DR.

The distance DR is preferably of a value less than TL×tan θ using the off angle θ and the thickness TL of the SiC semiconductor layer 2 (0<DR<TL×tan θ). Also, the farthest distance DD is preferably of a value less than TL×tan θ (0<DD<TL×tan θ). Preferably, in this case, three or more layers of the modified lines 22C are formed.

The side surface 5C has a raised portion formed by the plurality of modified lines 22C. An apex portion and base portions of the raised portion of the side surface 5C are formed by the plurality of modified lines 22C. In this embodiment, the apex portion of the raised portion is formed by the modified line 22C at the first main surface 3 side and the modified line 22C at the second main surface 4 side, and the base portions of the raised portion are formed by the middle modified line 22C. The side surface 5C is formed at an angular position between the c-axis of the SiC monocrystal and the normal to the first main surface 3 as a whole while having the raised portion.

Referring to FIG. 3, the modified line 22D is formed in a band shape extending rectilinearly along the a-axis direction at the side surface 5D. The modified line 22D has a thickness TR in the normal direction Z. The modified line 22D is formed at an interval toward the second main surface 4 side from the first main surface 3. The modified line 22D exposes a surface layer portion of the first main surface 3 from the side surface 5D. The modified line 22D is formed at an interval toward the first main surface 3 side from the second main surface 4. The modified line 22D exposes a surface layer portion of the second main surface 4 from the side surface 5D.

The modified line 22D is formed in the SiC semiconductor substrate 6. The modified line 22D is formed at an interval toward the second main surface 4 side from a boundary between the SiC semiconductor substrate 6 and the SiC epitaxial layer 7. The modified line 22D thereby exposes the SiC epitaxial layer 7 at the surface layer portion of the first main surface 3.

A plurality of modified lines 22D may be formed at the side surface 5D. In this case, the plurality of modified lines 22D are formed shifted from each other in the normal direction Z. The plurality of modified lines 22D may be mutually overlapped in the normal direction Z. The plurality of modified lines 22D are preferably formed at intervals in the normal direction Z. The thicknesses TR of the plurality of modified lines 22D may be mutually equal or may be mutually different.

The modified line 22A and the modified line 22B may be continuous to each other at a corner portion connecting the side surface 5A and the side surface 5B. The modified line 22B and the modified line 22C may be continuous to each other at a corner portion connecting the side surface 5B and the side surface 5C. The modified line 22C and the modified line 22D may be continuous to each other at a corner portion connecting the side surface 5C and the side surface 5D. The modified line 22D and the modified line 22A may be continuous to each other at a corner portion connecting the side surface 5D and the side surface 5A.

The modified lines 22A to 22D may be formed integrally such as to surround the SiC semiconductor layer 2. The modified lines 22A to 22D may form a single endless (annular) modified line surrounding the SiC semiconductor layer 2 at the side surfaces 5A to 5D.

The modified lines 22A to 22D are formed at different occupying ratios RA, RB, RC, and RD at the side surfaces 5A to 5D. The occupying ratio RA is a ratio of the modified lines 22A occupying the side surface 5A. The occupying ratio RB is a ratio of the modified line 22B occupying the side surface 5B. The occupying ratio RC is a ratio of the modified lines 22C occupying the side surface 5C. The occupying ratio RD is a ratio of the modified line 22D occupying the side surface 5D.

More specifically, the occupying ratios RA to RD differ in accordance with the crystal planes of the SiC monocrystal. The occupying ratios RB and RD of the modified lines 22B and 22D formed at the m-planes of the SiC monocrystal are not more than the occupying ratios RA and RC of the modified lines 22A and 22C formed at the a-planes of the SiC monocrystal (RB, RD≤RA, RC). More specifically, the occupying ratios RB and RD are less than occupying ratios RA and RC (RB, RD<RA, RC).

The occupying ratios RA and RC of the modified lines 22A and 22C may be mutually equal or may be mutually different. The occupying ratios RB and RD of the modified lines 22B and 22D may be mutually equal or may be mutually different.

The occupying ratios RA to RD are adjusted by numbers of layers, the thicknesses TR, total surface areas, etc., of the modified lines 22A to 22D. In this embodiment, as an example, the occupying ratios RA to RD of the modified lines 22A to 22D are adjusted by adjusting the numbers of layers and the thicknesses TR of the modified lines 22A to 22D.

The numbers of layers of the modified lines 22B and 22D are each less than the numbers of layers of the modified lines 22A and 22C. Also, total values of the thicknesses TR of the modified lines 22B and 22D are each less than total values of the thicknesses TR of the modified lines 22A and 22C. Also, the total values of the surface areas of the modified lines 22B and 22D are each less than the total values of the surface areas of the modified lines 22A and 22C.

In the normal direction Z, thicknesses TR of the modified lines 22A to 22D are preferably not more than the thickness TL of the SiC semiconductor layer 2 (TR TL). The thicknesses TR of the modified lines 22A to 22D are more preferably less than the thickness TS of the SiC semiconductor substrate 6 (TR<TS).

The thicknesses TR of the modified lines 22A to 22D may be not less than the thickness TE of the SiC epitaxial layer 7 (TR≥TE). The thickness TR of the modified line 22A, the thickness TR of the modified line 22B, the thickness TR of the modified line 22C, and the thickness TR of the modified line 22D may be mutually equal or may be mutually different.

Ratios TR/TL of the thicknesses TR of the modified lines 22A to 22D with respect to the thickness TL of the SiC semiconductor layer 2 are preferably not less than 0.1 and less than 1.0. The ratios TR/TL may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TL may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TL are preferably not less than 0.2 and not more than 0.5.

More preferably, ratios TR/TS of the thicknesses TR of the modified lines 22A to 22D with respect to the thickness TS of the SiC semiconductor substrate 6 are not less than 0.1 and less than 1.0. The ratios TR/TS may be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios TR/TS may be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. The ratios TR/TS are preferably not less than 0.2 and not more than 0.5.

Referring to FIG. 5, the modified line 22A includes a plurality of a-plane modified portions 28 (modified portions). In other words, the modified line 22A is formed of an aggregate of the plurality of a-plane modified portions 28. The plurality of a-plane modified portions 28 are portions at which the SiC monocrystal exposed from the side surface 5A is modified to be of the property differing from the SiC monocrystal. At the side surface 5A, a region in a periphery of each a-plane modified portion 28 may be modified to be of a property differing from the SiC monocrystal.

The plurality of a-plane modified portions 28 each include one end portion 28a positioned at the first main surface 3 side, another end portion 28b positioned at the second main surface 4 side, and a connecting portion 28c connecting the one end portion 28a and the other end portion 28b.

The plurality of a-plane modified portions 28 are each formed in a linear shape extending in the normal direction Z. The plurality of a-plane modified portions 28 are thereby formed in a stripe shape as a whole. The plurality of a-plane modified portions 28 may include a plurality of a-plane modified portions 28 formed in a convergent shape in which an m-axis direction width narrows from the one end portion 28a side to the other end portion 28b side.

The plurality of a-plane modified portions 28 are formed at intervals in the m-axis direction such as to oppose each other in the m-axis direction. The plurality of a-plane modified portions 28 may be overlapped mutually in the m-axis direction. A band-shaped region extending in the m-axis direction is formed by a line joining the one end portions 28a of the plurality of a-plane modified portions 28 and a line joining the other end portions 28b of the plurality of a-plane modified portions 28. The modified line 22A is formed by this band-shaped region.

The plurality of a-plane modified portions 28 may each form a notched portion at which the side surface 5A is notched. The plurality of a-plane modified portions 28 may each form a recess recessed toward the a-axis direction from the side surface 5A. The plurality of a-plane modified portions 28 may be formed in point shapes (dot shapes) in accordance with length in the normal direction Z and the m-axis direction width.

A pitch PR in the m-axis direction between central portions of a plurality of mutually adjacent a-plane modified portions 28 may exceed 0 μm and be not more than 20 μm. The pitch PR may exceed 0 μm and be not more than 5 μm, be not less than 5 μm and not more than 10 μm, be not less than 10 μm and not more than 15 μm, or be not less than 15 μm and not more than 20 μm.

A width WR in the m-axis direction of each a-plane modified portion 28 may exceed 0 μm and be not more than 20 μm. The width WR may exceed 0 μm and be not more than 5 μm, be not less than 5 μm and not more than 10 μm, be not less than 10 μm and not more than 15 μm, or be not less than 15 μm and not more than 20 μm.

The modified line 22C has the same structure as the modified line 22A with the exception of the point of being formed at the side surface 5C. The description of the modified line 22A applies to the description of the modified line 22C upon replacement of "side surface 5A" by "side surface 5C."

Referring to FIG. 6, the modified line 22D includes a plurality of m-plane modified portions 29 (modified portions). In other words, the modified line 22D is formed of an aggregate of the plurality of m-plane modified portions 29. The plurality of m-plane modified portions 29 are portions at which the SiC monocrystal exposed from the side surface 5D is modified to be of the property differing from the SiC monocrystal. At the side surface 5D, a region in a periphery of each m-plane modified portion 29 may be modified to be of a property differing from the SiC monocrystal.

The plurality of m-plane modified portions 29 each include one end portion 29a positioned at the first main surface 3 side, another end portion 29b positioned at the second main surface 4 side, and a connecting portion 29c connecting the one end portion 29a and the other end portion 29b.

The plurality of m-plane modified portions 29 are each formed in a linear shape extending in the normal direction Z. The plurality of m-plane modified portions 29 are thereby formed in a stripe shape as a whole. The plurality of m-plane modified portions 29 may include a plurality of m-plane modified portions 29 formed in a convergent shape in which the a-axis direction width narrows from the one end portion 29a side to the other end portion 29b side.

The plurality of m-plane modified portions 29 are formed at intervals in the a-axis direction such as to oppose each other in the a-axis direction. The plurality of m-plane modified portions 29 may be overlapped mutually in the a-axis direction. A band-shaped region extending in the a-axis direction is formed by a line joining the one end portions 29a of the plurality of m-plane modified portions 29 and a line joining the other end portions 29b of the plurality of m-plane modified portions 29. The modified line 22D is formed by this band-shaped region.

The plurality of m-plane modified portions 29 may each form a notched portion at which the side surface 5D is notched. The plurality of m-plane modified portions 29 may each form a recess recessed toward the m-axis direction from the side surface 5D. The plurality of m-plane modified portions 29 may be formed in point shapes (dot shapes) in accordance with length in the normal direction Z and the a-axis direction width.

A pitch PR in the a-axis direction between central portions of a plurality of mutually adjacent m-plane modified portions 29 may be not less than 0 μm and not more than 20 μm. The pitch PR may be not less than 0 μm and not more than 5 μm, not less than 5 μm and not more than 10 μm, not less than 10 μm and not more than 15 μm, or not less than 15 μm and not more than 20 μm.

A width WR in the a-axis direction of each m-plane modified portion 29 may exceed 0 μm and be not more than 20 μm. The width WR may exceed 0 μm and be not more than 5 μm, be not less than 5 μm and not more than 10 μm, be not less than 10 μm and not more than 15 μm, or be not less than 15 μm and not more than 20 μm.

The modified line 22B has the same structure as the modified line 22D with the exception of the point of being formed at the side surface 5B. The description of the modified line 22D applies to the description of the modified line 22B upon replacement of "side surface 5D" by "side surface 5B."

Referring to FIG. 8, the SiC semiconductor device 1 includes an n type diode region 35 formed in a surface layer portion of the first main surface 3 in the active region 8. In this embodiment, the diode region 35 is formed in a central portion of the first main surface 3. The diode region 35 may be formed in a quadrilateral shape having four sides parallel to the side surfaces 5A to 5D in plan view.

In this embodiment, the diode region 35 is formed using a portion of the SiC epitaxial layer 7. An n type impurity concentration of the diode region 35 is equal to the n type impurity concentration of the SiC epitaxial layer 7. The n type impurity concentration of the diode region 35 may be not less than the n type impurity concentration of the SiC epitaxial layer 7. That is, the diode region 35 may be formed by introduction of an n type impurity into a surface layer portion of the SiC epitaxial layer 7.

The SiC semiconductor device 1 includes a $p^+$ type guard region 36 formed in a surface layer portion of the first main surface 3 in the outer region 9. The guard region 36 is formed in a band shape extending along the diode region 35 in plan view. More specifically, the guard region 36 is formed in an endless shape surrounding the diode region 35 in plan view. The guard region 36 is formed in a quadrilateral annular shape (more specifically, a quadrilateral annular shape with chamfered corner portions or a circular annular shape).

The guard region 36 is thereby formed as a guard ring region. In this embodiment, the diode region 35 is defined by the guard region 36. Also, the active region 8 is defined by the guard region 36.

A p type impurity of the guard region 36 does not have to be activated. In this case, the guard region 36 is formed as a non-semiconductor region. The p type impurity of the guard region 36 may be activated. In this case, the guard region 36 is formed as a p type semiconductor region.

The main surface insulating layer 10 described above includes a diode opening 37 that exposes the diode region 35. The diode opening 37 exposes an inner peripheral edge of the guard region 36 in addition to the diode region 35. The diode opening 37 may be formed in a quadrilateral shape having four sides parallel to the side surfaces 5A to 5D in plan view.

The first main surface electrode layer 12 described above enters into the diode opening 37 from on the main surface insulating layer 10. Inside the diode opening 37, the first main surface electrode layer 12 is electrically connected to the diode region 35. More specifically, the first main surface electrode layer 12 forms a Schottky junction with the diode region 35. The Schottky barrier diode D, having the first main surface electrode layer 12 as an anode and the diode region 35 as a cathode, is thereby formed. The passivation layer 13 and the resin layer 16 described above are formed on the main surface insulating layer 10.

FIG. 9 is a perspective view showing an SiC semiconductor wafer 41 used in manufacturing the SiC semiconductor device 1 shown in FIG. 3.

The SiC semiconductor wafer 41 is a member to be a base of the SiC semiconductor substrate 6. The SiC semiconductor wafer 41 includes a 4H-SiC monocrystal as an example of an SiC monocrystal constituted of a hexagonal crystal. In this embodiment, the SiC semiconductor wafer 41 has an n type impurity concentration corresponding to the n type impurity concentration of the SiC semiconductor substrate 6.

The SiC semiconductor wafer 41 is formed in a plate shape or discoid shape. The SiC semiconductor wafer 41 may be formed in a disk shape. The SiC semiconductor wafer 41 has a first wafer main surface 42 at one side, a second wafer main surface 43 at another side, and a wafer side surface 44 connecting the first wafer main surface 42 and the second wafer main surface 43.

A thickness TW of the SiC semiconductor wafer 41 exceeds the thickness TS of the SiC semiconductor substrate 6 (TS<TW). The thickness TW of the SiC semiconductor wafer 41 is adjusted by grinding to the thickness TS of the SiC semiconductor substrate 6.

The thickness TW may exceed 150 μm and be not more than 750 μm. The thickness TW may exceed 150 μm and be not more than 300 μm, be not less than 300 μm and not more than 450 μm, be not less than 450 μm and not more than 600 μm, or be not less than 600 μm and not more than 750 μm. In view of grinding time of the SiC semiconductor wafer 41, the thickness TW preferably exceeds 150 μm and is not more than 500 μm. The thickness TW is typically not less than 300 μm and not more than 450 μm.

In this embodiment, the first wafer main surface 42 and the second wafer main surface 43 face the c-planes of the SiC monocrystal. The first wafer main surface 42 faces the (0001) plane (silicon plane). The second wafer main surface 43 faces the (000-1) plane (carbon plane) of the SiC monocrystal.

The first wafer main surface 42 and the second wafer main surface 43 have an off angle θ inclined at an angle of not more than 10° in the [11-20] direction with respect to the c-planes of the SiC monocrystal. A normal direction Z to the first wafer main surface 42 is inclined by just the off angle θ with respect to the c-axis ([0001] direction) of the SiC monocrystal.

The off angle θ may be not less than 0° and not more than 5.0°. The off angle θ may be set in an angular range of not less than 0° and not more than 1.0°, not less than 1.0° and not more than 1.5°, not less than 1.5° and not more than 2.0°, not less than 2.00 and not more than 2.5°, not less than 2.5° and not more than 3.0°, not less than 3.0° and not more than 3.5°, not less than 3.5° and not more than 4.0°, not less than 4.0° and not more than 4.5°, or not less than 4.5° and not more than 5.0°. The off angle θ preferably exceeds 0°. The off angle θ may be less than 4.0°.

The off angle θ may be set in an angular range of not less than 3.0° and not more than 4.5°. In this case, the off angle θ is preferably set in an angular range of not less than 3.0° and not more than 3.5°, or not less than 3.5° and not more than 4.0°. The off angle θ may be set in an angular range of not less than 1.5° and not more than 3.0°. In this case, the off angle θ is preferably set in an angular range of not less than 1.5° and not more than 2.0°, or not less than 2.0° and not more than 2.5°.

The SiC semiconductor wafer 41 includes a first wafer corner portion 45 connecting the first wafer main surface 42 and the wafer side surface 44, and a second wafer corner portion 46, connecting the second wafer main surface 43 and the wafer side surface 44. The first wafer corner portion 45 has a first chamfered portion 47 that is inclined downwardly from the first wafer main surface 42 toward the wafer side surface 44. The second wafer corner portion 46 has a second chamfered portion 48 that is inclined downwardly from the second wafer main surface 43 toward the wafer side surface 44.

The first chamfered portion 47 may be formed in a convexly curved shape. The second chamfered portion 48 may be formed in a convexly curved shape. The first chamfered portion 47 and the second chamfered portion 48 suppress cracking of the SiC semiconductor wafer 41.

A orientation flat 49, as an example of a mark indicating a crystal orientation of the SiC monocrystal, is formed in the wafer side surface 44. The orientation flat 49 is a notched portion formed in the wafer side surface 44. In this embodiment, the orientation flat 49 extends rectilinearly along the a-axis direction ([11-20] direction) of the SiC monocrystal.

A plurality of (for example, two) orientation flats 49 indicating the crystal orientations may be formed in the wafer side surface 44. The plurality of (for example, two) orientation flats 49 may include a first orientation flat and a second orientation flat.

The first orientation flat may be a notched portion extending rectilinearly along the a-axis direction ([11-20] direction) of the SiC monocrystal. The second orientation flat may be a notched portion extending rectilinearly along the m-axis direction ([1-100] direction) of the SiC monocrystal.

A plurality of device forming regions 51, each corresponding to an SiC semiconductor device 1, are set in the first wafer main surface 42. The plurality of device forming regions 51 are set in a matrix array at intervals in the m-axis direction ([1-100] direction) and the a-axis direction ([11-20] direction).

Each device forming region 51 has four sides 52A, 52B, 52C, and 52D oriented along the crystal orientation of the SiC monocrystal. The four sides 52A to 52D respectively correspond to the four side surfaces 5A to 5D of the SiC semiconductor layer 2. That is, the four sides 52A to 52D include the two sides 52A and 52C oriented along the m-axis direction ([1-100] direction) and the two sides 52B and 52D oriented along the a-axis direction ([11-20] direction).

A cutting schedule line 53 of a Lattice-shaped extending along the m-axis direction ([1-100] direction) and the a-axis direction ([11-20] direction) such as to demarcate the plurality of device forming regions 51 respectively is set in the first wafer main surface 42. The cutting schedule line 53 include a plurality of first cutting schedule lines 54 and a plurality of second cutting schedule lines 55.

The plurality of first cutting schedule lines 54 respectively extend along the m-axis direction ([1-100] direction). The plurality of second cutting schedule lines 55 respectively extend along the a-axis direction ([11-20] direction). After predetermined structures are formed in the plurality of device forming regions 51, the plurality of SiC semiconductor devices 1 are cut out by cutting the SiC semiconductor wafer 41 along the cutting schedule line 53.

FIG. 10A to FIG. 10M are sectional views of an example of a method for manufacturing the SiC semiconductor device 1 shown in FIG. 3. In FIG. 10A to FIG. 10M, for convenience of description, just a region that includes three device forming regions 51 are shown and illustration of other regions is omitted.

Figure 10A:
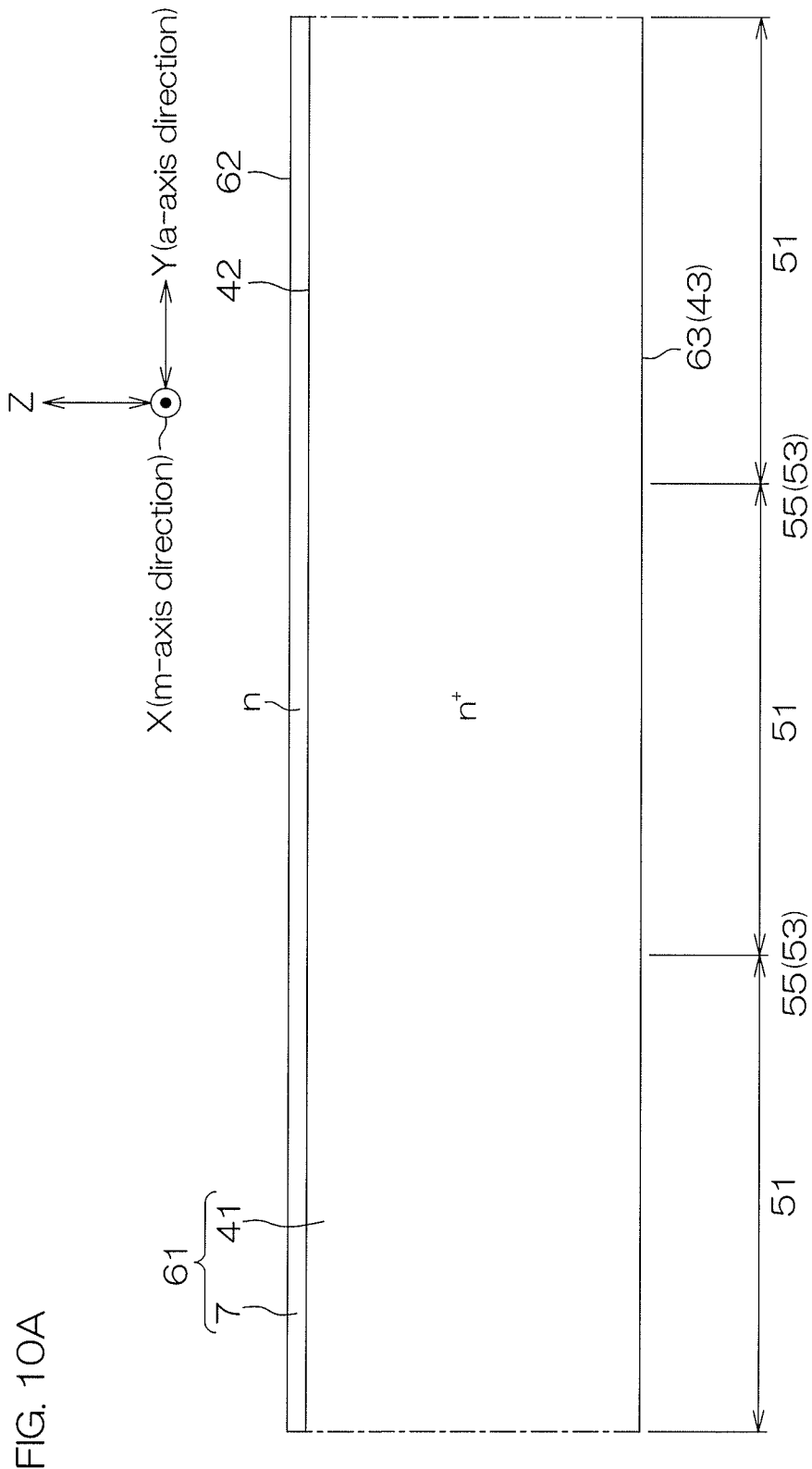
FIG. 10A is a sectional view of an example of a method for manufacturing the SiC semiconductor device shown in FIG. 3.

Referring to FIG. 10A, first, the SiC semiconductor wafer 41 is prepared (see also FIG. 9). Next, the SiC epitaxial layer 7 is formed on the first wafer main surface 42. In the step of forming the SiC epitaxial layer 7, SiC is epitaxially grown from the first wafer main surface 42. A thickness TE of the SiC epitaxial layer 7 may be not less than 1 μm and not more than 50 μm. An SiC semiconductor wafer structure 61 that includes the SiC semiconductor wafer 41 and the SiC epitaxial layer 7 is thereby formed.

The SiC semiconductor wafer structure 61 includes a first main surface 62 and a second main surface 63. The first main surface 62 and the second main surface 63 respectively correspond to the first main surface 3 and the second main surface 4 of the SiC semiconductor layer 2. A thickness TWS of the SiC semiconductor wafer structure 61 may exceed 150 μm and be not more than 800 μm. The thickness TWS preferably exceeds 150 μm and is not more than 550 μm.

Figure 10B:
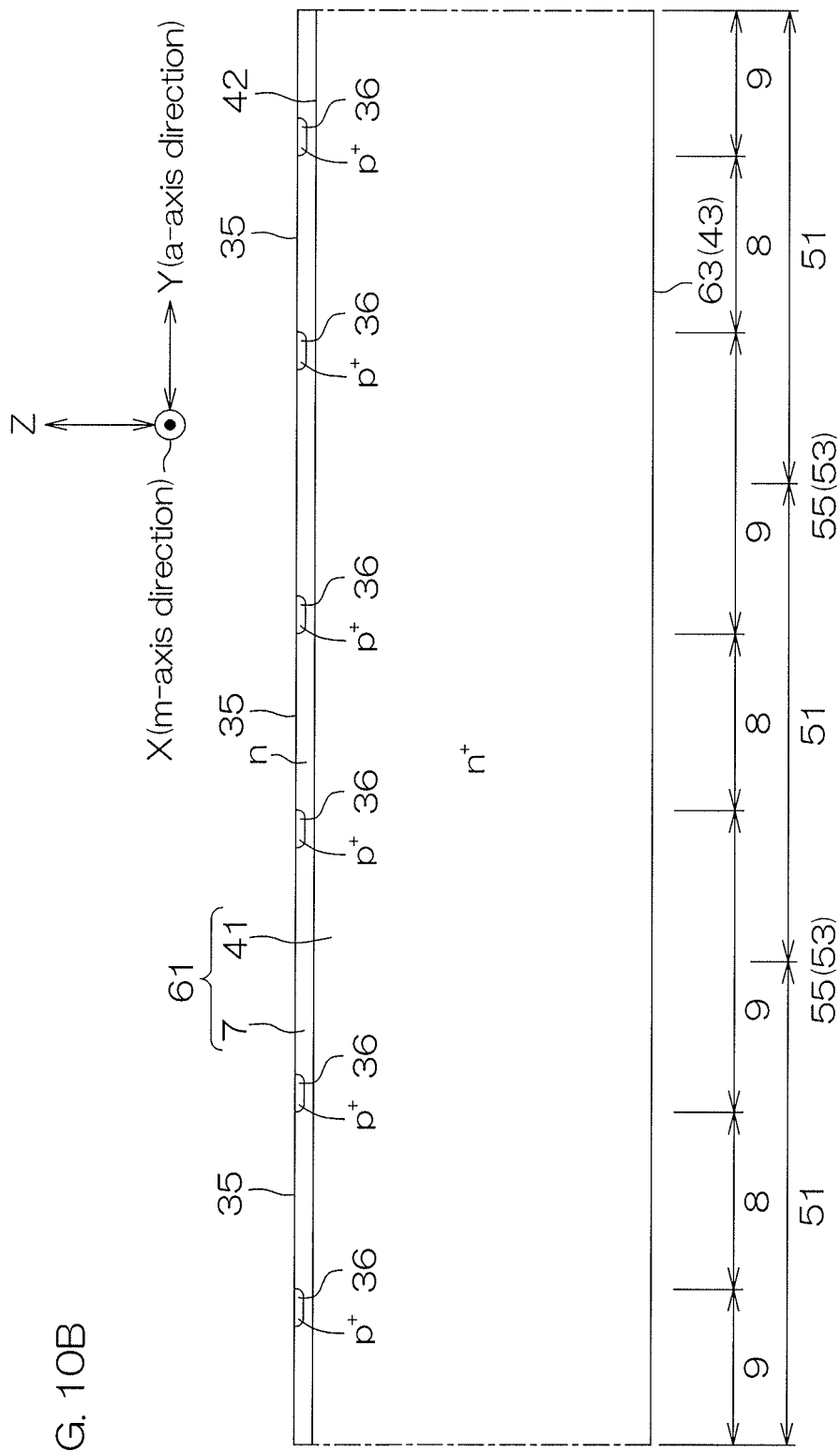
FIG. 10B is a diagram of a step subsequent to that of FIG. 10A.

Next, referring to FIG. 10B, the $p^+$ type guard regions 36 are formed in the first main surface 62. The step of forming the guard regions 36 includes a step of selectively introducing the p type impurity into surface layer portions of the first main surface 62 via an ion implantation mask (not shown). More specifically, the guard regions 36 are formed in surface layer portions of the SiC epitaxial layer 7.

The guard regions 36 demarcate the active regions 8 and the outer regions 9 in the SiC semiconductor wafer structure 61. The n type diode regions 35 are demarcated in regions (active regions 8) surrounded by the guard regions 36. The diode regions 35 may be formed by selectively introducing the n type impurity into surface layer portions of the first main surface 62 via an ion implantation mask (not shown).

Figure 10C:
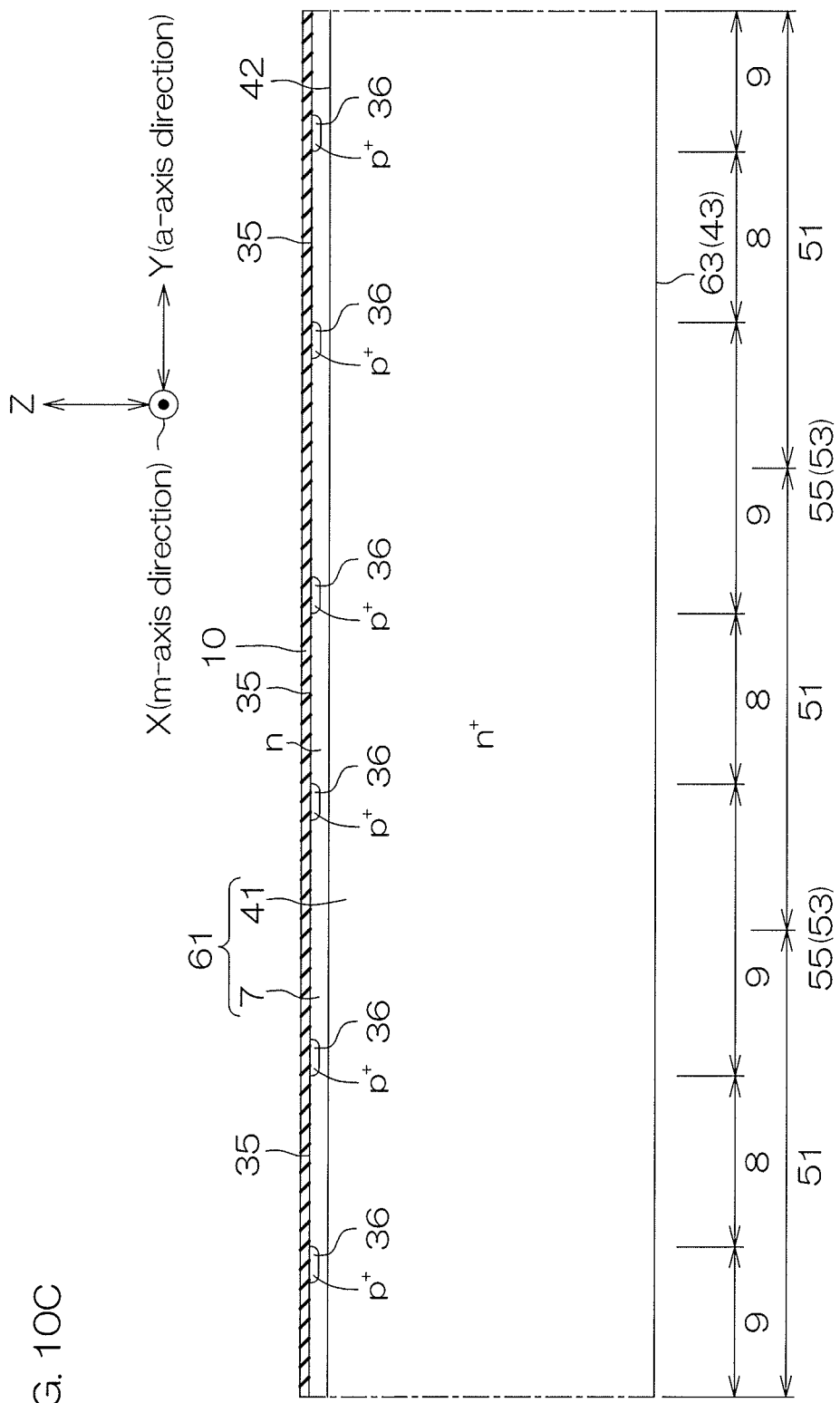
FIG. 10C is a diagram of a step subsequent to that of FIG. 10B.

Next, referring to FIG. 10C, the main surface insulating layer 10 is formed on the first main surface 62. The main surface insulating layer 10 includes silicon oxide ($SiO_2$). The main surface insulating layer 10 may be formed by a CVD (chemical vapor deposition) method or an oxidation treatment method (for example, a thermal oxidation treatment method).

Figure 10D:
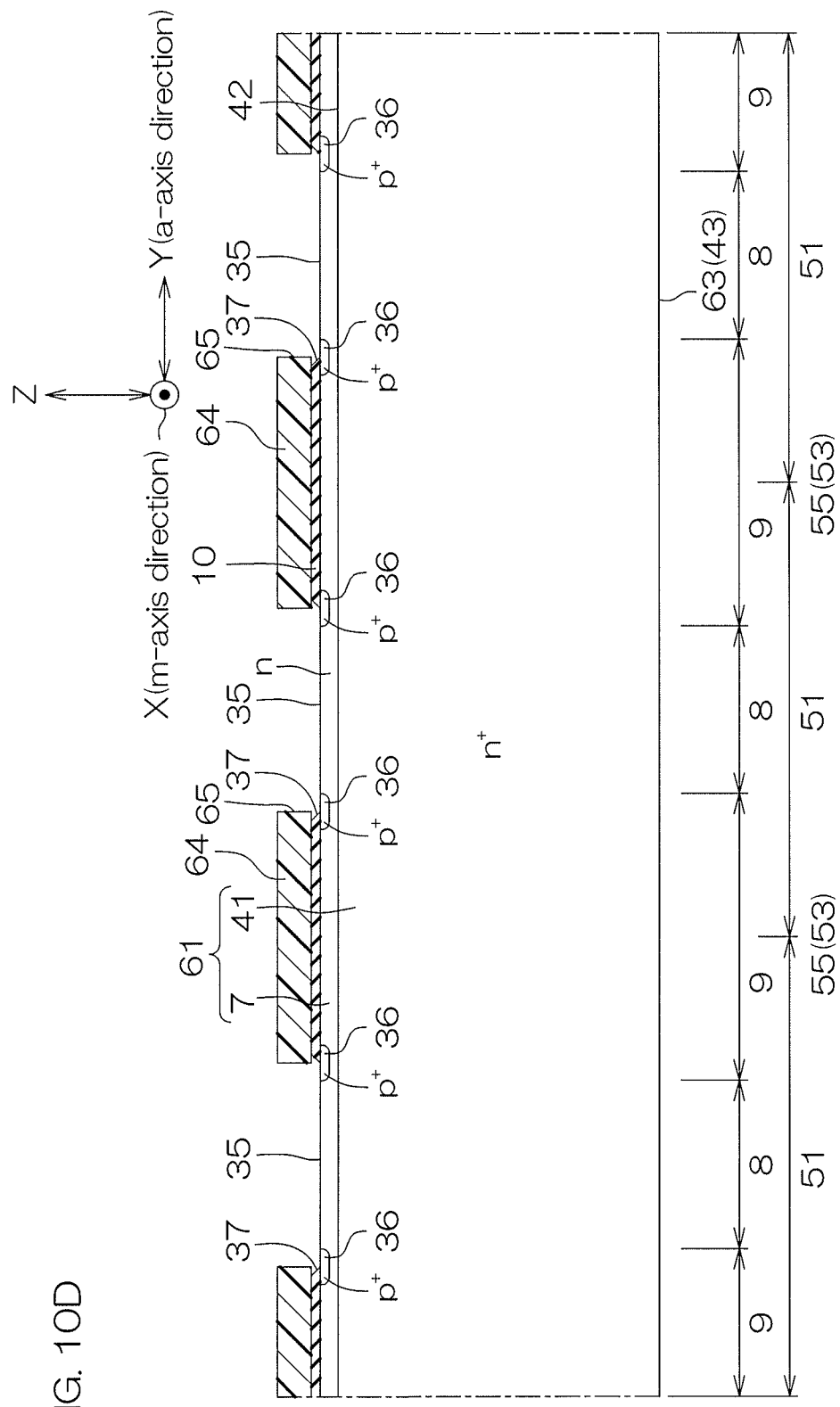
FIG. 10D is a diagram of a step subsequent to that of FIG. 10C.

Next, referring to FIG. 10D, a mask 64 having a predetermined pattern is formed on the main surface insulating layer 10. The mask 64 has a plurality of openings 65. The plurality of openings 65 respectively expose regions in the main surface insulating layer 10 in which the diode openings 37 are to be formed.

Next, unnecessary portions of the main surface insulating layer 10 are removed by an etching method via the mask 64. The diode openings 37 are thereby formed in the main surface insulating layer 10. After the diode openings 37 are formed, the mask 64 is removed.

Next, referring to FIG. 10E, a base electrode layer 66 to be a base of the first main surface electrode layers 12 is formed on the first main surface 62. The base electrode layer 66 is formed over an entire area of the first main surface 62 and covers the main surface insulating layer 10. The first main surface electrode layers 12 may be formed by a vapor deposition method, a sputtering method, or a plating method.

Figure 10F:
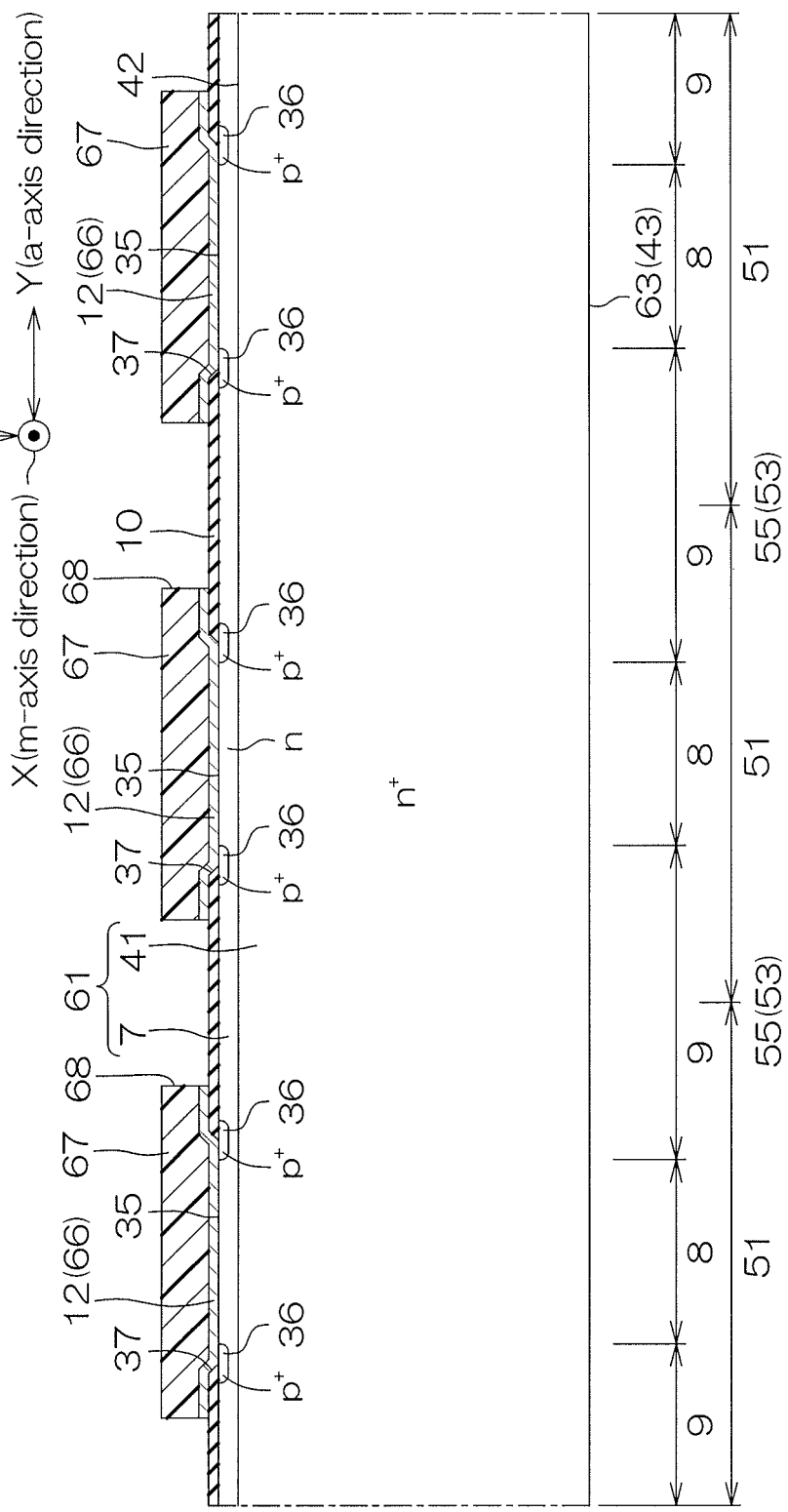
FIG. 10F is a diagram of a step subsequent to that of FIG. 10E.

Next, referring to FIG. 10F, a mask 67 having a predetermined pattern is formed on the base electrode layer 66. The mask 67 has openings 68 that expose regions of the base electrode layer 66 besides regions at which the first main surface electrode layers 12 are to be formed.

Next, unnecessary portions of the base electrode layer 66 are removed by an etching method via the mask 67. The base electrode layer 66 is thereby divided into the plurality of first main surface electrode layers 12. After the first main surface electrode layers 12 are formed, the mask 67 is removed.

Figure 10G:
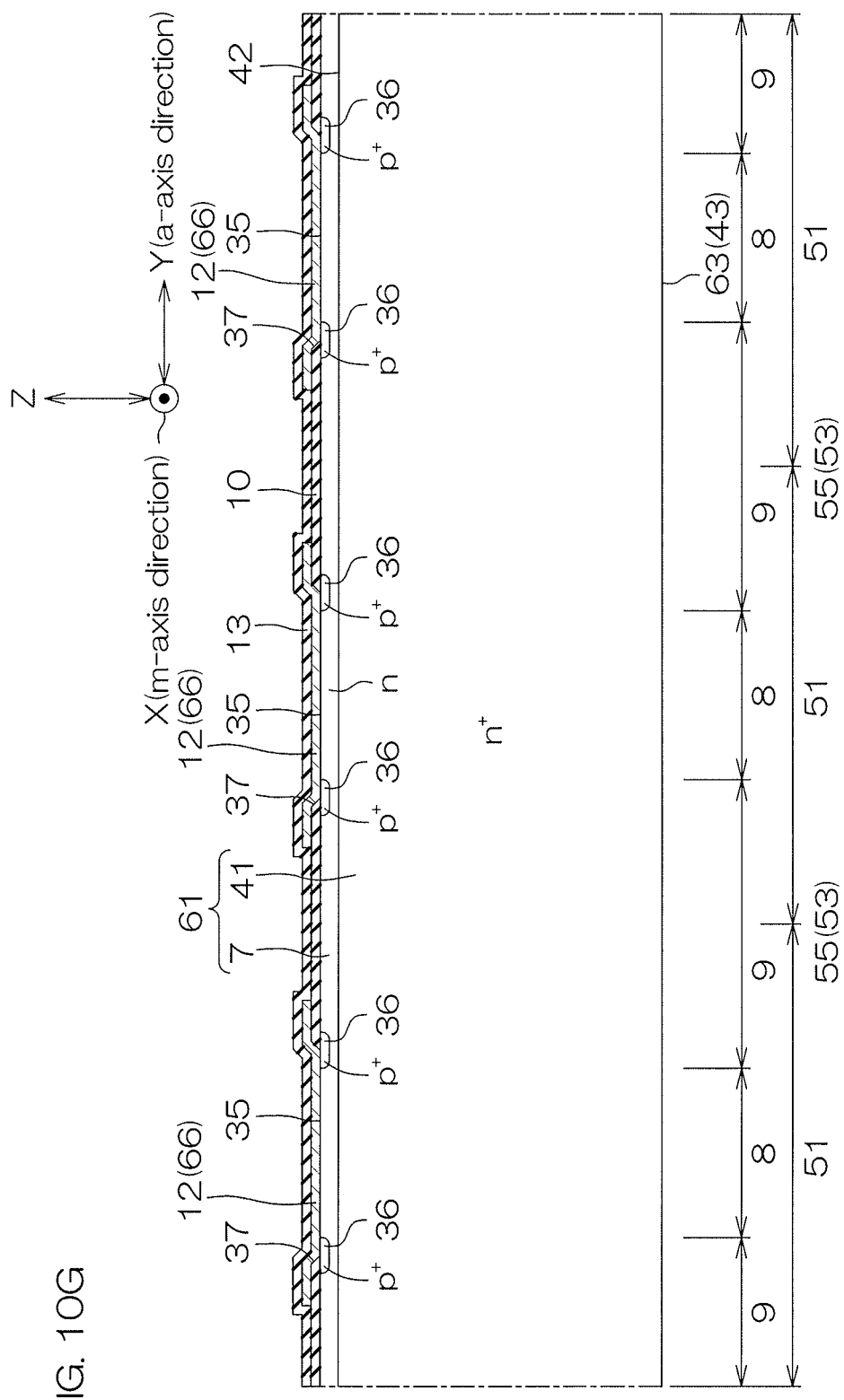
FIG. 10G is a diagram of a step subsequent to that of FIG. 10F.

Next, referring to FIG. 10G, the passivation layer 13 is formed on the first main surface 62. The passivation layer 13 includes silicon nitride (SiN). The passivation layer 13 may be formed by a CVD method.

Figure 10H:
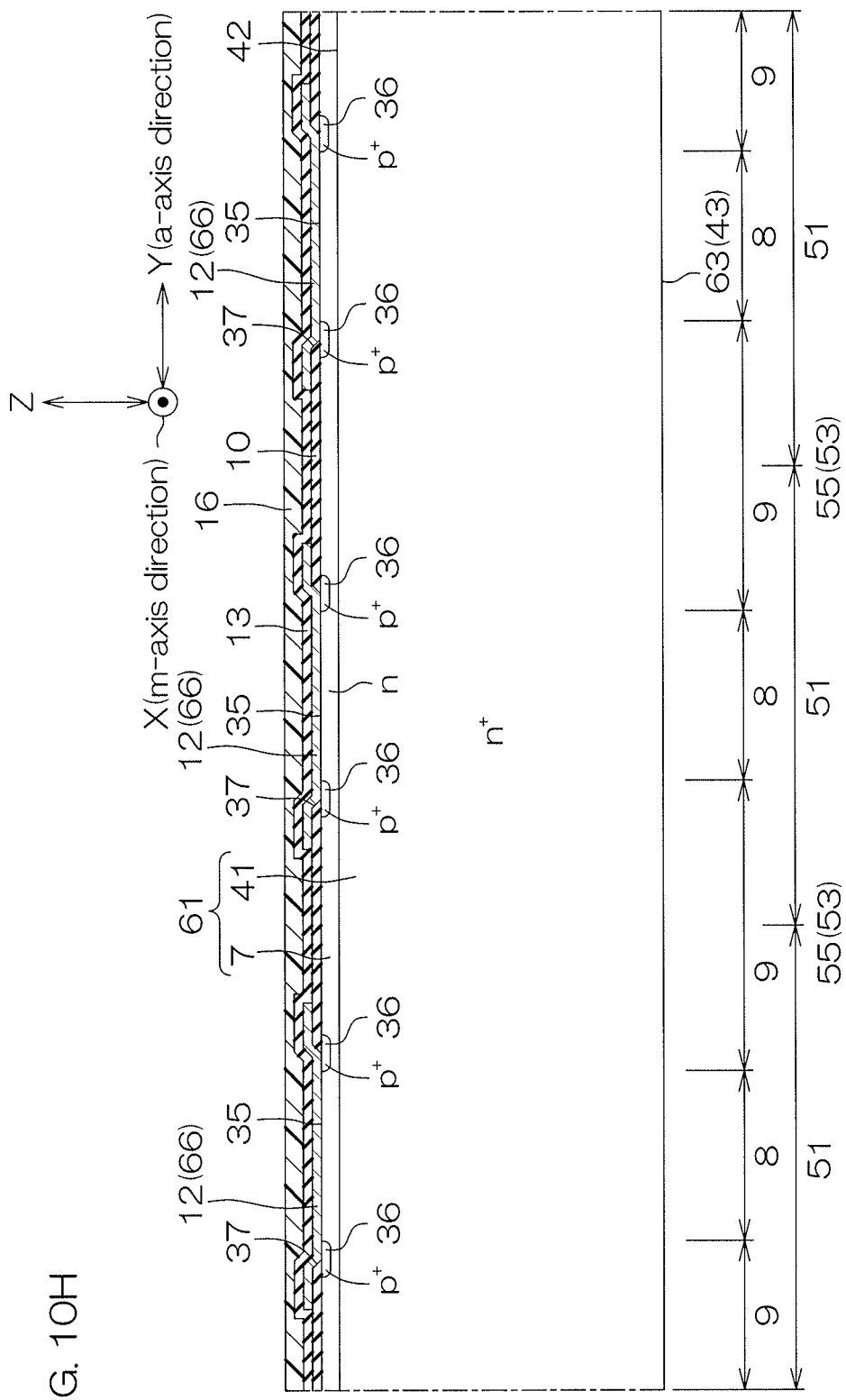
FIG. 10H is a diagram of a step subsequent to that of FIG. 10G.
Figure 10:
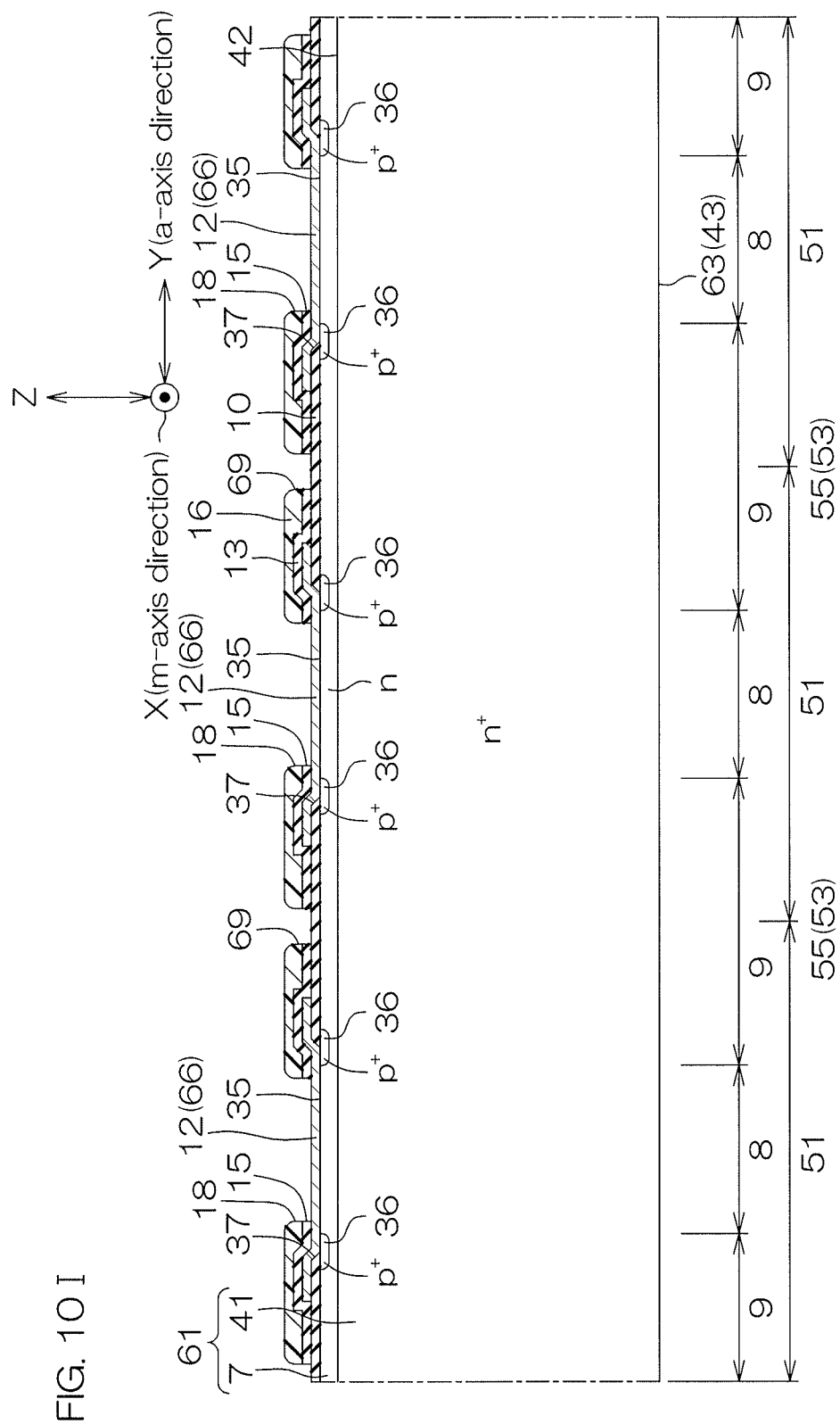
FIG. 10E is a diagram of a step subsequent to that of FIG. 10D.
FIG. 10I is a diagram of a step subsequent to that of FIG. 10H.
FIG. 10J is a diagram of a step subsequent to that of FIG. 10I.
FIG. 10K is a diagram of a step subsequent to that of FIG. 10J.
FIG. 10L is a diagram of a step subsequent to that of FIG. 10K.
FIG. 10M is a diagram of a step subsequent to that of FIG. 10L.

Next, referring to FIG. 10H, the resin layer 16 is coated onto the passivation layer 13. The resin layer 16 covers the active regions 8 and the outer regions 9 altogether. The resin layer 16 may include a polybenzoxazole as an example of a positive type photosensitive resin.

Next, referring to FIG. 10I, the resin layer 16 is exposed selectively and thereafter developed. The pad openings 18 are thereby formed in the resin layer 16. Also, dicing streets 69 oriented along the cutting schedule line 53 (the sides 52A to 52D of the respective device forming regions 51) are demarcated in the resin layer 16.

Next, unnecessary portions of the passivation layer 13 are removed. The unnecessary portions of the passivation layer 13 may be removed by an etching method via the resin layer 16. The sub pad openings 15 are thereby formed in the passivation layer 13. Also, the dicing streets 69 oriented along the cutting schedule line 53 are demarcated in the passivation layer 13.

With this embodiment, the step of removing the unnecessary portions of the passivation layer 13 using the resin layer 16 was described. However, the resin layer 16 and the pad openings 18 may be formed after forming the sub pad openings 15 in the passivation layer 13. In this case, before the step of forming the resin layer 16, the unnecessary portions of the passivation layer 13 are removed by an etching method via a mask to form the sub pad openings 15. According to this step, the passivation layer 13 can be formed in any shape.

Figure 10J:
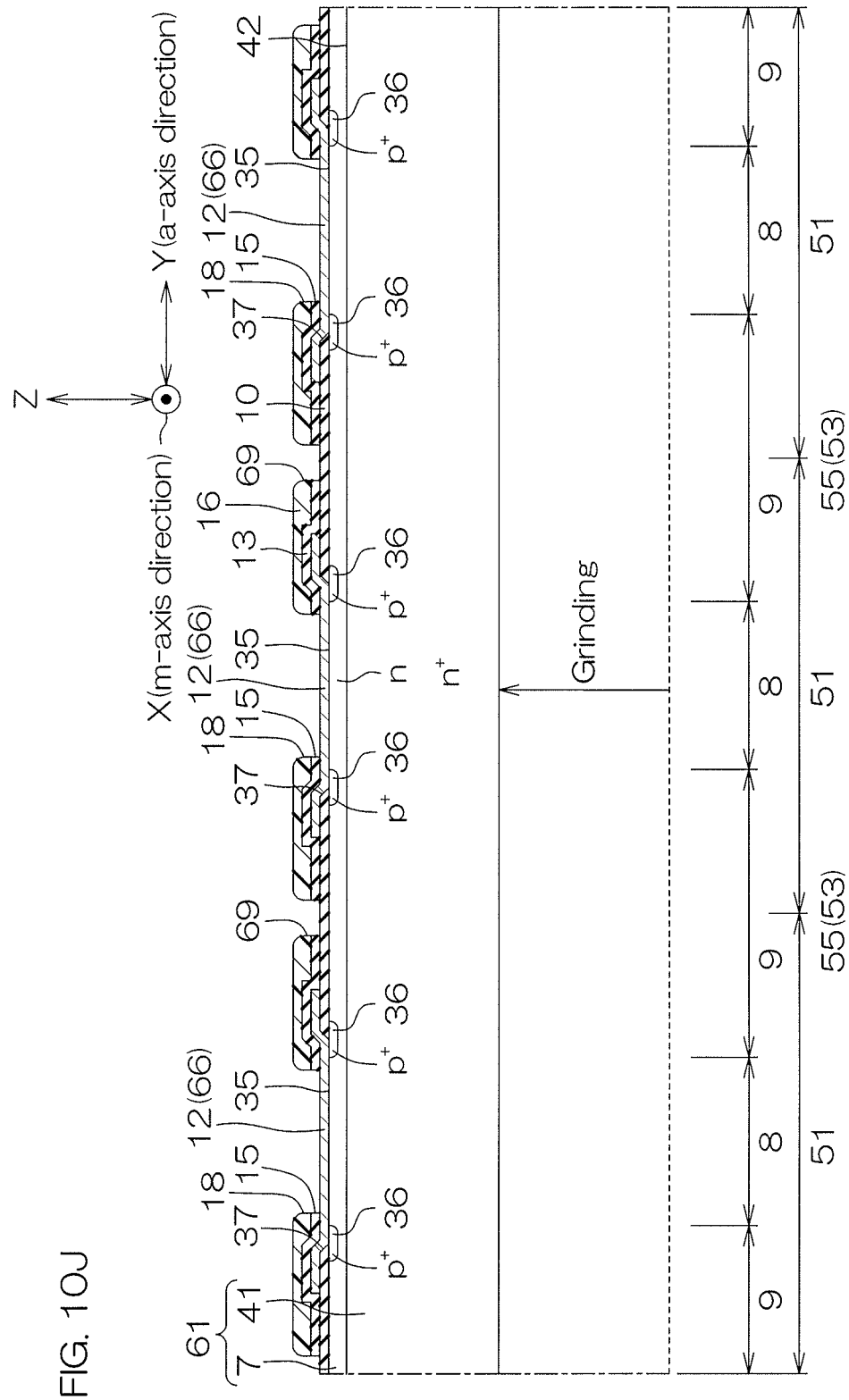

Next, referring to FIG. 10J, the second main surface 63 (second wafer main surface 43) is ground. The SiC semiconductor wafer structure 61 (SiC semiconductor wafer 41) is thereby thinned. Also, grinding marks are formed in the second main surface 63 (second wafer main surface 43). The SiC semiconductor wafer structure 61 is ground until it is of the thickness TWS corresponding to the thickness TL of the SiC semiconductor layer 2.

The SiC semiconductor wafer structure 61 may be ground to be of the thickness TWS of not less than 40 µm and not more than 200 µm. That is, the SiC semiconductor wafer 41 is ground until it is of the thickness TW corresponding to the thickness TS of the SiC semiconductor substrate 6. The SiC semiconductor wafer 41 may be ground to be of the thickness TW of not less than 40 µm and not more than 150 µm.

Figure 10K:
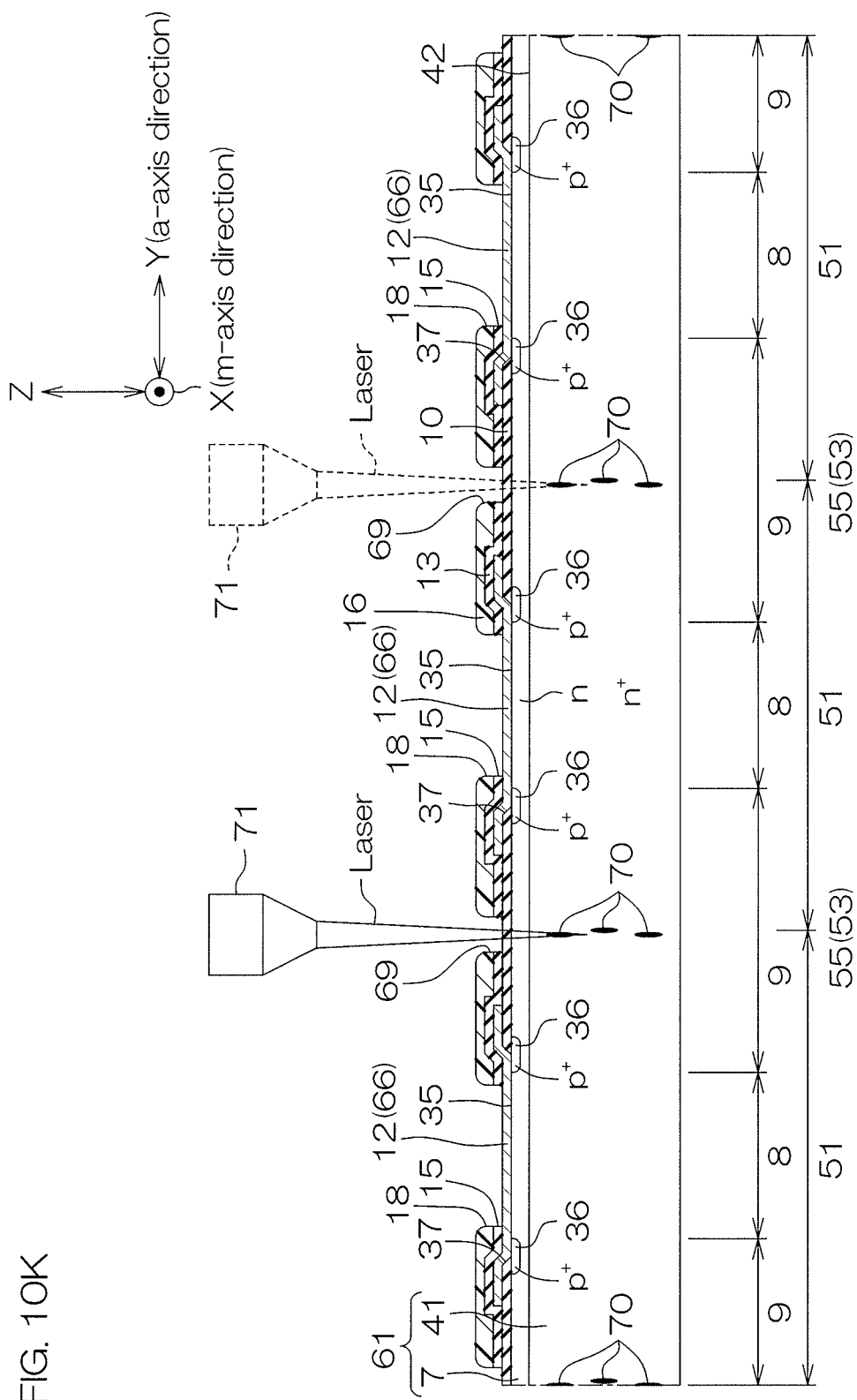

Next, referring to FIG. 10K, a plurality of modified lines 70 (modified layers) to be bases of the modified lines 22A to 22D are formed. In the step of forming the modified lines 70, pulsed laser light is irradiated toward the SiC semiconductor wafer structure 61 from a laser light irradiation apparatus 71.

The laser light is irradiated onto the SiC semiconductor wafer structure 61 from the first main surface 62 side and via the main surface insulating layer 10. The laser light may be irradiated directly onto the SiC semiconductor wafer structure 61 from the second main surface 63 side.

A light converging portion (focal point) of the laser light is set to thickness direction intermediate portions of the SiC semiconductor wafer structure 61. A laser light irradiation position with respect to the SiC semiconductor wafer structure 61 is moved along the cutting schedule line 53 (the four sides 52A to 52D of the respective device forming regions 51). More specifically, the laser light irradiation position with respect to the SiC semiconductor wafer structure 61 is moved along the first cutting schedule lines 54. Also, the laser light irradiation position with respect to the SiC semiconductor wafer structure 61 is moved along the second cutting schedule lines 55.

The plurality of modified lines 70 that extend along the cutting schedule line 53 (the four sides 52A to 52D of the respective device forming regions 51) and in which a crystal state of the SiC monocrystal is modified to be of the property differing from other regions are thereby formed in the thickness direction intermediate portions of the SiC semiconductor wafer structure 61.

One layer or a plurality each of the plurality of modified lines 70 is or are formed in a relationship of one-to-one correspondence with respect to the four sides 52A to 52D of each device forming region 51. In this embodiment, a plurality (three layers in this embodiment) of the modified lines 70 are formed at each first cutting schedule line 54, and one layer of the modified line 70 is formed at each second cutting schedule line 55.

The plurality of modified lines 70 at the first cutting schedule line 54 side correspond to the modified lines 22A (the modified lines 22C). The one layer of modified line 70 at the second cutting schedule line 55 side corresponds to the modified line 22B (the modified lines 22D).

In sectional view, the plurality of modified lines 70 at the first cutting schedule line 54 side are formed shifted along the normal direction Z and formed shifted alternately to the one side and the other side in the a-axis direction. The plurality of modified lines 70 at the first cutting schedule line 54 side include one layer or a plurality of the modified lines 70 that is or are formed shifted to an opposite side (the [11-20] direction side) with respect to the c-axis direction of the SiC monocrystal in the a-axis direction on a basis of the modified line 70 at the second main surface 63 side and/or the modified line 70 at the first main surface 62 side.

Each of the two modified lines 70 oriented along the sides 52A and 52C of the device forming region 51 includes the a-plane modified portion 28. Each of the two modified lines 70 oriented along the sides 52B and 52D of the device forming region 51 includes the m-plane modified portion 29.

The plurality of modified lines 70 are also laser processing marks formed in the thickness direction intermediate portions of the SiC semiconductor wafer structure 61. More specifically, the a-plane modified portions 28 and the m-plane modified portions 29 of the modified lines 70 are laser processing marks. The light converging portion (focal point), laser energy, pulse duty ratio, irradiation speed, etc., of the laser light are set to arbitrary values in accordance with positions, sizes, shapes, thicknesses, etc., of the modified lines 70 (modified lines 22A to 22D) to be formed.

Figure 10L:
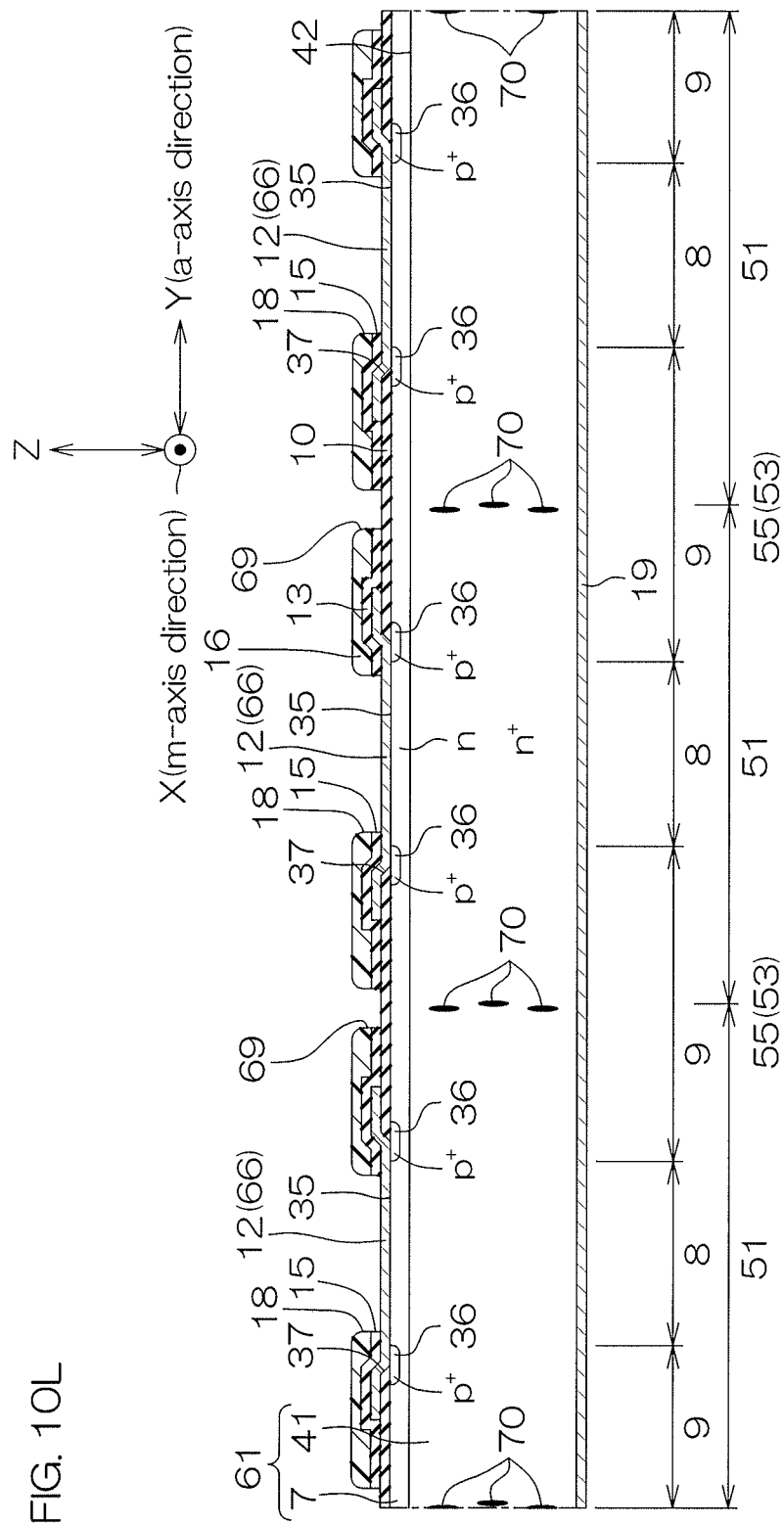

Next, referring to FIG. 10L, the second main surface electrode layer 19 is formed on the second main surface 63. The second main surface electrode layer 19 may be formed by a vapor deposition method, a sputtering method, or a plating method. An annealing treatment may be performed on the second main surface 63 (ground surface) before the step of forming the second main surface electrode layer 19. The annealing treatment may be performed by a laser annealing treatment method using laser light.

According to the laser annealing treatment method, the SiC monocrystal at a surface layer portion of the second main surface 63 is modified and an Si amorphous layer is formed. In this case, the SiC semiconductor device 1 having the Si amorphous layer at a surface layer portion of the second main surface 4 of the SiC semiconductor layer 2 is manufactured. At the second main surface 4, the grinding marks and the Si amorphous layer coexist. According to the laser annealing treatment method, an ohmic property of the second main surface electrode layer 19 with respect to the second main surface 4 can be improved.

Figure 10M:
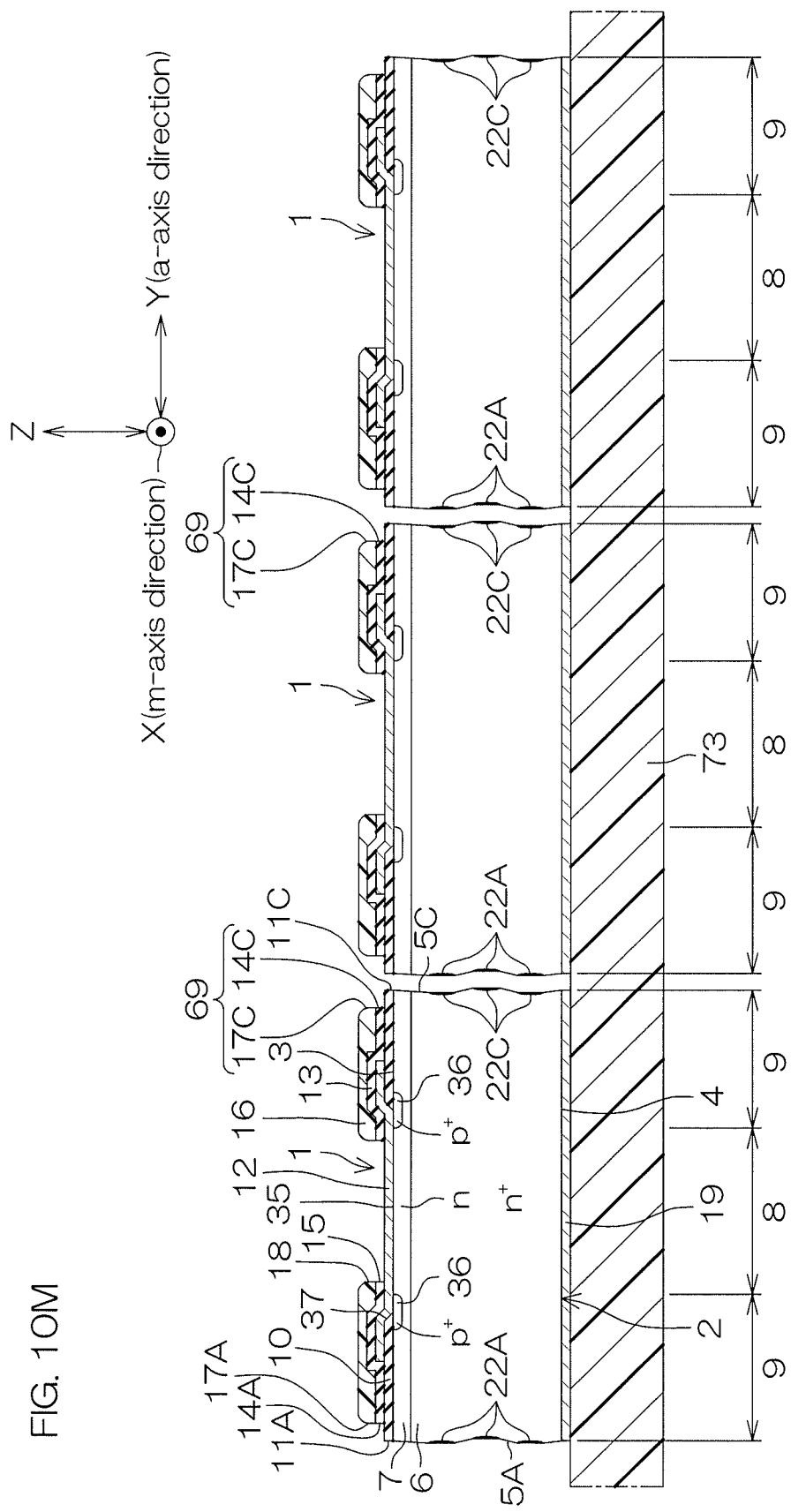

Next, referring to FIG. 10M, the plurality of SiC semiconductor devices 1 are cut out from the SiC semiconductor wafer structure 61. In this step, a tape-shaped supporting member 73 is adhered onto the second main surface 63 side. Next, an external force is applied to the cutting schedule line 53 via the supporting member 73 from the second main surface 63 side. The external force applied to the cutting schedule line 53 may be applied by a pressing member, such as a blade, etc.

The supporting member 73 may be adhered onto the first main surface 62 side. In this case, the external force may be applied to the cutting schedule line 53 via the supporting member 73 from the first main surface 62 side. The external force may be applied by a pressing member, such as a blade, etc.

An elastic supporting member 73 may be adhered to the first main surface 62 side or the second main surface 63 side. In this case, the SiC semiconductor wafer structure 61 may be cleaved by stretching the elastic supporting member 73 in the m-axis direction and the a-axis direction.

If the SiC semiconductor wafer structure 61 is to be cleaved using the supporting member 73, it is preferable to adhere the supporting member 73 onto the second main surface 63 side with few obstacles. The SiC semiconductor wafer structure 61 is thus cleaved along the cutting schedule line 53 with the modified lines 70 as starting points and the plurality of SiC semiconductor devices 1 are cut out from the single SiC semiconductor wafer structure 61 (SiC semiconductor wafer 41).

Portions of the modified lines 70 that are oriented along the sides 52A of the respective device forming regions 51 become the modified lines 22A. Portions of the modified lines 70 that are oriented along the sides 52B of the respective device forming regions 51 become the modified lines 22B. Portions of the modified lines 70 that are oriented along the sides 52C of the respective device forming regions 51 become the modified lines 22C. Portions of the modified lines 70 that are oriented along the sides 52D of the respective device forming regions 51 become the modified lines 22D. The SiC semiconductor devices 1 are manufactured through steps including the above.

In sectional view, the plurality of modified lines 70 at the first cutting schedule line 54 side are formed shifted alternately to the one side and the other side in the a-axis direction. A straight line connecting at least two modified lines 70 among the plurality of modified lines 70 at the first cutting schedule line 54 side is inclined toward the direction of the opposite side with respect to the c-axis of the SiC monocrystal from a normal to the first main surface 62.

The SiC semiconductor wafer structure 61 is cleaved along a straight line connecting two mutually adjacent modified lines 70 in addition to the c-axis direction of the SiC monocrystal at the first cutting schedule line 54. This can suppress formation of an inclined surface oriented along the c-axis direction of the SiC monocrystal at the side surfaces 5A and 5C of the SiC semiconductor layer 2 that is made into a chip.

In this embodiment, the step of grinding the SiC semiconductor wafer structure 61 (FIG. 10J) is performed before the step of forming the modified lines 70 (FIG. 10K). However, the step of grinding the SiC semiconductor wafer structure 61 (FIG. 10J) may be performed at any timing after the step of preparing the SiC semiconductor wafer 41 (FIG. 10A) and before the step of forming the second main surface electrode layer 19 (FIG. 10L).

For example, the step of grinding the SiC semiconductor wafer structure 61 (FIG. 10J) may be performed before the step of forming the SiC epitaxial layer 7 (FIG. 10A). Also, the step of grinding the SiC semiconductor wafer structure 61 (FIG. 10J) may be performed after the step of forming the modified lines 70 (FIG. 10K).

Also, the step of grinding the SiC semiconductor wafer structure 61 (FIG. 10J) may be performed over a plurality of times at any timing after the step of preparing the SiC semiconductor wafer 41 (FIG. 10A) and before the step of forming the modified lines 70 (FIG. 10K). Also, the step of grinding the SiC semiconductor wafer structure 61 (FIG. 10J) may be performed over a plurality of times at any timing after the step of preparing the SiC semiconductor wafer 41 (FIG. 10A) and before the step of forming the second main surface electrode layer 19 (FIG. 10L).

Figure 11:
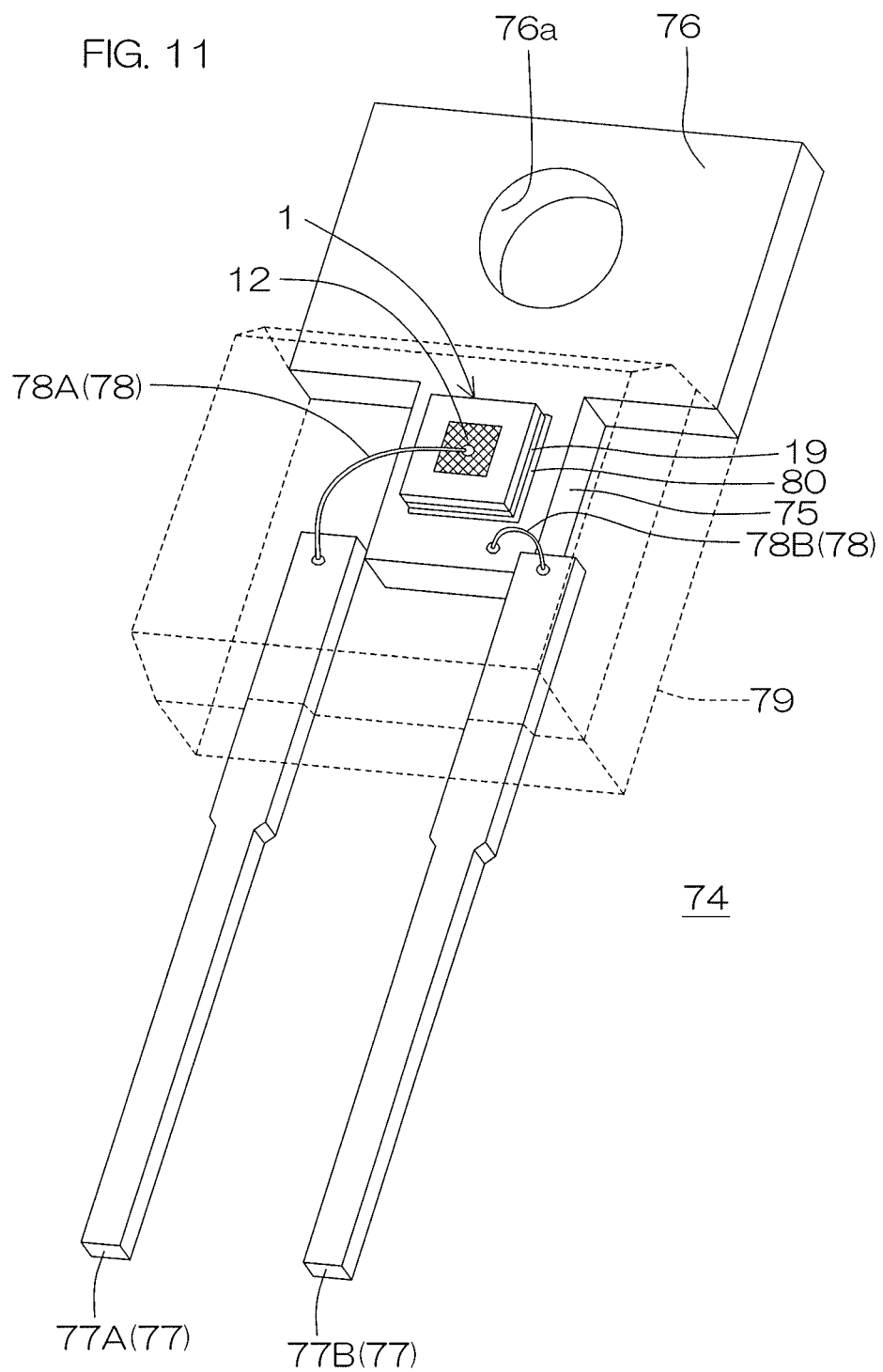
FIG. 11 is a perspective view, as seen through a sealing resin, of a semiconductor package incorporating the SiC semiconductor device shown in FIG. 3.

FIG. 11 is a perspective view, as seen through a sealing resin 79, of a semiconductor package 74 incorporating the SiC semiconductor device 1 shown in FIG. 3.

Referring to FIG. 11, the semiconductor package 74 in this embodiment is of a so-called TO-220 type. The semiconductor package 74 includes the SiC semiconductor device 1, a pad portion 75, a heat sink 76, a plurality of (in this embodiment, two) terminals 77, a plurality of (in this embodiment, two) conductive wires 78, and a sealing resin 79. The pad portion 75, the heat sink 76, and the plurality of terminals 77 form a lead frame as an example of a connection object.

The pad portion 75 includes a metal plate. The pad portion 75 may include iron, gold, silver, copper, aluminum, etc. The pad portion 75 is formed in a quadrilateral shape in plan view. The pad portion 75 has a plane area not less than a plane area of the SiC semiconductor device 1. The SiC semiconductor device 1 is arranged on the pad portion 75.

The second main surface electrode layer 19 of the SiC semiconductor device 1 is electrically connected to the pad portion 75 via a conductive bonding material 80. The conductive bonding material 80 is interposed in a region between the second main surface electrode layer 19 and the pad portion 75.

The conductive bonding material 80 may be a metal paste or a solder. The metal paste may be a conductive paste including Au (gold), Ag (silver), or Cu (copper). The conductive bonding material 80 is preferably constituted of the solder. The solder may be a lead-free type solder. The solder may include at least one type of material among SnAgCu, SnZnBi, SnCu, SnCuNi, and SnSbNi.

The heat sink 76 is connected to one side of the pad portion 75. In this embodiment, the pad portion 75 and the heat sink 76 are formed of a single metal plate. A penetrating hole 76a is formed in the heat sink 76. The penetrating hole 76a is formed in a circular shape.

The plurality of terminals 77 are aligned along a side opposite the heat sink 76 with respect to the pad portion 75. The plurality of terminals 77 includes a metal plate respectively. The terminals 77 may include iron, gold, silver, copper, aluminum, etc.

The plurality of terminals 77 include a first terminal 77A and a second terminal 77B. The first terminal 77A and the second terminal 77B are aligned at an interval along a side of the pad portion 75 opposite the heat sink 76. The first terminal 77A and the second terminal 77B extend in band shapes along a direction orthogonal to a direction of alignment thereof.

The plurality of conductive wires 78 may be bonding wires, etc. The plurality of conductive wires 78 include a conductive wire 78A and a conductive wire 78B. The conductive wire 78A is electrically connected to the first terminal 77A and the first main surface electrode layer 12 of the SiC semiconductor device 1. The first terminal 77A is thereby electrically connected to the first main surface electrode layer 12 of the SiC semiconductor device 1 via the conductive wire 78A.

The conductive wire 78B is electrically connected to the second terminal 77B and the pad portion 75. The second terminal 77B is thereby electrically connected to the second main surface electrode layer 19 of the SiC semiconductor device 1 via the conductive wire 78B. The second terminal 77B may be formed integral to the pad portion 75.

The sealing resin 79 seals the SiC semiconductor device 1, the pad portion 75, and the plurality of conductive wires 78 such as to expose the heat sink 76 and portions of the plurality of terminals 77. The sealing resin 79 is formed in a rectangular parallelepiped shape.

The configuration of the semiconductor package 74 is not restricted to TO-220. A SOP (small outline package), a QFN (quad for non-lead package), a DFP (dual flat package), a DIP (dual inline package), a QFP (quad flat package), a SIP (single inline package), a SOJ (small outline J-leaded package), or any of various similar configurations may be applied as the semiconductor package 74.

Figure 12:
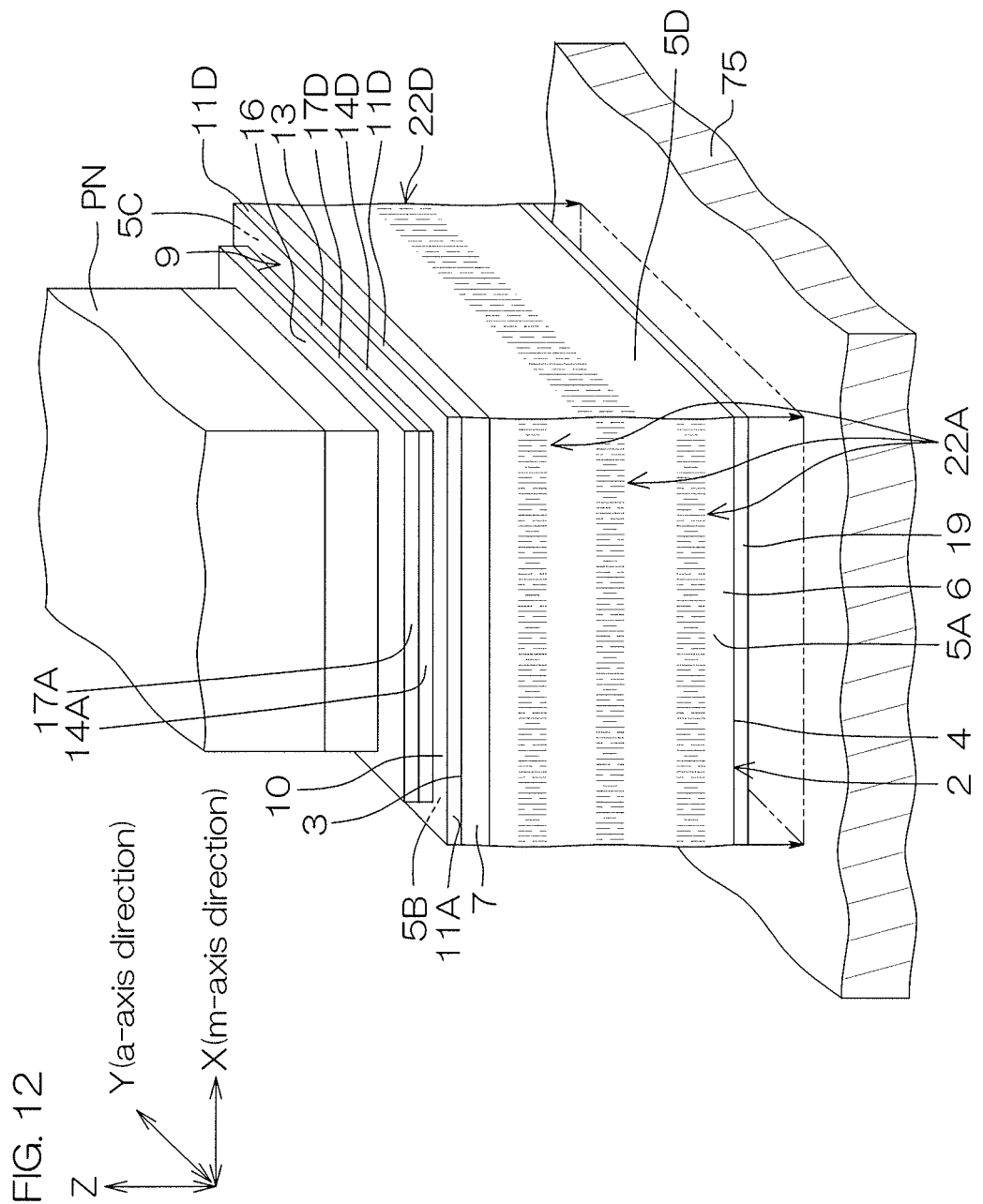
FIG. 12 is a perspective view showing a transfer state of the SiC semiconductor device shown in FIG. 3.

FIG. 12 is a perspective view showing a transfer state of the SiC semiconductor device 1 shown in FIG. 3.

The SiC semiconductor device 1 is mounted on the pad portion 75 of the semiconductor package 74 using a semiconductor assembly apparatus. A step of transferring the SiC semiconductor device 1 in the semiconductor assembly apparatus is performed by a pickup nozzle PN that suctions and holds the first main surface 3 of the SiC semiconductor layer 2.

Figure 13:
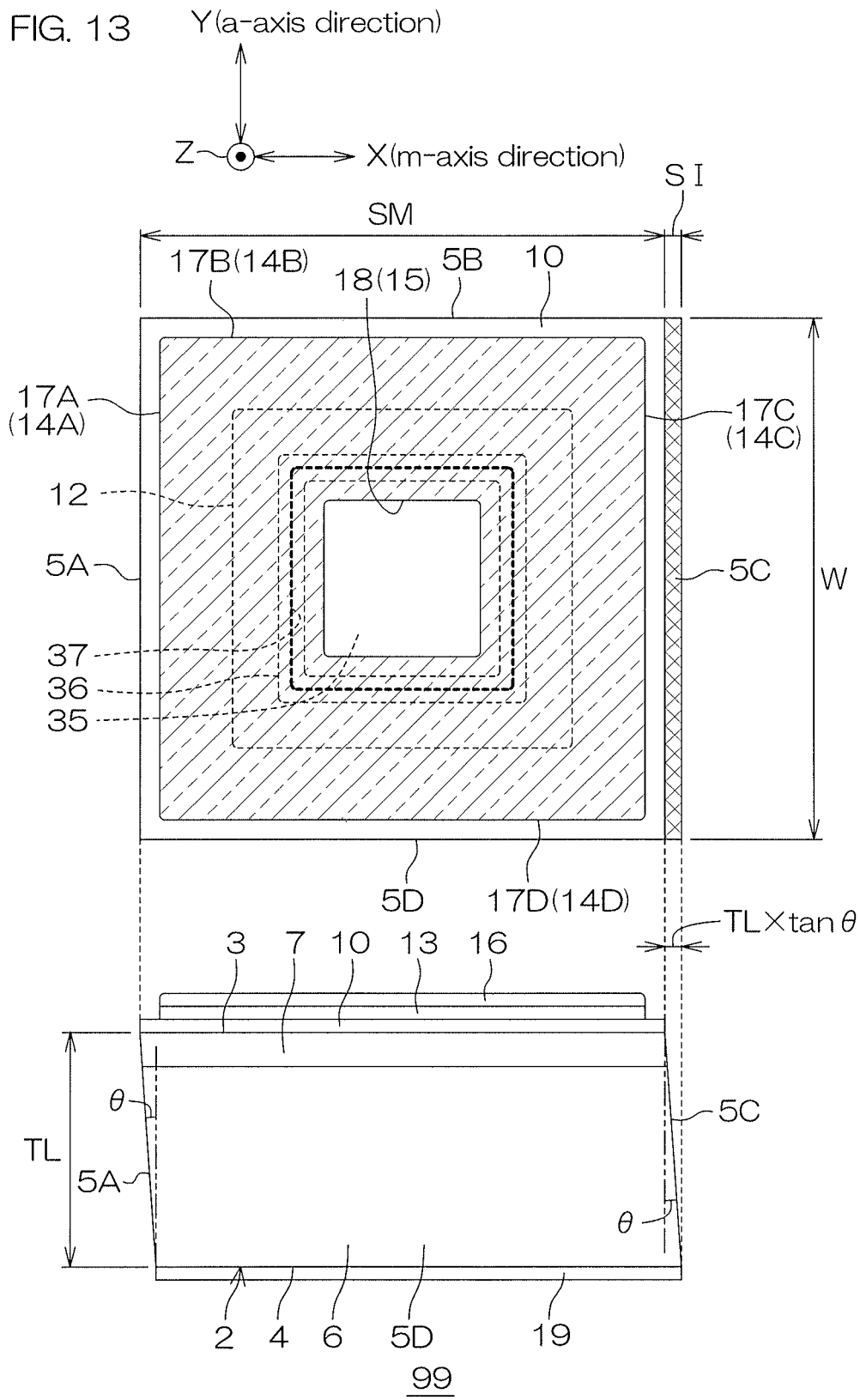
FIG. 13 is a diagram for describing a structure of an SiC semiconductor device according to a reference example.

FIG. 13 is a diagram for describing the structure of an SiC semiconductor device 99 according to a reference example.

With the exception of the side surfaces 5A and 5C of the SiC semiconductor layer 2 having inclined surfaces oriented along the c-axis, the SiC semiconductor device 99 has the same structure as the SiC semiconductor device 1. Structures in FIG. 13 corresponding to structures described with the SiC semiconductor device 1 shall be provided with the same reference symbols and description thereof shall be omitted.

The side surfaces 5A and 5C facing the a-planes of the SiC monocrystal have a physical property of cleaving with the c-axis of the SiC monocrystal as a cleavage direction. Therefore, when the plurality of modified lines 70 (the modified lines 22A and 22C) are formed along the c-axis of the SiC monocrystal or the normal direction Z of the first main surface 3, the side surfaces 5A and 5C become inclined surfaces oriented along the c-axis of the SiC monocrystal.

In this case, an apparent plane area S of the SiC semiconductor layer 2 is increased by just a plane area corresponding to the inclined surfaces. More specifically, the apparent plane area S of the SiC semiconductor layer 2 is expressed by the following formula (1) and formula (2).

$$S = SM + SI \quad (1)$$

$$SI = W \times TL \times \tan\theta \quad (2)$$

In the formulae (1) and (2) above, "SM" is a plane area of the first main surface 3, "SI" is a plane area increased by the inclined surfaces, "W" is the length of the side surfaces 5A and 5C, and "θ" is the off angle.

There is a problem in that when the SiC semiconductor device 99 according to the reference example is carried into the semiconductor assembly apparatus, suction by the pickup nozzle PN may be obstructed by the side surfaces 5A and 5C (the inclined surfaces) of the SiC semiconductor layer 2. In this case, the pickup nozzle PN cannot hold the SiC semiconductor device 99 appropriately and therefore a pickup error occurs in the semiconductor assembly apparatus.

On the other hand, with the SiC semiconductor device 1, at the SiC semiconductor layer 2, the side surfaces 5A and 5C facing the a-planes of the SiC monocrystal have an angle θa, less than the off angle θ, with respect to the normal to the first main surface 3 when the normal is 0°. More specifically, the angle θa is not less than 0° and less than the off angle θ (0°≤θa<θ). The "SI" in the formula (1) above can thereby be reduced and the SiC semiconductor device 1 that enables pickup error to be suppressed in the semiconductor assembly apparatus can thus be provided.

Also, with the SiC semiconductor device 1, one or a plurality (one in this embodiment) of the inclined portions inclined in the direction of the opposite side with respect to the c-axis of the SiC monocrystal from the normal to the first main surface 3 is or are introduced into each of the side surfaces 5A and 5C. The forming regions of the inclined surfaces extending along the c-axis are thereby reduced and the "SI" in the formula (1) above can thus be reduced. Consequently, the SiC semiconductor device 1 that enables pickup error to be suppressed in the semiconductor assembly apparatus can be provided.

Also, with the SiC semiconductor device 1, the plurality of modified lines 22A and 22C formed in the side surface 5A and 5C are shifted from each other in the a-axis direction of the SiC monocrystal in sectional view. More specifically, the plurality of modified lines 22A and 22C are formed shifted from each other in the normal direction Z in sectional view and are formed shifted alternately to the one side and the other side in the a-axis direction.

The distance DR in the a-axis direction of two mutually adjacent modified lines 22A and 22C is of a value less than TL×tan θ using the off angle θ and the thickness TL of the SiC semiconductor layer 2 (0<DR<TL×tan θ). Also, the farthest distance DD of the modified lines 22A is of a value less than TL×tan θ (0<DD<TL×tan θ). An inclination width (TL×tan θ) of the side surfaces 5A and 5C can thereby be reduced appropriately. The "SI" in the formula (1) above can thus be reduced appropriately.

Also, with the SiC semiconductor device 1, the side surfaces 5A and 5C having the angle θa can be realized with six or less layers each of the modified lines 22A and 22C. Time reduction of the step of forming the modified lines 70 to be bases of the modified lines 22A and 22C can thereby be achieved.

In a plan view of viewing the c-plane (silicon plane) from the c-axis, the SiC monocrystal has a physical property of cracking easily along the nearest atom directions (see also FIG. 1 and FIG. 2) and not cracking easily along directions intersecting the nearest atom directions. The nearest atom directions are the a-axis direction and directions equivalent thereto. The crystal planes oriented along the nearest atom directions are the m-planes and planes equivalent thereto. The directions intersecting the nearest atom directions are the m-axis direction and directions equivalent thereto. The crystal planes oriented along the directions intersecting the nearest atom directions are the a-planes and planes equivalent thereto.

Therefore, even if, in the step of forming the modified lines 70, the modified lines 70 having comparatively large occupying ratios are not formed at the crystal planes oriented along the nearest atom directions of the SiC monocrystal, the SiC monocrystal can be cut (cleaved) appropriately because these crystal planes have the property of cracking comparatively easily (see also FIG. 10L). That is, in the step of forming the modified lines 70, the occupying ratios (the number of layers) of the modified lines 70 oriented along the second cutting schedule lines 55 extending in the a-axis direction can be made smaller than the occupying ratios (the number of layers) of the modified lines 70 oriented along the first cutting schedule lines 54 extending in the m-axis direction.

On the other hand, the modified lines 70 having the comparatively large occupying ratios (comparatively large number of layers) are formed at the crystal planes oriented along the directions intersecting the nearest atom directions of the SiC monocrystal. Inappropriate cutting (cleaving) of the SiC semiconductor wafer structure 61 can thereby be suppressed and generation of cracks due to the physical property of the SiC monocrystal can thus be suppressed appropriately.

Thus, with the SiC semiconductor device 1, the physical property of the SiC monocrystal can be used to adjust the occupying ratios and the number of layers of the modified lines 22A to 22D with respect to the side surfaces 5A to 5D. Forming regions of the modified lines 22A to 22D with respect to the side surfaces 5A to 5D can thereby be reduced appropriately. Influences on the SiC semiconductor layer 2 due to the modified lines 22A to 22D can thus also be reduced. Time reduction of the step of forming the modified lines 70 can also be achieved.

As examples of the influences on the SiC semiconductor layer 2 due to the modified lines, fluctuation of electrical characteristics of the SiC semiconductor layer 2 due to the modified lines, generation of cracks in the SiC semiconductor layer 2 with the modified lines as starting points, etc., can be cited. Fluctuation of leak current characteristics can be cited as an example of the fluctuation of electrical characteristics of the SiC semiconductor layer 2 due to the modified lines.

An SiC semiconductor device may be sealed by the sealing resin 79 as was shown in FIG. 11. In this case, it can be considered that mobile ions in the sealing resin 79 will enter into the SiC semiconductor layer 2 via a modified line. With a structure where the plurality of modified lines are formed at intervals along the normal direction Z over entire areas of the respective side surfaces 5A to 5D, there is increased risk of current path formation due to such an external structure.

Also, with the structure where the plurality of modified lines are formed along the normal direction Z over the entire areas of the respective side surfaces 5A to 5D, there is also increased risk of generation of cracks in the SiC semiconductor layer 2. Therefore, by restricting the forming regions of the modified lines 22A to 22D as in the SiC semiconductor device 1, fluctuation of the electrical characteristics of the SiC semiconductor layer 2 and generation of cracks can be suppressed.

Also, with the SiC semiconductor device 1, the step of thinning the SiC semiconductor wafer structure 61 (the SiC semiconductor wafer 41) is performed and therefore the SiC semiconductor wafer structure 61 can be cleaved appropriately by a small number of layers (for example, six layers or less, preferably three layers or less) of the modified lines 70 (the modified lines 22A to 22D).

In other words, by the thinned SiC semiconductor wafer structure 61 (SiC semiconductor wafer 41), the SiC semiconductor wafer structure 61 (SiC semiconductor wafer 41) can be cleaved appropriately without forming the modified lines 70 (modified lines 22A to 22D) at intervals in the normal direction Z over an entire area in the thickness direction of the SiC semiconductor wafer structure 61.

In this case, the second main surface 4 is constituted of the ground surface. The SiC semiconductor device 1 preferably includes the SiC semiconductor layer 2 having the thickness TL that is not less than 40 μm and not more than 200 μm. The SiC semiconductor layer 2 having such thickness TL can be cut out appropriately from the SiC semiconductor wafer structure 61 (SiC semiconductor wafer 41).

In the SiC semiconductor layer 2, the thickness TS of the SiC semiconductor substrate 6 may be not less than 40 μm and not more than 150 μm. The thickness TE of the SiC epitaxial layer 7 in the SiC semiconductor layer 2 may be not less than 1 μm and not more than 50 μm. The thinning of the SiC semiconductor layer 2 is also effective in terms of reducing resistance value.

Also, with the SiC semiconductor device 1, the modified lines 22A to 22D are formed at intervals toward the second main surface 4 side from the first main surface 3. Stress concentrates readily at corner portions connecting the first main surface 3 and the side surfaces 5A to 5D. Therefore, by forming the modified lines 22A to 22D at intervals from the corner portions connecting the first main surface 3 and the side surfaces 5A to 5D, generation of cracks at the corner portions of the SiC semiconductor layer 2 can be suppressed appropriately.

In particular, with the SiC semiconductor device 1, the modified lines 22A to 22D are formed in the SiC semiconductor substrate 6 while avoiding the SiC epitaxial layer 7. That is, the modified lines 22A to 22D expose the SiC epitaxial layer 7 in which a main portion of the functional device (the Schottky barrier diode D in this embodiment) is formed. Thereby, influences on the functional device due to the modified lines 22A to 22D can also be reduced appropriately.

Also, with the SiC semiconductor device 1, the modified lines 22A to 22D are formed at intervals toward the first main surface 3 side from the second main surface 4. Stress concentrates readily at corner portions connecting the second main surface 4 and the side surfaces 5A to 5D. Therefore, by forming the modified lines 22A to 22D at intervals from the corner portions connecting the second main surface 4 and the side surfaces 5A to 5D, generation of cracks at the corner portions of the SiC semiconductor layer 2 can be suppressed appropriately.

Also, with the SiC semiconductor device 1, the main surface insulating layer 10 and the first main surface electrode layer 12 formed on the first main surface 3 are included. The main surface insulating layer 10 has the insulating side surfaces 11A to 11D that are continuous to the side surfaces 5A to 5D of the SiC semiconductor layer 2. The main surface insulating layer 10 improves an insulating property between the side surfaces 5A to 5D and the first main surface electrode layer 12 in the structure in which the modified lines 22A to 22D are formed. Stability of the electrical characteristics of the SiC semiconductor layer 2 can thereby be improved in the structure in which the modified lines 22A to 22D are formed in the side surfaces 5A to 5D.

Figure 14A:
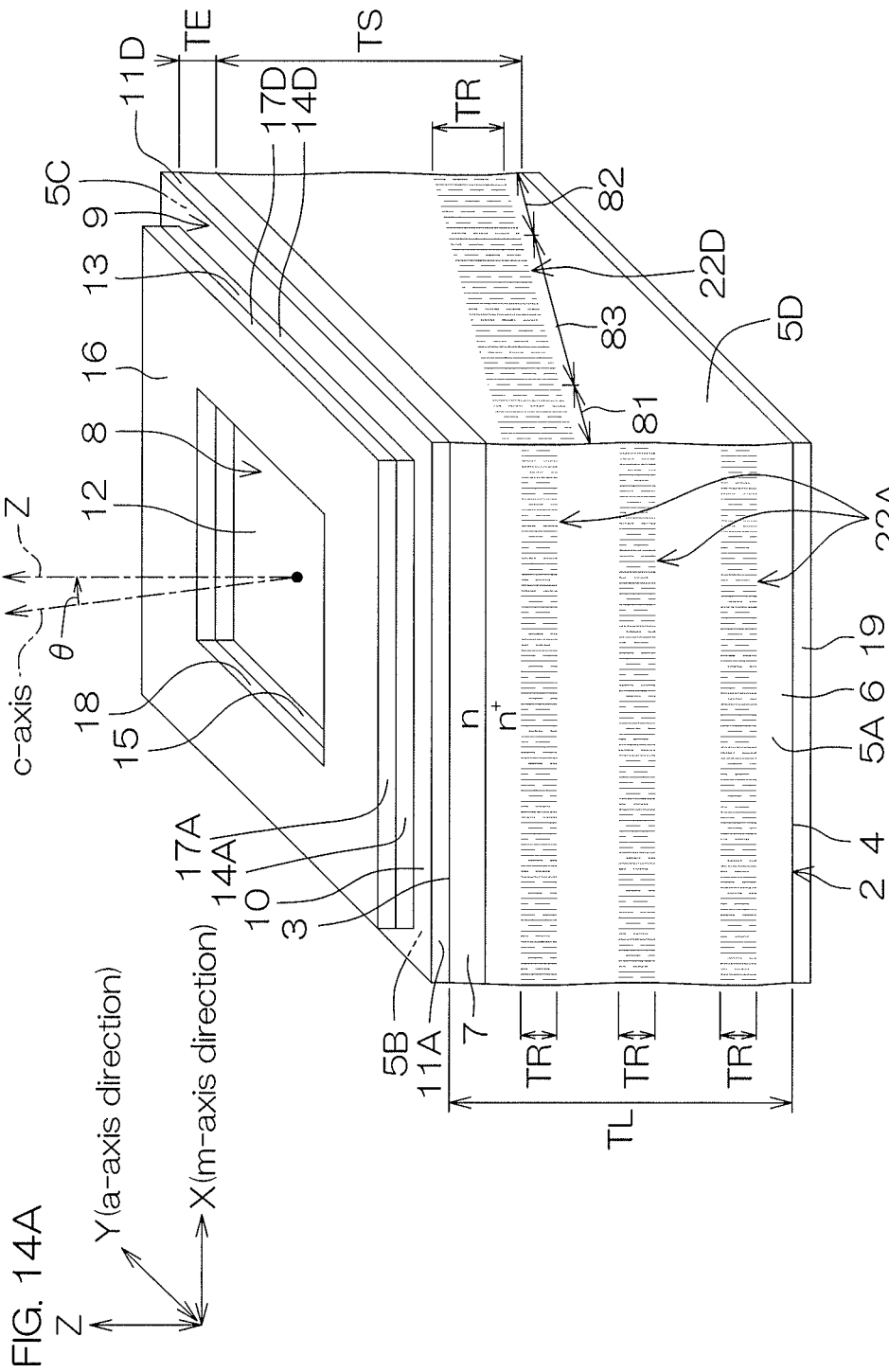
FIG. 14A is a perspective view showing the SiC semiconductor device shown in FIG. 3 and is a perspective view showing a second configuration example of the modified lines.

FIG. 14A is a perspective view showing the SiC semiconductor device 1 shown in FIG. 3 and is a perspective view showing a second configuration example of the modified lines 22A to 22D. In the following, structures corresponding to the structures described with the SiC semiconductor device 1 shall be provided with the same reference symbols and description thereof shall be omitted.

The modified lines 22B and 22D according to the first configuration example are formed in band shapes extending rectilinearly along the tangential direction to the first main surface 3. On the other hand, the modified lines 22B and 22D according to the second configuration example are formed in band shapes extending in slope shapes inclining downwardly from the first main surface 3 toward the second main surface 4. More specifically, the modified lines 22B and 22D according to the second configuration example each include a first end portion region 81, a second end portion region 82, and a slope region 83.

The first end portion regions 81 are positioned at the first main surface 3 side in vicinities of the corner portions of the SiC semiconductor layer 2. The second end portion regions 82 are positioned at the second main surface 4 sides with respect to the first end portion regions 81 in the vicinities of the corner portions of the SiC semiconductor layer 2. The slope regions 83 are inclined downwardly from the first main surface 3 toward the second main surface 4 in regions between the first end portion regions 81 and the second end portion regions 82. Inclination directions and inclination angles of the modified lines 22B and 22D are arbitrary and not restricted to the configuration of FIG. 14A.

The modified lines 22B and 22D according to the second configuration example are formed by adjusting the light converging portion (focal point), etc., of the laser light in the step of forming the modified lines 70 (the modified lines 22B and 22D) (see also FIG. 10K). Even in a case where the modified lines 22B and 22D according to the second configuration example are formed, the same effects as in the case of forming the modified lines 22A to 22D according to the first configuration example can be exhibited.

In particular, with the modified lines 22B and 22D according to the second configuration example, cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22B and 22D constituted of a single layer are formed.

The modified lines 22A and 22C may be formed in band shapes extending in slope shapes inclining downwardly from the first main surface 3 toward the second main surface 4 like the modified lines 22B and 22D. That is, the modified lines 22A and 22C may each include the first end portion region 81, the second end portion region 82, and the slope region 83. However, the modified lines 22A and 22C are premised on being formed in plurality at the side surfaces 5A and 5C and therefore there is little need to go so far as to perform control of making the modified lines 70 inclined during laser light irradiation.

Figure 14B:
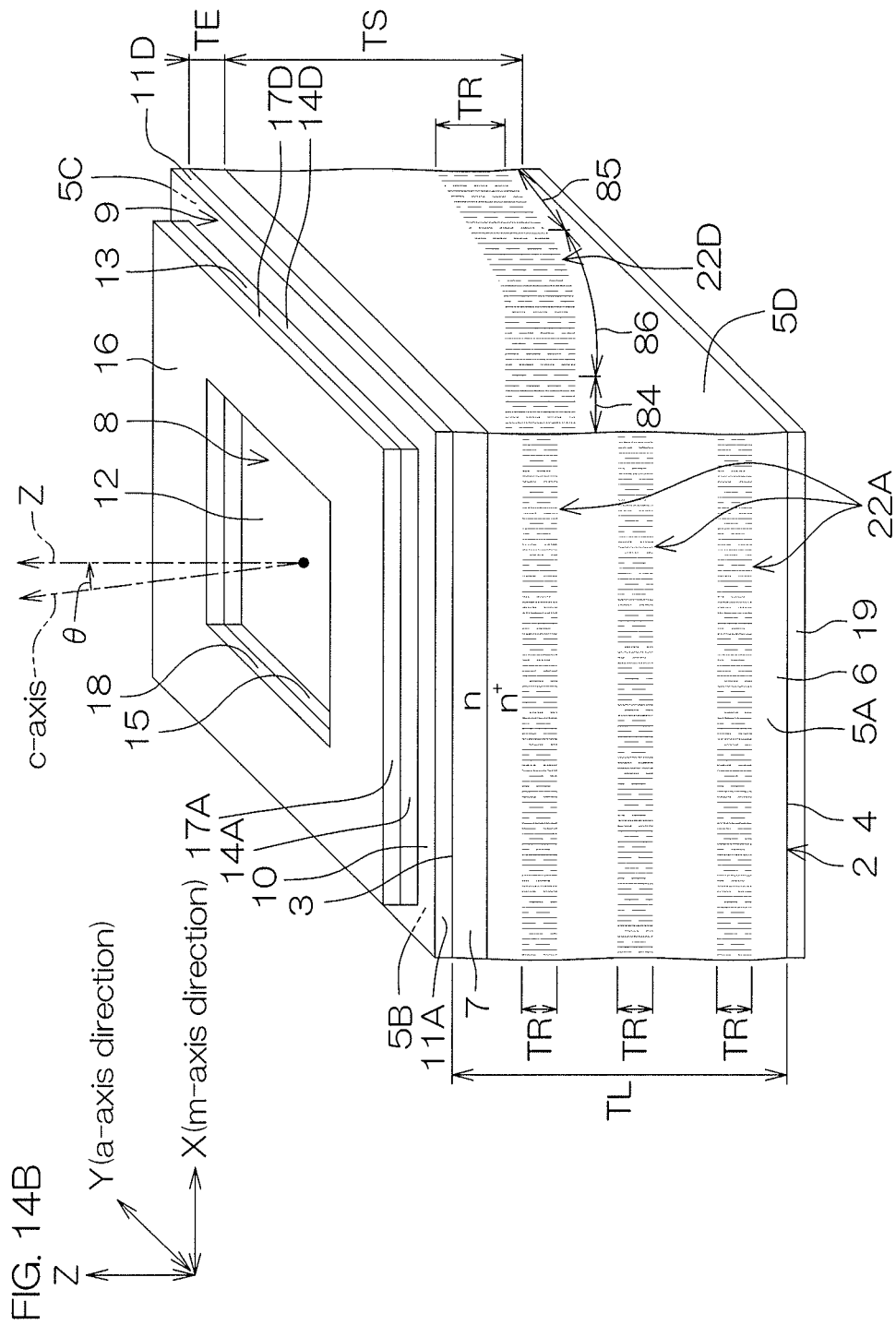
FIG. 14B is a perspective view showing the SiC semiconductor device shown in FIG. 3 and is a perspective view showing a third configuration example of the modified lines.

FIG. 14B is a perspective view showing the SiC semiconductor device 1 shown in FIG. 3 and is a perspective view showing a third configuration example of the modified lines 22A to 22D. In the following, structures corresponding to the structures described with the SiC semiconductor device 1 shall be provided with the same reference symbols and description thereof shall be omitted.

The modified lines 22B and 22D according to the first configuration example are formed in band shapes extending rectilinearly along the tangential direction to the first main surface 3. On the other hand, the modified lines 22B and 22D according to the third configuration example are formed in band shapes extending such as to be inclined downwardly in curves (curved shapes) from the first main surface 3 toward the second main surface 4. More specifically, the modified lines 22B and 22D according to the third configuration example each include a first end portion region 84, a second end portion region 85, and a curved region 86.

The first end portion regions 84 are positioned at the first main surface 3 side in vicinities of the corner portions of the SiC semiconductor layer 2. The second end portion regions 85 are positioned at the second main surface 4 side with respect to the first end portion regions 84 in the vicinities of the corner portions of the SiC semiconductor layer 2. The curved regions 86 are inclined downwardly in shapes curved concavely from the first main surface 3 toward the second main surface 4 and connect the first end portion regions 84 and the second end portion regions 85. Inclination directions and inclination angles of the modified lines 22B and 22D are arbitrary and not restricted to the configuration of FIG. 14B.

The modified lines 22B and 22D according to the third configuration example are formed by adjusting the light converging portion (focal point), etc., of the laser light in the step of forming the modified lines 70 (the modified lines 22B and 22D) (see also FIG. 10K). Even in a case where the modified lines 22B and 22D according to the third configuration example are formed, the same effects as in the case of forming the modified lines 22A to 22D according to the first configuration example can be exhibited.

In particular, with the modified lines 22B and 22D according to the third configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22B and 22D constituted of a single layer are formed.

The modified lines 22A and 22C may be formed to incline downwardly in shapes curved concavely from the first main surface 3 toward the second main surface 4 like the modified lines 22B and 22D. That is, the modified lines 22A and 22C may each include the first end portion region 84, the second end portion region 85, and the slope region 86. However, the modified lines 22A and 22C are premised on being formed in plurality at the side surfaces 5A and 5C and therefore there is little need to go so far as to perform control of making the modified lines 70 inclined during laser light irradiation.

Figure 14C:
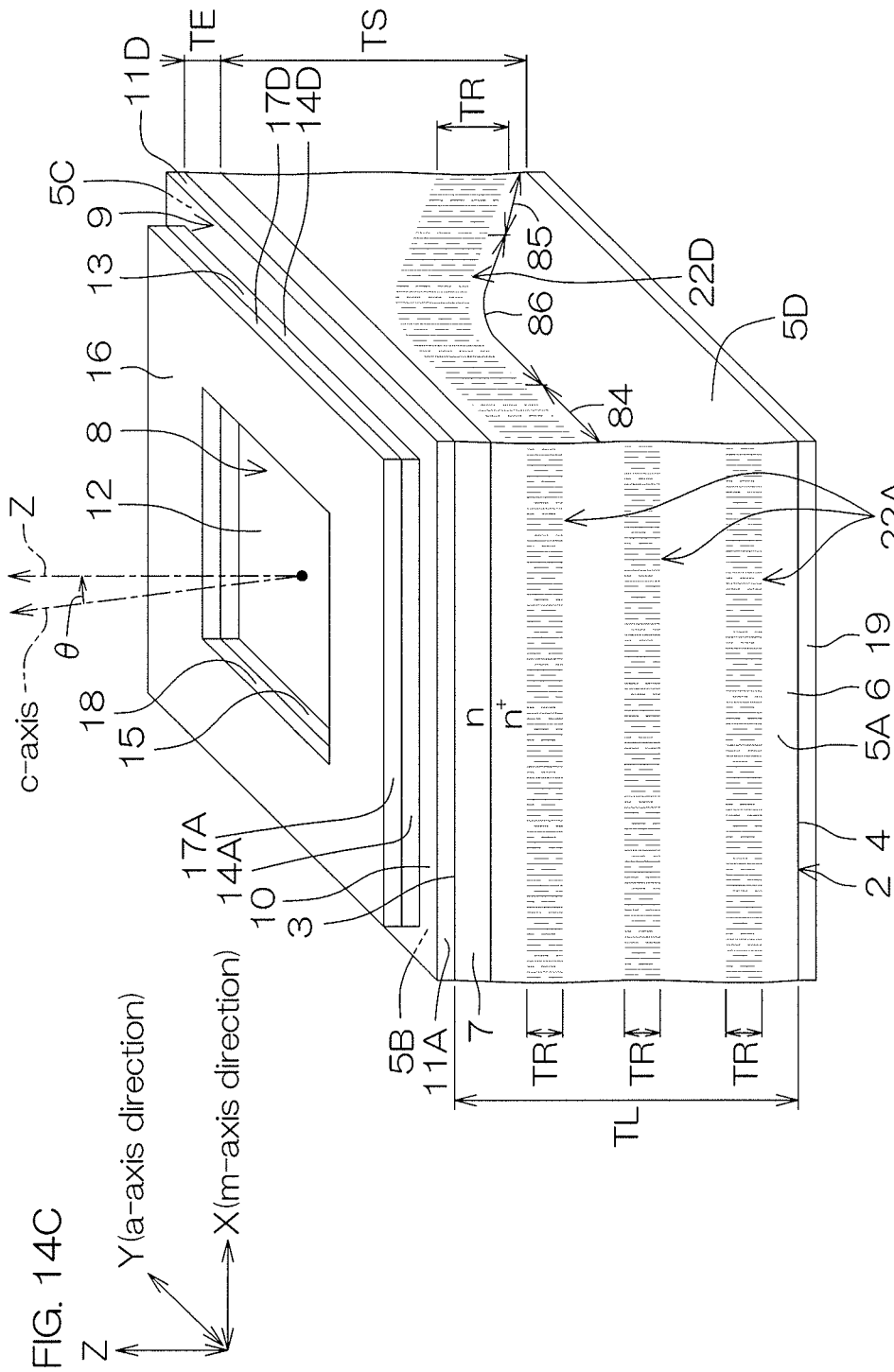
FIG. 14C is a perspective view showing the SiC semiconductor device shown in FIG. 3 and is a perspective view showing a fourth configuration example of the modified lines.

FIG. 14C is a perspective view showing the SiC semiconductor device 1 shown in FIG. 3 and is a perspective view showing a fourth configuration example of the modified lines 22A to 22D. In the following, structures corresponding to the structures described with the SiC semiconductor device 1 shall be provided with the same reference symbols and description thereof shall be omitted.

The modified lines 22B and 22D according to the first configuration example are formed in band shapes extending rectilinearly along the tangential direction to the first main surface 3. On the other hand, the modified lines 22B and 22D according to the fourth configuration example are formed in band shapes extending such as to be inclined downwardly in curves (curved shapes) from the first main surface 3 toward the second main surface 4. More specifically, the modified lines 22B and 22D according to the third configuration example each include a first end portion region 84, a second end portion region 85, and a curved region 86.

The first end portion regions 84 are positioned at the first main surface 3 side in vicinities of the corner portions of the SiC semiconductor layer 2. The second end portion regions 85 are positioned at the second main surface 4 side with respect to the first end portion regions 84 in the vicinities of the corner portions of the SiC semiconductor layer 2. The curved regions 86 are inclined downwardly in shapes curved convexly from the second main surface 4 toward the first main surface 3 and connect the first end portion regions 84 and the second end portion regions 85. Inclination directions and inclination angles of the modified lines 22B and 22D are arbitrary and not restricted to the configuration of FIG. 14C.

The modified lines 22B and 22D according to the fourth configuration example are formed by adjusting the light converging portion (focal point), etc., of the laser light in the step of forming the modified lines 70 (the modified lines 22B and 22D) (see also FIG. 10K). Even in a case where the modified lines 22B and 22D according to the fourth configuration example are formed, the same effects as in the case of forming the modified lines 22A to 22D according to the first configuration example can be exhibited.

In particular, with the modified lines 22B and 22D according to the fourth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22B and 22D constituted of a single layer are formed.

The modified lines 22A and 22C may be formed to incline downwardly in shapes curved convexly from the second main surface 4 toward the first main surface 3 like the modified lines 22B and 22D. That is, the modified lines 22A and 22C may each include the first end portion region 84, the second end portion region 85, and the slope region 86. However, the modified lines 22A and 22C are premised on being formed in plurality at the side surfaces 5A and 5C and therefore there is little need to go so far as to perform control of making the modified lines 70 inclined during laser light irradiation.

Figure 14D:
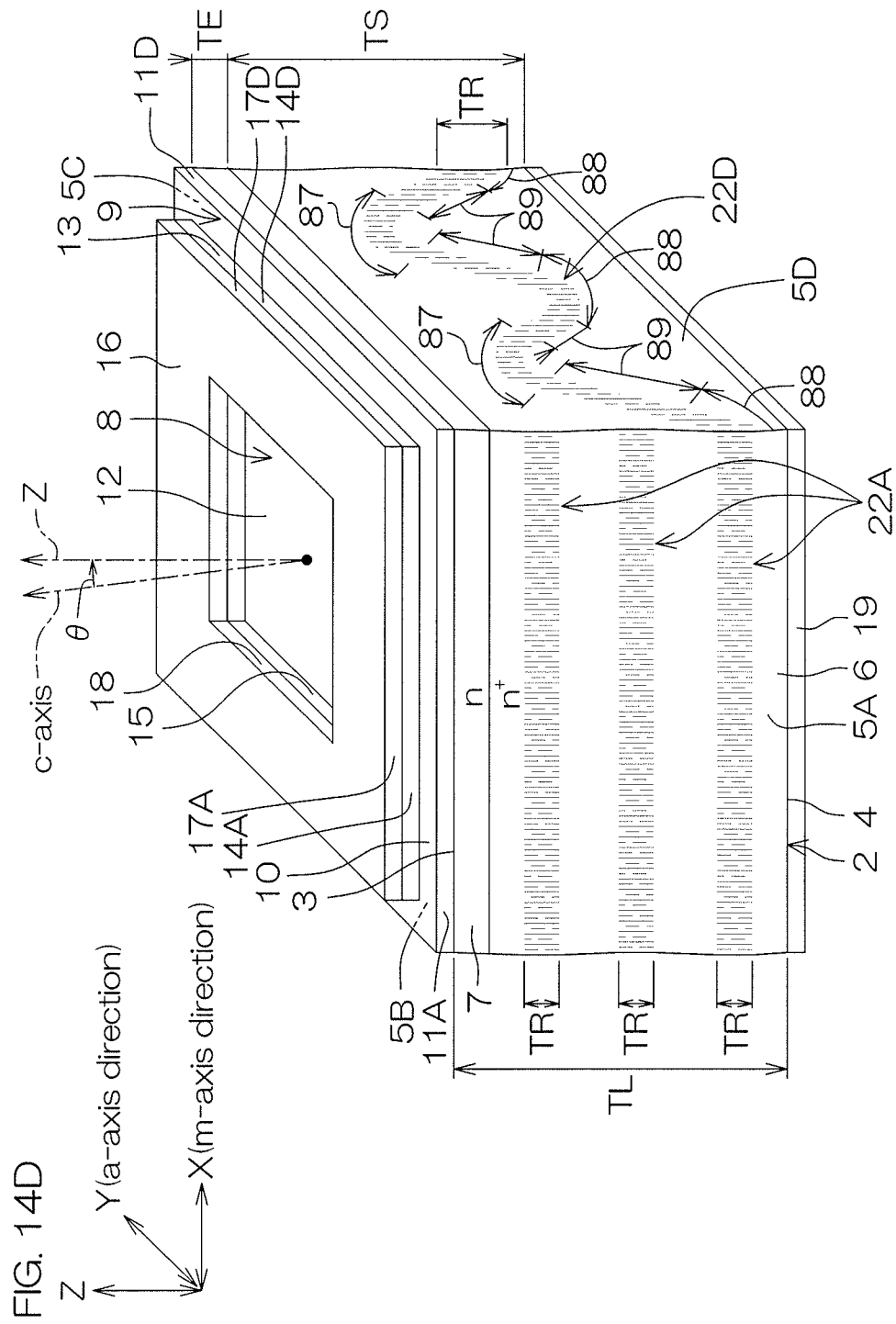
FIG. 14D is a perspective view showing the SiC semiconductor device shown in FIG. 3 and is a perspective view showing a fifth configuration example of the modified lines.

FIG. 14D is a perspective view showing the SiC semiconductor device 1 shown in FIG. 3 and is a perspective view showing a fifth configuration example of the modified lines 22A to 22D. In the following, structures corresponding to the structures described with the SiC semiconductor device 1 shall be provided with the same reference symbols and description thereof shall be omitted.

The modified lines 22B and 22D according to the first configuration example are formed in band shapes extending rectilinearly along the tangential direction to the first main surface 3. On the other hand, the modified lines 22B and 22D according to the fifth configuration example are formed in band shapes extending in curves (curved shapes) meandering from the first main surface 3 toward the second main surface 4. More specifically, the modified lines 22B and 22D according to the fifth configuration example each include a plurality of first regions 87, a plurality of second regions 88, and a plurality of connecting regions 89.

The plurality of first regions 87 are positioned at regions at the first main surface 3 side. The plurality of second regions 88 are positioned at the second main surface 4 side with respect to the plurality of first regions 87. Each of the plurality of curved regions 86 connects the corresponding first region 87 and second region 88.

Meandering cycles of the modified lines 22B and 22D are arbitrary. The modified lines 22B and 22D may each be formed in a single band shape extending in a shape curved concavely from the first main surface 3 toward the second main surface 4. In this case, each of the modified lines 22B and 22D may include two first regions 87, one second region 88, and two connecting regions 89.

Also, the modified lines 22B and 22D may each be formed in a single band shape extending in a shape curved convexly from the second main surface 4 toward the first main surface 3. In this case, each of the modified lines 22B and 22D may include one first region 87, two second regions 88, and two connecting regions 89.

The modified lines 22B and 22D according to the fifth configuration example are formed by adjusting the light converging portion (focal point), etc., of the laser light in the step of forming the modified lines 70 (the modified lines 22B and 22D) (see also FIG. 10K). Even in a case where the modified lines 22B and 22D according to the fifth configuration example are formed, the same effects as in the case of forming the modified lines 22A to 22D according to the first configuration example can be exhibited.

In particular, with the modified lines 22B and 22D according to the fifth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22B and 22D constituted of a single layer are formed.

Obviously, the modified lines 22A and 22C may also be formed in band shapes extending in curves (curved shapes) meandering from the first main surface 3 toward the second main surface 4 like the modified lines 22B and 22D. That is, the modified lines 22A and 22C may each include the first regions 87, the second regions 88, and the connecting regions 89. However, the modified lines 22A and 22C are premised on being formed in plurality at the side surfaces 5A and 5C and therefore there is little need to go so far as to perform control of making the modified lines 70 meander during laser light irradiation.

The SiC semiconductor device 1 that includes at least two types of the modified lines 22A to 22D according to the first configuration example, second configuration example, third configuration example, fourth configuration example, and fifth configuration example (hereinafter referred to simply as the "first to fifth configuration examples") at the same time may be formed.

Also, features of the modified lines 22A to 22D according to the first to fifth configuration examples may be combined among each other in any mode or any configuration. That is, the modified lines 22A to 22D having configurations combining at least two features among the features of the modified lines 22A to 22D according to the first to fifth configuration examples may be adopted.

The structures of modified lines 22A to 22D according to sixth to thirteenth configuration examples shall now be described with reference to FIG. 14E to FIG. 14M. In each of the sixth to thirteenth configuration examples, the SiC semiconductor device 1 that enables the influences on the SiC semiconductor layer 2 due to the modified lines 22A to 22D to be reduced is provided.

Figure 14E:
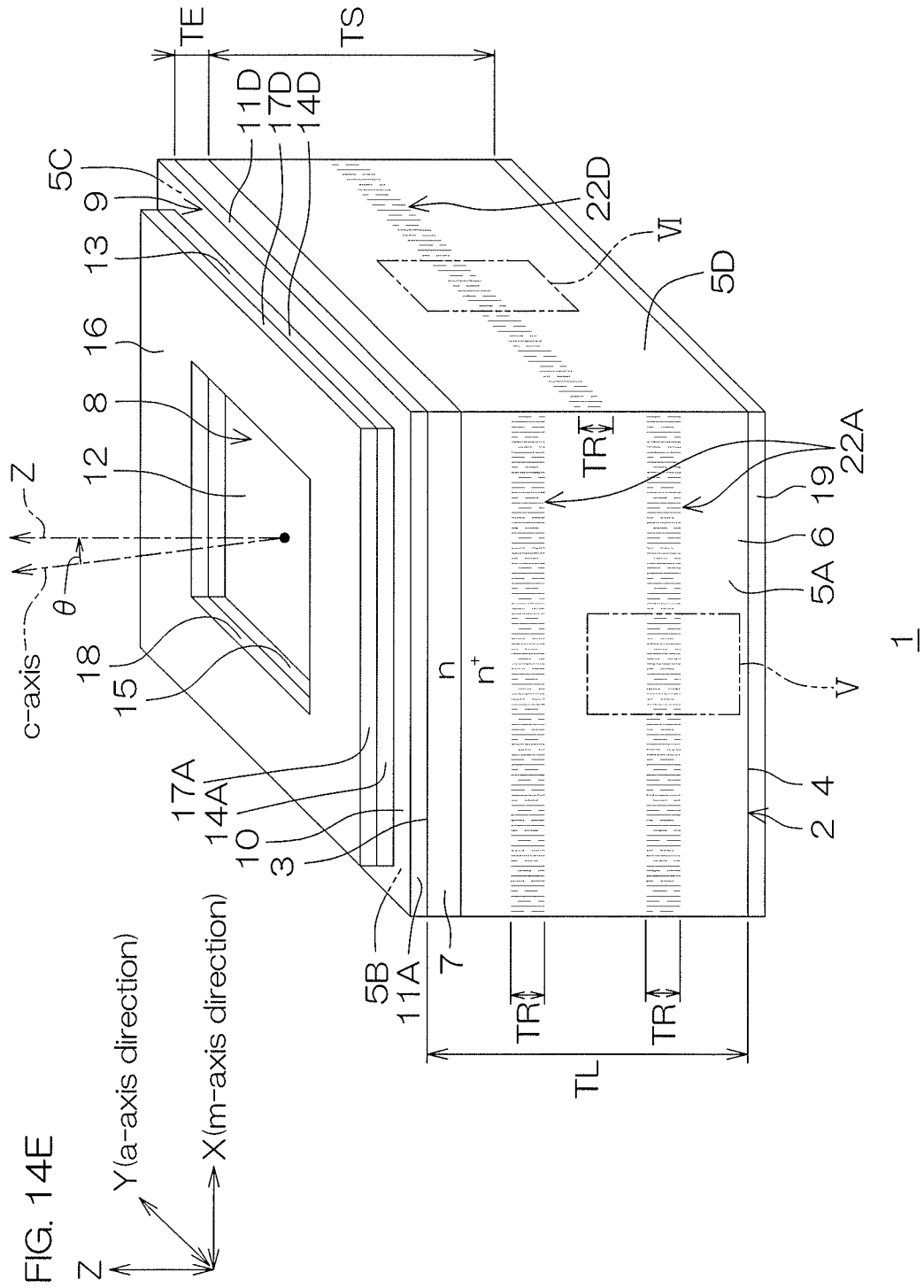
FIG. 14E is a perspective view showing the SiC semiconductor device shown in FIG. 3 and is a perspective view showing a sixth configuration example of the modified lines.
Figure 14F:
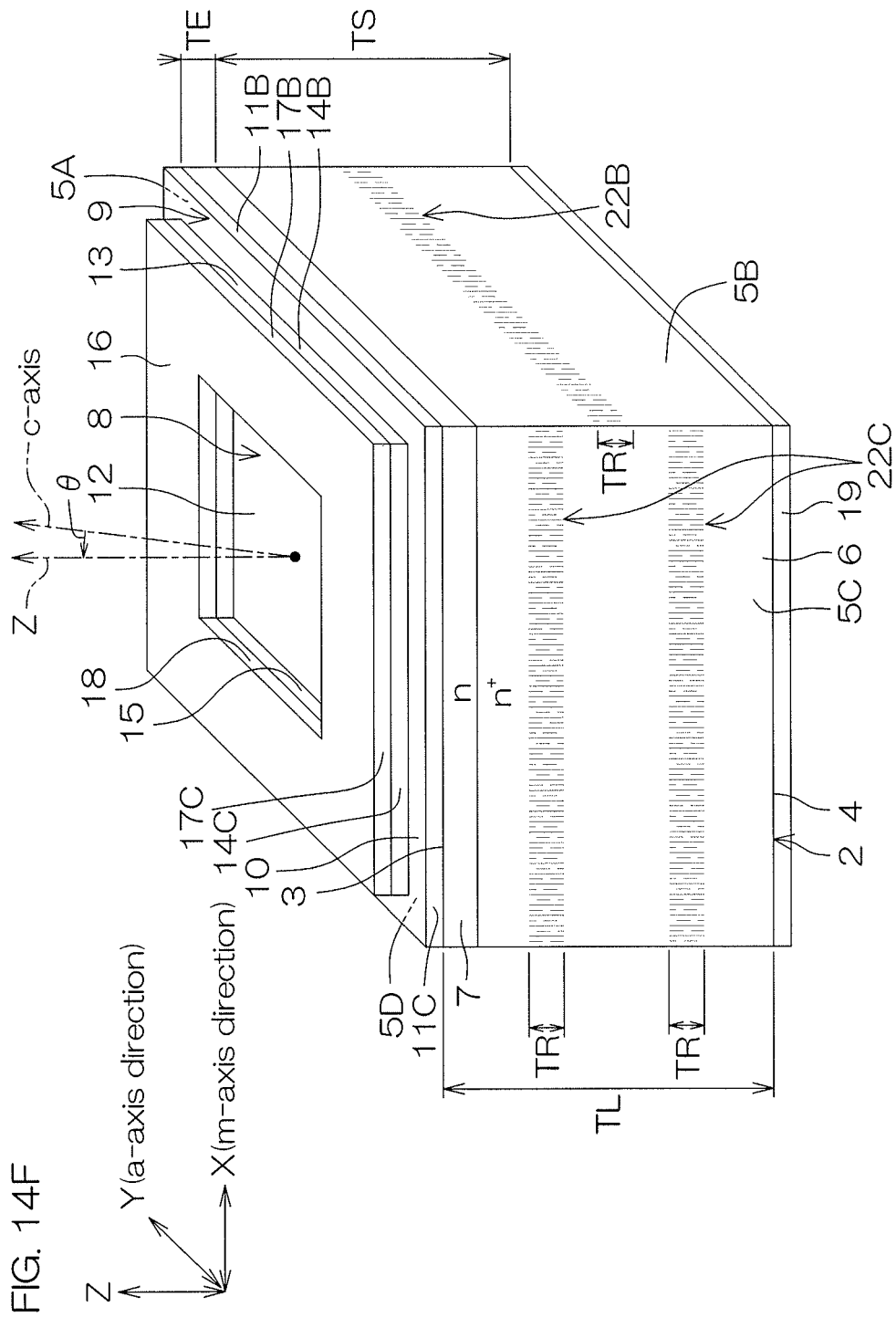
FIG. 14F is a perspective view as viewed from another angle of the SiC semiconductor device shown in FIG. 14E.

FIG. 14E is a perspective view as viewed from one angle of the SiC semiconductor device 1 shown in FIG. 3 and is a perspective view showing the sixth configuration example of the modified lines 22A to 22D. FIG. 14F is a perspective view as viewed from another angle of the SiC semiconductor device 1 shown in FIG. 14E.

Referring to FIG. 14E and FIG. 14F, the side surface 5A and the side surface 5C may form inclined surfaces that, when the normal to the first main surface 3 is taken as a basis, are inclined toward the c-axis direction ([0001] direction) of the SiC monocrystal with respect to the normal. In this case, the side surface 5A and the side surface 5C may be inclined at an angle in accordance with the off angle θ with respect to the normal to the first main surface 3 when the normal to the first main surface 3 is 0°. The angle in accordance with the off angle θ may be equal to the off angle θ or may be an angle that exceeds 0° and is less than the off angle θ.

The modified line 22A is formed in one layer or a plurality (two layers or more; two layers in this embodiment) at the side surface 5A. The modified line 22C is formed in one layer or a plurality (two layers or more; two layers in this embodiment) at the side surface 5C. The modified line 22B is formed in one layer or a plurality (two layers or more; one layer in this embodiment) at the side surface 5B. The modified line 22D is formed in one layer or a plurality (two layers or more; one layer in this embodiment) at the side surface 5D. The numbers of layers of the modified lines 22B and 22D are preferably less than the numbers of layers of the modified lines 22A and 22C.

The modified lines 22A to 22D extend in band shapes along tangential directions to the first main surface 3. The tangential directions to the first main surface 3 are directions orthogonal to the normal direction Z. The tangential directions include the first direction X (the m-axis direction of the SiC monocrystal) and the second direction Y (the a-axis direction of the SiC monocrystal).

The plurality of modified lines 22A are each formed in a band shape extending rectilinearly along the m-axis direction at the side surface 5A. The plurality of modified lines 22A are formed shifted from each other in the normal direction Z. The plurality of modified lines 22A may be mutually overlapped in the normal direction Z. The plurality of modified lines 22A may be formed at intervals from each other in the normal direction Z.

Each of the plurality of modified lines 22A has a thickness TR in the normal direction Z. The thicknesses TR of the plurality of modified lines 22A may be mutually equal or may be mutually different. A total thickness Tall of the plurality of modified lines 22A is determined by a total value of the thicknesses TR of the plurality of modified lines 22A.

The one layer of modified line 22B is formed in a band shape extending rectilinearly along the a-axis direction at the side surface 5B. The one layer of modified line 22B has a thickness TR in the normal direction Z. A total thickness Tall of the modified line 22B is determined by the thickness TR of the one layer of modified line 22B.

A plurality of modified lines 22B may be formed at the side surface 5B. In this case, the plurality of modified lines 22B are formed shifted from each other in the normal direction Z. The plurality of modified lines 22B may be mutually overlapped in the normal direction Z. The plurality of modified lines 22B may be formed at intervals from each other in the normal direction Z.

Each of the plurality of modified lines 22B has a thickness TR in the normal direction Z. The thicknesses TR of the plurality of modified lines 22B may be mutually equal or may be mutually different. A total thickness Tall of the plurality of modified lines 22B is determined by a total value of the thicknesses TR of the plurality of modified lines 22B.

The plurality of modified lines 22C are each formed in a band shape extending rectilinearly along the m-axis direction at the side surface 5C. The plurality of modified lines 22C are formed shifted from each other in the normal direction Z. The plurality of modified lines 22C may be mutually overlapped in the normal direction Z. The plurality of modified lines 22C may be formed at intervals from each other in the normal direction Z.

Each of the plurality of modified lines 22C has a thickness TR in the normal direction Z. The thicknesses TR of the plurality of modified lines 22C may be mutually equal or may be mutually different. A total thickness Tall of the plurality of modified lines 22C is determined by a total value of the thicknesses TR of the plurality of modified lines 22C.

The one layer of modified line 22D is formed in a band shape extending rectilinearly along the a-axis direction at the side surface 5D. The one layer of modified line 22D has a thickness TR in the normal direction Z. A total thickness Tall of the modified line 22D is determined by the thickness TR of the one layer of modified line 22D.

A plurality of modified lines 22D may be formed at the side surface 5D. In this case, the plurality of modified lines 22D are formed shifted from each other in the normal direction Z. The plurality of modified lines 22D may be mutually overlapped in the normal direction Z. The plurality of modified lines 22D may be formed at intervals from each other in the normal direction Z.

Each of the plurality of modified lines 22D has a thickness TR in the normal direction Z. The thicknesses TR of the plurality of modified lines 22D may be mutually equal or may be mutually different. A total thickness Tall of the plurality of modified lines 22D is determined by a total value of the thicknesses TR of the plurality of modified lines 22D.

The thicknesses TR of the modified lines 22A to 22D may be mutually equal or may be mutually different. The total thicknesses Tall of the modified lines 22A and 22C may be mutually equal or may be mutually different. The total thicknesses Tall of the modified lines 22B and 22D may be mutually equal or may be mutually different.

Preferably, the total thicknesses Tall of the modified lines 22A to 22D are each not more than the thickness TL of the SiC semiconductor layer 2 (TR≤TL). More preferably, the total thicknesses Tall are each less than the thickness TS of the SiC semiconductor substrate 6 (TR<TS). The total thicknesses Tall may each be not less than the thickness TE of the SiC epitaxial layer 7 (TR≥TE).

Preferably, ratios Tall/TL of the total thicknesses Tall with respect to the thickness TL of the SiC semiconductor layer 2 are each not less than 0.1 and less than 1.0. The ratios Tall/TL may each be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios Tall/TL may each be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. Preferably, the ratios Tall/TL are each not less than 0.2 and not more than 0.5.

More preferably, ratios Tall/TS of the total thicknesses Tall with respect to the thickness TS of the SiC semiconductor substrate 6 are each not less than 0.1 and less than 1.0. The ratios Tall/TS may each be not less than 0.1 and not more than 0.2, not less than 0.2 and not more than 0.4, not less than 0.4 and not more than 0.6, not less than 0.6 and not more than 0.8, or not less than 0.8 and less than 1.0.

The ratios Tall/TS may each be not less than 0.1 and not more than 0.2, not less than 0.2 and not more than 0.3, not less than 0.3 and not more than 0.4, not less than 0.4 and not more than 0.5, not less than 0.5 and not more than 0.6, not less than 0.6 and not more than 0.7, not less than 0.7 and not more than 0.8, not less than 0.8 and not more than 0.9, or not less than 0.9 and less than 1.0. Preferably, the ratios Tall/TS are each not less than 0.2 and not more than 0.5.

The modified lines 22A to 22D are formed at intervals toward the second main surface 4 side from the first main surface 3. The modified lines 22A to 22D expose surface layer portions of the first main surface 3 from the side surfaces 5A to 5D. That is, the modified lines 22A to 22D are not formed in the main surface insulating layer 10, the passivation layer 13 and the resin layer 16.

The modified lines 22A to 22D are formed at intervals toward the first main surface 3 side from the second main surface 4. The modified lines 22A to 22D expose surface layer portions of the second main surface 4 from the side surfaces 5A to 5D.

The modified lines 22A to 22D are formed in the SiC semiconductor substrate 6. The modified lines 22A to 22D are formed at intervals toward the second main surface 4 side from a boundary between the SiC semiconductor substrate 6 and the SiC epitaxial layer 7. The modified lines 22A to 22D expose the SiC epitaxial layer 7 at the surface layer portions of the first main surface 3.

The modified line 22A and the modified line 22B may be continuous to each other at the corner portion connecting the side surface 5A and the side surface 5B. The modified line 22B and the modified line 22C may be continuous to each other at the corner portion connecting the side surface 5B and the side surface 5C. The modified line 22C and the modified line 22D may be continuous to each other at the corner portion connecting the side surface 5C and the side surface 5D. The modified line 22D and the modified line 22A may be continuous to each other at the corner portion connecting the side surface 5D and the side surface 5A.

The modified lines 22A to 22D may be formed integrally such as to surround the SiC semiconductor layer 2. The modified lines 22A to 22D may form a single endless (annular) modified line surrounding the SiC semiconductor layer 2 at the side surfaces 5A to 5D.

The modified lines 22A to 22D are formed at different occupying ratios RA, RB, RC, and RD at the side surfaces 5A to 5D. The occupying ratio RA is a ratio of the modified lines 22A occupying in the side surfaces 5A. The occupying ratio RB is a ratio of the modified line 22B occupying in the side surfaces 5B. The occupying ratio RC is a ratio of the modified lines 22C occupying in the side surfaces 5C. The occupying ratio RD is a ratio of the modified line 22D occupying in the side surfaces 5D.

More specifically, the occupying ratios RA to RD differ in accordance with the crystal planes of the SiC monocrystal. The occupying ratios RB and RD of the modified lines 22B and 22D formed at the m-planes of the SiC monocrystal are not more than the occupying ratios RA and RC of the modified lines 22A and 22C formed at the a-planes of the SiC monocrystal (RB, RD≤RA, RC). More specifically, the occupying ratios RB and RD are less than occupying ratios RA and RC (RB, RD<RA, RC).

The occupying ratios RA and RC of the modified lines 22A and 22C may be mutually equal or may be mutually different. The occupying ratios RB and RD of the modified lines 22B and 22D may be mutually equal or may be mutually different.

The occupying ratios RA to RD are adjusted by the numbers of layers, the total thicknesses Tall, the total surface areas, etc., of the modified lines 22A to 22D. In this embodiment, as an example, the occupying ratios RA to RD (the total thicknesses Tall and the total surface areas) of the modified lines 22A to 22D are adjusted by adjusting the numbers of layers of the modified lines 22A to 22D each having an equal thickness TR.

That is, the numbers of layers of the modified lines 22B and 22D are less than the numbers of layers of the modified lines 22A and 22C. Also, the total thicknesses Tall of the modified lines 22B and 22D are less than the total thicknesses Tall of the modified lines 22A and 22C. Also, the total surface areas of the modified lines 22B and 22D are less than the total surface areas of the modified lines 22A and 22C. These are structures that, by a comparatively simple design, make the occupying ratios RB and RD of the modified lines 22B and 22D less than the occupying ratios RA and RC of the modified lines 22A and 22C.

The numbers of layers of the modified lines 22B and 22D may each be set to be not less than the numbers of layers of the modified lines 22A and 22C under a condition that the occupying ratios RB and RD are less than the occupying ratios RA and RC. The thicknesses TR of the modified lines 22B and 22D may each be set to be not less than the thicknesses TR of the modified lines 22A and 22C under the condition that the occupying ratios RB and RD are less than the occupying ratios RA and RC.

The modified lines 22A to 22D according to the sixth configuration example are formed by adjusting the light converging portion (focal point), laser energy, pulse duty ratio, irradiation speed, etc., of the laser light in the step of forming the modified lines 70 (the modified lines 22A to 22D) (see also FIG. 10K).

As described above, the SiC semiconductor device 1 (see FIG. 14E and FIG. 14F) includes the modified lines 22A to 22D having the occupying ratios RA to RD that differ in accordance with the crystal planes of the SiC monocrystal. More specifically, the occupying ratios RB and RD of the modified lines 22B and 22D formed at the m-planes of the SiC monocrystal are not more than the occupying ratios RA and RC of the modified lines 22A and 22C formed at the a-planes of the SiC monocrystal (RB, RD≤RA, RC). Even more specifically, the occupying ratios RB and RD are less than occupying ratios RA and RC (RB, RD<RA, RC).

In a plan view of viewing the c-plane (silicon plane) from the c-axis, the SiC monocrystal has a physical property of cracking easily along the nearest atom directions (see also FIG. 1 and FIG. 2) and not cracking easily along directions intersecting the nearest atom directions. The nearest atom directions are the a-axis direction and directions equivalent thereto. The crystal planes oriented along the nearest atom directions are the m-planes and planes equivalent thereto. The directions intersecting the nearest atom directions are the m-axis direction and directions equivalent thereto. The crystal planes oriented along the directions intersecting the nearest atom directions are the a-planes and planes equivalent thereto.

Therefore, even if, in the step of forming the modified lines 70, the modified lines 70 having comparatively large occupying ratios are not formed at the crystal planes oriented along the nearest atom directions of the SiC monocrystal, the SiC monocrystal can be cut (cleaved) appropriately because these crystal planes have the property of cracking comparatively easily (see also FIG. 10L). That is, in the step of forming the modified lines 70, the occupying ratios of the modified lines 70 oriented along the second cutting schedule lines 55 extending in the a-axis direction can be made smaller than the occupying ratios of the modified lines 70 oriented along the first cutting schedule lines 54 extending in the m-axis direction.

On the other hand, the modified lines 70 having the comparatively large occupying ratios are formed at the crystal planes oriented along the directions intersecting the nearest atom directions of the SiC monocrystal. Inappropriate cutting (cleaving) of the SiC semiconductor wafer structure 61 can thereby be suppressed and generation of cracks due to the physical property of the SiC monocrystal can thus be suppressed appropriately.

Also, according to the SiC semiconductor device 1 (see FIG. 14E and FIG. 14F), the number of layers of the modified lines 22B and 22D formed at the m-planes of the SiC monocrystal are less than the number of layers of the modified lines 22A and 22C formed at the a-planes of the SiC monocrystal.

In a plan view of viewing the c-plane (silicon plane) from the c-axis, the SiC monocrystal has a physical property of cracking easily along the nearest atom directions (see also FIG. 1 and FIG. 2) and not cracking easily along directions intersecting the nearest atom directions. The nearest atom directions are the a-axis direction and directions equivalent thereto. The crystal planes oriented along the nearest atom directions are the m-planes and planes equivalent thereto. The directions intersecting the nearest atom directions are the m-axis direction and directions equivalent thereto. The crystal planes oriented along the directions intersecting the nearest atom directions are the a-planes and planes equivalent thereto.

Therefore, in the step of forming the modified lines 70, the SiC monocrystal can be cut (cleaved) appropriately without increasing the number of layer of the modified line 70, with respect to the crystal planes oriented along the nearest atom directions of the SiC monocrystal. That is, in the step of forming the modified lines 70, the number of layer of the modified line 70 along the second cutting schedule lines 55 extending in the a-axis direction can be reduced comparing to the number of layer of the modified line 70 along the first cutting schedule lines 54 extending in the m-axis direction.

On the other hand, a comparatively large number of layers of the modified lines 70 are formed on the crystal planes oriented along the directions intersecting the nearest atom directions of the SiC monocrystal. The SiC semiconductor wafer structure 61 can thereby be appropriately cut (cleaved) and generation of cracks due to the physical property of the SiC monocrystal can thus be suppressed appropriately.

Thus, with the SiC semiconductor device 1 (see FIG. 14E and FIG. 14F), the physical property of the SiC monocrystal can be used to adjust the occupying ratios and the number of layers of the modified lines 22A to 22D with respect to the side surfaces 5A to 5D. Forming regions of the modified lines 22A to 22D with respect to the side surfaces 5A to 5D can thereby be reduced appropriately. Influences on the SiC semiconductor layer 2 due to the modified lines 22A to 22D can thus also be reduced. Time reduction of the step of forming the modified lines 70 can also be achieved.

As examples of the influences on the SiC semiconductor layer 2 due to the modified lines, fluctuation of electrical characteristics of the SiC semiconductor layer 2 due to the modified lines, generation of cracks in the SiC semiconductor layer 2 with the modified lines as starting points, etc., can be cited. Fluctuation of leak current characteristics can be cited as an example of the fluctuation of electrical characteristics of the SiC semiconductor layer 2 due to the modified lines.

An SiC semiconductor device may be sealed by the sealing resin 79 as was shown in FIG. 11. In this case, it can be considered that mobile ions in the sealing resin 79 will enter into the SiC semiconductor layer 2 via a modified line. With a structure where the plurality of modified lines are formed at intervals along the normal direction Z over entire areas of the respective side surfaces 5A to 5D, there is increased risk of current path formation due to such an external structure.

Also, with the structure where the plurality of modified lines are formed along the normal direction Z over the entire areas of the respective side surfaces 5A to 5D, there is also increased risk of generation of cracks in the SiC semiconductor layer 2. Therefore, by restricting the forming regions of the modified lines 22A to 22D as in the SiC semiconductor device 1 (see FIG. 14E and FIG. 14F), fluctuation of the electrical characteristics of the SiC semiconductor layer 2 and generation of cracks can be suppressed.

Also, with the SiC semiconductor device 1 (see FIG. 14E and FIG. 14F), the step of thinning the SiC semiconductor wafer structure 61 (the SiC semiconductor wafer 41) is performed and therefore the SiC semiconductor wafer structure 61 can be cleaved appropriately, even when the single modified lines 22B and 22D (the modified lines 70) are formed.

In other words, by the thinned SiC semiconductor wafer structure 61 (SiC semiconductor wafer 41), the SiC semiconductor wafer structure 61 (SiC semiconductor wafer 41) can be cleaved appropriately without forming the modified lines 22B and 22D (the modified lines 70) at intervals in the normal direction Z. Influences on the SiC semiconductor layer 2 due to the modified lines 22A to 22D can thus also be further reduced. Time reduction of the step of forming the modified lines 70 can also be achieved.

In this case, the second main surface 4 is constituted of the ground surface. The SiC semiconductor device 1 (see FIG. 14E and FIG. 14F) preferably includes the SiC semiconductor layer 2 having the thickness TL that is not less than 40 μm and not more than 200 μm. The SiC semiconductor layer 2 having such thickness TL can be cut out appropriately from the SiC semiconductor wafer structure 61 (SiC semiconductor wafer 41).

In the SiC semiconductor layer 2, the thickness TS of the SiC semiconductor substrate 6 may be not less than 40 μm and not more than 150 μm. The thickness TE of the SiC epitaxial layer 7 in the SiC semiconductor layer 2 may be not less than 1 μm and not more than 50 μm. The thinning of the SiC semiconductor layer 2 is also effective in terms of reducing resistance value.

Also, with the SiC semiconductor device 1 (see FIG. 14E and FIG. 14F), the modified lines 22A to 22D are formed at intervals toward the second main surface 4 side from the first main surface 3. Stress concentrates readily at corner portions connecting the first main surface 3 and the side surfaces 5A to 5D. Therefore, by forming the modified lines 22A to 22D at intervals from the corner portions connecting the first main surface 3 and the side surfaces 5A to 5D, generation of cracks at the corner portions of the SiC semiconductor layer 2 can be suppressed appropriately.

In particular, with the SiC semiconductor device 1 (see FIG. 14E and FIG. 14F), the modified lines 22A to 22D are formed in the SiC semiconductor substrate 6 while avoiding the SiC epitaxial layer 7. That is, the modified lines 22A to 22D expose the SiC epitaxial layer 7 in which a main portion of the functional device (the Schottky barrier diode D in this embodiment) is formed. Thereby, influences on the functional device due to the modified lines 22A to 22D can also be reduced appropriately.

Also, with the SiC semiconductor device 1 (see FIG. 14E and FIG. 14F), the modified lines 22A to 22D are formed at intervals toward the first main surface 3 side from the second main surface 4. Stress concentrates readily at corner portions connecting the second main surface 4 and the side surfaces 5A to 5D. Therefore, by forming the modified lines 22A to 22D at intervals from the corner portions connecting the second main surface 4 and the side surfaces 5A to 5D, generation of cracks at the corner portions of the SiC semiconductor layer 2 can be suppressed appropriately.

Also, the SiC semiconductor device 1 (see FIG. 14E and FIG. 14F) includes the main surface insulating layer 10 and the first main surface electrode layer 12 formed on the first main surface 3. The main surface insulating layer 10 has the insulating side surfaces 11A to 11D that are continuous to the side surfaces 5A to 5D of the SiC semiconductor layer 2.

The main surface insulating layer 10 improves an insulating property between the side surfaces 5A to 5D and the first main surface electrode layer 12 in the structure in which the modified lines 22A to 22D are formed. Stability of the electrical characteristics of the SiC semiconductor layer 2 can thereby be improved in the structure in which the modified lines 22A to 22D are formed in the side surfaces 5A to 5D.

Figure 14G:
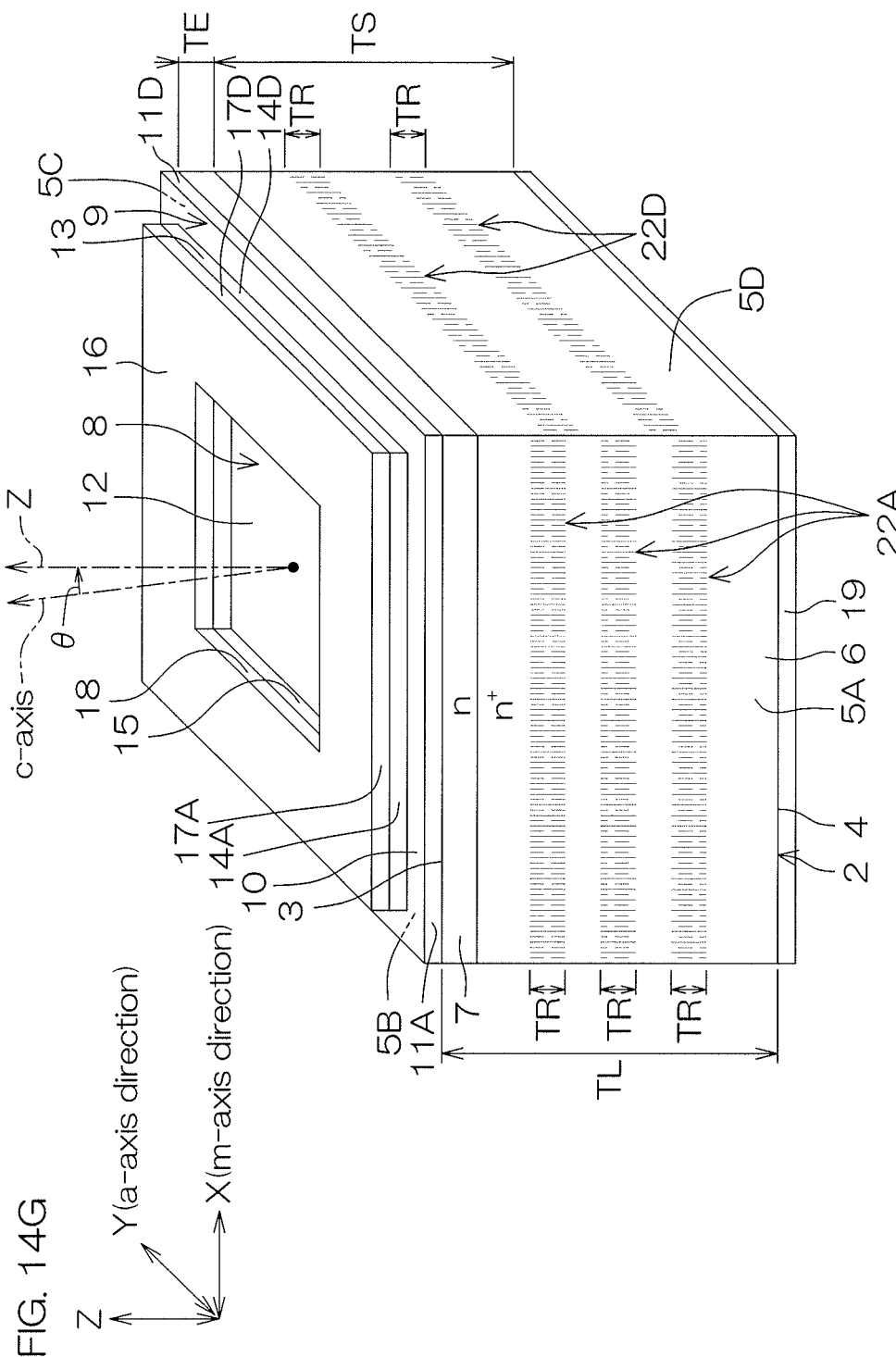
FIG. 14G is a perspective view showing the SiC semiconductor device shown in FIG. 3 and is a perspective view showing a seventh configuration example of the modified lines.

FIG. 14G is a perspective view showing the SiC semiconductor device 1 shown in FIG. 3 and is a perspective view showing a seventh configuration example of the modified lines 22A to 22D. In the following, structures corresponding to the structures described with the SiC semiconductor device 1 shall be provided with the same reference symbols and description thereof shall be omitted.

With the sixth configuration example, the plurality of each of the modified lines 22A and 22C and the one layer of each of the modified lines 22B and 22D are formed. On the other hand, with the seventh configuration example, a plurality of each of the modified lines 22A to 22D are formed under the condition that the occupying ratios RB and RD are less than the occupying ratios RA and RC (RB, RD<RA, RC).

In this configuration, a plurality (three layers in this configuration) of each of the modified lines 22A and 22C are formed and a plurality less than the numbers of layers of the modified lines 22A and 22C (two layers in this configuration) of each of the modified lines 22B and 22D are formed.

The modified lines 22A to 22D according to the seventh configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the seventh configuration example are formed, the same effects as in the case of forming the modified lines 22A to 22D according to the sixth configuration example can be exhibited. However, from a standpoint of time reduction of the step of forming the modified lines 70 (the modified lines 22A to 22D), the modified lines 22A to 22D according to the sixth configuration example are more preferable.

Figure 14H:
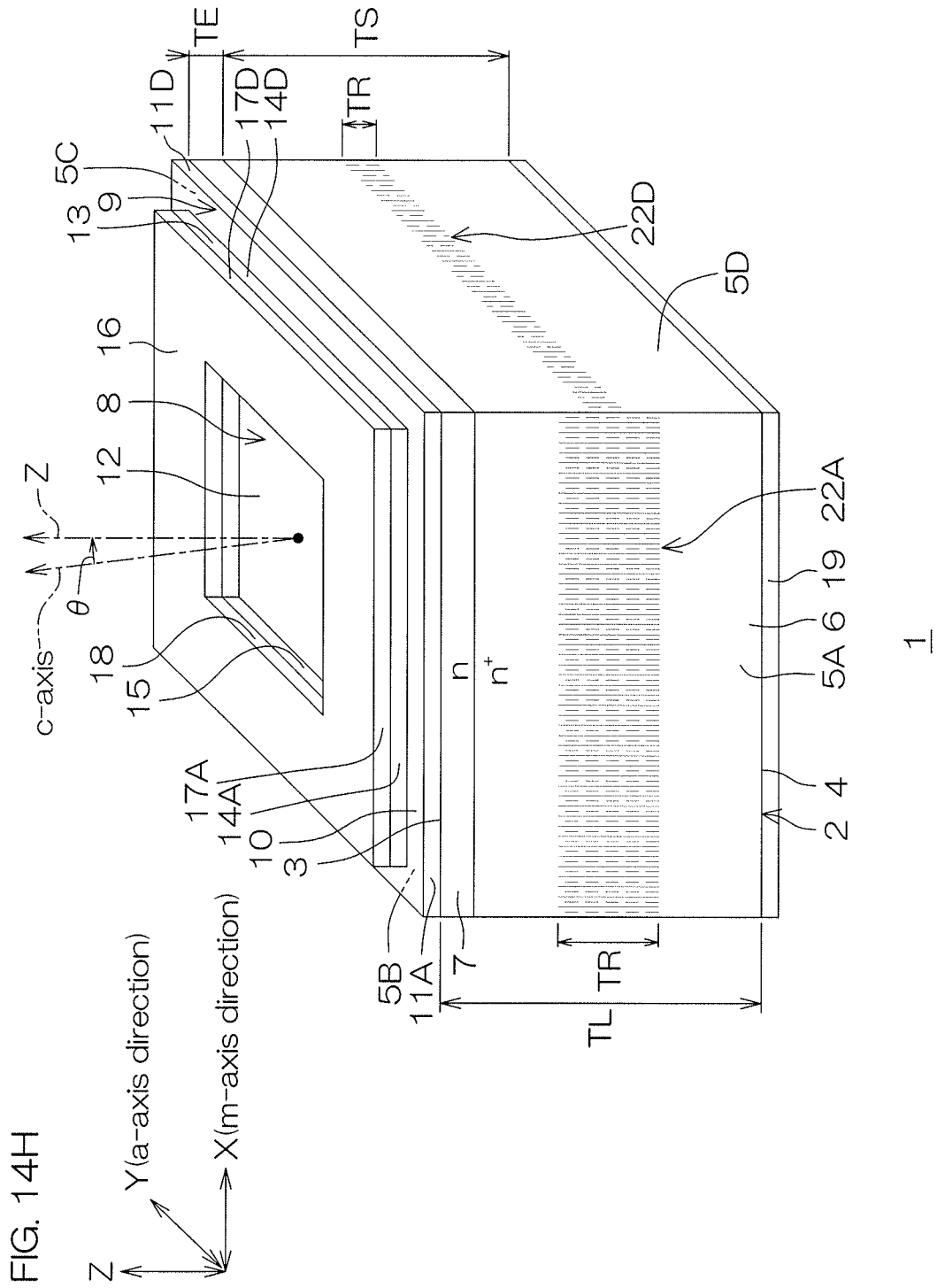
FIG. 14H is a perspective view showing the SiC semiconductor device shown in FIG. 3 and is a perspective view showing an eighth configuration example of the modified lines.
Figure 14:
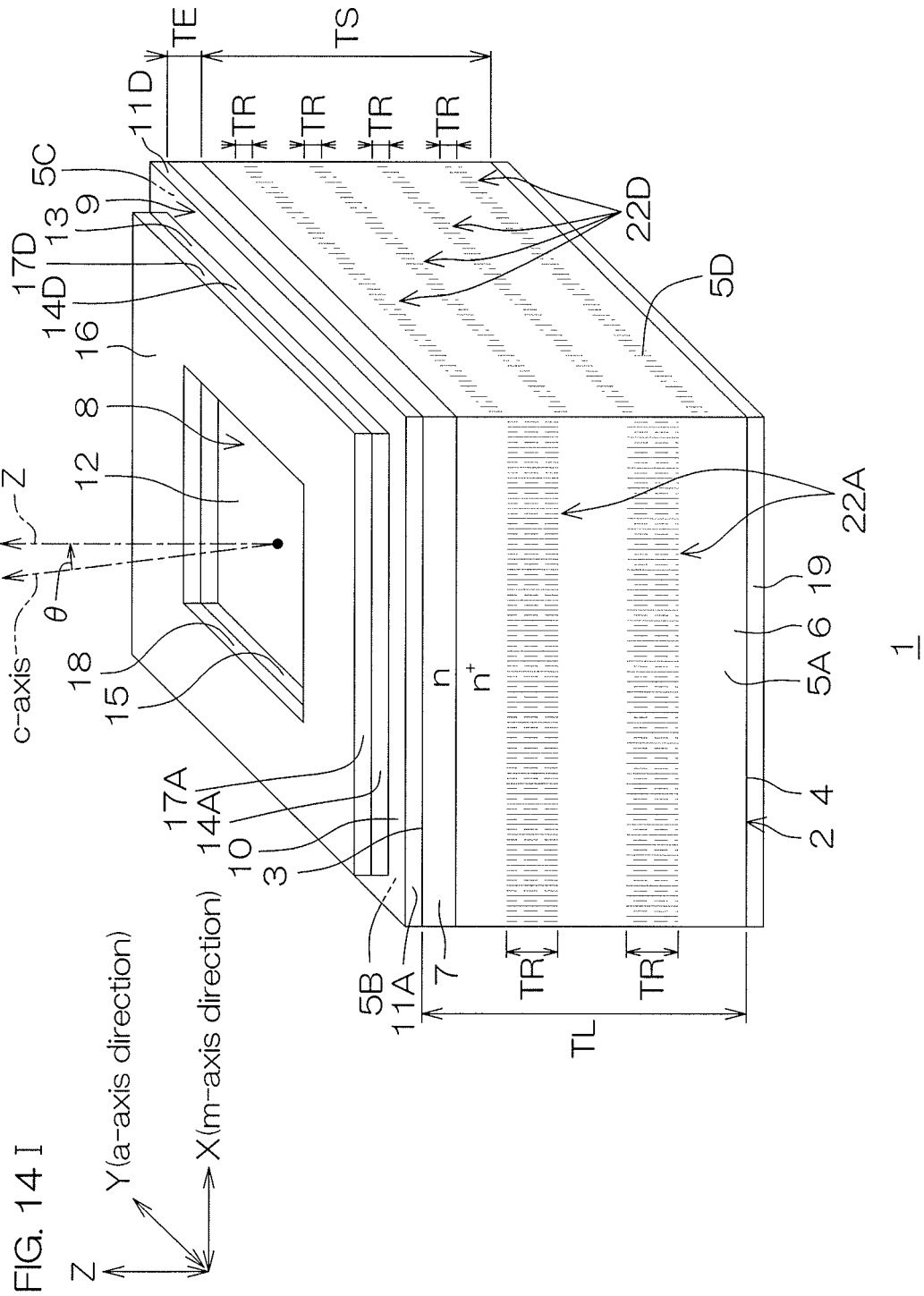
FIG. 14I is a perspective view showing the SiC semiconductor device shown in FIG. 3 and is a perspective view showing a ninth configuration example of the modified lines.
FIG. 14J is a perspective view showing the SiC semiconductor device shown in FIG. 3 and is a perspective view showing a tenth configuration example of the modified lines.
FIG. 14K is a perspective view showing the SiC semiconductor device shown in FIG. 3 and is a perspective view showing an eleventh configuration example of the modified lines.
FIG. 14L is a perspective view showing the SiC semiconductor device shown in FIG. 3 and is a perspective view showing a twelfth configuration example of the modified lines.
FIG. 14M is a perspective view showing the SiC semiconductor device shown in FIG. 3 and is a perspective view showing a thirteenth configuration example of the modified lines.

FIG. 14H is a perspective view showing the SiC semiconductor device 1 shown in FIG. 3 and is a perspective view showing an eighth configuration example of the modified lines 22A to 22D. In the following, structures corresponding to the structures described with the SiC semiconductor device 1 shall be provided with the same reference symbols and description thereof shall be omitted.

With the sixth configuration example, the plurality of each of the modified lines 22A and 22C and the one layer of each of the modified lines 22B and 22D are formed. On the other hand, with the eighth configuration example, one layer of each of the modified lines 22A to 22D are formed in a relationship of one-to-one correspondence with respect to the side surfaces 5A to 5D under the condition that the occupying ratios RB and RD are less than the occupying ratios RA and RC (RB, RD<RA, RC). The thicknesses TR of the modified lines 22B and 22D are less than the thicknesses TR of the modified lines 22A and 22C.

The modified lines 22A to 22D according to the eighth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the eighth configuration example are formed, the same effects as in the case of forming the modified lines 22A to 22D according to the sixth configuration example can be exhibited. In particular, with the modified lines 22A to 22D according to the eighth configuration example, further time reduction of the step of forming the modified lines 70 (the modified lines 22A to 22D) can be achieved because there is no need to form a plurality of each of the modified lines 22A to 22D along the normal direction Z.

FIG. 14I is a perspective view showing the SiC semiconductor device 1 shown in FIG. 3 and is a perspective view showing a ninth configuration example of the modified lines 22A to 22D. In the following, structures corresponding to the structures described with the SiC semiconductor device 1 shall be provided with the same reference symbols and description thereof shall be omitted.

With the sixth configuration example, the plurality of each of the modified lines 22A and 22C and the one layer of each of the modified lines 22B and 22D are formed. On the other hand, with the ninth configuration example, a plurality of each of the modified lines 22A to 22D are formed under the condition that the occupying ratios RB and RD are less than the occupying ratios RA and RC (RB, RD<RA, RC).

In this configuration, a plurality (two layers in this configuration) of each of the modified lines 22A and 22C are formed and a plurality not less than the numbers of layers of the modified lines 22A and 22C (four layers in this configuration) of each of the modified lines 22B and 22D are formed. The numbers of layers of the modified lines 22B and 22D may be the same as the numbers of layers of the modified lines 22A and 22C. The thickness TR of each of the modified lines 22B and 22D is less than the thickness TR of each of the modified lines 22A and 22C.

The modified lines 22A to 22D according to the ninth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the ninth configuration example are formed, the same effects as in the case of forming the modified lines 22A to 22D according to the sixth configuration example can be exhibited. However, from a standpoint of time reduction of the step of forming the modified lines 70 (the modified lines 22A to 22D), the modified lines 22A to 22D according to the sixth configuration example are more preferable.

Figure 14J:
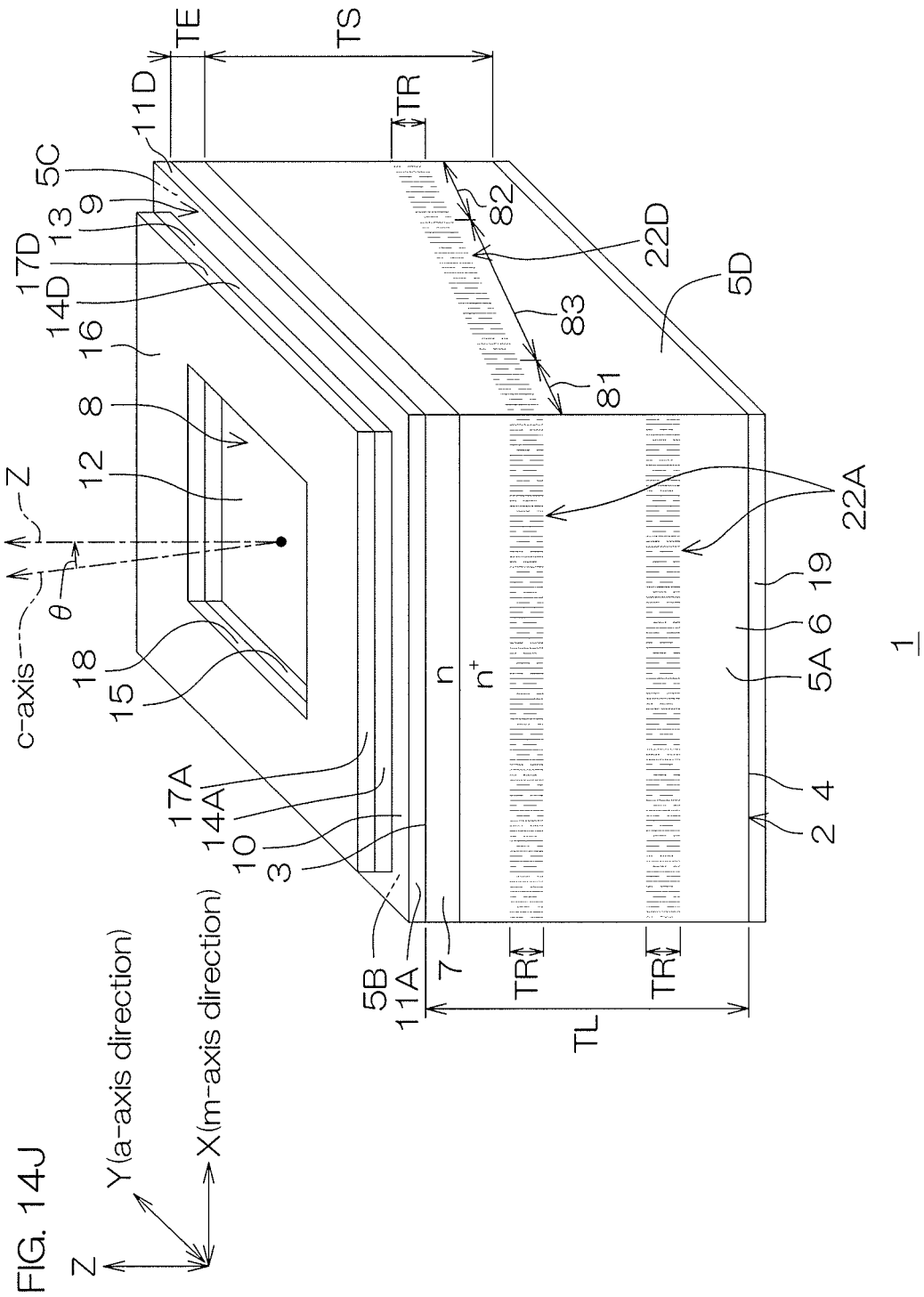

FIG. 14J is a perspective view showing the SiC semiconductor device 1 shown in FIG. 3 and is a perspective view showing a tenth configuration example of the modified lines 22A to 22D. In the following, structures corresponding to the structures described with the SiC semiconductor device 1 shall be provided with the same reference symbols and description thereof shall be omitted.

The modified lines 22B and 22D according to the sixth configuration example are formed in band shapes extending rectilinearly along the tangential direction to the first main surface 3. On the other hand, the modified lines 22B and 22D according to the tenth configuration example are formed in band shapes inclining downwardly from the first main surface 3 toward the second main surface 4. More specifically, the modified lines 22B and 22D according to the tenth configuration example each include a first end portion region 81, a second end portion region 82, and a slope region 83.

The first end portion regions 81 are positioned at the first main surface 3 side in vicinities of the corner portions of the SiC semiconductor layer 2. The second end portion regions 82 are positioned at the second main surface 4 sides with respect to the first end portion regions 81 in the vicinities of the corner portions of the SiC semiconductor layer 2. The slope regions 83 are inclined downwardly rectilinearly from the first main surface 3 toward the second main surface 4 in regions between the first end portion regions 81 and the second end portion regions 82.

The slope regions 83 may be inclined downwardly from the first main surface 3 toward the second main surface 4 in concavely curved shapes (curves). The slope regions 83 may be inclined downwardly from the first main surface 3 toward the second main surface 4 in convexly curved shapes (curves).

In this configuration, the modified lines 22A and 22C are formed in band shapes extending rectilinearly along the tangential direction of the first main surface 3. However, the modified lines 22A and 22C may instead be formed in band shapes inclining downwardly from the first main surface 3 toward the second main surface 4 like the modified lines 22B and 22D. That is, the modified lines 22A and 22C may also each include a first end portion region 81, a second end portion region 82, and a slope region 83.

The modified lines 22A to 22D according to the tenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the tenth configuration example are formed, the same effects as in the case of forming the modified lines 22A to 22D according to the sixth configuration example can be exhibited. In particular, with the modified lines 22B and 22D according to the tenth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22B and 22D constituted of a single layer are formed.

Figure 14K:
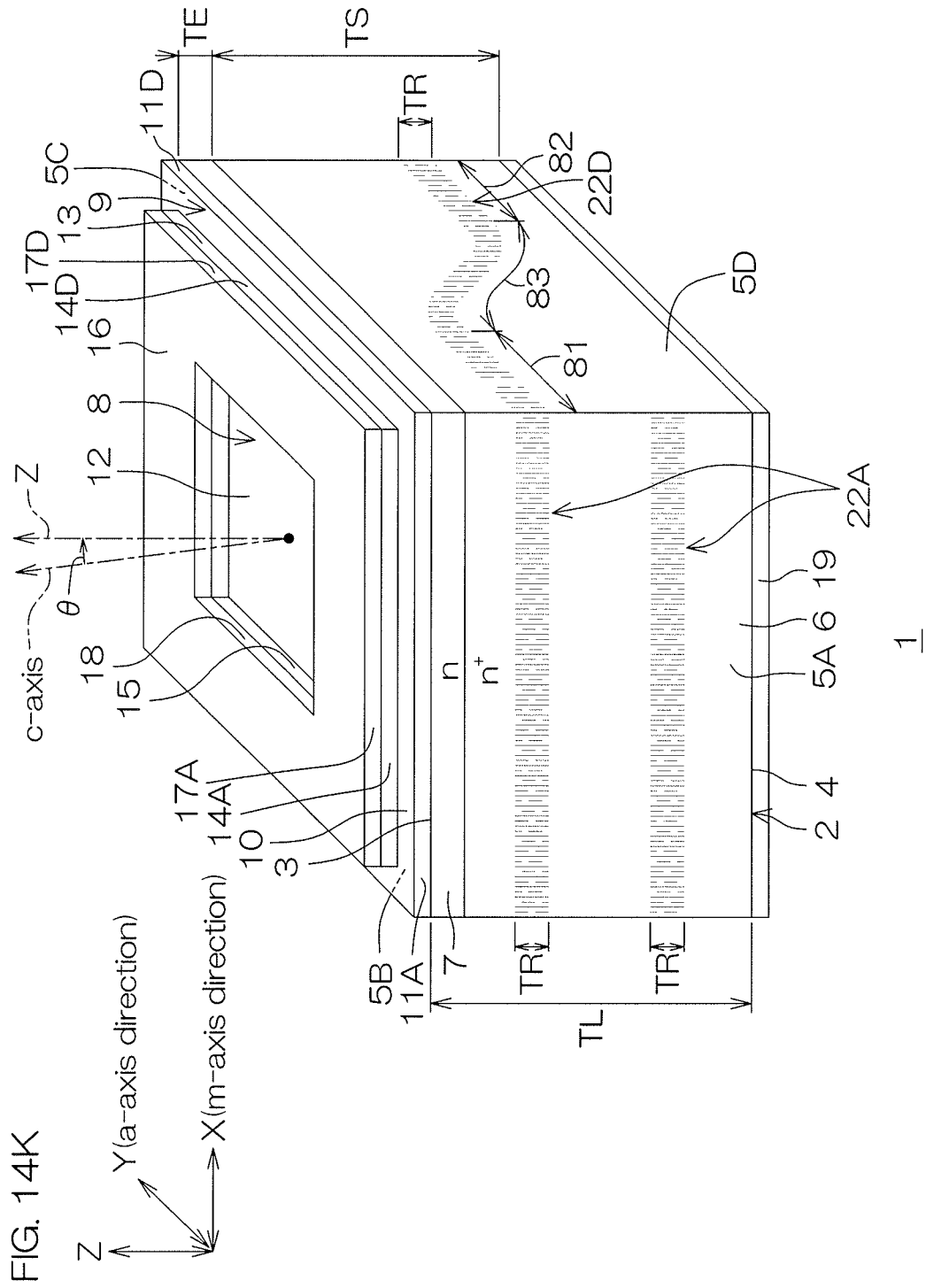

FIG. 14K is a perspective view showing the SiC semiconductor device 1 shown in FIG. 3 and is a perspective view showing an eleventh configuration example of the modified lines 22A to 22D. In the following, structures corresponding to the structures described with the SiC semiconductor device 1 shall be provided with the same reference symbols and description thereof shall be omitted.

The modified lines 22B and 22D according to the sixth configuration example are formed in band shapes extending rectilinearly along the tangential direction to the first main surface 3. On the other hand, the modified lines 22B and 22D according to the eleventh configuration example are formed in band shapes inclining downwardly from the first main surface 3 toward the second main surface 4. More specifically, the modified lines 22B and 22D according to the eleventh configuration example each include a first end portion region 81, a second end portion region 82, and a slope region 83.

The first end portion regions 81 are positioned at the first main surface 3 side in vicinities of the corner portions at one side of the SiC semiconductor layer 2. The first end portion regions 81 extend rectilinearly along the tangential direction of the first main surface 3. The second end portion regions 82 are positioned at the second main surface 4 sides with respect to the first end portion regions 81 in the vicinities of the corner portions at the other side of the SiC semiconductor layer 2. The second end portion regions 82 extend rectilinearly along the tangential direction of the first main surface 3.

The slope regions 83 connect the first end portion regions 81 and the second end portion regions 82. The slope regions 83 are inclined downwardly rectilinearly from the first end portion regions 81 toward the second end portion regions 82. The slope regions 83 may be inclined downwardly from the first end portion regions 81 toward the second end portion regions 82 in concavely curved shapes (curves).

In this configuration, the modified lines 22A and 22C are formed in band shapes extending rectilinearly along the tangential direction of the first main surface 3. However, the modified lines 22A and 22C may instead be formed in band shapes inclining downwardly from the first main surface 3 toward the second main surface 4 like the modified lines 22B and 22D. That is, the modified lines 22A and 22C may also each include a first end portion region 81, a second end portion region 82, and a slope region 83.

The modified lines 22A to 22D according to the eleventh configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the eleventh configuration example are formed, the same effects as in the case of forming the modified lines 22A to 22D according to the sixth configuration example can be exhibited. In particular, with the modified lines 22B and 22D according to the eleventh configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22B and 22D constituted of a single layer are formed.

Figure 14L:
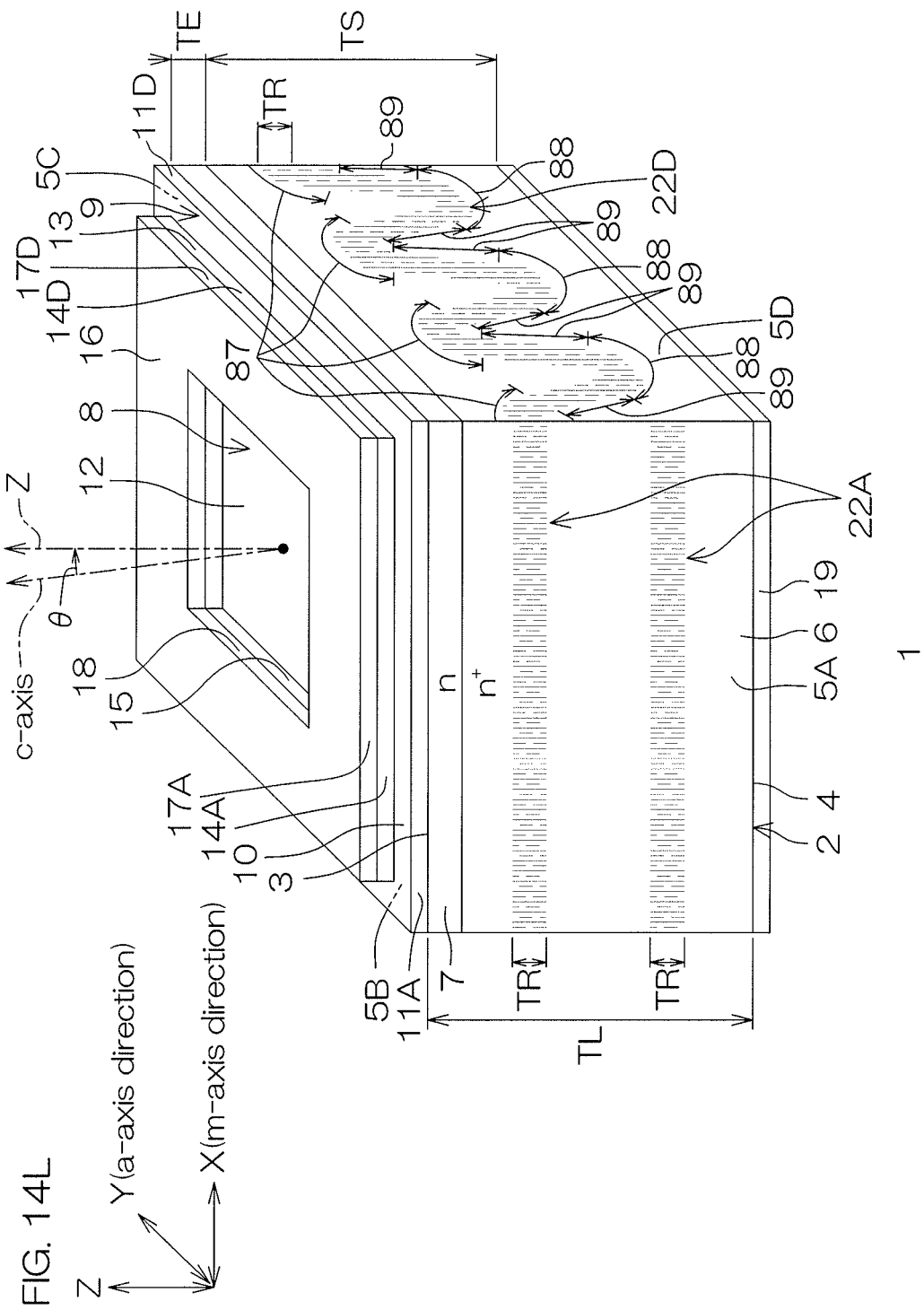

FIG. 14L is a perspective view showing the SiC semiconductor device 1 shown in FIG. 3 and is a perspective view showing a twelfth configuration example of the modified lines 22A to 22D. In the following, structures corresponding to the structures described with the SiC semiconductor device 1 shall be provided with the same reference symbols and description thereof shall be omitted.

The modified lines 22B and 22D according to the sixth configuration example are formed in band shapes extending rectilinearly along the tangential direction to the first main surface 3. On the other hand, the modified lines 22B and 22D according to the twelfth configuration example are formed in band shapes extending in curved shapes (curves) meandering from the first main surface 3 toward the second main surface 4. More specifically, the modified lines 22B and 22D according to the twelfth configuration example each include a plurality of first regions 87, a plurality of second regions 88, and a plurality of connecting regions 89.

The plurality of first regions 87 are positioned at regions at the first main surface 3 side. The plurality of second regions 88 are positioned at the second main surface 4 side with respect to the plurality of first regions 87. Each of the plurality of slope regions 83 connects the corresponding first region 87 and second region 88.

In this configuration, the modified lines 22A and 22C are formed in band shapes extending rectilinearly along the tangential direction of the first main surface 3. However, the modified lines 22A and 22C may instead be formed in band shapes extending in curves (curved shapes) meandering from the first main surface 3 toward the second main surface 4 like the modified lines 22B and 22D. That is, the modified lines 22A and 22C may also each include a plurality of first regions 87, a plurality of second regions 88, and a plurality of connecting regions 89.

Meandering cycles of the modified lines 22A to 22D are arbitrary. The modified lines 22A to 22D may each be formed in a single band shape extending in a shape curved concavely from the first main surface 3 toward the second main surface 4. In this case, each of the modified lines 22A to 22D may include two first regions 87, one second region 88, and two connecting regions 89.

Also, the modified lines 22A to 22D may each be formed in a single band shape extending in a shape curved convexly from the second main surface 4 toward the first main surface 3. In this case, each of the modified lines 22A to 22D may include one first region 87, two second regions 88, and two connecting regions 89.

The modified lines 22A to 22D according to the twelfth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the twelfth configuration example are formed, the same effects as in the case of forming the modified lines 22A to 22D according to the sixth configuration example can be exhibited. In particular, with the modified lines 22B and 22D according to the twelfth configuration example, the cleaving starting points can be formed in different regions in the thickness direction of the SiC semiconductor wafer structure 61 (SiC semiconductor wafer 41). The SiC semiconductor wafer structure 61 can thereby be cleaved appropriately even when the modified lines 22B and 22D constituted of a single layer are formed.

Figure 14M:
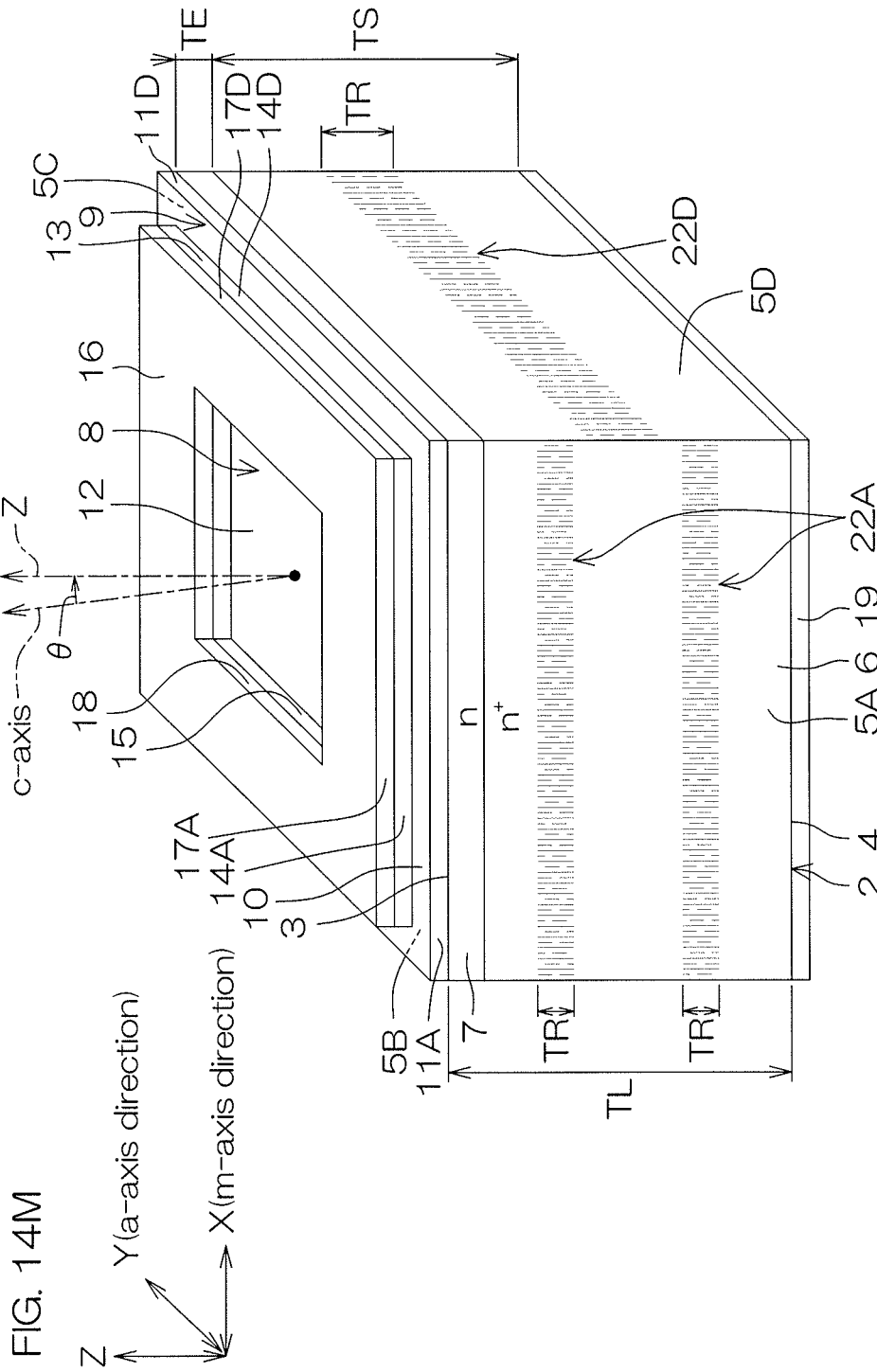

FIG. 14M is a perspective view showing the SiC semiconductor device 1 shown in FIG. 3 and is a perspective view showing a thirteenth configuration example of the modified lines. In the following, structures corresponding to the structures described with the SiC semiconductor device 1 shall be provided with the same reference symbols and description thereof shall be omitted.

With the sixth configuration example, the plurality of each of the modified lines 22A and 22C and the one layer of each of the modified lines 22B and 22D are formed under the condition that the occupying ratios RB and RD are less than the occupying ratios RA and RC (RB, RD<RA, RC).

On the other hand, with the thirteenth configuration example, the modified lines 22A to 22D are formed under a condition that the occupying ratios RB and RD are not less than the occupying ratios RA and RC (RB, RD≥RA, RC). In this configuration, a plurality (two layers or more; two layers in this configuration) of each of the modified lines 22A and 22C are formed and one layer or a plurality less than the numbers of layers of the modified lines 22A and 22C (one layer in this configuration) of each of the modified lines 22B and 22D are formed. The modified lines 22B and 22D are each preferably constituted of one layer.

The modified lines 22B and 22D are each preferably formed at an interval toward the second main surface 4 side from the first main surface 3 as in the sixth configuration example. Also, the modified lines 22B and 22D are each preferably formed at an interval toward the first main surface 3 side from the second main surface 4.

The modified lines 22A to 22D according to the thirteenth configuration example are formed by adjusting the light converging portion (focal point), etc., of the laser light in the step of forming the modified lines 70 (the modified lines 22A to 22D) (see also FIG. 10K).

Even in a case where the modified lines 22A to 22D according to the thirteenth configuration example are formed, the forming regions of the modified lines 22B and 22D can be restricted. The same effects as in the case of forming the modified lines 22A to 22D according to the sixth configuration example can thereby be exhibited.

From a standpoint of time reduction of the step of forming the modified lines 70 (the modified lines 22A to 22D), the thirteenth configuration is substantially the same as the sixth configuration example. However, from the standpoint of the occupying ratios RA to RD, the modified lines 22A to 22D according to the sixth configuration example are more preferable.

The SiC semiconductor device 1 that includes at least two types of the modified lines 22A to 22D according to the sixth configuration example, seventh configuration example, eighth configuration example, ninth configuration example, tenth configuration example, eleventh configuration example, twelfth configuration example, and thirteenth configuration example (hereinafter referred to simply as the "sixth to thirteenth configuration examples") at the same time may be formed.

Also, features of the modified lines 22A to 22D according to the sixth to thirteenth configuration examples may be combined among each other in any mode or any configuration. That is, the modified lines 22A to 22D having configurations combining at least two features among the features of the modified lines 22A to 22D according to the sixth to thirteenth configuration examples may be adopted.

For example, the features of the modified lines 22A to 22D according to the tenth configuration example may be combined with the features of the modified lines 22A to 22D according to the eleventh configuration example and the twelfth configuration example. In this case, band shaped modified lines 22A to 22D inclined downwardly from the first main surface 3 toward the second main surface 4 and meandering from the first main surface 3 toward the second main surface 4 are formed.

Figure 15:
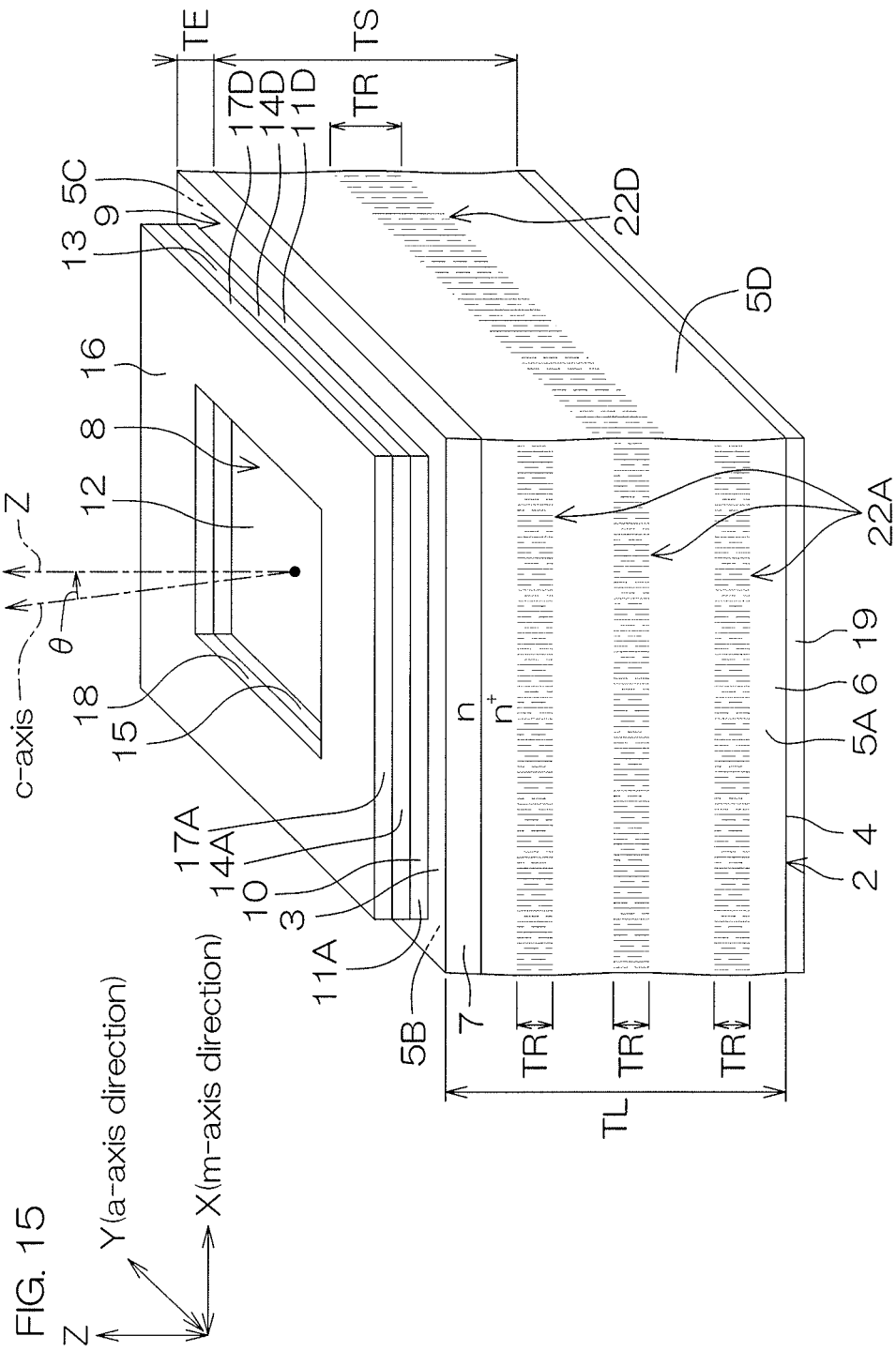
FIG. 15 is a perspective view showing an SiC semiconductor device according to a second preferred embodiment of the present invention and is a perspective view showing a structure applied with the modified lines according to the first configuration example.

FIG. 15 is a perspective view showing an SiC semiconductor device 91 according to a second preferred embodiment of the present invention and is a perspective view showing a structure applied with the modified lines 22A to 22D according to the first configuration example. In the following, structures corresponding to the structures described with the SiC semiconductor device 1 shall be provided with the same reference symbols and description thereof shall be omitted.

In this embodiment, the modified lines 22A to 22D according to the first configuration example are applied. However, the modified lines 22A to 22D according to the second to fifth configuration examples may be adopted in place of or in addition to the modified lines 22A to 22D according to the first configuration example. Also, the modified lines 22A to 22D having configurations combining at least two features among the features of the modified lines 22A to 22D according to the first to fifth configuration examples may be adopted.

Also, the modified lines 22A to 22D according to the sixth configuration example may be adopted in place of the modified lines 22A to 22D according to the first configuration example. Also, any one of the modified lines 22A to 22D according to the seventh to thirteenth configuration examples may be adopted in place of or in addition to the modified lines 22A to 22D according to the sixth configuration example. Also, the modified lines 22A to 22D having configurations combining at least two features among the features of the modified lines 22A to 22D according to the sixth to thirteenth configuration examples may be adopted.

Referring to FIG. 15, in this embodiment, the insulating side surfaces 11A to 11D of the main surface insulating layer 10 are formed at intervals toward the inner region from the side surfaces 5A to 5D of the SiC semiconductor layer 2. In plan view, the main surface insulating layer 10 exposes a peripheral edge portion of the first main surface 3.

The main surface insulating layer 10, together with the resin layer 16 and the passivation layer 13, exposes the peripheral edge portion of the first main surface 3. In this embodiment, the insulating side surfaces 11A to 11D of the main surface insulating layer 10 are formed flush with the resin side surfaces 17A to 17D of the resin layer 16 and the side surfaces 14A to 14D of the passivation layer 13. In this embodiment, the resin side surfaces 11A to 11D demarcate a dicing street.

The main surface insulating layer 10 is formed by performing a step of removing the main surface insulating layer 10 by an etching method after the step of removing the passivation layer 13 in the step of FIG. 10I described above. In this case, in the step of FIG. 10K described above, the laser light may be irradiated directly onto an interior of the SiC semiconductor wafer structure 61 from the first main surface 62 side of the SiC semiconductor wafer structure 61 and not via the main surface insulating layer 10.

As described above, even with the SiC semiconductor device 91, the same effects as the effects described for the SiC semiconductor device 1 can be exhibited. However, in terms of improving the insulating property between the side surfaces 5A to 5D of the SiC semiconductor layer 2 and the first main surface electrode layer 12, the structure of the SiC semiconductor device 1 according to the first preferred embodiment is preferable.

Figure 16:
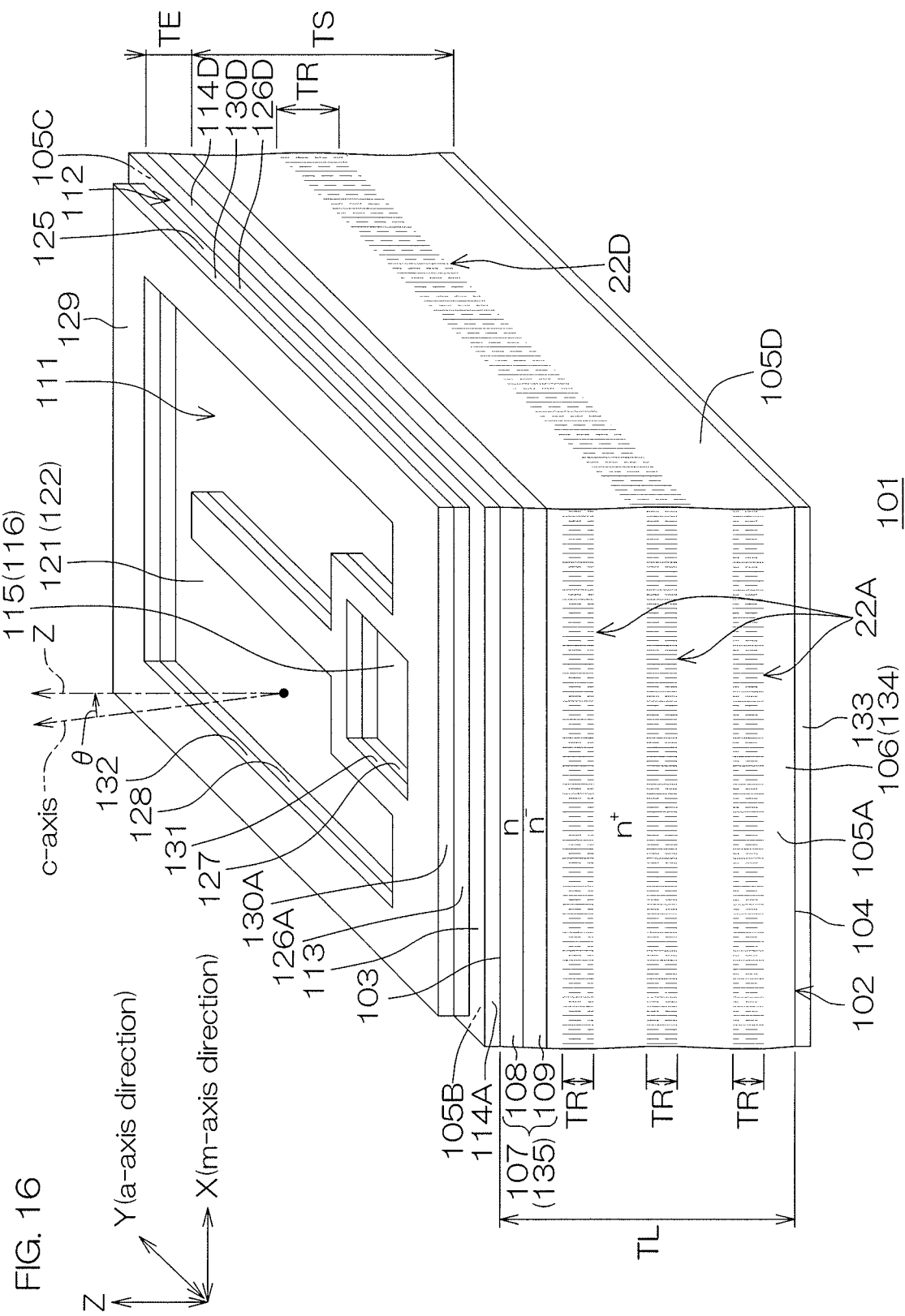
FIG. 16 is a perspective view as viewed from one angle of an SiC semiconductor device according to a third preferred embodiment of the present invention and is a perspective view showing a structure applied with the modified lines according to the first configuration example.
Figure 17:
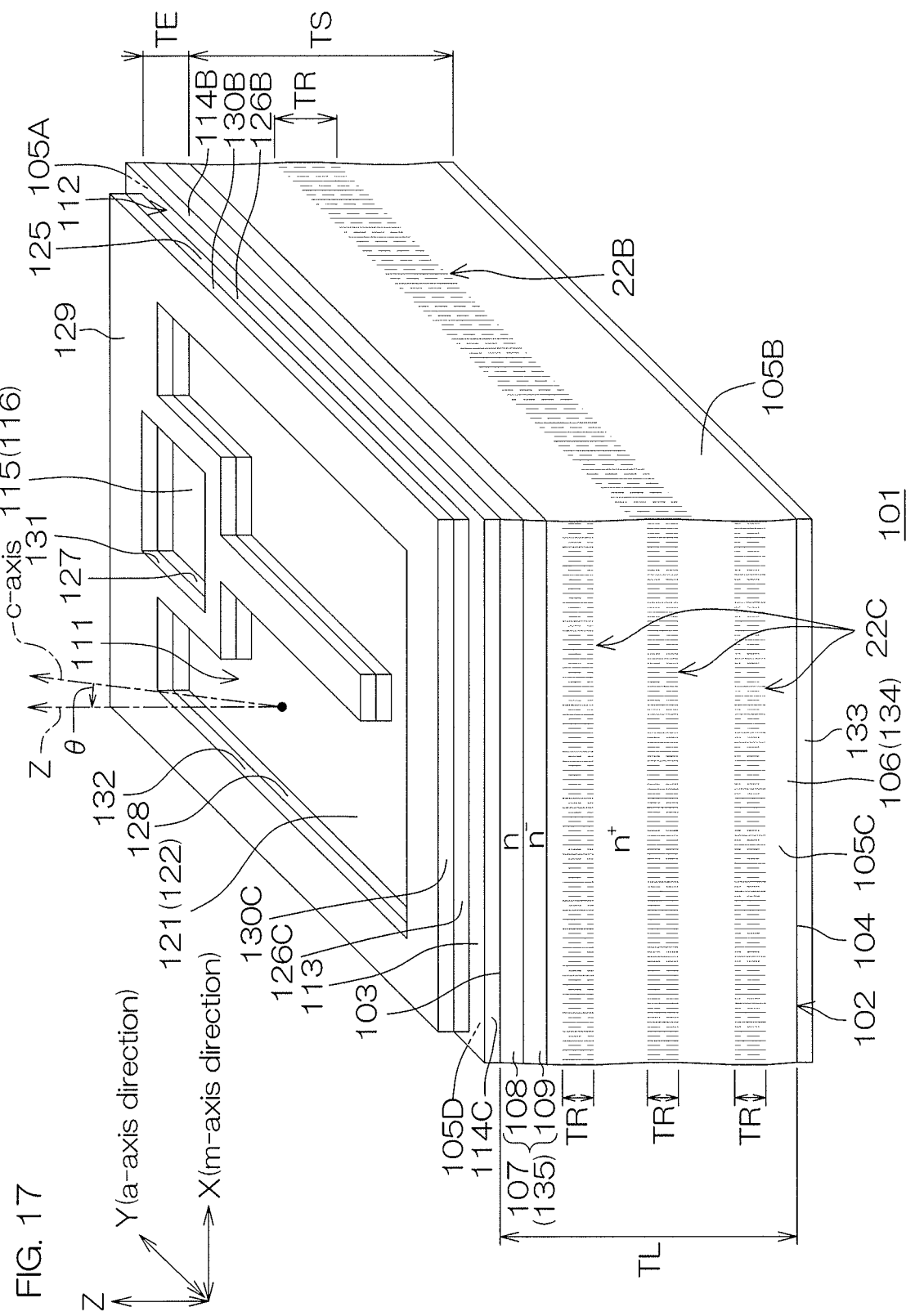
FIG. 17 is a perspective view as viewed from another angle of the SiC semiconductor device shown in FIG. 16.
Figure 18:
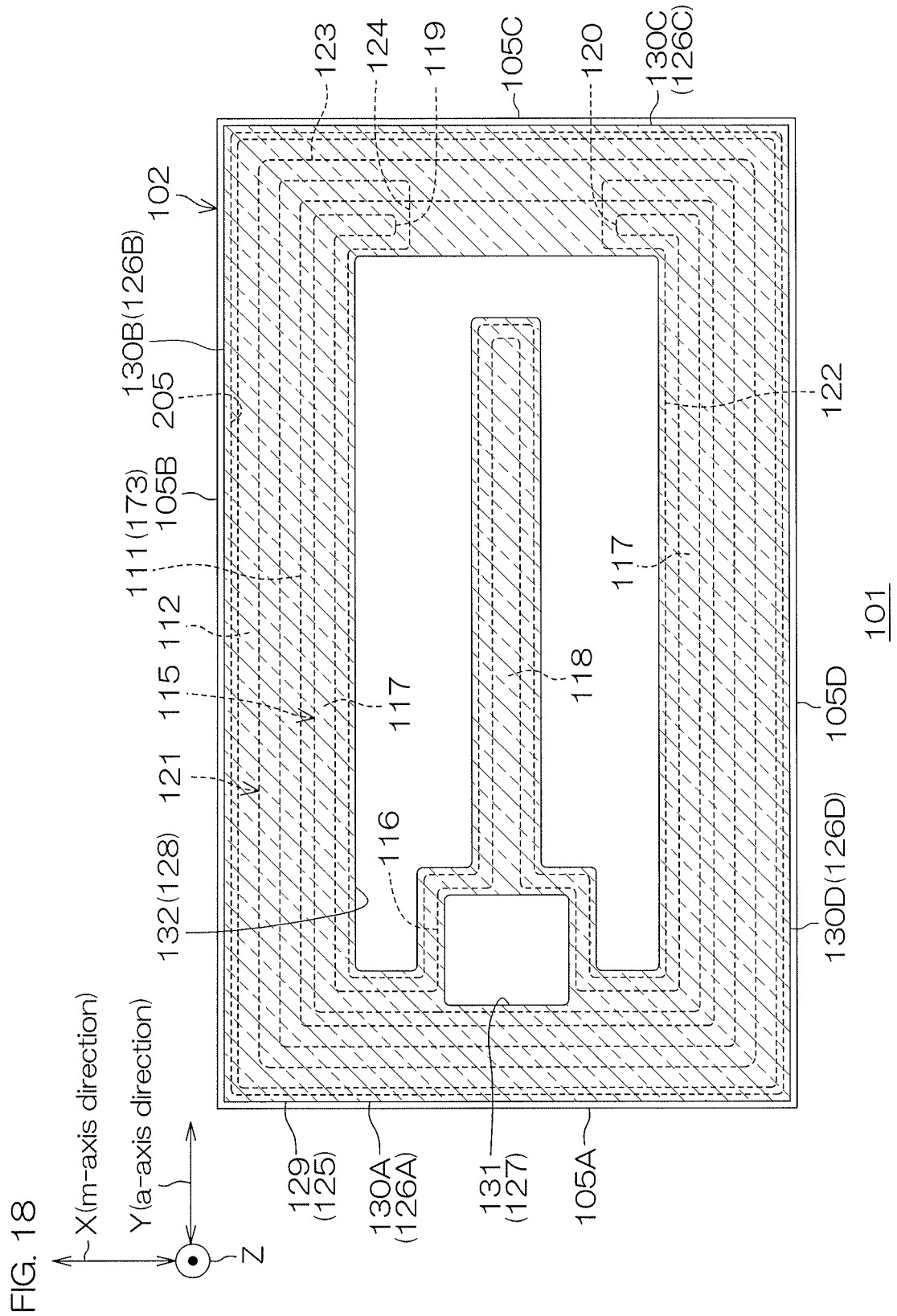
FIG. 18 is a plan view of the SiC semiconductor device shown in FIG. 16.
Figure 19:
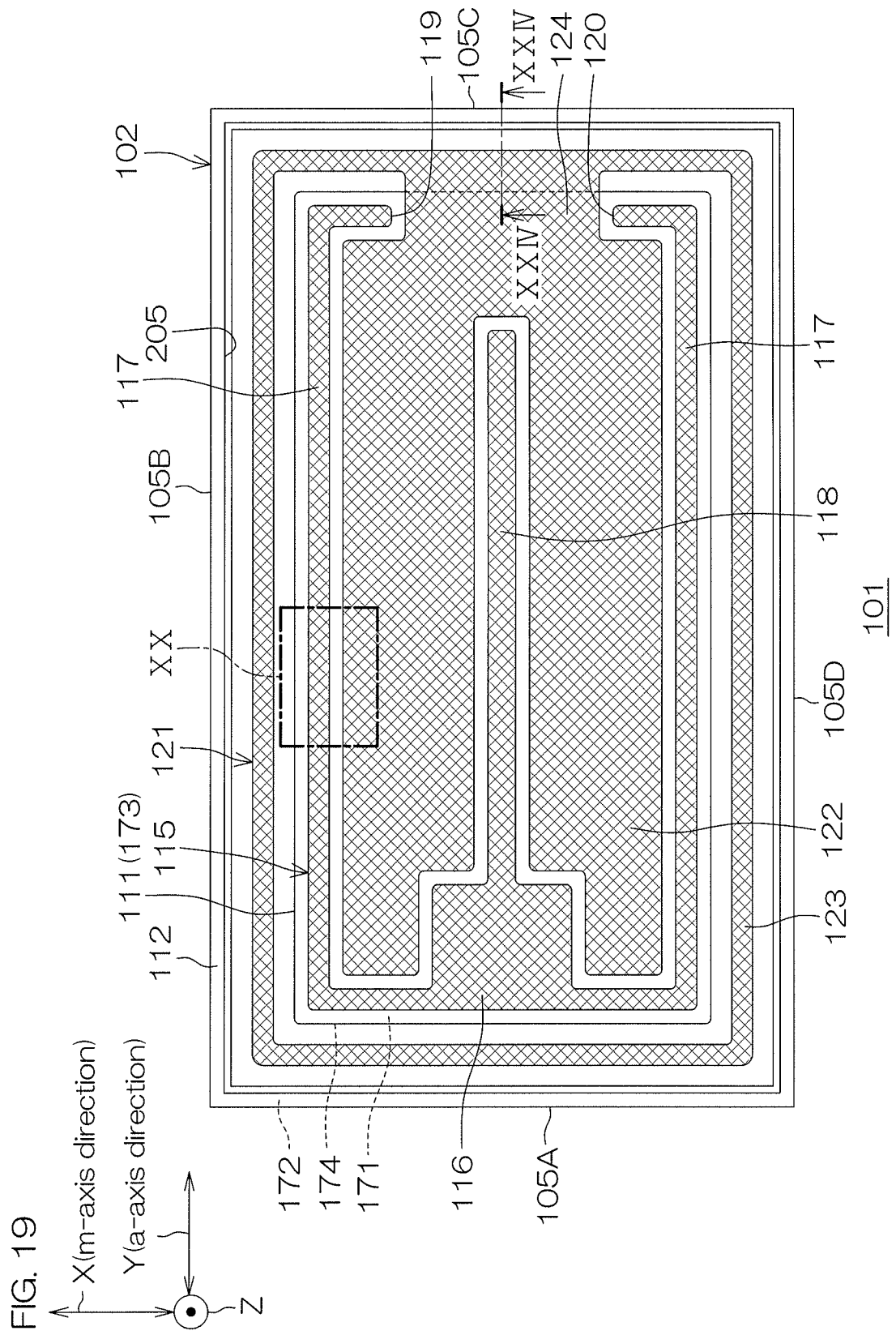
FIG. 19 is a plan view with a resin layer removed from FIG. 18.

FIG. 16 is a perspective view as viewed from one angle of an SiC semiconductor device 101 according to a third preferred embodiment of the present invention and is a perspective view showing a structure applied with the modified lines 22A to 22D according to the first configuration example. FIG. 17 is a perspective view as viewed from another angle of the SiC semiconductor device 101 shown in FIG. 16. FIG. 18 is a plan view of the SiC semiconductor device 101 shown in FIG. 16. FIG. 19 is a plan view with a resin layer 129 removed from FIG. 18.

In this embodiment, the modified lines 22A to 22D according to the first configuration example are applied. That is, in a manufacturing process of the SiC semiconductor device 101, the same steps as the steps of FIG. 10A to FIG. 10M described above are applied.

In the SiC semiconductor device 101, any one of the modified lines 22A to 22D according to the second to fifth configuration examples may be adopted in place of or in addition to the modified lines 22A to 22D according to the first configuration example. Also, the modified lines 22A to 22D having configurations combining at least two features among the features of the modified lines 22A to 22D according to the first to fifth configuration examples may be adopted.

Also, in the SiC semiconductor device 101, the modified lines 22A to 22D according to the sixth configuration example may be adopted in place of the modified lines 22A to 22D according to the first configuration example. Also, any one of the modified lines 22A to 22D according to the seventh to thirteenth configuration examples may be adopted in place of or in addition to the modified lines 22A to 22D according to the sixth configuration example. Also, the modified lines 22A to 22D having configurations combining at least two features among the features of the modified lines 22A to 22D according to the sixth to thirteenth configuration examples may be adopted.

Referring to FIG. 16 to FIG. 19, the SiC semiconductor device 101 includes an SiC semiconductor layer 102. The SiC semiconductor layer 102 includes a 4H-SiC monocrystal as an example of an SiC monocrystal constituted of a hexagonal crystal. The SiC semiconductor layer 102 is formed in a chip shape of rectangular parallelepiped shape.

The SiC semiconductor layer 102 has a first main surface 103 at one side, a second main surface 104 at another side, and side surfaces 105A, 105B, 105C, and 105D connecting the first main surface 103 and the second main surface 104. The first main surface 103 and the second main surface 104 are formed in quadrilateral shapes (rectangular shapes here) in a plan view as viewed in a normal direction Z thereof (hereinafter referred to simply as "plan view").

The first main surface 103 is a device surface in which a functional device is formed. The second main surface 104 is constituted of a ground surface having grinding marks. The side surfaces 105A to 105D are each constituted of a smooth cleavage surface facing a crystal plane of the SiC monocrystal. The side surfaces 105A to 105D are free from a grinding mark.

A thickness TL of the SiC semiconductor layer 102 may be not less than 40 μm and not more than 200 μm. The thickness TL may be not less than 40 μm and not more than 60 μm, not less than 60 μm and not more than 80 μm, not less than 80 μm and not more than 100 μm, not less than 100 μm and not more than 120 μm, not less than 120 μm and not more than 140 μm, not less than 140 μm and not more than 160 μm, not less than 160 μm and not more than 180 μm, or not less than 180 μm and not more than 200 μm. The thickness TL is preferably not less than 60 μm and not more than 150 μm.

In this embodiment, the first main surface 103 and the second main surface 104 face the c-planes of the SiC monocrystal. The first main surface 103 faces the (0001) plane (silicon plane). The second main surface 104 faces the (000-1) plane (carbon plane) of the SiC monocrystal.

The first main surface 103 and the second main surface 104 have an off angle θ inclined at an angle of not more than 10° in the [11-20] direction with respect to the c-planes of the SiC monocrystal. The normal direction Z is inclined by just the off angle θ with respect to the c-axis ([0001] direction) of the SiC monocrystal.

The off angle θ may be not less than 0° and not more than 5.0°. The off angle θ may be set in an angular range of not less than 0° and not more than 1.0°, not less than 1.0° and not more than 1.5°, not less than 1.5° and not more than 2.0°, not less than 2.0° and not more than 2.5°, not less than 2.5° and not more than 3.0°, not less than 3.0° and not more than 3.5°, not less than 3.5° and not more than 4.0°, not less than 4.0° and not more than 4.5°, or not less than 4.5° and not more than 5.0°. The off angle θ preferably exceeds 0°. The off angle θ may be less than 4.0°.

The off angle θ may be set in an angular range of not less than 3.0° and not more than 4.5°. In this case, the off angle θ is preferably set in an angular range of not less than 3.0° and not more than 3.5°, or not less than 3.5° and not more than 4.0°. The off angle θ may be set in an angular range of not less than 1.5° and not more than 3.0°. In this case, the off angle θ is preferably set in an angular range of not less than 1.5° and not more than 2.0°, or not less than 2.0° and not more than 2.5°.

Lengths of the side surfaces 105A to 105D may each be not less than 1 mm and not more than 10 mm (for example, not less than 2 mm and not more than 5 mm). In this embodiment, surface areas of the side surfaces 105B and 105D exceed surface areas of the side surfaces 105A and 105C. The first main surface 103 and the second main surface 104 may be formed in square shapes in plan view. In this case, the surface areas of the side surfaces 105A and 105C are equal to the surface areas of the side surfaces 105B and 105D.

In this embodiment, the side surface 105A and the side surface 105C extend in a first direction X and oppose each other in a second direction Y intersecting the first direction X. In this embodiment, the side surface 105B and the side surface 105D extend in the second direction Y and oppose each other in the first direction X. More specifically, the second direction Y is orthogonal to the first direction X.

In this embodiment, the first direction X is set to the m-axis direction ([1-100] direction) of the SiC monocrystal. The second direction Y is set to the a-axis direction ([11-20] direction) of the SiC monocrystal.

The side surface 105A and the side surface 105C form short sides of the SiC semiconductor layer 102 in plan view. The side surface 105A and the side surface 105C are formed by the a-planes of the SiC monocrystal and oppose each other in the a-axis direction. The side surface 105A is formed by the (−1-120) plane of the SiC monocrystal. The side surface 105C is formed by the (11-20) plane of the SiC monocrystal.

The side surface 105A and the side surface 105C may form inclined surfaces that, when a normal to the first main surface 103 is taken as a basis, are inclined toward the c-axis direction ([0001] direction) of the SiC monocrystal with respect to the normal. In this case, the side surface 105A and the side surface 105C may be inclined at an angle in accordance with the off angle θ with respect to the normal to the first main surface 103 when the normal to the first main surface 103 is 0°. The angle in accordance with the off angle θ may be equal to the off angle θ or may be an angle that exceeds 0° and is less than the off angle θ.

The side surface 105B and the side surface 105D form long sides of the SiC semiconductor layer 102 in plan view. The side surface 105B and the side surface 105D are formed by the m-planes of the SiC monocrystal and oppose each other in the m-axis direction. The side surface 105B is formed by the (−1100) plane of the SiC monocrystal. The side surface 105D is formed by the (1-100) plane of the SiC monocrystal. The side surface 105B and the side surface 105D extend in plane shapes along the normal to the first main surface 103. More specifically, the side surface 105B and the side surface 105D are formed substantially perpendicular to the first main surface 103 and the second main surface 104.

In this embodiment, the SiC semiconductor layer 102 has a laminated structure that includes an n$^+$ type SiC semiconductor substrate 106 and an n type SiC epitaxial layer 107. The SiC semiconductor substrate 106 and the SiC epitaxial layer 107 respectively correspond to the SiC semiconductor substrate 6 and the SiC epitaxial layer 7 according to the first preferred embodiment. The second main surface 104 of the SiC semiconductor layer 102 is formed by the SiC semiconductor substrate 106.

The first main surface 103 is formed by the SiC epitaxial layer 107. The side surfaces 105A to 105D of the SiC semiconductor layer 102 are formed by the SiC semiconductor substrate 106 and the SiC epitaxial layer 107.

A thickness TS of the SiC semiconductor substrate 106 may be not less than 40 µm and not more than 150 µm. The thickness TS may be not less than 40 µm and not more than 50 µm, not less than 50 µm and not more than 60 µm, not less than 60 µm and not more than 70 µm, not less than 70 µm and not more than 80 µm, not less than 80 µm and not more than 90 µm, not less than 90 µm and not more than 100 µm, not less than 100 µm and not more than 110 µm, not less than 110 µm and not more than 120 µm, not less than 120 µm and not more than 130 µm, not less than 130 µm and not more than 140 µm, or not less than 140 µm and not more than 150 µm. The thickness TS is preferably not less than 40 µm and not more than 130 µm. By thinning the SiC semiconductor substrate 106, a current path is shortened and reduction of resistance value can thus be achieved.

A thickness TE of the SiC epitaxial layer 107 may be not less than 1 µm and not more than 50 µm. The thickness TE may be not less than 1 µm and not more than 5 µm, not less than 5 µm and not more than 10 µm, not less than 10 µm and not more than 15 µm, not less than 15 µm and not more than 20 µm, not less than 20 µm and not more than 25 µm, not less than 25 µm and not more than 30 µm, not less than 30 µm and not more than 35 µm, not less than 35 µm and not more than 40 µm, not less than 40 µm and not more than 45 µm, or not less than 45 µm and not more than 50 µm. The thickness TE is preferably not less than 5 µm and not more than 15 µm.

An n type impurity concentration of the SiC epitaxial layer 107 is not more than an n type impurity concentration of the SiC semiconductor substrate 106. More specifically, the n type impurity concentration of the SiC epitaxial layer 107 is less than the n type impurity concentration of the SiC semiconductor substrate 106. The n type impurity concentration of the SiC semiconductor substrate 106 may be not less than $1.0\times10^{18}$ cm$^{-3}$ and not more than $1.0\times10^{21}$ cm$^{-3}$. The n type impurity concentration of the SiC epitaxial layer 107 may be not less than $1.0\times10^{15}$ cm$^{-3}$ and not more than $1.0\times10^{18}$ cm$^{-3}$.

In this embodiment, the SiC epitaxial layer 107 has a plurality of regions having different n type impurity concentrations along the normal direction Z. More specifically, the SiC epitaxial layer 107 includes a high concentration region 108 having a comparatively high n type impurity concentration and a low concentration region 109 having an n type impurity concentration lower than the high concentration region 108. The high concentration region 108 is formed in a region at the first main surface 103 side. The low concentration region 109 is formed in a region at the second main surface 104 side with respect to the high concentration region 108.

The n type impurity concentration of the high concentration region 108 may be not less than $1\times10^{16}$ cm$^{-3}$ and not more than $1\times10^{18}$ cm$^{-3}$. The n type impurity concentration of the low concentration region 109 may be not less than $1\times10^{15}$ cm$^{-3}$ and not more than $1\times10^{16}$ cm$^{-3}$.

A thickness of the high concentration region 108 is not more than a thickness of the low concentration region 109. More specifically, the thickness of the high concentration region 108 is less than the thickness of the low concentration region 109. The thickness of the high concentration region 108 is less than one-half the total thickness of the SiC epitaxial layer 107.

The SiC semiconductor layer 102 includes an active region 111 and an outer region 112. The active region 111 is a region in which a vertical MISFET (metal insulator field effect transistor) is formed as an example of a functional device. In plan view, the active region 111 is formed in a central portion of the SiC semiconductor layer 102 at intervals toward an inner region from the side surfaces 105A to 105D. In plan view, the active region 111 is formed in a quadrilateral shape (a rectangular shape in this embodiment) having four sides parallel to the four side surfaces 105A to 105D.

The outer region 112 is a region at an outer side of the active region 111. The outer region 112 is formed in a region between the side surfaces 105A to 105D and peripheral edges of the active region 111. The outer region 112 is formed in an endless shape (a quadrilateral annular shape in this embodiment) surrounding the active region 111 in plan view.

The SiC semiconductor device 101 includes a main surface insulating layer 113 formed on the first main surface 103. The main surface insulating layer 113 selectively covers the active region 111 and the outer region 112. The main surface insulating layer 113 may include silicon oxide (SiO$_2$).

The main surface insulating layer 113 has four insulating side surfaces 114A, 114B, 114C, and 114D exposed from the side surfaces 105A to 105D. The insulating side surfaces 114A to 114D are continuous to the side surfaces 105A to 105D. The insulating side surfaces 114A to 114D are formed flush with the side surfaces 105A to 105D. The insulating side surfaces 114A to 114D are constituted of cleavage surfaces.

A thickness of the main surface insulating layer 113 may be not less than 1 µm and not more than 50 µm. The thickness of the main surface insulating layer 113 may be not less than 1 µm and not more than 10 µm, not less than 10 µm and not more than 20 µm, not less than 20 µm and not more than 30 µm, not less than 30 µm and not more than 40 µm, or not less than 40 µm and not more than 50 µm.

The SiC semiconductor device 101 includes a main surface gate electrode layer 115 formed on the main surface insulating layer 113 as one of first main surface electrode layers. A gate voltage is applied to the main surface gate electrode layer 115. The gate voltage may be not less than 10 V and not more than 50 V (for example, approximately 30 V). The main surface gate electrode layer 115 penetrates through the main surface insulating layer 113 and is electrically connected to an arbitrary region of the SiC semiconductor layer 102.

The main surface gate electrode layer 115 includes a gate pad 116 and gate fingers 117 and 118. The gate pad 116 and the gate fingers 117 and 118 are arranged in the active region 111.

The gate pad 116 is formed along the side surface 105A in plan view. The gate pad 116 is formed along a central region of the side surface 105A in plan view. The gate pad 116 may be formed along a corner portion connecting any two of the side surfaces 105A to 105D in plan view. The gate pad 116 may be formed in a quadrilateral shape in plan view.

The gate fingers 117 and 118 include an outer gate finger 117 and an inner gate finger 118. The outer gate finger 117 is led out from the gate pad 116 and extends in a band shape along a peripheral edge of the active region 111. In this embodiment, the outer gate finger 117 is formed along the three side surfaces 105A, 105B, and 105D such as to demarcate an inner region of the active region 111 from three directions.

The outer gate finger 117 has a pair of open end portions 119 and 120. The pair of open end portions 119 and 120 are formed in a region opposing the gate pad 116 across the inner region of the active region 111. In this embodiment, the pair of open end portions 119 and 120 are formed along the side surface 105C.

The inner gate finger 118 is led out from the gate pad 116 to the inner region of the active region 111. The inner gate finger 118 extends in a band shape in the inner region of the active region 111. The inner gate finger 118 extends from the gate pad 116 toward the side surface 105C.

The SiC semiconductor device 101 includes a main surface source electrode layer 121 formed on the main surface insulating layer 113 as one of the first main surface electrode layers. A source voltage is applied to the main surface source electrode layer 121. The source voltage may be a reference voltage (for example, a GND voltage). The main surface source electrode layer 121 penetrates through the main surface insulating layer 113 and is electrically connected to an arbitrary region of the SiC semiconductor layer 102. In this embodiment, the main surface source electrode layer 121 includes a source pad 122, a source routing wiring 123, and a source connection portion 124.

The source pad 122 is formed in the active region 111 at intervals from the gate pad 116 and the gate fingers 117 and 118. The source pad 122 is formed in a C shape (an inverted C shape in FIG. 18 and FIG. 19) in plan view such as to cover a region of C shape (inverted C shape in FIG. 18 and FIG. 19) demarcated by the gate pad 116 and the gate fingers 117 and 118.

The source routing wiring 123 is formed in the outer region 112. The source routing wiring 123 extends in a band shape along the active region 111. In this embodiment, the source routing wiring 123 is formed in an endless shape (a quadrilateral annular shape in this embodiment) surrounding the active region 111 in plan view. The source routing wiring 123 is electrically connected to the SiC semiconductor layer 102 in the outer region 112.

The source connection portion 124 connects the source pad 122 and the source routing wiring 123. The source connection portion 124 is formed in a region between the pair of open end portions 119 and 120 of the outer gate finger 117. The source connection portion 124 crosses a boundary region between the active region 111 and the outer region 112 from the source pad 122 and is connected to the source routing wiring 123.

The MISFET formed in the active region 111 includes an npn type parasitic bipolar transistor due to its structure. When an avalanche current generated in the outer region 112 flows into the active region 111, the parasitic bipolar transistor is switched to an on state. In this case, control of the MISFET may become unstable, for example, due to latchup.

Therefore, with the SiC semiconductor device 101, the structure of the main surface source electrode layer 121 is used to form an avalanche current absorbing structure that absorbs the avalanche current generated in the outer region 112. More specifically, the avalanche current generated in the outer region 112 is absorbed by the source routing wiring 123 and reaches the source pad 122 via the source connection portion 124. If a conductive wire (for example, a bonding wire) for external connection is connected to the source pad 122, the avalanche current is taken out by this conductive wire.

Switching of the parasitic bipolar transistor to the on state by an undesirable current generated in the outer region 112 can thereby be suppressed. Latchup can thus be suppressed and therefore stability of control of the MISFET can be improved.

The SiC semiconductor device 101 includes a passivation layer 125 (insulating layer) formed on the main surface insulating layer 113. The passivation layer 125 may have a single layer structure constituted of a silicon oxide layer or a silicon nitride layer. The passivation layer 125 may have a laminated structure that includes a silicon oxide layer and a silicon nitride layer. The silicon oxide layer may be formed on the silicon nitride layer. The silicon nitride layer may be formed on the silicon oxide layer. In this embodiment, the passivation layer 125 has a single layer structure constituted of a silicon nitride layer.

The passivation layer 125 includes four side surfaces 126A, 126B, 126C, and 126D. In plan view, the side surfaces 126A to 126D of the passivation layer 125 are formed at intervals toward the inner region from the side surfaces 105A to 105D of the SiC semiconductor layer 102. In plan view, the passivation layer 125 exposes a peripheral edge portion of the SiC semiconductor layer 102. The passivation layer 125 exposes the main surface insulating layer 113. The side surfaces 126A to 126D of the passivation layer 125 may be formed flush with the side surfaces 105A to 105D of the SiC semiconductor layer 102.

The passivation layer 125 selectively covers the main surface gate electrode layer 115 and the main surface source electrode layer 121. The passivation layer 125 includes a gate sub pad opening 127 and a source sub pad opening 128. The gate sub pad opening 127 exposes the gate pad 116. The source sub pad opening 128 exposes the source pad 122.

A thickness of the passivation layer 125 may be not less than 1 μm and not more than 50 μm. The thickness of the passivation layer 125 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 101 includes a resin layer 129 (insulating layer) formed on the passivation layer 125. The passivation layer 125 and the resin layer 129 form a single insulating laminated structure (insulating layer). In FIG. 18, the resin layer 129 is shown with hatching.

The resin layer 129 may include a negative type or positive type photosensitive resin. In this embodiment, the resin layer 129 includes a polybenzoxazole as an example of a positive type photosensitive resin. The resin layer 129 may include a polyimide as an example of a negative type photosensitive resin.

The resin layer 129 selectively covers the main surface gate electrode layer 115 and the main surface source electrode layer 121. The resin layer 129 includes four resin side surfaces 130A, 130B, 130C, and 130D. The resin side surfaces 130A to 130D are formed at intervals toward the inner region from the side surfaces 105A to 105D of the SiC semiconductor layer 102. The resin layer 129, together with the passivation layer 125, exposes the main surface insulating layer 113. In this embodiment, the resin side surfaces 130A to 130D are formed flush with the side surfaces 126A to 126D of the passivation layer 125.

The resin side surfaces 130A to 130D of the resin layer 129, with the side surfaces 105A to 105D of the SiC semiconductor layer 102, demarcate a dicing street. In this embodiment, the side surfaces 126A to 126D of the passivation layer 125 also demarcate the dicing street. According to the dicing street, it is made unnecessary to physically cut the resin layer 129 and the passivation layer 125 when cutting out the SiC semiconductor device 101 from a single SiC semiconductor wafer. The SiC semiconductor device 101 can thereby be cut out smoothly from the single SiC semiconductor wafer. Also, insulation distances from the side surfaces 105A to 105D can be increased.

A width of the dicing street may be not less than 1 μm and not more than 25 μm. The width of the dicing street may be not less than 1 μm and not more than 5 μm, not less than 5 μm and not more than 10 μm, not less than 10 μm and not more than 15 μm, not less than 15 μm and not more than 20 μm, or not less than 20 μm and not more than 25 μm.

The resin layer 129 includes a gate pad opening 131 and a source pad opening 132. The gate pad opening 131 exposes the gate pad 116. The source pad opening 132 exposes the source pad 122.

The gate pad opening 131 is in communication with the gate sub pad opening 127 of the passivation layer 125. Inner walls of the gate pad opening 131 may be positioned at outer sides of inner walls of the gate sub pad opening 127. The inner walls of the gate pad opening 131 may be positioned at inner sides of the inner walls of the gate sub pad opening 127. The resin layer 129 may cover the inner walls of the gate sub pad opening 127.

The source pad opening 132 is in communication with the source sub pad opening 128 of the passivation layer 125. The inner walls of the gate pad opening 131 may be positioned at outer sides of inner walls of the source sub pad opening 128. Inner walls of the source pad opening 132 may be positioned at inner sides of the inner walls of the source sub pad opening 128. The resin layer 129 may cover the inner walls of the source sub pad opening 128.

A thickness of the resin layer 129 may be not less than 1 μm and not more than 50 μm. The thickness of the resin layer 129 may be not less than 1 μm and not more than 10 μm, not less than 10 μm and not more than 20 μm, not less than 20 μm and not more than 30 μm, not less than 30 μm and not more than 40 μm, or not less than 40 μm and not more than 50 μm.

The SiC semiconductor device 101 includes a drain electrode layer 133 formed on the second main surface 104 as a second main surface electrode layer. The drain electrode layer 133 forms an ohmic contact with the second main surface 104 (SiC semiconductor substrate 106). That is, the SiC semiconductor substrate 106 is formed as a drain region 134 of the MISFET. Also, the SiC epitaxial layer 107 is formed as a drift region 135 of the MISFET. A maximum voltage applicable between the main surface source electrode layer 121 and the drain electrode layer 133 in an off state may be not less than 1000 V and not more than 10000 V.

The drain electrode layer 133 may include at least one layer among a Ti layer, an Ni layer, an Au layer, an Ag layer, and an Al layer. The drain electrode layer 133 may have a single layer structure that includes a Ti layer, an Ni layer, an Au layer, an Ag layer, or an Al layer. The drain electrode layer 133 may have a laminated structure in which at least two layers among a Ti layer, an Ni layer, an Au layer, an Ag layer, and an Al layer are laminated in any mode. The drain electrode layer 133 may have a four-layer structure that includes a Ti layer, an Ni layer, an Au layer, and an Ag layer that are laminated in that order from the second main surface 104.

The SiC semiconductor device 101 includes the plurality of modified lines 22A to 22D according to the first configuration example that are formed at the side surfaces 105A to 105D of the SiC semiconductor layer 102. The structure of the modified lines 22A to 22D of the SiC semiconductor device 101 is the same as the structure of the modified lines 22A to 22D of the SiC semiconductor device 1 with the exception of the point of being formed in the SiC semiconductor layer 102 instead of the SiC semiconductor layer 2.

The descriptions of the modified lines 22A to 22D of the SiC semiconductor device 1 apply respectively to the modified lines 22A to 22D of the SiC semiconductor device 101. Specific descriptions of the modified lines 22A to 22D of the SiC semiconductor device 101 shall be omitted.

Figure 20:
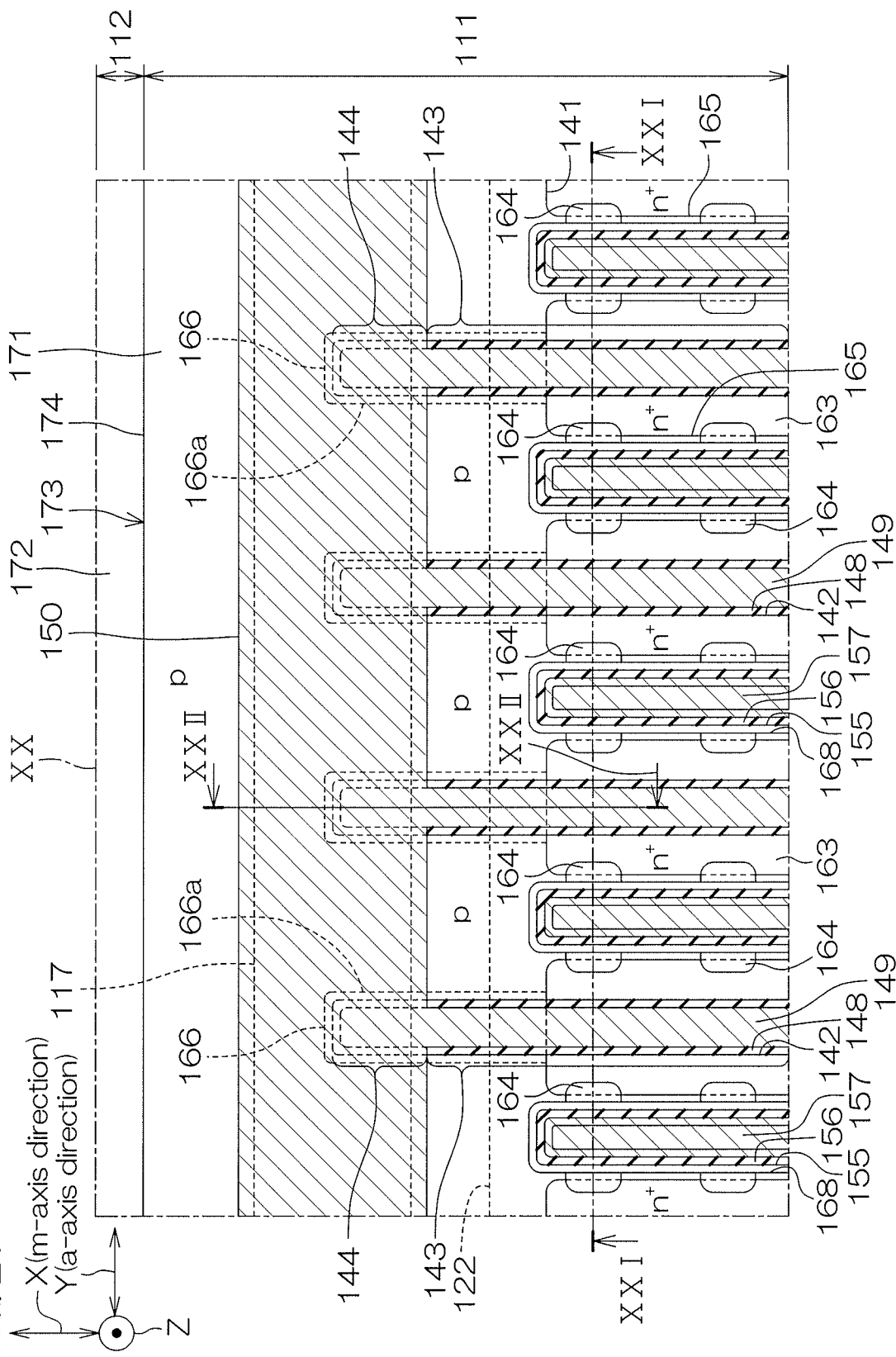
FIG. 20 is an enlarged view of a region XX shown in FIG. 19 and is a diagram for describing the structure of a first main surface of an SiC semiconductor layer.
Figure 21:
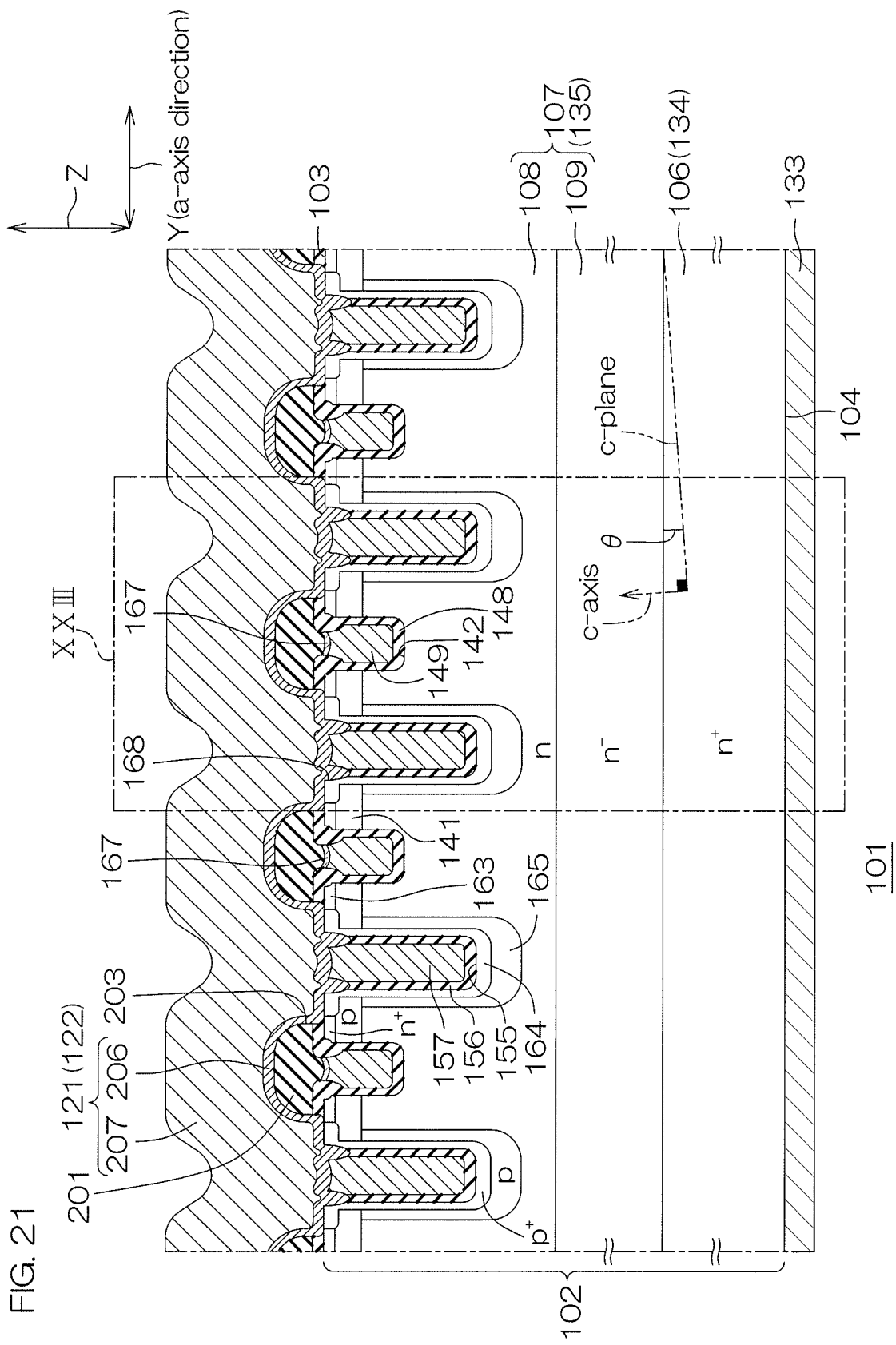
FIG. 21 is a sectional view taken along line XXI-XXI shown in FIG. 20.
Figure 22:
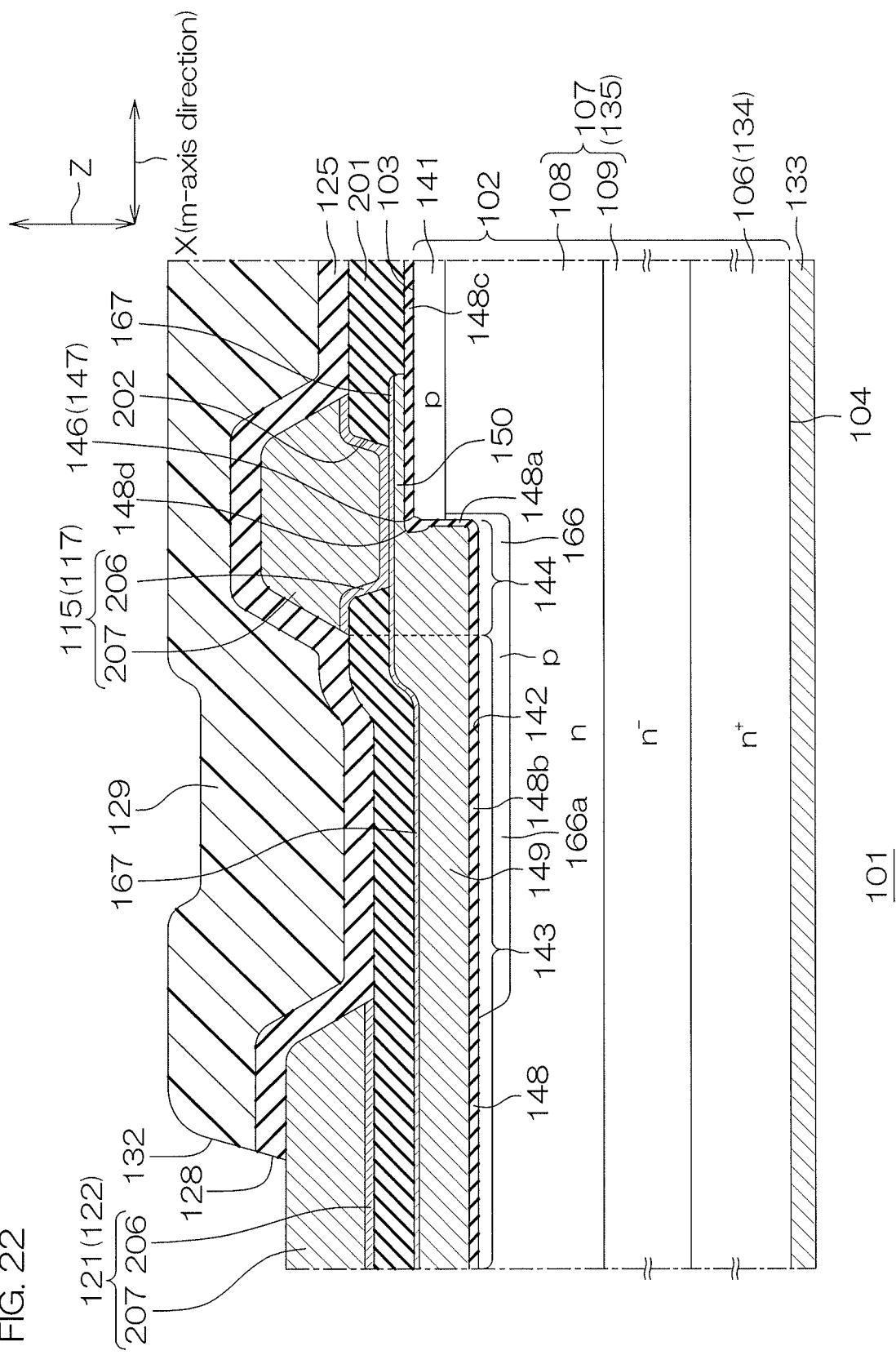
FIG. 22 is a sectional view taken along line XXII-XXII shown in FIG. 20.
Figure 23:
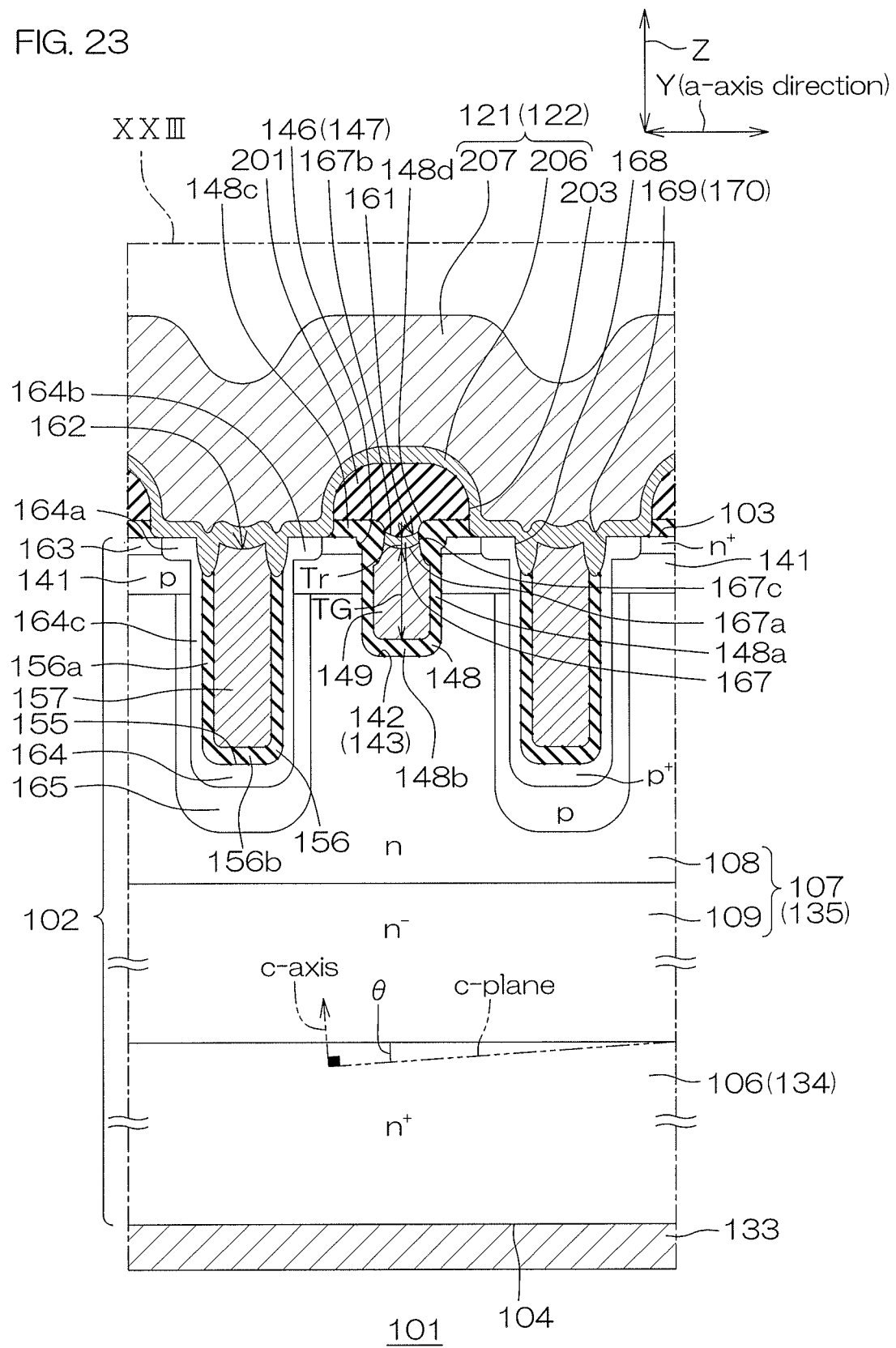
FIG. 23 is an enlarged view of a region XXIII shown in FIG. 21.
Figure 24:
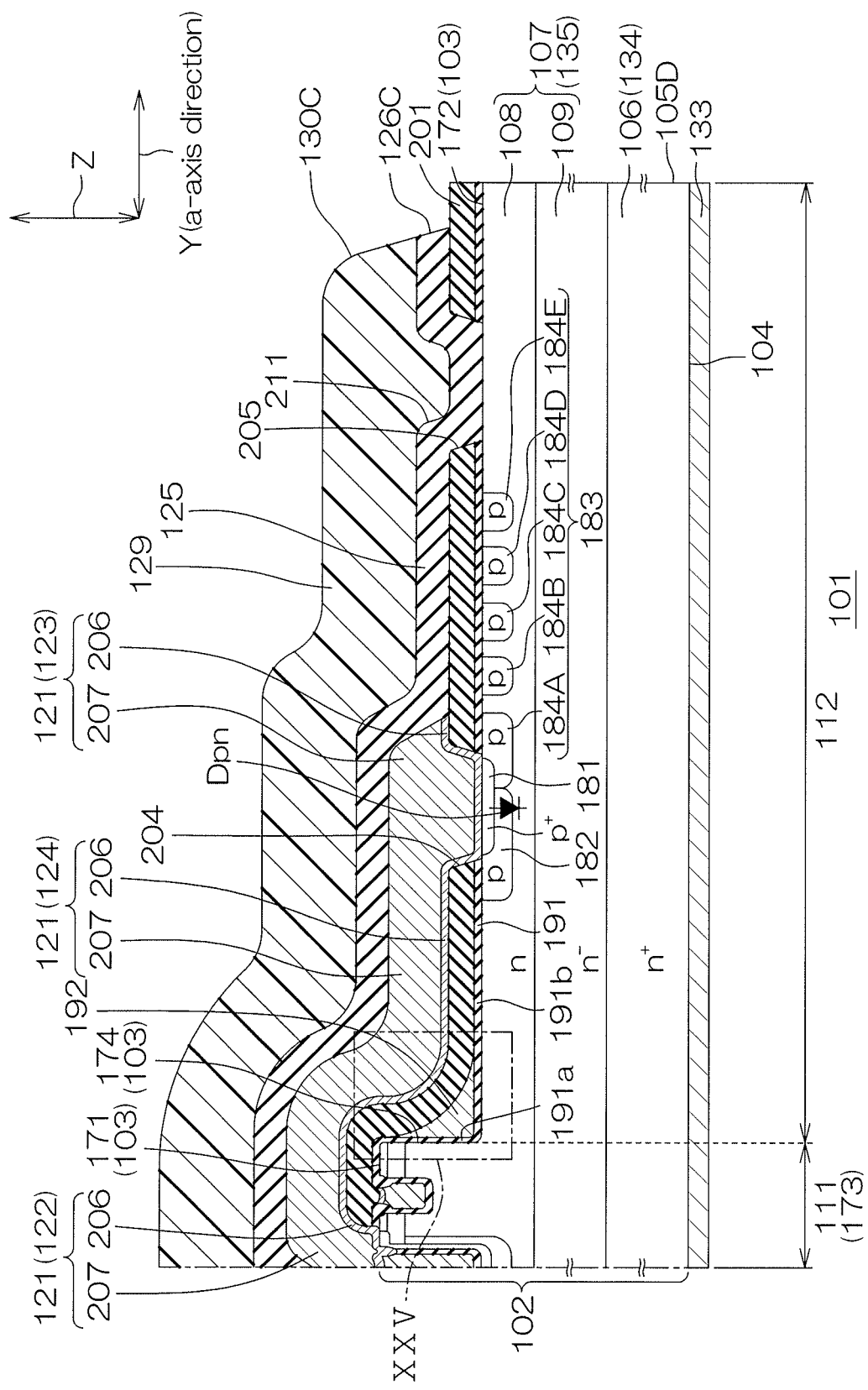
FIG. 24 is a sectional view taken along line XXIV-XXIV shown in FIG. 19.
Figure 25:
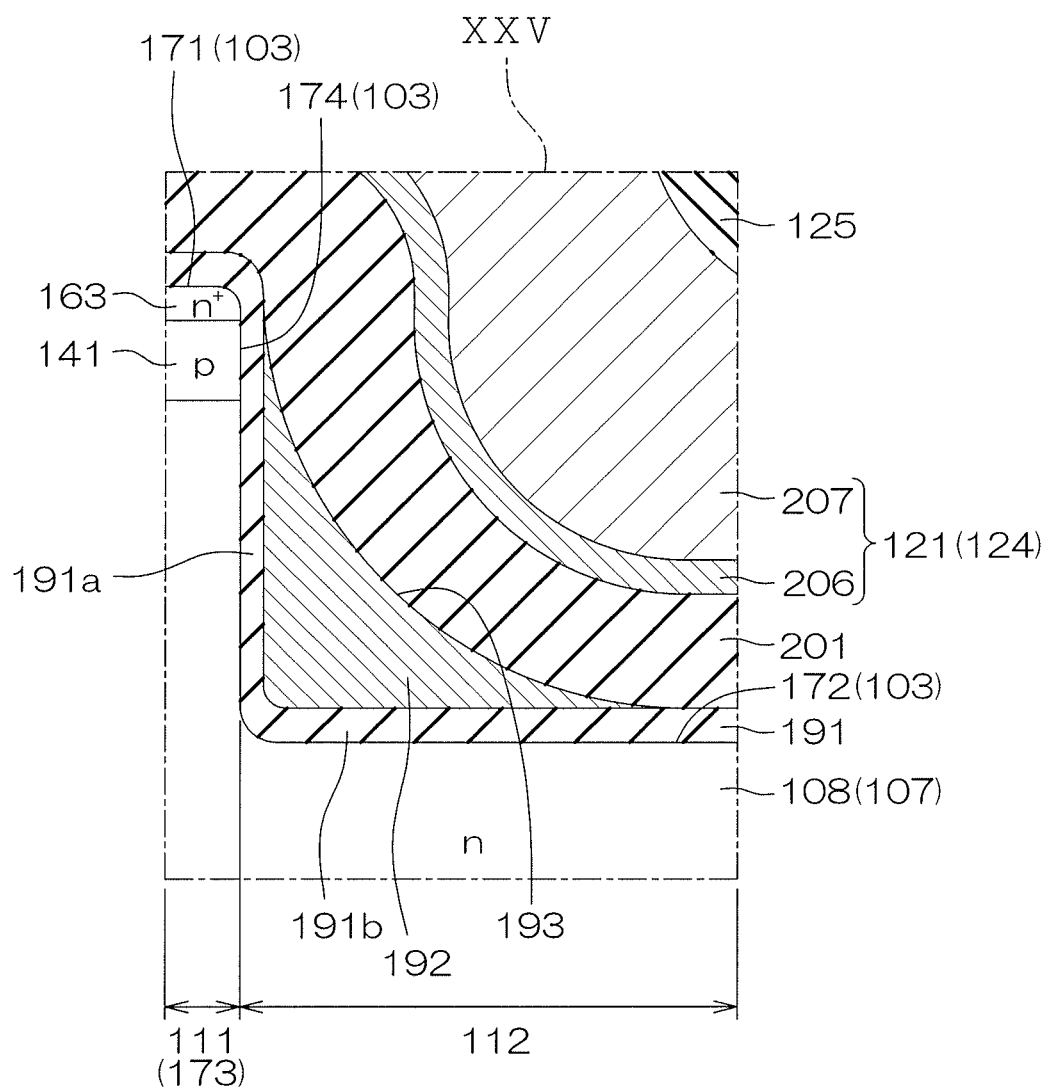
FIG. 25 is an enlarged view of a region XXV shown in FIG. 24.

FIG. 20 is an enlarged view of a region XX shown in FIG. 19 and is a diagram for describing the structure of the first main surface 103. FIG. 21 is a sectional view taken along line XXI-XXI shown in FIG. 20. FIG. 22 is a sectional view taken along line XXII-XXII shown in FIG. 20. FIG. 23 is an enlarged view of a region XXIII shown in FIG. 21. FIG. 24 is a sectional view taken along line XXIV-XXIV shown in FIG. 19. FIG. 25 is an enlarged view of a region XXV shown in FIG. 24.

Referring to FIG. 20 to FIG. 24, the SiC semiconductor device 101 includes a p type body region 141 formed in a surface layer portion of the first main surface 103 in the active region 111. In this embodiment, the body region 141 is formed over an entire area of a region of the first main surface 103 forming the active region 111. The body region 141 thereby defines the active region 111. A p type impurity concentration of the body region 141 may be not less than $1.0 \times 10^{17}$ cm$^{-3}$ and not more than $1.0 \times 10^{19}$ cm$^{-3}$.

The SiC semiconductor device 101 includes a plurality of gate trenches 142 formed in the surface layer portion of the first main surface 103 in the active region 111. In plan view, the plurality of gate trenches 142 are respectively formed in band shapes extending along the first direction X (the m-axis direction of the SiC monocrystal) and are formed at intervals along the second direction Y (the a-axis direction of the SiC monocrystal).

In this embodiment, each gate trench 142 extends from a peripheral edge portion at one side (the side surface 105B side) toward a peripheral edge portion at another side (the side surface 105D side) of the active region 111. The plurality of gate trenches 142 are formed in a stripe shape as a whole in plan view.

Each gate trench 142 crosses an intermediate portion between the peripheral edge portion at the one side and the peripheral edge portion at the other side of the active region 111. One end portion of each gate trench 142 is positioned at the peripheral edge portion at the one side of the active region 111. Another end portion of each gate trench 142 is positioned at the peripheral edge portion at the other side of the active region 111.

A length of each gate trench 142 may be not less than 0.5 mm. The length of each gate trench 142 is, in the section shown in FIG. 22, a length from the end portion at the side of a connection portion of each gate trench 142 and the outer gate finger 117 to the end portion at the opposite side. In this embodiment, the length of each gate trench 142 is not less than 1 mm and not more than 10 mm (for example, not less than 2 mm and not more than 5 mm). A total extension of one or a plurality of the gate trenches 142 per unit area may be not less than 0.5 μm/μm$^2$ and not more than 0.75 μm/μm$^2$.

Each gate trench 142 integrally includes an active trench portion 143 and a contact trench portion 144. The active trench portion 143 is a portion in the active region 111 oriented along a channel of the MISFET.

The contact trench portion 144 is a portion of the gate trench 142 that mainly serves as a contact with the outer gate finger 117. The contact trench portion 144 is led out from the active trench portion 143 to the peripheral edge portion of the active region 111. The contact trench portion 144 is formed in a region directly below the outer gate finger 117. A lead-out amount of the contact trench portion 144 is arbitrary.

Each gate trench 142 penetrates through the body region 141 and reaches the SiC epitaxial layer 107. Each gate trench 142 includes side walls and a bottom wall. The side walls that form long sides of each gate trench 142 are formed by the a-planes of the SiC monocrystal. The side walls that form short sides of each gate trench 142 are formed by the m-planes of the SiC monocrystal.

The side walls of each gate trench 142 may extend along the normal direction Z. The side walls of each gate trench 142 may be formed substantially perpendicular to the first main surface 103. Angles that the side walls of each gate trench 142 form with respect to the first main surface 103 inside the SiC semiconductor layer 102 may be not less than 90° and not more than 95° (for example, not less than 91° and not more than 93°). Each gate trench 142 may be formed in a tapered shape with an opening area at the bottom wall side being smaller than an opening area at an opening side in sectional view.

The bottom wall of each gate trench 142 is positioned at the SiC epitaxial layer 107. More specifically, the bottom wall of each gate trench 142 is positioned at the high concentration region 108 of the SiC epitaxial layer 107. The bottom wall of each gate trench 142 faces the c-plane of the SiC monocrystal. The bottom wall of each gate trench 142 has the off angle θ inclined in the [11-20] direction with respect to the c-plane of the SiC monocrystal.

The bottom wall of each gate trench 142 may be formed parallel to the first main surface 103. Obviously, the bottom wall of each gate trench 142 may be formed in a shape curved toward the second main surface 104.

A depth in the normal direction Z of each gate trench 142 may be not less than 0.5 μm and not more than 3.0 μm. The depth of each gate trench 142 may be not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 μm and not more than 3.0 μm.

A width of each gate trench 142 along the second direction Y may be not less than 0.1 μm and not more than 2 μm. The width of each gate trench 142 may be not less than 0.1 μm and not more than 0.5 μm, not less than 0.5 μm and not more than 1.0 μm, not less than 1.0 μm and not more than 1.5 μm, or not less than 1.5 μm and not more than 2 μm.

Referring to FIG. 23, an opening edge portion 146 of each gate trench 142 includes an inclined portion 147 that is inclined downwardly from the first main surface 103 toward an inner side of each gate trench 142. The opening edge portion 146 of each gate trench 142 is a corner portion connecting the first main surface 103 and the side walls of each gate trench 142.

In this embodiment, the inclined portion 147 is formed in a curved shape recessed toward the SiC semiconductor layer 102 side. The inclined portion 147 may be formed in a curved shape protruding toward the corresponding gate trench 142 side. The inclined portion 147 relaxes concentration of electric field with respect to the opening edge portion 146 of the corresponding gate trench 142.

The SiC semiconductor device 101 includes a gate insulating layer 148 and a gate electrode layer 149 that are formed inside the respective gate trenches 142. In FIG. 20, the gate insulating layers 148 and the gate electrode layers 149 are shown with hatching.

The gate insulating layer 148 includes at least one type of material among silicon oxide ($SiO_2$), silicon nitride (SiN), aluminum oxide ($Al_2O_3$), zirconium oxide ($ZrO_2$), and tantalum oxide ($Ta_2O_3$). The gate insulating layer 148 may have a laminated structure that includes an SiN layer and an $SiO_2$ layer that are laminated in that order from the SiC semiconductor layer 102 side.

The gate insulating layer 148 may have a laminated structure that includes an $SiO_2$ layer and an SiN layer that are laminated in that order from the SiC semiconductor layer 102 side. The gate insulating layer 148 may have a single layer structure constituted of an $SiO_2$ layer or an SiN layer.

In this embodiment, the gate insulating layer 148 has a single layer structure constituted of an SiO$_2$ layer.

The gate insulating layer 148 is formed in a film along inner wall surfaces of each gate trench 142 and demarcates a recess space inside the gate trench 142. The gate insulating layer 148 includes first regions 148a, second regions 148b, and third regions 148c.

Each first region 148a is formed along the side walls of the corresponding gate trench 142. Each second region 148b is formed along the bottom wall of the corresponding gate trench 142. Each third region 148c is formed along the first main surface 103. The third region 148c of the gate insulating layer 148 forms a portion of the main surface insulating layer 113.

A thickness Ta of the first region 148a is less than a thickness Tb of the second region 148b and a thickness Tc of the third region 148c. A ratio Tb/Ta of the thickness Tb of the second region 148b with respect to the thickness Ta of the first region 148a may be not less than 2 and not more than 5. A ratio T3/Ta of the thickness Tc of the third region 148c with respect to the thickness Ta of the first region 148a may be not less than 2 and not more than 5.

The thickness Ta of the first region 148a may be not less than 0.01 µm and not more than 0.2 µm. The thickness Tb of the second region 148b may be not less than 0.05 µm and not more than 0.5 µm. The thickness Tc of the third region 148c may be not less than 0.05 µm and not more than 0.5 µm.

By making the first region 148a thin, increase in carriers induced in regions of the body region 141 in vicinities of the side walls of the corresponding gate trench 142 can be suppressed. Increase in channel resistance can thereby be suppressed. By making the second region 148b thick, concentration of electric field with respect to the bottom wall of the corresponding gate trench 142 can be relaxed.

By making the third region 148c thick, a withstand voltage of the gate insulating layer 148 in a vicinity of the opening edge portion 146 of each gate trench 142 can be improved. Also, by making the third region 148c thick, loss of the third region 148c due to an etching method can be suppressed.

The first region 148a can thereby be suppressed from being removed by the etching method due to the loss of the third region 148c. Consequently, each gate electrode layer 149 can be made to oppose the SiC semiconductor layer 102 (body region 141) appropriately across the corresponding gate insulating layer 148.

The gate insulating layer 148 further includes a bulging portion 148d bulging toward an interior of the corresponding gate trench 142 at the opening edge portion 146 of the corresponding gate trench 142. The bulging portion 148d is formed at a corner portion connecting the corresponding first region 148a and third region 148c of the gate insulating layer 148.

The bulging portion 148d bulges curvingly toward the interior of the corresponding gate trench 142. The bulging portion 148d narrows an opening of the corresponding gate trench 142 at the opening edge portion 146 of the corresponding gate trench 142.

The bulging portion 148d improves a dielectric withstand voltage of the gate insulating layer 148 at the opening edge portions 146. Obviously, the gate insulating layer 148 not having the bulging portion 148d may be formed. Also, the gate insulating layer 148 having a uniform thickness may be formed.

Each gate electrode layer 149 is embedded in the corresponding gate trench 142 across the gate insulating layer 148. More specifically, the gate electrode layer 149 is embedded in the recess space demarcated by the gate insulating layer 148 in the corresponding gate trench 142. The gate electrode layer 149 is controlled by the gate voltage.

The gate electrode layer 149 has an upper end portion positioned at the opening side of the corresponding gate trench 142. The upper end portion of the gate electrode layer 149 is formed in a curved shape recessed toward the bottom wall of the corresponding gate trench 142. The upper end portion of the gate electrode layer 149 has a constricted portion that is constricted along the bulging portion 148d of the gate insulating layer 148.

A cross-sectional area of the gate electrode layer 149 may be not less than 0.05 µm$^2$ and not more than 0.5 µm$^2$. The cross-sectional area of the gate electrode layer 149 is an area of a section that appears when the gate electrode layer 149 is cut in a direction orthogonal to the direction in which the gate trench 142 extends. The cross-sectional area of the gate electrode layer 149 is defined as a product of a depth of the gate electrode layer 149 and a width of the gate electrode layer 149.

The depth of the gate electrode layer 149 is a distance from the upper end portion to a lower end portion of the gate electrode layer 149. The width of the gate electrode layer 149 is a width of the gate trench 142 at an intermediate position between the upper end portion and the lower end portion of the gate electrode layer 149. If the upper end portion is a curved surface, the position of the upper end portion of the gate electrode layer 149 is deemed to be an intermediate position of the upper end portion of the gate electrode layer 149.

The gate electrode layer 149 includes a p type polysilicon doped with a p type impurity. The p type impurity of the gate electrode layer 149 may include at least one type of material among boron (B), aluminum (Al), indium (In), and gallium (Ga).

A p type impurity concentration of the gate electrode layer 149 is not less than the p type impurity concentration of the body region 141. More specifically, the p type impurity concentration of the gate electrode layer 149 exceeds the p type impurity concentration of the body region 141. The p type impurity concentration of the gate electrode layer 149 may be not less than $1 \times 10^{18}$ cm$^{-3}$ and not more than $1 \times 10^{22}$ cm$^{-3}$. A sheet resistance of the gate electrode layer 149 may be not less than 10Ω/☐ and not more than 500Ω/☐ (approximately 200Ω/☐ in this embodiment).

Referring to FIG. 20 and FIG. 22, the SiC semiconductor device 101 includes a gate wiring layer 150 formed in the active region 111. The gate wiring layer 150 is electrically connected to the gate pad 116 and the gate fingers 117 and 118. In FIG. 22, the gate wiring layer 150 is shown with hatching.

The gate wiring layer 150 is formed on the first main surface 103. More specifically, the gate wiring layer 150 is formed on the third regions 148c of the gate insulating layer 148. In this embodiment, the gate wiring layer 150 is formed along the outer gate finger 117. More specifically, the gate wiring layer 150 is formed along the three side surfaces 105A, 105B, and 105D of the SiC semiconductor layer 102 such as to demarcate the inner region of the active region 111 from three directions.

The gate wiring layer 150 is connected to the gate electrode layer 149 exposed from the contact trench portion 144 of each gate trench 142. In this embodiment, the gate wiring layer 150 is formed by lead-out portions of the gate electrode layers 149 that are led out from the respective gate trenches 142 onto the first main surface 103. An upper end portion of the gate wiring layer 150 is connected to the upper end portions of the gate electrode layers 149.

Referring to FIG. 20, FIG. 21 and FIG. 23, the SiC semiconductor device 101 includes a plurality of source trenches 155 formed in the first main surface 103 in the active region 111. Each source trench 155 is formed in a region between two mutually adjacent gate trenches 142.

The plurality of source trenches 155 are each formed in a band shape extending along the first direction X (the m-axis direction of the SiC monocrystal). The plurality of source trenches 155 are formed in a stripe shape as a whole in plan view. A pitch in the second direction Y between central portions of source trenches 155 that are mutually adjacent may be not less than 1.5 μm and not more than 3 μm.

Each source trench 155 penetrates through the body region 141 and reaches the SiC epitaxial layer 107. Each source trench 155 includes side walls and a bottom wall. The side walls that form long sides of each source trench 155 are formed by the a-planes of the SiC monocrystal. The side walls that form short sides of each source trench 155 are formed by the m-planes of the SiC monocrystal.

The side walls of each source trench 155 may extend along the normal direction Z. The side walls of each source trench 155 may be formed substantially perpendicular to the first main surface 103. Angles that the side walls of each source trench 155 form with respect to the first main surface 103 inside the SiC semiconductor layer 102 may be not less than 90° and not more than 95° (for example, not less than 91° and not more than 93°). Each source trench 155 may be formed in a tapered shape with an opening area at the bottom wall side being smaller than an opening area at an opening side in sectional view.

The bottom wall of each source trench 155 is positioned inside the SiC epitaxial layer 107. More specifically, the bottom wall of each source trench 155 is positioned at the high concentration region 108 of the SiC epitaxial layer 107. The bottom wall of each source trench 155 is positioned at the second main surface 104 side with respect to the bottom wall of each gate trench 142. The bottom wall of each source trench 155 is positioned at a region between the bottom wall of each gate trench 142 and the low concentration region 109.

The bottom wall of each source trench 155 faces the c-plane of the SiC monocrystal. The bottom wall of each source trench 155 has the off angle θ inclined in the [11-20] direction with respect to the c-plane of the SiC monocrystal. The bottom wall of each source trench 155 may be formed parallel to the first main surface 103. The bottom wall of each source trench 155 may be formed in a shape curved toward the second main surface 104.

In this embodiment, a depth of each source trench 155 is not less than the depth of each gate trench 142. More specifically, the depth of each source trench 155 is greater than the depth of each gate trench 142. The depth of each source trench 155 may be equal to the depth of each gate trench 142.

The depth in the normal direction Z of each source trench 155 may be not less than 0.5 μm and not more than 10 μm (for example, approximately 2 μm). A ratio of the depth of each source trench 155 with respect to the depth of each gate trench 142 may be not less than 1.5. The ratio of the depth of each source trench 155 with respect to the depth of each gate trench 142 is preferably not less than 2.

A first direction width of each source trench 155 may be substantially equal to the first direction width of each gate trench 142. The first direction width of each source trench 155 may be not less than the first direction width of each gate trench 142. The first direction width of each source trench 155 may be not less than 0.1 μm and not more than 2 μm (for example, approximately 0.5 μm).

The SiC semiconductor device 101 includes a source insulating layer 156 and a source electrode layer 157 that are formed inside each source trench 155. In FIG. 20, the source insulating layers 156 and the source electrode layers 157 are shown with hatching.

Each source insulating layer 156 includes at least one type of material among silicon oxide ($SiO_2$), silicon nitride (SiN), aluminum oxide ($Al_2O_3$), zirconium oxide ($ZrO_2$), and tantalum oxide ($Ta_2O_3$). The source insulating layer 156 may have a laminated structure that includes an SiN layer and an $SiO_2$ layer that are laminated in that order from the first main surface 103 side.

The source insulating layer 156 may have a laminated structure that includes an $SiO_2$ layer and an SiN layer that are laminated in that order from the first main surface 103 side. The source insulating layer 156 may have a single layer structure constituted of an $SiO_2$ layer or an SiN layer. In this embodiment, the source insulating layer 156 has a single layer structure constituted of an $SiO_2$ layer.

The source insulating layer 156 is formed in a film along inner wall surfaces of the corresponding source trench 155 and demarcates a recess space inside the corresponding source trench 155. The source insulating layer 156 includes a first region 156a and a second region 156b.

The first region 156a is formed along the side walls of the corresponding source trench 155. The second region 156b is formed along the bottom wall of the corresponding source trench 155. A thickness Tsa of the first region 156a is less than a thickness Tsb of the second region 156b.

A ratio Tsb/Tsa of the thickness Tsb of the second region 156b with respect to the thickness Tsa of the first region 156a may be not less than 2 and not more than 5. The thickness Tsa of the first region 156a may be not less than 0.01 μm and not more than 0.2 μm. The thickness Tsb of the second region 156b may be not less than 0.05 μm and not more than 0.5 μm.

The thickness Tsa of the first region 156a may be substantially equal to the thickness Ta of the first region 156a of the gate insulating layer 148. The thickness Tsb of the second region 156b may be substantially equal to the thickness Tb of the second region 156b of the gate insulating layer 148. Obviously, a source insulating layer 156 having a uniform thickness may be formed.

Each source electrode layer 157 is embedded in the corresponding source trench 155 across the source insulating layer 156. More specifically, the source electrode layer 157 is embedded in the recess space demarcated by the source insulating layer 156 in the corresponding source trench 155. The source electrode layer 157 is controlled by the source voltage.

The source electrode layer 157 has an upper end portion positioned at an opening side of the corresponding source trench 155. The upper end portion of the source electrode layer 157 is formed at the bottom wall side of the source trench 155 with respect to the first main surface 103. The upper end portion of the source electrode layer 157 may be positioned higher than the first main surface 103.

The upper end portion of the source electrode layer 157 is formed in a concavely curved shape recessed toward the bottom wall of the corresponding source trench 155. The upper end portion of the source electrode layer 157 may be formed parallel to the first main surface 103.

The upper end portion of the source electrode layer 157 may protrude higher than an upper end portion of the source insulating layer 156. The upper end portion of the source electrode layer 157 may be positioned at the bottom wall side of the source trench 155 with respect to the upper end portion of the source insulating layer 156. A thickness of the source electrode layer 157 may be not less than 0.5 µm and not more than 10 µm (for example, approximately 1 µm).

The source electrode layer 157 preferably includes a polysilicon having properties close to SiC in terms of material properties. Stress generated in the SiC semiconductor layer 102 can thereby be reduced. In this embodiment, the source electrode layer 157 includes a p type polysilicon doped with a p type impurity. In this case, the source electrode layer 157 can be formed at the same time as the gate electrode layer 149. The p type impurity of the source electrode layer 157 may include at least one type of material among boron (B), aluminum (Al), indium (In), and gallium (Ga).

A p type impurity concentration of the source electrode layer 157 is not less than the p type impurity concentration of the body region 141. More specifically, the p type impurity concentration of the source electrode layer 157 exceeds the p type impurity concentration of the body region 141. The p type impurity concentration of the source electrode layer 157 may be not less than $1 \times 10^8$ cm$^{-3}$ and not more than $1 \times 10^{22}$ cm$^{-3}$.

A sheet resistance of the source electrode layer 157 may be not less than 10Ω/□ and not more than 500Ω/□ (approximately 200Ω/□ in this embodiment). The p type impurity concentration of the source electrode layer 157 may be substantially equal to the p type impurity concentration of the gate electrode layer 149. The sheet resistance of the source electrode layer 157 may be substantially equal to the sheet resistance of the gate electrode layer 149.

The source electrode layer 157 may include an n type polysilicon in place of or in addition to the p type polysilicon. The source electrode layer 157 may include at least one type of material among tungsten, aluminum, copper, an aluminum alloy, and a copper alloy in place of or in addition to the p type polysilicon.

The SiC semiconductor device 101 thus has a plurality of trench gate structures 161 and a plurality of trench source structures 162. Each trench gate structure 161 includes the gate trench 142, the gate insulating layer 148, and the gate electrode layer 149. Each trench source structure 162 includes the source trench 155, the source insulating layer 156, and the source electrode layer 157.

The SiC semiconductor device 101 includes n$^+$ type source regions 163 formed in regions of a surface layer portion of the body region 141 along the side walls of each gate trench 142. An n type impurity concentration of the source regions 163 may be not less than $1.0 \times 10^{18}$ cm$^{-3}$ and not more than $1.0 \times 10^{21}$ cm$^{-3}$. An n type impurity of the source regions 163 may be phosphorus (P).

A plurality of the source regions 163 are formed along the side wall at one side and the side wall at another side of each gate trench 142. The plurality of source regions 163 are respectively formed in band shapes extending along the first direction X. The plurality of source regions 163 are formed in a stripe shape as a whole in plan view. The respective source regions 163 are exposed from the side walls of the respective gate trenches 142 and the side walls of the respective source trenches 155.

The source regions 163, the body region 141, and the drift region 135 are thus formed in that order from the first main surface 103 toward the second main surface 104 in regions of the surface layer portion of the first main surface 103 along the side walls of the gate trenches 142. The channels of the MISFET are formed in regions of the body region 141 along the side walls of the gate trenches 142. The channels are formed in the regions along the side walls of the gate trenches 142 facing the a-planes of the SiC monocrystal. ON/OFF of the channels is controlled by the gate electrode layers 149.

The SiC semiconductor device 101 includes a plurality of p$^+$ type contact regions 164 formed in the surface layer portion of the first main surface 103 in the active region 111. Each contact region 164 is formed in a region between two mutually adjacent gate trenches 142 in plan view. Each contact region 164 is formed in a region opposite the corresponding gate trench 142 with respect to the corresponding source region 163.

Each contact region 164 is formed along an inner wall of the corresponding source trench 155. In this embodiment, a plurality of contact regions 164 are formed at intervals along the inner walls of each source trench 155. Each contact region 164 is formed at intervals from the corresponding gate trenches 142.

A p type impurity concentration of each contact region 164 is greater than the p type impurity concentration of the body region 141. The p type impurity concentration of each contact region 164 may be not less than $1.0 \times 10^{18}$ cm$^{-3}$ and not more than $1.0 \times 10^{21}$ cm$^{-3}$. A p type impurity of each contact region 164 may be aluminum (Al).

Each contact region 164 covers the side walls and the bottom wall of the corresponding source trench 155. A bottom portion of each contact region 164 may be formed parallel to the bottom wall of the corresponding source trench 155. More specifically, each contact region 164 integrally includes a first surface layer region 164a, a second surface layer region 164b, and an inner wall region 164c.

The first surface layer region 164a covers the side wall at one side of the source trench 155 in the surface layer portion of the body region 141. The first surface layer region 164a is electrically connected to the body region 141 and the source region 163.

The first surface layer region 164a is positioned at a region at the first main surface 103 side with respect to a bottom portion of the source region 163. In this embodiment, the first surface layer region 164a has a bottom portion extending in parallel to the first main surface 103. In this embodiment, the bottom portion of the first surface layer region 164a is positioned at a region between a bottom portion of the body region 141 and the bottom portion of the source region 163. The bottom portion of the first surface layer region 164a may be positioned at a region between the first main surface 103 and the bottom portion of the body region 141.

In this embodiment, the first surface layer region 164a is led out from the source trench 155 toward the gate trench 142 adjacent thereto. The first surface layer region 164a may extend to an intermediate region between the gate trench 142 and the source trench 155. The first surface layer region 164a is formed at an interval toward the source trench 155 side from the gate trench 142.

The second surface layer region 164b covers the side wall at the other side of the source trench 155 in the surface layer portion of the body region 141. The second surface layer region 164b is electrically connected to the body region 141 and the source region 163. The second surface layer region 164b is positioned at a region at the first main surface 103 side with respect to the bottom portion of the source region 163. In this embodiment, the second surface layer region 164b has a bottom portion extending in parallel to the first main surface 103.

In this embodiment, the bottom portion of the second surface layer region 164b is positioned at a region between the bottom portion of the body region 141 and the bottom portion of the source region 163. The bottom portion of the second surface layer region 164b may be positioned at a region between the first main surface 103 and the bottom portion of the body region 141.

In this embodiment, the second surface layer region 164b is led out from the side wall at the other side of the source trench 155 toward the gate trench 142 adjacent thereto. The second surface layer region 164b may extend to an intermediate region between the source trench 155 and the gate trench 142. The second surface layer region 164b is formed at an interval toward the source trench 155 side from the gate trench 142.

The inner wall region 164c is positioned at a region at the second main surface 104 side with respect to the first surface layer region 164a and the second surface layer region 164b (the bottom portion of the source region 163). The inner wall region 164c is formed in a region of the SiC semiconductor layer 102 along the inner walls of the source trench 155. The inner wall region 164c covers the side walls of the source trench 155.

The inner wall region 164c covers a corner portion connecting the side walls and the bottom wall of the source trench 155. The inner wall region 164c covers the bottom wall of the source trench 155 from the side walls and via the corner portion of the source trench 155. The bottom portion of the contact region 164 is formed by the inner wall region 164c.

The SiC semiconductor device 101 includes a plurality of deep well regions 165 formed in the surface layer portion of the first main surface 103 in the active region 111. Each deep well region 165 is also referred to as a withstand voltage adjustment region (withstand voltage holding region) that adjusts the withstand voltage of the SiC semiconductor layer 102.

Each deep well region 165 is formed in the SiC epitaxial layer 107. More specifically, each deep well region 165 is formed in the high concentration region 108 of the SiC epitaxial layer 107.

Each deep well region 165 is formed along the inner walls of the corresponding source trench 155 such as to cover the corresponding contact regions 164. Each deep well region 165 is electrically connected to the corresponding contact regions 164. Each deep well region 165 is formed in a band shape extending along the corresponding source trench 155 in plan view. Each deep well region 165 covers the side walls of the corresponding source trench 155.

Each deep well region 165 covers the corner portion connecting the side walls and the bottom wall of the corresponding source trench 155. Each deep well region 165 covers the bottom wall of the corresponding source trench 155 from the side walls and via the corner portion of the corresponding source trench 155. Each deep well region 165 is continuous to the body region 141 at the side walls of the corresponding source trench 155.

Each deep well region 165 has a bottom portion positioned at the second main surface 104 side with respect to the bottom wall of the corresponding gate trench 142. The bottom portion of each deep well region 165 may be formed parallel to the bottom wall of the corresponding source trench 155.

A p type impurity concentration of each deep well region 165 may be substantially equal to the p type impurity concentration of the body region 141. The p type impurity concentration of each deep well region 165 may exceed the p type impurity concentration of the body region 141. The p type impurity concentration of each deep well region 165 may be less than the p type impurity concentration of the body region 141.

The p type impurity concentration of each deep well region 165 may be not more than the p type impurity concentration of the contact regions 164. The p type impurity concentration of each deep well region 165 may be less than the p type impurity concentration of the contact regions 164. The p type impurity concentration of each deep well region 165 may be not less than $1.0 \times 10^{17}$ cm$^{-3}$ and not more than $1.0 \times 10^{19}$ cm$^{-3}$.

Each deep well region 165 forms a pn junction portion with the SiC semiconductor layer 102 (the high concentration region 108 of the SiC epitaxial layer 107). From the pn junction portion, a depletion layer spreads toward a region between the plurality of gate trenches 142 that are mutually adjacent. The depletion layer spreads toward a region at the second main surface 104 side with respect to the bottom wall of each gate trench 142.

The depletion layer spreading from each deep well region 165 may overlap with the bottom walls of the corresponding gate trenches 142. The depletion layer spreading from the bottom portion of each deep well region 165 may overlap with the bottom walls of the corresponding gate trenches 142.

Referring to FIG. 20 and FIG. 22, the SiC semiconductor device 101 includes a p type peripheral edge deep well region 166 formed in a peripheral edge portion of the active region 111. The peripheral edge deep well region 166 is formed in the SiC epitaxial layer 107. More specifically, the peripheral edge deep well region 166 is formed in the high concentration region 108 of the SiC epitaxial layer 107.

The peripheral edge deep well region 166 is electrically connected to the respective deep well regions 165. The peripheral edge deep well region 166 forms an equal potential with the respective deep well regions 165. In this embodiment, the peripheral edge deep well region 166 is formed integral to the respective deep well regions 165.

More specifically, in the peripheral edge portion of the active region 111, the peripheral edge deep well region 166 is formed in regions along the inner wall of the contact trench portions 144 of the respective gate trenches 142. The peripheral edge deep well region 166 covers the side walls of the contact trench portions 144 of the respective gate trenches 142. The peripheral edge deep well region 166 covers corner portions connecting the side walls and the bottom walls of the respective contact trench portions 144.

The peripheral edge deep well region 166 covers the bottom walls of the respective contact trench portions 144 from the side walls and via the corner portions of the respective contact trench portions 144. The respective deep well regions 165 are continuous to the body region 141 at the side walls of the corresponding contact trench portions 144. A bottom portion of the peripheral edge deep well region 166 is positioned at the second main surface 104 side with respect to the bottom walls of the respective contact trench portions 144.

The peripheral edge deep well region 166 overlaps with the gate wiring layer 150 in plan view. The peripheral edge deep well region 166 opposes the gate wiring layer 150 across the gate insulating layer 148 (the third regions 148c).

The peripheral edge deep well region 166 includes lead-out portions 166a led out to the respective active trench portions 143 from the corresponding contact trench portions 144. The lead-out portions 166a are formed in the high concentration region 108 of the SiC epitaxial layer 107. Each lead-out portion 166a extends along the side walls of the corresponding active trench portion 143 and covers the bottom wall of the active trench portion 143 through a corner portion.

The lead-out portion 166a covers the side walls of the corresponding active trench portion 143. The lead-out portion 166a covers the corner portion connecting the side walls and the bottom wall of the corresponding active trench portion 143. The lead-out portion 166a covers the bottom wall of the corresponding active trench portion 143 from the side walls and via the corner portion of the corresponding active trench portion 143. The lead-out portion 166a is continuous to the body region 141 at the side walls of the corresponding active trench portion 143. A bottom portion of the lead-out portion 166a is positioned at the second main surface 104 side with respect to the bottom wall of the corresponding active trench portion 143.

A p type impurity concentration of the peripheral edge deep well region 166 may be substantially equal to the p type impurity concentration of the body region 141. The p type impurity concentration of the peripheral edge deep well region 166 may exceed the p type impurity concentration of the body region 141. The p type impurity concentration of the peripheral edge deep well region 166 may be less than the p type impurity concentration of the body region 141.

The p type impurity concentration of the peripheral edge deep well region 166 may be substantially equal to the p type impurity concentration of each deep well region 165. The p type impurity concentration of the peripheral edge deep well region 166 may exceed the p type impurity concentration of each deep well region 165. The p type impurity concentration of the peripheral edge deep well region 166 may be less than the p type impurity concentration of each deep well region 165.

The p type impurity concentration of the peripheral edge deep well region 166 may be not more than the p type impurity concentration of the contact regions 164. The p type impurity concentration of the peripheral edge deep well region 166 may be less than the p type impurity concentration of the contact regions 164. The p type impurity concentration of the peripheral edge deep well region 166 may be not less than $1.0 \times 10^{17}$ cm$^{-3}$ and not more than $1.0 \times 10^{19}$ cm$^{-3}$.

With an SiC semiconductor device that includes just a pn junction diode, due to the structure being free from trenches, a problem of concentration of electric field inside the SiC semiconductor layer 102 rarely occurs. The respective deep well regions 165 (the peripheral edge deep well region 166) make the trench gate type MISFET approach the structure of a pn junction diode. The electric field inside the SiC semiconductor layer 102 can thereby be relaxed in the trench gate type MISFET. Narrowing a pitch between the plurality of mutually adjacent deep well regions 165 is thus effective in terms of relaxing the concentration of electric field.

Also, with the respective deep well regions 165 having the bottom portions at the second main surface 104 side with respect to the bottom walls of the corresponding gate trenches 142, concentration of electric field with respect to the corresponding gate trenches 142 can be relaxed appropriately by the depletion layers. Preferably, distances between the bottom portions of the plurality of deep well regions 165 and the second main surface 104 are substantially equal.

Occurrence of variation in the distances between the bottom portions of the plurality of deep well regions 165 and the second main surface 104 can thereby be suppressed. The withstand voltage (for example, an electrostatic breakdown strength) of the SiC semiconductor layer 102 can thus be suppressed from being restricted by a configuration of the respective deep well regions 165 and therefore improvement of the withstand voltage can be achieved appropriately.

By forming the source trenches 155, the p type impurity can be introduced into the inner walls of the source trenches 155. The respective deep well regions 165 can thereby be formed conformally to the source trenches 155 and occurrence of variation in the depths of the respective deep well regions 165 can thus be suppressed appropriately. Also, by using the respective source trenches 155, the corresponding deep well regions 165 can be formed appropriately in comparatively deep regions of the SiC semiconductor layer 102.

In this embodiment, the high concentration region 108 of the SiC epitaxial layer 107 is interposed in regions between the plurality of mutually adjacent deep well regions 165. JFET (junction field effect transistor) resistance can thereby be reduced in the regions between the plurality of mutually adjacent deep well regions 165.

Further, in this embodiment, the bottom portions of the respective deep well regions 165 are positioned inside the high concentration region 108 of the SiC epitaxial layer 107. Current paths can thereby be expanded in lateral direction parallel to the first main surface 103 from the bottom portions of the respective deep well regions 165. Current spread resistance can thereby be reduced. The low concentration region 109 of the SiC epitaxial layer 107 increases the withstand voltage of the SiC semiconductor layer 102 in such a structure.

Referring to FIG. 23, the SiC semiconductor device 101 includes a low resistance electrode layer 167 formed on the gate electrode layers 149. Inside the respective gate trenches 142, the low resistance electrode layer 167 covers the upper end portions of the gate electrode layers 149. The low resistance electrode layer 167 includes a conductive material having a sheet resistance less than the sheet resistance of the gate electrode layers 149. The sheet resistance of the low resistance electrode layer 167 may be not less than $0.01\Omega/\square$ and not more than $10\Omega/\square$.

The low resistance electrode layer 167 is formed in a film. The low resistance electrode layer 167 has connection portions 167a in contact with the upper end portions of the gate electrode layers 149 and non-connection portions 167b opposite thereof. The connection portions 167a and the non-connection portions 167b of the low resistance electrode layer 167 may be formed in curved shapes conforming to the upper end portions of the gate electrode layers 149. The connection portions 167a and the non-connection portions 167b of the low resistance electrode layer 167 may take on any of various configurations.

An entirety of each connection portion 167a may be positioned higher than the first main surface 103. The entirety of the connection portion 167a may be positioned lower than the first main surface 103. The connection portion 167a may include a portion positioned higher than the first main surface 103. The connection portion 167a may include a portion positioned lower than the first main surface 103. For example, a central portion of the connection portion 167a may be positioned lower than the first main surface 103 and a peripheral edge portion of the connection portion 167*a* may be positioned higher than the first main surface 103.

An entirety of each non-connection portion 167*b* may be positioned higher than the first main surface 103. The entirety of the non-connection portion 167*b* may be positioned lower than the first main surface 103. The non-connection portion 167*b* may include a portion positioned higher than the first main surface 103. The non-connection portion 167*b* may include a portion positioned lower than the first main surface 103. For example, a central portion of the non-connection portion 167*b* may be positioned lower than the first main surface 103 and a peripheral edge portion of the non-connection portion 167*b* may be positioned higher than the first main surface 103.

The low resistance electrode layer 167 has edge portions 167*c* contacting the gate insulating layer 148. Each edge portion 167*c* contacts a corner portion of the gate insulating layer 148 connecting the corresponding first region 148*a* and the corresponding second region 148*b*. The edge portion 167*c* contacts the corresponding third region 148*c* of the gate insulating layer 148. More specifically, the edge portion 167*c* contacts the corresponding bulging portion 148*d* of the gate insulating layer 148.

The edge portion 167*c* is formed in a region at the first main surface 103 side with respect to the bottom portions of the source regions 163. The edge portion 167*c* is formed in a region further to the first main surface 103 side than boundary regions between the body region 141 and the source regions 163. The edge portion 167*c* thus opposes the source regions 163 across the gate insulating layer 148. The edge portion 167*c* does not oppose the body region 141 across the gate insulating layer 148.

Forming of a current path in a region of the gate insulating layer 148 between the low resistance electrode layer 167 and the body region 141 can thereby be suppressed. The current path may be formed by undesired diffusion of an electrode material of the low resistance electrode layer 167 into the gate insulating layer 148. In particular, a design where the edge portion 167*c* is connected to the comparatively thick third region 148*c* of the gate insulating layer 148 (the corner portion of the gate insulating layer 148) is effective for reducing the risk of forming the current path.

In the normal direction Z, a thickness Tr of the low resistance electrode layer 167 is not more than a thickness TG of the gate electrode layer 149 (Tr≤TG). The thickness Tr of the low resistance electrode layer 167 is preferably less than the thickness TG of the gate electrode layer 149 (Tr<TG). More specifically, the thickness Tr of the low resistance electrode layer 167 is not more than one-half the thickness TG of the gate electrode layer 149 (Tr≤TG/2).

A ratio Tr/TG of the thickness Tr of the low resistance electrode layer 167 with respect to the thickness TG of the gate electrode layer 149 is not less than 0.01 and not more than 1. The thickness TG of the gate electrode layer 149 may be not less than 0.5 µm and not more than 3 µm. The thickness Tr of the low resistance electrode layer 167 may be not less than 0.01 µm and not more than 3 µm.

A current supplied into the respective gate trenches 142 flows through the low resistance electrode layer 167 having the comparatively low sheet resistance and is transmitted to entireties of the gate electrode layers 149. The entireties of the gate electrode layers 149 (an entire area of the active region 111) can thereby be made to transition rapidly from an off state to an on state and therefore delay of switching response can be suppressed.

In particular, although time is required for transmission of current in a case of the gate trenches 142 having a length of the millimeter order (a length not less than 1 mm), the delay of the switching response can be suppressed appropriately by the low resistance electrode layer 167. That is, the low resistance electrode layer 167 is formed in a current diffusing electrode layer that diffuses the current into the corresponding gate trench 142.

Also, as refinement of cell structure progresses, the width, depth, cross-sectional area, etc., of the gate electrode layer 149 decreases and there is thus concern for the delay of the switching response due to increase of electrical resistance inside each gate trench 142. In this respect, according to the low resistance electrode layer 167, the entireties of the gate electrode layers 149 can be made to transition rapidly from the off state to the on state and therefore the delay of the switching response due to refinement can be suppressed appropriately.

Referring to FIG. 22, in this embodiment, the low resistance electrode layer 167 also covers the upper end portion of the gate wiring layer 150. A portion of the low resistance electrode layer 167 that covers the upper end portion of the gate wiring layer 150 is formed integral to portions of the low resistance electrode layer 167 covering the upper end portions of the gate electrode layers 149. The low resistance electrode layer 167 thereby covers entire areas of the gate electrode layers 149 and an entire area of the gate wiring layer 150.

A current supplied from the gate pad 116 and the gate fingers 117 and 118 to the gate wiring layer 150 is thus transmitted via the low resistance electrode layer 167 having the comparatively low sheet resistance to the entireties of the gate electrode layers 149 and the gate wiring layer 150.

The entireties of the gate electrode layers 149 (the entire area of the active region 111) can thereby be made to transition rapidly from the off state to the on state via the gate wiring layer 150 and therefore the delay of the switching response can be suppressed. In particular, in the case of the gate trenches 142 having the length of the millimeter order, the delay of the switching response can be suppressed appropriately by the low resistance electrode layer 167 covering the upper end portion of the gate wiring layer 150.

The low resistance electrode layer 167 includes a polycide layer. The polycide layer is formed by portions forming surface layer portions of the gate electrode layers 149 being silicided by a metal material. More specifically, the polycide layer is constituted of a p type polycide layer that includes the p type impurity doped in the gate electrode layers 149 (p type polysilicon). The polycide layer preferably has a specific resistance of not less than 10 µΩ·cm and not more than 110 µΩ·cm.

A sheet resistance inside the gate trench 142 embedded with the gate electrode layers 149 and the low resistance electrode layer 167 is not more than a sheet resistance of the gate electrode layers 149 alone. The sheet resistance inside the gate trench 142 is preferably not more than a sheet resistance of an n type polysilicon doped with an n type impurity.

The sheet resistance inside the gate trench 142 is approximated by the sheet resistance of the low resistance electrode layer 167. That is, the sheet resistance inside the gate trench 142 may be not less than 0.01Ω/☐ and not more than 10Ω/☐. The sheet resistance inside the gate trench 142 is preferably less than 10Ω/☐.

The low resistance electrode layer 167 may include at least one type of material among TiSi, TiSi$_2$, NiSi, CoSi, CoSi$_2$, MoSi$_2$, and WSi$_2$. Among these types of materials, NiSi, CoSi$_2$, and TiSi$_2$ are especially suitable as the polycide layer forming the low resistance electrode layer 167 due to being comparatively low in specific resistance value and temperature dependence.

The SiC semiconductor device 101 includes source sub-trenches 168 formed in regions of the first main surface 103 along the upper end portions of the source electrode layers 157 such as to be in communication with the corresponding source trenches 155. Each source sub-trench 168 forms a portion of the side walls of the corresponding source trench 155.

In this embodiment, the source sub-trench 168 is formed in an endless shape (a quadrilateral annular shape in this embodiment) surrounding the upper end portion of the source electrode layer 157 in plan view. The source sub-trench 168 borders the upper end portion of the source electrode layer 157.

The source sub-trench 168 is formed by digging into a portion of the source insulating layer 156. More specifically, the source sub-trench 168 is formed by digging into the upper end portion of the source insulating layer 156 and the upper end portion of the source electrode layer 157 from the first main surface 103.

The upper end portion of the source electrode layer 157 has a shape that is inwardly constricted with respect to a lower end portion of the source electrode layer 157. The lower end portion of the source electrode layer 157 is a portion of the source electrode layer 157 that is positioned at the bottom wall side of the corresponding source trench 155. A first direction width of the upper end portion of the source electrode layer 157 may be less than a first direction width of the lower end portion of the source electrode layer 157.

The source sub-trench 168 is formed, in sectional view, to a convergent shape with a bottom area being less than an opening area. A bottom wall of the source sub-trench 168 may be formed in a shape curved toward the second main surface 104.

An Inner wall of the source sub-trench 168 exposes the source region 163, the contact region 164, the source insulating layer 156, and the source electrode layer 157. The inner wall of the source sub-trench 168 exposes the first surface layer region 164a and the second surface layer region 164b of the contact region 164. The bottom wall of the source sub-trench 168 exposes at least the first region 156a of the source insulating layer 156. An upper end portion of the first region 156a of the source insulating layer 156 is positioned lower than the first main surface 103.

An opening edge portion 169 of each source trench 155 includes an inclined portion 170 that inclines downwardly from the first main surface 103 toward an inner side of the source trench 155. The opening edge portion 169 of each source trench 155 is a corner portion connecting the first main surface 103 and the side walls of the source trench 155. The inclined portion 170 of each source trench 155 is formed by the source sub-trench 168.

In this embodiment, the inclined portion 170 is formed in a curved shape recessed toward the SiC semiconductor layer 102 side. The inclined portion 170 may be formed in a curved shape protruding toward the source sub-trench 168 side. The inclined portion 170 relaxes concentration of electric field with respect to the opening edge portion 169 of the corresponding source trench 155.

Referring to FIG. 24 and FIG. 25, the active region 111 has an active main surface 171 forming a portion of the first main surface 103. The outer region 112 has an outer main surface 172 forming a portion of the first main surface 103.

In this embodiment, the outer main surface 172 is connected to the side surfaces 105A to 105D of the SiC semiconductor layer 102.

The active main surface 171 and the outer main surface 172 respectively face the c-plane of the SiC monocrystal. Also, active main surface 171 and the outer main surface 172 respectively each have the off angle θ inclined in the [11-20] direction with respect to the c-planes of the SiC monocrystal.

The outer main surface 172 is positioned at the second main surface 104 side with respect to the active main surface 171. In this embodiment, the outer region 112 is formed by digging into the first main surface 103 toward the second main surface 104 side. The outer main surface 172 is thus formed in a region that is recessed toward the second main surface 104 side with respect to the active main surface 171.

The outer main surface 172 may be positioned at the second main surface 104 side with respect to the bottom walls of the respective gate trenches 142. The outer main surface 172 may be formed at a depth position substantially equal to the bottom walls of the respective source trenches 155. The outer main surface 172 may be positioned on substantially the same plane as the bottom walls of the respective source trenches 155.

A distance between the outer main surface 172 and the second main surface 104 may be substantially equal to distances between the bottom walls of the respective source trenches 155 and the second main surface 104. The outer main surface 172 may be positioned at the second main surface 104 side with respect to the bottom walls of the respective source trenches 155. The outer main surface 172 may be positioned at a range of not less than 0 μm and not more than 1 μm to the second main surface 104 side with respect to the bottom walls of the respective source trenches 155.

The outer main surface 172 exposes the SiC epitaxial layer 107. More specifically, the outer main surface 172 exposes the high concentration region 108 of the SiC epitaxial layer 107. The outer main surface 172 thereby opposes the low concentration region 109 across the high concentration region 108.

In this embodiment, the active region 111 is demarcated as a mesa by the outer region 112. That is, the active region 111 is formed as an active mesa 173 of mesa shape protruding further upward than the outer region 112.

The active mesa 173 includes active side walls 174 connecting the active main surface 171 and the outer main surface 172. The active side walls 174 demarcate a boundary region between the active region 111 and the outer region 112. The first main surface 103 is formed by the active main surface 171, the outer main surface 172, and the active side walls 174.

In this embodiment, the active side walls 174 extend along the normal direction Z to the active main surface 171 (outer main surface 172). The active side walls 174 are formed by the m-planes and the a-planes of the SiC monocrystal.

The active side walls 174 may have inclined surfaces inclined downwardly from the active main surface 171 toward the outer main surface 172. An inclination angle of each active side wall 174 is an angle that the active side wall 174 forms with the active main surface 171 inside the SiC semiconductor layer 102.

In this case, the inclination angle of the active side wall 174 may exceed 90° and be not more than 135°. The inclination angle of the active side wall 174 may exceed 90° and be not more than 95°, be not less than 95° and not more than 100°, be not less than 100° and not more than 110°, be not less than 110° and not more than 120°, or be not less than 120° and be not more than 135°. The inclination angle of the active side wall 174 preferably exceeds 90° and is not more than 95°.

The active side walls 174 expose the SiC epitaxial layer 107. More specifically, the active side walls 174 expose the high concentration region 108. In a region at the active main surface 171 side, the active side walls 174 expose at least the body region 141. In FIG. 24 and FIG. 25, a configuration example where the active side walls 174 expose the body region 141 and the source regions 163 is shown.

The SiC semiconductor device 101 includes a p⁺ type diode region 181 (impurity region) formed in a surface layer portion of the outer main surface 172. Also, the SiC semiconductor device 101 includes a p type outer deep well region 182 formed in the surface layer portion of the outer main surface 172. Also, the SiC semiconductor device 101 includes a p type field limit structure 183 formed in the surface layer portion of the outer main surface 172.

The diode region 181 is formed in a region of the outer region 112 between the active side walls 174 and the side surfaces 105A to 105D. The diode region 181 is formed at intervals from the active side walls 174 and the side surfaces 105A to 105D.

The diode region 181 extends in a band shape along the active region 111 in plan view. In this embodiment, the diode region 181 is formed in an endless shape (a quadrilateral annular shape in this embodiment) surrounding the active region 111 in plan view. The diode region 181 overlaps with the source routing wiring 123 in plan view. The diode region 181 is electrically connected to the source routing wiring 123. The diode region 181 forms a portion of the avalanche current absorbing structure.

The diode region 181 forms a pn junction portion with the SiC semiconductor layer 102. More specifically, the diode region 181 is positioned inside the SiC epitaxial layer 107. The diode region 181 thus forms the pn junction portion with the SiC epitaxial layer 107.

Even more specifically, the diode region 181 is positioned inside the high concentration region 108. The diode region 181 thus forms the pn junction portion with the high concentration region 108. A pn junction diode Dpn, having the diode region 181 as an anode and the SiC semiconductor layer 102 as a cathode, is thereby formed.

An entirety of the diode region 181 is positioned at the second main surface 104 side with respect to the bottom walls of the respective gate trenches 142. A bottom portion of the diode region 181 is positioned at the second main surface 104 side with respect to the bottom walls of the respective source trenches 155. The bottom portion of the diode region 181 may be formed at a depth position substantially equal to the bottom portions of the contact regions 164. The bottom portion of the diode region 181 may be positioned on substantially the same plane as the bottom portions of the contact regions 164.

A p type impurity concentration of the diode region 181 is substantially equal to the p type impurity concentration of the contact regions 164. The p type impurity concentration of the diode region 181 is greater than the p type impurity concentration of the body region 141. The p type impurity concentration of the diode region 181 may be not less than $1.0 \times 10^{18}$ cm⁻³ and not more than $1.0 \times 10^{21}$ cm⁻³.

The outer deep well region 182 is formed in a region between the active side walls 174 and the diode region 181 in plan view. In this embodiment, the outer deep well region 182 is formed at intervals toward the diode region 181 side from the active side walls 174. The outer deep well region 182 is also referred to as a withstand voltage adjustment region (withstand voltage holding region) that adjusts the withstand voltage of the SiC semiconductor layer 102.

The outer deep well region 182 extends in a band shape along the active region 111 in plan view. In this embodiment, the outer deep well region 182 is formed in an endless shape (a quadrilateral annular shape in this embodiment) surrounding the active region 111 in plan view. The outer deep well region 182 is electrically connected to the source routing wiring 123 via the diode region 181. The outer deep well region 182 may form a portion of the pn junction diode Dpn. The outer deep well region 182 may form a portion of the avalanche current absorbing structure.

An entirety of the outer deep well region 182 is positioned at the second main surface 104 side with respect to the bottom walls of the respective gate trenches 142. A bottom portion of the outer deep well region 182 is positioned at the second main surface 104 side with respect to the bottom walls of the respective source trenches 155. The bottom portion of the outer deep well region 182 is positioned at the second main surface 104 side with respect to the bottom portion of the diode region 181.

The bottom portion of the outer deep well region 182 may be formed at a depth position substantially equal to the bottom portions of the respective deep well regions 165. The bottom portion of the outer deep well region 182 may be positioned on substantially the same plane as the bottom portions of the respective deep well regions 165. A distance between the bottom portion of the outer deep well region 182 and the outer main surface 172 may be substantially equal to distances between the bottom portions of the respective deep well regions 165 and the bottom walls of the respective source trenches 155.

A distance between the bottom portion of the outer deep well region 182 and the second main surface 104 may be substantially equal to the distances between the bottom portions of the respective deep well regions 165 and the second main surface 104. Variation can thereby be suppressed from occurring between the distance between the bottom portion of the outer deep well region 182 and the second main surface 104 and the distances between the bottom portions of the respective deep well regions 165 and the second main surface 104.

The withstand voltage (for example, the electrostatic breakdown strength) of the SiC semiconductor layer 102 can thus be suppressed from being restricted by the configuration of the outer deep well region 182 and the configuration of the respective deep well regions 165 and therefore improvement of the withstand voltage can be achieved appropriately.

The bottom portion of the outer deep well region 182 may be positioned at the second main surface 104 side with respect to the bottom portions of the respective deep well regions 165. The bottom portion of the outer deep well region 182 may be positioned at a range of not less than 0 μm and not more than 1 μm to the second main surface 104 side with respect to the bottom portions of the respective deep well regions 165.

An inner peripheral edge of the outer deep well region 182 may extend to the vicinity of the boundary region between the active region 111 and the outer region 112. The outer deep well region 182 may cross the boundary region between the active region 111 and the outer region 112. The inner peripheral edge of the outer deep well region 182 may cover corner portions connecting the active side walls 174 and the outer main surface 172. The inner peripheral edge of the outer deep well region 182 may extend further along the active side walls 174 and be connected to the body region 141.

In this embodiment, an outer peripheral edge of the outer deep well region 182 covers the diode region 181 from the second main surface 104 side. The outer deep well region 182 may overlap with the source routing wiring 123 in plan view. The outer peripheral edge of the outer deep well region 182 may be formed at intervals toward the active side wall 174 sides from the diode region 181.

A p type impurity concentration of the outer deep well region 182 may be not more than the p type impurity concentration of the diode region 181. The p type impurity concentration of the outer deep well region 182 may be less than the p type impurity concentration of the diode region 181.

The p type impurity concentration of the outer deep well region 182 may be substantially equal to the p type impurity concentration of each deep well region 165. The p type impurity concentration of the outer deep well region 182 may be substantially equal to the p type impurity concentration of the body region 141.

The p type impurity concentration of the outer deep well region 182 may exceed the p type impurity concentration of the body region 141. The p type impurity concentration of the outer deep well region 182 may be less than the p type impurity concentration of the body region 141.

The p type impurity concentration of the outer deep well region 182 may be not more than the p type impurity concentration of each contact region 164. The p type impurity concentration of the outer deep well region 182 may be less than the p type impurity concentration of each contact region 164. The p type impurity concentration of the outer deep well region 182 may be not less than $1.0\times10^{17}$ cm$^{-3}$ and not more than $1.0\times10^{19}$ cm$^{-3}$.

The field limit structure 183 is formed in a region between the diode region 181 and the side surfaces 105A to 105D in plan view. In this embodiment, the field limit structure 183 is formed at intervals toward the diode region 181 side from the side surfaces 105A to 105D.

The field limit structure 183 includes one or a plurality of (for example, not less than two and not more than twenty) field limit regions 184. In this embodiment, the field limit structure 183 includes a field limit region group having a plurality of (five) field limit regions 184A, 184B, 184C, 184D, and 184E. The field limit regions 184A to 184E are formed in that order at intervals along a direction away from the diode region 181.

The field limit regions 184A to 184E respectively extend in band shapes along the peripheral edge of the active region 111 in plan view. More specifically, the field limit regions 184A to 184E are respectively formed in endless shapes (quadrilateral annular shapes in this embodiment) surrounding the active region 111 in plan view. Each of the field limit regions 184A to 184E is also referred to as an FLR (field limiting ring) region.

In this embodiment, bottom portions of the field limit regions 184A to 184E are positioned at the second main surface 104 side with respect to the bottom portion of the diode region 181. In this embodiment, the field limit region 184A at an innermost side among the field limit regions 184A to 184E covers the diode region 181 from the second main surface 104 side. The field limit region 184A may be overlapped in plan view with the source routing wiring 123 described above.

The field limit region 184A is electrically connected to the source routing wiring 123 via the diode region 181. The field limit region 184A may form a portion of the pn junction diode Dpn. The field limit region 184A may form a portion of the avalanche current absorbing structure.

Entireties of the field limit regions 184A to 184E are positioned at the second main surface 104 side with respect to the bottom walls of the respective gate trenches 142. The bottom portions of the field limit regions 184A to 184E are positioned at the second main surface 104 side with respect to the bottom walls of the respective source trenches 155.

The field limit regions 184A to 184E may be formed at a depth position substantially equal to the respective deep well regions 165 (the outer deep well region 182). The bottom portions of the field limit regions 184A to 184E may be positioned on substantially the same plane as the bottom portions of the respective deep well regions 165 (the outer deep well region 182).

The bottom portions of the field limit regions 184A to 184E may be positioned at the outer main surface 172 side with respect to the bottom portions of the respective deep well regions 165 (the outer deep well region 182). The bottom portions of the field limit regions 184A to 184E may be positioned at the second main surface 104 side with respect to the bottom portions of the respective deep well regions 165 (the outer deep well region 182).

Widths between mutually adjacent field limit regions 184A to 184E may differ from each other. The widths between mutually adjacent field limit regions 184A to 184E may increase in a direction away from the active region 111. The widths between mutually adjacent field limit regions 184A to 184E may decrease in the direction away from the active region 111.

Depths of the field limit regions 184A to 184E may differ from each other. The depths of the field limit regions 184A to 184E may decrease in the direction away from the active region 111. The depths of the field limit regions 184A to 184E may increase in the direction away from the active region 111.

A p type impurity concentration of the field limit regions 184A to 184E may be not more than the p type impurity concentration of the diode region 181. The p type impurity concentration of the field limit regions 184A to 184E may be less than the p type impurity concentration of the diode region 181.

The p type impurity concentration of the field limit regions 184A to 184E may be not more than the p type impurity concentration of the outer deep well region 182. The p type impurity concentration of the field limit regions 184A to 184E may be less than the p type impurity concentration of the outer deep well region 182.

The p type impurity concentration of the field limit regions 184A to 184E may be not less than the p type impurity concentration of the outer deep well region 182. The p type impurity concentration of the field limit regions 184A to 184E may be greater than the p type impurity concentration of the outer deep well region 182.

The p type impurity concentration of the field limit regions 184A to 184E may be not less than $1.0\times10^{15}$ cm$^{-3}$ and not more than $1.0\times10^{18}$ cm$^{-3}$. Preferably, the p type impurity concentration of the diode region 181>the p type impurity concentration of the outer deep well region 182>the p type impurity concentration of the field limit regions 184A to 184E.

The field limit structure 183 relaxes concentration of electric field in the outer region 112. The number, widths, depths, p type impurity concentration, etc., of the field limit regions 184 may take on any of various values in accordance with the electric field to be relaxed.

With this embodiment, an example where the field limit structure 183 includes one or a plurality of field limit regions 184 formed in the region between the diode region 181 and the side surfaces 105A to 105D in plan view was described.

However, the field limit structure 183 may include one or a plurality of field limit regions 184 formed in the region between the active side walls 174 and the diode region 181 in plan view in place of the region between the diode region 181 and the side surfaces 105A to 105D.

Also, the field limit structure 183 may include one or a plurality of field limit regions 184 formed in the region between the diode region 181 and the side surfaces 105A to 105D in plan view and one or a plurality of field limit regions 184 formed in the region between the active side walls 174 and the diode region 181 in plan view.

The SiC semiconductor device 101 includes an outer insulating layer 191 formed on the first main surface 103 in the outer region 112. The outer insulating layer 191 forms a portion of the main surface insulating layer 113. The outer insulating layer 191 forms portions of the insulating side surfaces 114A to 114D of the main surface insulating layer 113.

The outer insulating layer 191 selectively covers the diode region 181, the outer deep well region 182, and the field limit structure 183 in the outer region 112. The outer insulating layer 191 is formed in a film along the active side walls 174 and the outer main surface 172. On the active main surface 171, the outer insulating layer 191 is continuous to the gate insulating layer 148. More specifically, the outer insulating layer 191 is continuous to the third regions 148c of the gate insulating layer 148.

The outer insulating layer 191 may include silicon oxide. The outer insulating layer 191 may include another insulating film of silicon nitride, etc. In this embodiment, the outer insulating layer 191 is formed of the same insulating material type as the gate insulating layer 148.

The outer insulating layer 191 includes a first region 191a and a second region 191b. The first region 191a of the outer insulating layer 191 covers the active side walls 174. The second region 191b of the outer insulating layer 191 covers the outer main surface 172.

A thickness of the second region 191b of the outer insulating layer 191 may be not more than a thickness of the first region 191a of the outer insulating layer 191. The thickness of the second region 191b of the outer insulating layer 191 may be less than the thickness of the first region 191a of the outer insulating layer 191.

The thickness of the first region 191a of the outer insulating layer 191 may be substantially equal to the thickness of the first regions 191a of the gate insulating layer 148. The thickness of the second region 191b of the outer insulating layer 191 may be substantially equal to the thickness of the third regions 148c of the gate insulating layer 148. Obviously, the outer insulating layer 191 having a uniform thickness may be formed.

Referring to FIG. 24 and FIG. 25, the SiC semiconductor device 101 further includes a side wall structure 192 covering the active side walls 174. The side wall structure 192 protects and reinforces the active mesa 173 from the outer region 112 side.

Also, the side wall structure 192 forms a level difference moderating structure that moderates a level difference formed between the active main surface 171 and the outer main surface 172. If an upper layer structure (covering layer) covering the boundary region between the active region 111 and the outer region 112 is formed, the upper layer structure covers the side wall structure 192. The side wall structure 192 improves flatness of the upper layer structure.

The side wall structure 192 may have an inclined portion 193 that inclines downwardly from the active main surface 171 toward the outer main surface 172. The level difference can be moderated appropriately by the inclined portion 193. The inclined portion 193 may be formed in a curved shape recessed toward the SiC semiconductor layer 102 side. The inclined portion 193 may be formed in a curved shape protruding in a direction away from the SiC semiconductor layer 102.

The inclined portion 193 may extend in a plane from the active main surface 171 side toward the outer main surface 172 side. The inclined portion 193 may extend rectilinearly from the active main surface 171 side toward the outer main surface 172 side.

The inclined portion 193 may be formed in a set of stairs descending from the active main surface 171 toward the outer main surface 172. That is, the inclined portion 193 may have one or a plurality of step portions recessed toward the SiC semiconductor layer 102 side. A plurality of step portions increase a surface area of the inclined portion 193 and improve adhesion force with respect to the upper layer structure.

The inclined portion 193 may include a plurality of raised portions raised in the direction away from the SiC semiconductor layer 102. The plurality of raised portions increase the surface area of the inclined portion 193 and improve the adhesion force with respect to the upper layer structure. The inclined portion 193 may include a plurality of recesses recessed toward the SiC semiconductor layer 102 side. The plurality of recesses increase the surface area of the inclined portion 193 and improve the adhesion force with respect to the upper layer structure.

The side wall structure 192 is formed self-aligningly with respect to the active main surface 171. More specifically, the side wall structure 192 is formed along the active side walls 174. In this embodiment, the side wall structure 192 is formed in an endless shape (a quadrilateral annular shape in this embodiment) surrounding the active region 111 in plan view.

The side wall structure 192 preferably includes a p type polysilicon doped with a p type impurity. In this case, the side wall structure 192 can be formed at the same time as the gate electrode layers 149 and the source electrode layers 157.

A p type impurity concentration of the side wall structure 192 is not less than the p type impurity concentration of the body region 141. More specifically, the p type impurity concentration of the side wall structure 192 is greater than the p type impurity concentration of the body region 141. The p type impurity of the side wall structure 192 may include at least one type of material among boron (B), aluminum (Al), indium (In), and gallium (Ga).

The p type impurity concentration of the side wall structure 192 may be not less than $1 \times 10^{18}$ cm$^{-3}$ and not more than $1 \times 10^{22}$ cm$^{-3}$. A sheet resistance of the side wall structure 192 may be not less than $10\Omega/\square$ and not more than $500\Omega/\square$ (approximately $200\Omega/\square$ in this embodiment). The p type impurity concentration of the side wall structure 192 may be substantially equal to the p type impurity concentration of the gate electrode layers 149. The sheet resistance of the side wall structure 192 may be substantially equal to the sheet resistance of the gate electrode layers 149.

The side wall structure 192 may include an n type polysilicon in place of or in addition to the p type polysilicon. The side wall structure 192 may include at least one type of material among tungsten, aluminum, copper, an aluminum alloy, and a copper alloy in place of or in addition to the p type polysilicon. The side wall structure 192 may include an insulating material. In this case, an insulating property of the active region 111 with respect to the outer region 112 can be improved by the side wall structure 192.

Referring to FIG. 21 to FIG. 25, the SiC semiconductor device 101 includes an interlayer insulating layer 201 formed on the first main surface 103. The interlayer insulating layer 201 forms a portion of the main surface insulating layer 113. The interlayer insulating layer 201 forms portions of the insulating side surfaces 114A to 114D of the main surface insulating layer 113. That is, the main surface insulating layer 113 has a laminated structure that includes the gate insulating layer 148 (outer insulating layer 191) and the interlayer insulating layer 201.

The interlayer insulating layer 201 selectively covers the active region 111 and the outer region 112. More specifically, the interlayer insulating layer 201 selectively covers the third regions 148c of the gate insulating layer 148 and the outer insulating layer 191.

The interlayer insulating layer 201 is formed in a film along the active main surface 171 and the outer main surface 172. In the active region 111, the interlayer insulating layer 201 selectively covers the trench gate structures 161, the gate wiring layer 150, and the trench source structures 162. In the outer region 112, the interlayer insulating layer 201 selectively covers the diode region 181, the outer deep well region 182, and the field limit structure 183.

In the boundary region between the active region 111 and the outer region 112, the interlayer insulating layer 201 is formed along an outer surface (inclined portion 193) of the side wall structure 192. The interlayer insulating layer 201 forms a portion of the upper layer structure that covers the side wall structure 192.

The interlayer insulating layer 201 may include silicon oxide or silicon nitride. The interlayer insulating layer 201 may include PSG (phosphor silicate glass) and/or BPSG (boron phosphor silicate glass) as an example of silicon oxide. The interlayer insulating layer 201 may have a laminated structure including a PSG layer and a BPSG layer laminated in that order from the first main surface 103 side. The interlayer insulating layer 201 may have a laminated structure including a BPSG layer and a PSG layer laminated in that order from the first main surface 103 side.

The interlayer insulating layer 201 includes a gate contact hole 202, source contact holes 203, and a diode contact hole 204. The interlayer insulating layer 201 also includes an anchor hole 205.

The gate contact hole 202 exposes the gate wiring layer 150 in the active region 111. The gate contact hole 202 may be formed in a band shape oriented along the gate wiring layer 150. An opening edge portion of the gate contact hole 202 is formed in a shape curved toward the gate contact hole 202 side.

The source contact holes 203 expose the source regions 163, the contact regions 164, and the trench source structures 162 in the active region 111. The source contact holes 203 may be formed in band shapes oriented along the trench source structures 162, etc. An opening edge portion of each source contact hole 203 is formed in a shape curved toward the source contact hole 203 side.

The diode contact hole 204 exposes the diode region 181 in the outer region 112. The diode contact hole 204 may be formed in a band shape (more specifically, an endless shape) extending along the diode region 181.

The diode contact hole 204 may expose the outer deep well region 182 and/or the field limit structure 183. An opening edge portion of the diode contact hole 204 is formed in a shape curved toward the diode contact hole 204 side.

The anchor hole 205 is formed by digging into the interlayer insulating layer 201 in the outer region 112. The anchor hole 205 is formed in the region between the diode region 181 and the side surfaces 105A to 105D in plan view. More specifically, the anchor hole 205 is formed in a region between the field limit structure 183 and the side surfaces 105A to 105D in plan view. The anchor hole 205 exposes the first main surface 103 (outer main surface 172). An opening edge portion of the anchor hole 205 is formed in a shape curved toward the anchor hole 205 side.

Referring to FIG. 19, the anchor hole 205 extends in a band shape along the active region 111 in plan view. In this embodiment, the anchor hole 205 is formed in an endless shape (a quadrilateral annular shape in this embodiment) surrounding the active region 111 in plan view.

In this embodiment, a single anchor hole 205 is formed in a portion of the interlayer insulating layer 201 covering the outer region 112. However, a plurality of anchor holes 205 may be formed in portions of the interlayer insulating layer 201 covering the outer region 112.

The main surface gate electrode layer 115 and the main surface source electrode layer 121 described above are respectively formed on the interlayer insulating layer 201. Each of the main surface gate electrode layer 115 and the main surface source electrode layer 121 has a laminated structure that includes a barrier electrode layer 206 and a main electrode layer 207 laminated in that order from the SiC semiconductor layer 102 side.

The barrier electrode layer 206 may have a single layer structure constituted of a titanium layer or a titanium nitride layer. The barrier electrode layer 206 may have a laminated structure including a titanium layer and a titanium nitride layer that are laminated in that order from the SiC semiconductor layer 102 side.

A thickness of the main electrode layer 207 exceeds a thickness of the barrier electrode layer 206. The main electrode layer 207 includes a conductive material having a resistance value less than a resistance value of the barrier electrode layer 206. The main electrode layer 207 may include at least one type of material among aluminum, copper, an aluminum alloy, and a copper alloy. The main electrode layer 207 may include at least one type of material among an AlSi alloy, an AlSiCu alloy, and an AlCu alloy. In this embodiment, the main electrode layer 207 includes an AlSiCu alloy.

The outer gate finger 117 included in the main surface gate electrode layer 115 enters into the gate contact hole 202 from on the interlayer insulating layer 201. The outer gate finger 117 is electrically connected to the gate wiring layer 150 inside the gate contact hole 202. An electrical signal from the gate pad 116 is thereby transmitted to the gate electrode layers 149 via the outer gate finger 117.

The source pad 122 included in the main surface source electrode layer 121 enters into the source contact holes 203 and the source sub-trenches 168 from on the interlayer insulating layer 201. The source pad 122 is electrically connected to the source regions 163, the contact regions 164, and the source electrode layers 157 inside the source contact holes 203 and the source sub-trenches 168.

The source electrode layers 157 may be formed using partial regions of the source pad 122. The source electrode layers 157 may be formed by portions of the source pad 122 entering into the respective source trenches 155.

The source routing wiring 123 included in the main surface source electrode layer 121 enters into the diode contact hole 204 from on the interlayer insulating layer 201. The source routing wiring 123 is electrically connected to the diode region 181 inside the diode contact hole 204.

The source connection portion 124 included in the main surface source electrode layer 121 crosses the side wall structure 192 from the active region 111 and is led out to the outer region 112. The source connection portion 124 forms a portion of the upper layer structure covering the side wall structure 192.

The passivation layer 125 described above is formed on the interlayer insulating layer 201. The passivation layer 125 is formed in a film along the interlayer insulating layer 201. The passivation layer 125 selectively covers the active region 111 and the outer region 112 via the interlayer insulating layer 201.

The passivation layer 125 crosses the side wall structure 192 from the active region 111 and is led out to the outer region 112. The passivation layer 125 forms a portion of the upper layer structure covering the side wall structure 192.

Referring to FIG. 24, in the outer region 112, the passivation layer 125 enters into the anchor hole 205 from on the interlayer insulating layer 201. Inside the anchor hole 205, the passivation layer 125 is connected to the outer main surface 172 (first main surface 103). A recess 211 recessed in conformance to the anchor hole 205 is formed in a region of an outer surface of the passivation layer 125 positioned on the anchor hole 205.

The resin layer 129 described above is formed on the passivation layer 125. The resin layer 129 is formed in a film along the passivation layer 125. The resin layer 129 selectively covers the active region 111 and the outer region 112 across the passivation layer 125 and the interlayer insulating layer 201. The resin layer 129 crosses the side wall structure 192 from the active region 111 and is led out to the outer region 112. The resin layer 129 forms a portion of the upper layer structure covering the side wall structure 192.

Referring to FIG. 24, the resin layer 129 has, in the outer region 112, an anchor portion entering into the recess 211 of the passivation layer 125. An anchor structure arranged to improve a connection strength of the resin layer 129 is thus formed in the outer region 112.

The anchor structure includes an uneven structure formed in the first main surface 103 in the outer region 112. More specifically, the uneven structure (anchor structure) includes unevenness formed using the interlayer insulating layer 201 covering the outer main surface 172. Even more specifically, the uneven structure (anchor structure) includes the anchor hole 205 formed in the interlayer insulating layer 201.

The resin layer 129 is engaged with the anchor hole 205. In this embodiment, the resin layer 129 is engaged with the anchor hole 205 via the passivation layer 125. The connection strength of the resin layer 129 with respect to the first main surface 103 can thereby be improved and therefore, peeling of the resin layer 129 can be suppressed.

As described above, even with the SiC semiconductor device 101, the same effects as the effects described for the SiC semiconductor device 1 can be exhibited. Also, with the SiC semiconductor device 101, depletion layers can be spread from boundary regions (pn junction portions) between the SiC semiconductor layer 102 and the deep well regions 165 toward regions at the second main surface 104 side with respect to the gate trenches 142.

Current paths of a short-circuit current flowing between the main surface source electrode layer 121 and the drain electrode layers 133 can thereby be narrowed. Also, a feedback capacitance Crss can be reduced inverse-proportionately by the depletion layers spreading from the boundary regions between the SiC semiconductor layer 102 and the deep well regions 165. The SiC semiconductor device 101 can thus be provided in which the short-circuit capacity can be improved and the feedback capacitance Crss can be reduced. The feedback capacitance Crss is a static capacitance across the gate electrode layers 149 and the drain electrode layer 133.

The depletion layers spreading from the boundary regions between the SiC semiconductor layer 102 and the deep well regions 165 may overlap with the bottom walls of the gate trenches 142. In this case, the depletion layers spreading from the bottom portions of the deep well regions 165 may overlap with the bottom walls of the gate trenches 142.

Also, with the SiC semiconductor device 101, the distances between the bottom portions of the respective deep well regions 165 and the second main surface 104 are substantially equal. Occurrence of variation in the distances between the bottom portions of the respective deep well regions 165 and the second main surface 104 can thereby be suppressed. The withstand voltage (for example, the electrostatic breakdown strength) of the SiC semiconductor layer 102 can thus be suppressed from being restricted by the deep well regions 165 and therefore improvement of the withstand voltage can be achieved appropriately.

Also, with the SiC semiconductor device 101, the diode region 181 is formed in the outer region 112. The diode region 181 is electrically connected to the main surface source electrode layer 121. The avalanche current generated in the outer region 112 can thereby be made to flow into the main surface source electrode layer 121 via the diode region 181. That is, the avalanche current generated in the outer region 112 can be absorbed by the diode region 181 and the main surface source electrode layer 121. Consequently, stability of operation of the MISFET can be improved.

Also, with the SiC semiconductor device 101, the outer deep well region 182 is formed in the outer region 112. The withstand voltage of the SiC semiconductor layer 102 can thereby be adjusted in the outer region 112. In particular, with the SiC semiconductor device 101, the outer deep well region 182 is formed at substantially the same depth position as the deep well regions 165. More specifically, the bottom portion of the outer deep well region 182 is positioned on substantially the same plane as the bottom portions of the deep well regions 165.

The distance between the bottom portion of the outer deep well region 182 and the second main surface 104 is substantially equal to the distances between the bottom portions of the deep well regions 165 and the second main surface 104. Variation can thereby be suppressed from occurring between the distance between the bottom portion of the outer deep well region 182 and the second main surface 104 and the distances between the bottom portions of the deep well regions 165 and the second main surface 104.

The withstand voltage (for example, the electrostatic breakdown strength) of the SiC semiconductor layer 102 can thus be suppressed from being restricted by the configuration of outer deep well region 182 and the configuration of the deep well regions 165. Consequently, improvement of the withstand voltage can be achieved appropriately. In particular, with the SiC semiconductor device 101, the outer region 112 is formed in a region at the second main surface 104 side with respect to the active region 111. The position of the bottom portion of the outer deep well region 182 can thereby be made to approach the positions of the bottom portions of the deep well regions 165 appropriately.

That is, a need to introduce the p type impurity to a comparatively deep position of the surface layer portion of the first main surface 103 during the forming of the outer deep well region 182 is eliminated. The position of the bottom portion of the outer deep well region 182 can thus be suppressed appropriately from deviating greatly with respect to the positions of the bottom portions of the deep well regions 165.

Moreover, with the SiC semiconductor device 101, the outer main surface 172 is positioned on substantially the same plane as the bottom walls of the source trenches 155. Thereby, if the p type impurity is introduced into the bottom walls of the source trenches 155 and the outer main surface 172 at an equal energy, the deep well regions 165 and the outer deep well region 182 can be formed at substantially equal depth positions. Consequently, the position of the bottom portion of the outer deep well region 182 can be suppressed even more appropriately from deviating greatly with respect to the positions of the bottom portions of the deep well regions 165.

Also, with the SiC semiconductor device 101, the field limit structure 183 is formed in the outer region 112. An electric field relaxation effect by the field limit structure 183 can thereby be obtained in the outer region 112. The electrostatic breakdown strength of the SiC semiconductor layer 102 can thus be improved appropriately.

Also, with the SiC semiconductor device 101, the active region 111 is formed as the active mesa 173 of mesa shape. The active mesa 173 includes the active side walls 174 connecting the active main surface 171 of the active region 111 and the outer main surface 172. The level difference moderating structure that moderates the level difference between the active main surface 171 and the outer main surface 172 is formed in the region between the active main surface 171 and the outer main surface 172. The level difference moderating structure includes the side wall structure 192.

The level difference between the active main surface 171 and the outer main surface 172 can thereby be moderated appropriately. The flatness of the upper layer structure formed on the side wall structure 192 can thus be improved appropriately. With the SiC semiconductor device 101, the interlayer insulating layer 201, the main surface source electrode layer 121, the passivation layer 125, and the resin layer 129 are formed as an example of the upper layer structure.

Also, with the SiC semiconductor device 101, the anchor structure arranged to improve the connection strength of the resin layer 129 is formed in the outer region 112. The anchor structure includes the uneven structure formed in the first main surface 103 in the outer region 112. More specifically, the uneven structure (anchor structure) includes the unevenness formed using the interlayer insulating layer 201 formed on the first main surface 103 in the outer region 112. Even more specifically, the uneven structure (anchor structure) includes the anchor hole 205 formed in the interlayer insulating layer 201.

The resin layer 129 is engaged with the anchor hole 205. In this embodiment, the resin layer 129 is engaged with the anchor hole 205 via the passivation layer 125. The connection strength of the resin layer 129 with respect to the first main surface 103 can thereby be improved and therefore, peeling of the resin layer 129 can be suppressed appropriately.

Also, with the SiC semiconductor device 101, the trench gate structures 161 with each of which the gate electrode layer 149 is embedded across the gate insulating layer 148 in the gate trench 142 are formed. With the trench gate structure 161, the gate electrode layer 149 is covered by the low resistance electrode layer 167 in the limited space of the gate trench 142. An effect described using FIG. 26 can be exhibited by such a structure.

Figure 26:
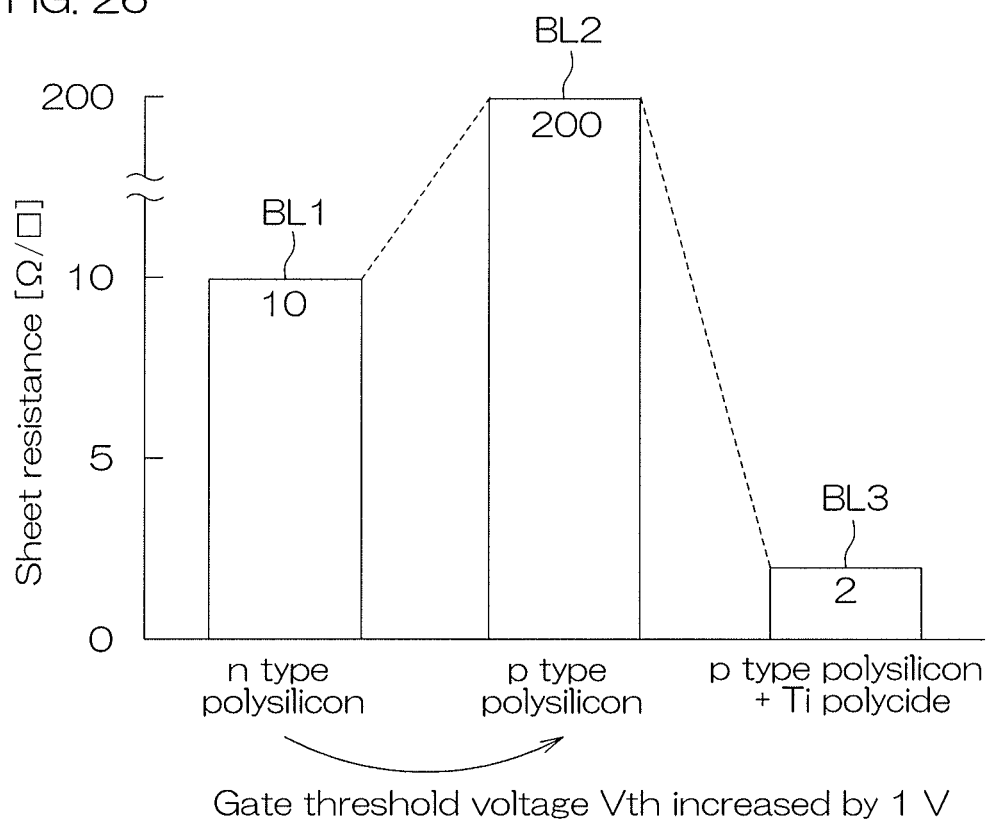
FIG. 26 is a graph for describing sheet resistance.

FIG. 26 is a graph for describing the sheet resistance inside the gate trench 142. In FIG. 26, the ordinate represents sheet resistance ($\Omega/\square$) and the abscissa represents items. In FIG. 26, a first bar graph BL1, a second bar graph BL2, and a third bar graph BL3 are shown.

The first bar graph BL1 represents the sheet resistance inside the gate trench 142 embedded with the n type polysilicon. The second bar graph BL2 represents the sheet resistance inside the gate trench 142 embedded with the p type polysilicon.

The third bar graph BL3 represents the sheet resistance inside the gate trench 142 embedded with the gate electrode layers 149 (p type polysilicon) and the low resistance electrode layer 167. Here, a case where the low resistance electrode layer 167 constituted of $TiSi_2$ (p type titanium silicide) as an example of polycide (silicide) is formed shall be described.

Referring to the first bar graph BL1, the sheet resistance inside the gate trench 142 embedded with the n type polysilicon was $10\Omega/\square$. Referring to the second bar graph BL2, the sheet resistance inside the gate trench 142 embedded with the p type polysilicon was $200\Omega/\square$. Referring to the third bar graph BL3, the sheet resistance inside the gate trench 142 embedded with the gate electrode layers 149 (p type polysilicon) and the low resistance electrode layer 167 was $2\ \Omega/\square$.

The p type polysilicon has a work function differing from the n type polysilicon. With a structure in which the p type polysilicon is embedded in the gate trenches 142, a gate threshold voltage Vth can be increased by approximately 1 V.

However, the p type polysilicon has a sheet resistance of several tens of times (here, approximately 20 times) higher than a sheet resistance of the n type polysilicon. Therefore, if the p type polysilicon is adopted as a material of the gate electrode layers 149, energy loss increases significantly in accompaniment with increase of parasitic resistance inside the gate trenches 142 (referred to hereinafter simply as "gate resistance").

On the other hand, with the structure having the low resistance electrode layer 167 on the gate electrode layers 149 (p type polysilicon), the sheet resistance can be decreased to not more than 1/100th in comparison to a case of not forming the low resistance electrode layer 167. That is, with the structure having the low resistance electrode layer 167, the sheet resistance can be decreased to not more than 1/5th in comparison to the gate electrode layers 149 including the n type polysilicon.

Thus, with the structure having the low resistance electrode layer 167, the sheet resistance inside the gate trench 142 can be reduced while increasing the gate threshold voltage Vth (for example, increasing it by approximately 1 V). Reduction of the gate resistance can thereby be achieved and therefore a current can be diffused efficiently along the trench gate structures 161. Consequently, reduction of switching delay can be achieved.

Also, with the structure having the low resistance electrode layer 167, the p type impurity concentration of the body region 141 and the p type impurity concentration of the contact regions 164 do not have to be increased. The gate threshold voltage Vth can thus be increased appropriately while suppressing the increase in channel resistance.

The low resistance electrode layer 167 may include at least one type of material among TiSi, $TiSi_2$, NiSi, CoSi, $CoSi_2$, $MoSi_2$, and $WSi_2$. Among these types of materials, NiSi, $CoSi_2$, and $TiSi_2$ are especially suitable as the polycide layer forming the low resistance electrode layer 167 due to being comparatively low in the value of specific resistance and temperature dependence.

As a result of further tests by the present inventors, increase of gate-to-source leak current was observed during low electric field application when $TiSi_2$ was adopted as the material of the low resistance electrode layer 167. On the other hand, increase of gate-to-source leak current was not observed during low electric field application when $CoSi_2$ was adopted. In consideration of this point, it is considered that $CoSi_2$ is most preferable as the polycide layer forming the low resistance electrode layer 167.

Further, with the SiC semiconductor device 101, the gate wiring layer 150 is covered by the low resistance electrode layer 167. Reduction of gate resistance of the gate wiring layer 150 can also be achieved thereby. In particular, with the structure where the gate electrode layers 149 and the gate wiring layer 150 are covered by the low resistance electrode layer 167, the current can be diffused efficiently along the trench gate structures 161. The reduction of switching delay can thus be achieved appropriately.

Figure 27:
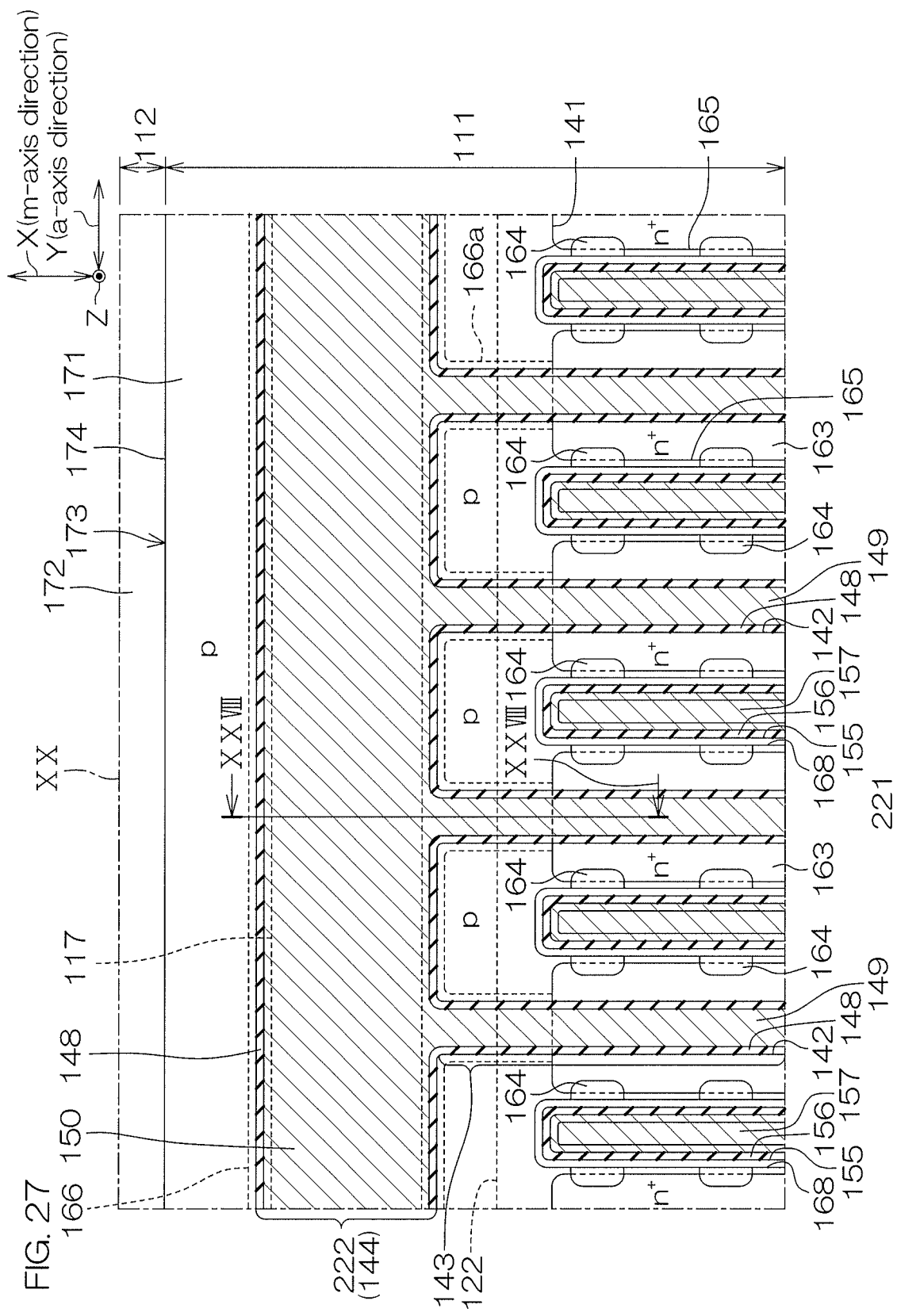
FIG. 27 is an enlarged view of a region corresponding to FIG. 20 and is an enlarged view of an SiC semiconductor device according to a fourth preferred embodiment of the present invention.
Figure 28:
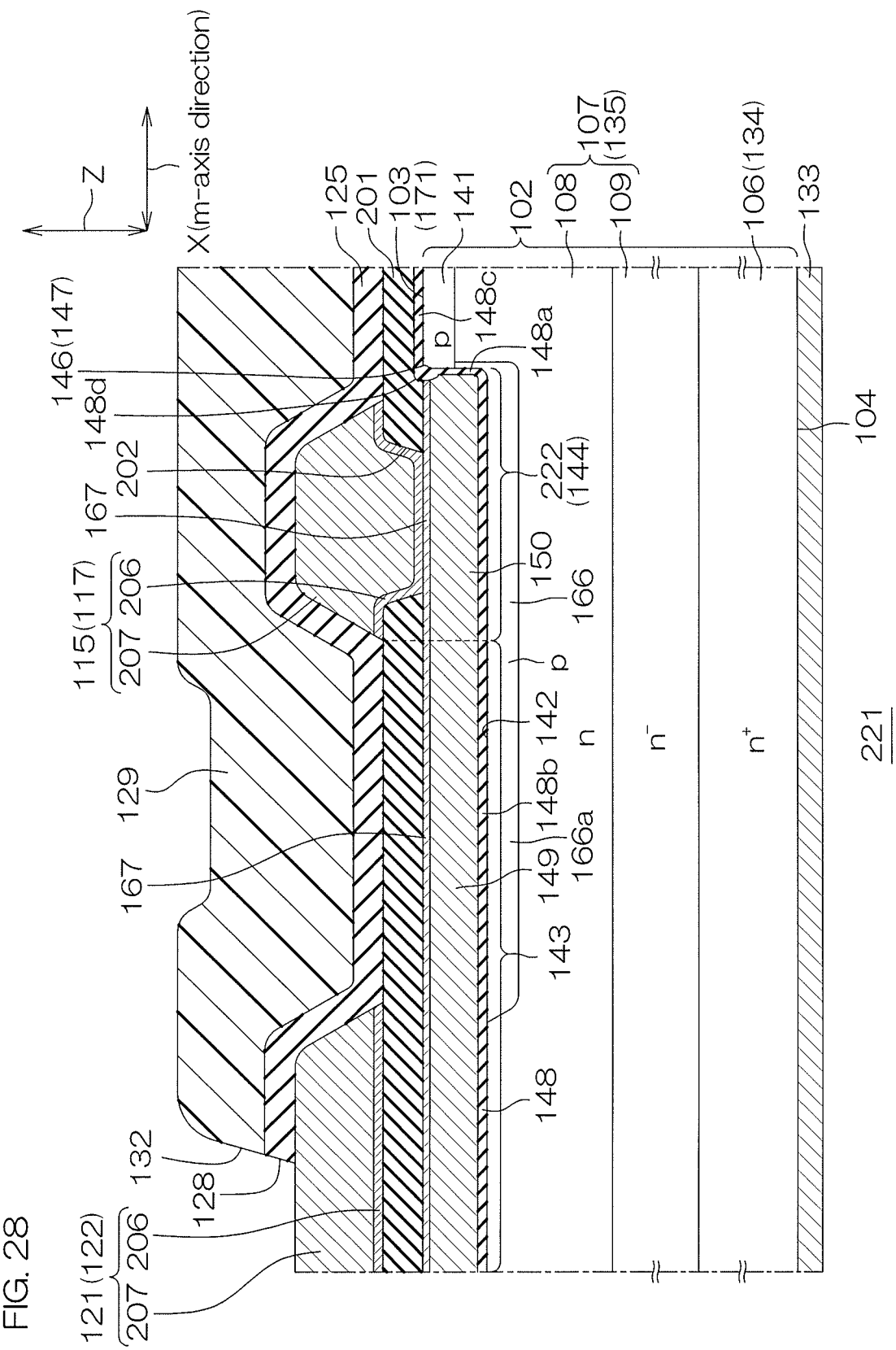
FIG. 28 is a sectional view taken along line XXVIII-XXVIII shown in FIG. 27.

FIG. 27 is an enlarged view of a region corresponding to FIG. 20 and is an enlarged view of an SiC semiconductor device 221 according to a fourth preferred embodiment of the present invention. FIG. 28 is a sectional view taken along line XXVIII-XXVIII shown in FIG. 27. In the following, structures corresponding to structures described with the SiC semiconductor device 101 shall be provided with the same reference signs and description thereof shall be omitted.

Referring to FIG. 27 and FIG. 28, the SiC semiconductor device 221 includes an outer gate trench 222 formed in the first main surface 103 in the active region 111. The outer gate trench 222 extends in a band shape along the peripheral edge portions of the active region 111. The outer gate trench 222 is formed in a region of the first main surface 103 directly below the outer gate finger 117.

The outer gate trench 222 extends along the outer gate finger 117. More specifically, the outer gate trench 222 is formed along the three side surfaces 105A, 105B, and 105D of the SiC semiconductor layer 102 such as to demarcate the inner region of the active region 111 from three directions. The outer gate trench 222 may be formed in an endless shape (for example, a quadrilateral annular shape) surrounding the inner region of the active region 111.

The outer gate trench 222 is in communication with the contact trench portions 144 of the respective gate trenches 142. The outer gate trench 222 and the gate trenches 142 are thereby formed by a single trench.

The gate wiring layer 150 described above is embedded in the outer gate trench 222. The gate wiring layer 150 is connected to the gate electrode layers 149 at communication portions of the gate trenches 142 and the outer gate trench 222. Also, the low resistance electrode layer 167 described above covers the gate wiring layer 150 inside the outer gate trench 222. In this case, the low resistance electrode layer 167 covering the gate electrode layers 149 and the low resistance electrode layer 167 covering the gate wiring layer 150 are formed inside a single trench.

As described above, even with the SiC semiconductor device 221, the same effects as the effects described for the SiC semiconductor device 101 can be exhibited. Also, with the semiconductor device 221, the gate wiring layer 150 is not required to be led out onto the first main surface 103. The gate wiring layer 150 can thereby be suppressed from opposing the SiC semiconductor layer 102 across the gate insulating layer 148 at the opening edge portions 146 of the gate trenches 142 (the outer gate trench 222). Consequently, the concentration of electric field at the opening edge portions 146 of the gate trenches 142 (the outer gate trench 222) can be suppressed.

Figure 29:
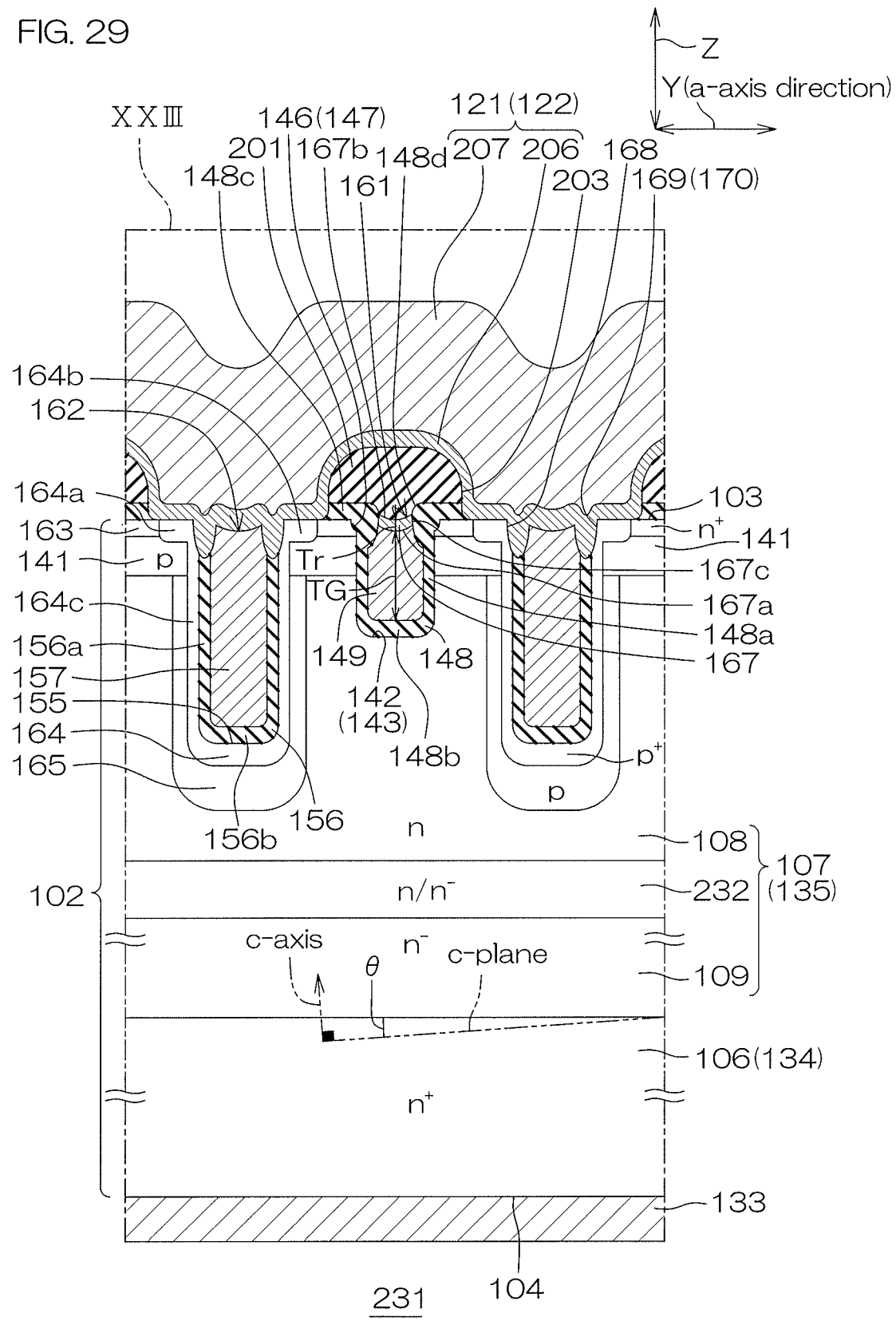
FIG. 29 is an enlarged view of a region corresponding to FIG. 23 and is an enlarged view of an SiC semiconductor device according to a fifth preferred embodiment of the present invention.

FIG. 29 is an enlarged view of a region corresponding to FIG. 23 and is an enlarged view of an SiC semiconductor device 231 according to a fifth preferred embodiment of the present invention. In the following, structures corresponding to the structures described with the SiC semiconductor device 101 shall be provided with the same reference signs and description thereof shall be omitted.

Referring to FIG. 29, in this embodiment, the SiC epitaxial layer 107 includes the high concentration region 108, the low concentration region 109, and a concentration gradient region 232, interposed between the high concentration region 108 and the low concentration region 109. In the SiC epitaxial layer 107, the concentration gradient region 232 is formed in the outer region 112 as well as in the active region 111. The concentration gradient region 232 is formed in an entire area of the SiC epitaxial layer 107.

The concentration gradient region 232 has a concentration gradient in which the n type impurity concentration decreases gradually from the high concentration region 108 toward the low concentration region 109. In other words, the concentration gradient region 232 has a concentration gradient in which the n type impurity concentration increases gradually from the low concentration region 109 toward the high concentration region 108. The concentration gradient region 232 suppresses sudden change of the n type impurity concentration in a region between the high concentration region 108 and the low concentration region 109.

When the SiC epitaxial layer 107 includes the concentration gradient region 232, the n type impurity concentration of the high concentration region 108 is preferably not less than 1.5 times and not more than 5 times the n type impurity concentration of the low concentration region 109. The n type impurity concentration of the high concentration region 108 may be not less than 3 times and not more than 5 times the n type impurity concentration of the low concentration region 109.

A thickness of the concentration gradient region 232 may be not less than 0.5 μm and not more than 2.0 μm. The thickness of the concentration gradient region 232 may be not less than 0.5 μm and not more than 1.0 μm, not less than 1.0 μm and not more than 1.5 μm, or not less than 1.5 μm and not more than 2.0 μm.

Although a specific description shall be omitted, the gate trenches 142, the source trenches 155, the deep well regions 165, the outer deep well region 182, etc., described above are formed in the high concentration region 108. That is, the gate trenches 142, the source trenches 155, the deep well regions 165, the outer deep well region 182, etc., described above are formed in a region of the SiC semiconductor layer 102 at the first main surface 103 side of a boundary region between the high concentration region 108 and the concentration gradient region 232.

As described above, even with the semiconductor device 231, the same effects as the effects described for the SiC semiconductor device 101 can be exhibited.

Figure 30:
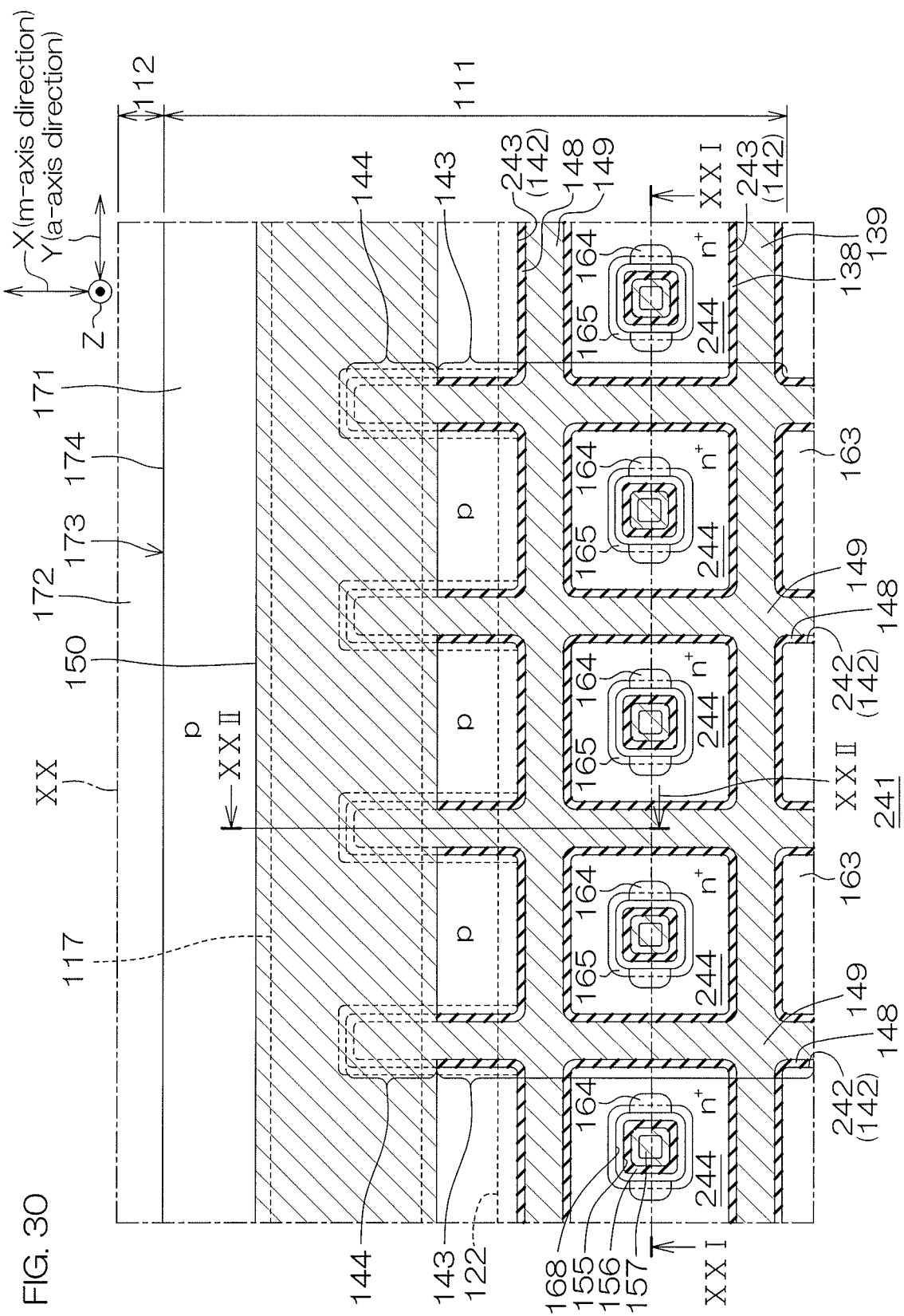
FIG. 30 is an enlarged view of a region corresponding to FIG. 20 and is an enlarged view of an SiC semiconductor device according to a sixth preferred embodiment of the present invention.

FIG. 30 is an enlarged view of a region corresponding to FIG. 20 and is an enlarged view of an SiC semiconductor device 241 according to a sixth preferred embodiment of the present invention. In the following, structures corresponding to the structures described with the SiC semiconductor device 101 shall be provided with the same reference signs and description thereof shall be omitted.

Referring to FIG. 30, in this embodiment, a gate trench 142 is formed in a lattice shape in plan view. More specifically, the gate trench 142 includes a plurality of first gate trenches 242 and a plurality of second gate trenches 243. The plurality of first gate trenches 242 and the plurality of second gate trenches 243 form active trench portions 143.

The plurality of first gate trenches 242 are formed at intervals in the second direction Y and are each formed in a band shape extending along the first direction X. The plurality of first gate trenches 242 are formed in a stripe shape as a whole in plan view. Side walls of each first gate trench 242 that form long sides are formed by the a-planes of the SiC monocrystal. The side walls of each first gate trench 242 that form short sides are formed by the m-planes of the SiC monocrystal.

The plurality of second gate trenches 243 are formed at intervals in the first direction X and are each formed in a band shape extending along the second direction Y. The plurality of second gate trenches 243 are formed in a stripe shape as a whole in plan view. Side walls of each second gate trench 243 that form long sides are formed by the m-planes of the SiC monocrystal. The side walls of each second gate trench 243 that form short sides are formed by the a-planes of the SiC monocrystal.

The plurality of first gate trenches 242 and the plurality of second gate trenches 243 intersect each other. A single gate trench 142 of lattice shape in plan view is thereby formed. A plurality of cell regions 244 are demarcated in regions surrounded by the gate trench 142.

The plurality of cell regions 244 are arranged in a matrix at intervals in the first direction X and the second direction Y in plan view. The plurality of cell regions 244 are formed in quadrilateral shapes in plan view. In each cell region 244, the body region 141 is exposed from the side walls of the gate trench 142. The body region 141 is exposed from the side walls of the gate trench 142 that are formed by the m-planes and the a-planes of the SiC monocrystal.

Obviously, the gate trench 142 may be formed in a honeycomb shape in plan view as one mode of the lattice shape. In this case, the plurality of cell regions 244 may be arranged in a staggered arrangement at intervals in the first direction X and the second direction Y. Also, in this case, the plurality of cell regions 244 may be formed in hexagonal shapes in plan view.

Each source trench 155 is formed in a central portion of the corresponding cell region 244 in plan view. Each source trench 155 is formed in a pattern appearing singly at a cut surface appearing when the corresponding cell region 244 is cut along the first direction X. Also, each source trench 155 is formed in a pattern appearing singly at a cut surface appearing when the corresponding cell region 244 is cut along the second direction Y.

More specifically, each source trench 155 is formed in a quadrilateral shape in plan view. Four side walls of each source trench 155 are formed by the m-planes and the a-planes of the SiC monocrystal. A planar shape of each source trench 155 is arbitrary. Each source trench 155 may be formed in a polygonal shape, such as a triangular shape, pentagonal shape, hexagonal shape, etc., or a circular shape or elliptical shape in plan view.

A sectional view taken along line XXI-XXI of FIG. 30 corresponds to the sectional view of FIG. 21. A sectional view taken along line XXII-XXII of FIG. 30 corresponds to the sectional view of FIG. 22.

As described above, even with the SiC semiconductor device 241, the same effects as the effects described for the SiC semiconductor device 101 can be exhibited.

Preferred embodiments of the present invention may be implemented in yet other embodiments.

With each of the preferred embodiments described above, an embodiment where the side surface 5A or 105A and the side surface 5C or 105C of the SiC semiconductor layer 2 or 102 face the a-planes of the SiC monocrystal and the side surface 5B or 105B and the side surface 5D or 105D face the m-planes of the SiC monocrystal was described. However, an embodiment where the side surface 5A or 105A and the side surface 5C or 105C face the m-planes of the SiC monocrystal and the side surface 5B or 105B and the side surface 5D or 105D face the a-planes of the SiC monocrystal may be adopted.

With each of the preferred embodiments described above, an example where the modified lines 22A to 22D of band shapes that extend continuously are formed was described. However, in each of the preferred embodiments described above, the modified lines 22A to 22D of broken-line band shapes (broken line shapes) may be formed. That is, the modified lines 22A to 22D may be formed in band shapes extending intermittently. In this case, one, two or three of the modified lines 22A to 22D may be formed in a broken-line band shape and the remainder may be formed in a band shape.

With each of the third to sixth preferred embodiments described above, an example where the plurality of gate trenches 142 (first gate trenches 242) extending along the m-axis direction (the [1-100] direction) of the SiC monocrystal are formed was described. However, the plurality of gate trenches 142 (first gate trenches 242) extending along the a-axis direction (the [11-20] direction) of the SiC monocrystal may be formed. In this case, the plurality of source trenches 155 extending along the a-axis direction (the [11-20] direction) of the SiC monocrystal are formed.

With each of the third to sixth preferred embodiments described above, an example where the source electrode layers 157 are embedded in the source trenches 155 across the source insulating layers 156 was described. However, the source electrode layers 157 may be embedded directly in the source trenches 155 without interposition of the source insulating layers 156.

With each of the third to sixth preferred embodiments described above, an example where each source insulating layer 156 is formed along the side walls and the bottom wall of the corresponding source trench 155 was described. However, each source insulating layer 156 may be formed along the side walls of the corresponding source trench 155 such as to expose the bottom wall of the source trench 155. Each source insulating layer 156 may be formed along the side walls and the bottom wall of the corresponding source trench 155 such as to expose a portion of the bottom wall of the source trench 155.

Also, each source insulating layer 156 may be formed along the bottom wall of the corresponding source trench 155 such as to expose the side walls of the source trench 155. Each source insulating layer 156 may be formed along the side walls and the bottom wall of the corresponding source trench 155 such as to expose a portion of the side walls of the source trench 155.

With each of the third to sixth preferred embodiments described above, an example where the gate electrode layers 149 and the gate wiring layer 150 that include the p type polysilicon doped with the p type impurity are formed was described. However, if increase of the gate threshold voltage Vth is not emphasized, the gate electrode layers 149 and the gate wiring layer 150 may include the n type polysilicon doped with the n type impurity in place of or in addition to the p type polysilicon.

In this case, the low resistance electrode layer 167 may be formed by siliciding, by a metal material, the portions of the gate electrode layers 149 (n type polysilicon) forming the surface layer portions. That is, the low resistance electrode layer 167 may include an n type polycide. With such a structure, reduction of gate resistance can be achieved.

In each of the third to sixth preferred embodiments described above, a $p^+$ type SiC semiconductor substrate (106) may be adopted in place of the $n^+$ type SiC semiconductor substrate 106. With this structure, an IGBT (insulated gate bipolar transistor) can be provided in place of a MISFET. In this case, in each of the third to sixth preferred embodiments described above, the "source" of the MISFET is replaced by an "emitter" of the IGBT and the "drain" of the MISFET is replaced by a "collector" of the IGBT.

In each of the preferred embodiments described above, a structure in which the conductivity types of the respective semiconductor portions are inverted may be adopted. That is, a p type portion may be made to be of an n type and an n type portion may be made to be of a p type.

The respective preferred embodiments described above can also be applied to a semiconductor device using a semiconductor material differing from SiC. The semiconductor material differing from SiC may be a compound semiconductor material. The compound semiconductor material may be either or both of gallium nitride (GaN) and gallium oxide ($Ga_2O_3$).

For example, each of the third to sixth preferred embodiments described above may be a compound semiconductor device that includes a vertical type compound semiconductor MISFET adopting a compound semiconductor material in place of SiC. In the compound semiconductor, magnesium may be adopted as a p type impurity (acceptor). Also, germanium (Ge), oxygen (O), or silicon (Si) may be adopted as an n type impurity (donor).

The present description does not restrict any combined embodiment of features illustrated with the first to sixth preferred embodiments. The first to sixth preferred embodiments may be combined among each other in any mode or any embodiment. That is, an SiC semiconductor device combining features illustrated with the first to sixth preferred embodiments in any mode or any configuration may be adopted.

Examples of features extracted from the present description and drawings (in particular FIG. 14E to FIG. 14M) are indicated below.

Japanese Patent Application Publication No. 2012-146878 discloses a method for manufacturing an SiC semiconductor device that uses a stealth dicing method. With the manufacturing method of Japanese Patent Application Publication No. 2012-146878, a plurality of columns of modified regions (modified layers) are formed over entire areas of respective side surfaces of an SiC semiconductor layer cut out from an SiC semiconductor wafer. The plurality of columns of modified regions (modified layers) extend along tangential directions to a main surface of the SiC semiconductor layer and are formed at intervals in a normal direction to the main surface of the SiC semiconductor layer.

The modified layers are formed by modifying an SiC monocrystal of the SiC semiconductor layer to be of another property. Thus, in consideration of influences on the SiC semiconductor layer due to the modified layers, it cannot be said to be desirable to form the plurality of modified layers over the entire areas of the side surfaces of the SiC semiconductor layer. As examples of the influences on the SiC semiconductor layer due to the modified layers, fluctuation of electrical characteristics of the SiC semiconductor layer due to the modified layers, generation of cracks in the SiC semiconductor layer with the modified layers as starting points, etc., can be cited.

[A1] to [A20] and [B1] to [B27] in the following provide an SiC semiconductor device that enables influences on an SiC semiconductor layer due to modified layers to be reduced.

[A1] An SiC semiconductor device including an SiC semiconductor layer including an SiC monocrystal that is constituted of a hexagonal crystal and having a first main surface as a device surface, a second main surface at a side opposite to the first main surface, a first side surface facing an a-plane of the SiC monocrystal, and a second side surface facing an m-plane of the SiC monocrystal, a first modified layer formed at the first side surface of the SiC semiconductor layer at a first occupying ratio and modified to be of a property differing from the SiC monocrystal, and a second modified layer formed at the second side surface of the SiC semiconductor layer at a second occupying ratio less than the first occupying ratio and modified to be of a property differing from the SiC monocrystal.

According to this SiC semiconductor device, the first modified layer and the second modified layer are formed at the occupying ratios that differ in accordance with the crystal planes of the SiC monocrystal. The SiC monocrystal has a physical property of cracking easily along nearest atom directions of Si atoms (an a-axis direction and directions equivalent thereto) and not cracking easily along directions intersecting the nearest atom directions (an m-axis direction and directions equivalent thereto) in a plan view of viewing a c-plane from a c-axis.

Therefore, in regard to the crystal planes of the SiC monocrystal that have the property of cracking comparatively easily (the m-planes and planes equivalent thereto), cutting can be performed appropriately even without forming modified layers having a comparatively large occupying ratio. Reduction of forming regions of the modified layers can thereby be achieved and influences on the SiC semiconductor layer due to the modified layers can thus be reduced.

[A2] An SiC semiconductor device including an SiC semiconductor layer including an SiC monocrystal that is constituted of a hexagonal crystal and having a first main surface as a device surface, a second main surface at a side opposite to the first main surface, a first side surface facing an a-plane of the SiC monocrystal, and a second side surface facing an m-plane of the SiC monocrystal, a plurality of first modified layers formed at intervals along a normal direction to the first main surface at the first side surface of the SiC semiconductor layer and modified to be of a property differing from the SiC monocrystal, and one or a plurality of second modified layers formed at the second side surface of the SiC semiconductor layer in a number less than a number of the first modified layers and modified to be of a property differing from the SiC monocrystal.

According to this SiC semiconductor device, the first modified layers and the second modified layers are formed to differ in number in accordance with the crystal planes of the SiC monocrystal. The SiC monocrystal has the physical property of cracking easily along the nearest atom directions of the Si atoms (the a-axis direction and directions equivalent thereto) and not cracking easily along the directions intersecting the nearest atom directions (the m-axis direction and directions equivalent thereto) in the plan view of viewing the c-plane from the c-axis.

Therefore, in regard to the crystal planes of the SiC monocrystal that have the property of cracking comparatively easily (the m-planes and planes equivalent thereto), cutting can be performed appropriately even without increasing the number of modified layers. Reduction of the forming regions of the modified layers can thereby be achieved and influences on the SiC semiconductor layer due to the modified layers can thus be reduced.

[A3] The SiC semiconductor device according to A1, wherein a plurality of the first modified layers are formed at intervals along a normal direction to the first main surface at the first side surface of the SiC semiconductor layer, and one or a plurality of the second modified layers of a number less than a number of the first modified layers is or are formed at intervals along the normal direction to the first main surface at the second side surface of the SiC semiconductor layer.

[A4] The SiC semiconductor device according to any one of A1 to 3, wherein each first modified layer has a first thickness in the normal direction to the first main surface and each second modified layer has a second thickness in the normal direction to the first main surface that is not more than the first thickness.

[A5] The SiC semiconductor device according to any one of A1 to A4, wherein each first modified layer is formed at an interval toward the second main surface side from the first main surface of the SiC semiconductor layer.

[A6] The SiC semiconductor device according to any one of A1 to A5, wherein each second modified layer is formed at an interval toward the second main surface side from the first main surface of the SiC semiconductor layer.

[A7] The SiC semiconductor device according to any one of A1 to A6, wherein each first modified layer is formed at an interval toward the first main surface side from the second main surface of the SiC semiconductor layer.

[A8] The SiC semiconductor device according to any one of A1 to A7, wherein each second modified layer is formed at an interval toward the first main surface side from the second main surface of the SiC semiconductor layer.

[A9] The SiC semiconductor device according to any one of A1 to A8, wherein each first modified layer extends in a straight line, a curve, or a broken line along an m-axis direction of the SiC monocrystal and each second modified layer extends in a straight line, a curve, or a broken line along an a-axis direction of the SiC monocrystal.

[A10] The SiC semiconductor device according to any one of A1 to A9, wherein the first main surface of the SiC semiconductor layer faces a c-plane of the SiC monocrystal.

[A11] The SiC semiconductor device according to any one of A1 to A10, wherein the first main surface of the SiC semiconductor layer has an off angle inclined at an angle not less than 0° and not more than 10° with respect to a c-plane of the SiC monocrystal.

[A12] The SiC semiconductor device according to A11, wherein the off angle is an angle not more than 5°.

[A13] The SiC semiconductor device according to A11 or A12, wherein the off angle is an angle exceeding 0° and being less than 4°.

[A14] The SiC semiconductor device according to any one of A1 to A13, wherein the SiC monocrystal is constituted of a 2H (hexagonal) —SiC monocrystal, a 4H—SiC monocrystal, or a 6H—SiC monocrystal.

[A15] The SiC semiconductor device according to any one of A1 to A14, wherein the second main surface of the SiC semiconductor layer is constituted of a ground surface.

[A16] The SiC semiconductor device according to any one of A1 to A15, wherein the first side surface of the SiC semiconductor layer is constituted of a cleavage surface and the second side surface of the SiC semiconductor layer is constituted of a cleavage surface.

[A17] The SiC semiconductor device according to any one of A1 to A16, wherein the SiC semiconductor layer has a thickness not less than 40 μm and not more than 200 μm.

[A18] The SiC semiconductor device according to any one of A1 to A17, wherein the SiC semiconductor layer has a laminated structure that includes an SiC semiconductor substrate and an SiC epitaxial layer and in which the first main surface is formed by the SiC epitaxial layer, each first modified layer is formed in the SiC semiconductor substrate, and each second modified layer is formed in the SiC semiconductor substrate.

[A19] The SiC semiconductor device according to A18, wherein the SiC epitaxial layer has a thickness not more than a thickness of the SiC semiconductor substrate.

[A20] The SiC semiconductor device according to A18 or 19, wherein the SiC semiconductor substrate has a thickness not less than 40 μm and not more than 150 μm and the SiC epitaxial layer has a thickness not less than 1 μm and not more than 50 μm.

[B1] An SiC semiconductor device including an SiC semiconductor layer including an SiC monocrystal that is constituted of a hexagonal crystal and having a first main surface as an element forming surface, a second main surface at a side opposite to the first main surface, a first side surface facing an a-plane of the SiC monocrystal, and a second side surface facing an m-plane of the SiC monocrystal, a first modified layer having a first thickness in a normal direction to the first main surface, formed at the first side surface of the SiC semiconductor layer at a first occupying ratio, and modified to be of a property differing from the SiC monocrystal, and a second modified layer having a second thickness in the normal direction to the first main surface that is not more than the first thickness, formed at the second side surface of the SiC semiconductor layer at a second occupying ratio less than the first occupying ratio, and modified to be of a property differing from the SiC monocrystal.

According to this SiC semiconductor device, reduction of forming regions of the modified layers can be achieved and influences on the SiC semiconductor layer due to the modified layers can thus be reduced.

[B2] An SiC semiconductor device including an SiC semiconductor layer including an SiC monocrystal that is constituted of a hexagonal crystal and having a first main surface as an element forming surface, a second main surface constituted of a ground surface at a side opposite to the first main surface, a first side surface facing an a-plane of the SiC monocrystal, and a second side surface facing an m-plane of the SiC monocrystal, a first modified layer formed at the first side surface of the SiC semiconductor layer at a first occupying ratio and modified to be of a property differing from the SiC monocrystal, and a second modified layer formed at the second side surface of the SiC semiconductor layer at a second occupying ratio less than the first occupying ratio and modified to be of a property differing from the SiC monocrystal.

According to this SiC semiconductor device, reduction of the forming regions of the modified layers can be achieved and influences on the SiC semiconductor layer due to the modified layers can thus be reduced.

[B3] An SiC semiconductor device including an SiC semiconductor layer including an SiC monocrystal that is constituted of a hexagonal crystal and having a first main surface as an element forming surface, a second main surface at a side opposite to the first main surface, a first side surface facing an a-plane of the SiC monocrystal and is constituted of a cleavage surface, and a second side surface facing an m-plane of the SiC monocrystal and is constituted of a cleavage surface, a first modified layer formed at the first side surface of the SiC semiconductor layer at a first occupying ratio and modified to be of a property differing from the SiC monocrystal, and a second modified layer formed at the second side surface of the SiC semiconductor layer at a second occupying ratio less than the first occupying ratio and modified to be of a property differing from the SiC monocrystal.

According to this SiC semiconductor device, reduction of the forming regions of the modified layers can be achieved and influences on the SiC semiconductor layer due to the modified layers can thus be reduced.

[B4] An SiC semiconductor device including an SiC semiconductor layer including an SiC monocrystal that is constituted of a hexagonal crystal, having a first main surface as an element forming surface, a second main surface at a side opposite to the first main surface, a first side surface facing an a-plane of the SiC monocrystal, and a second side surface facing an m-plane of the SiC monocrystal and having a thickness not less than 40 μm and not more than 200 μm, a first modified layer formed at the first side surface of the SiC semiconductor layer at a first occupying ratio and modified to be of a property differing from the SiC monocrystal, and a second modified layer formed at the second side surface of the SiC semiconductor layer at a second occupying ratio less than the first occupying ratio and modified to be of a property differing from the SiC monocrystal.

According to this SiC semiconductor device, reduction of the forming regions of the modified layers can be achieved and influences on the SiC semiconductor layer due to the modified layers can thus be reduced.

[B5] An SiC semiconductor device including an SiC semiconductor layer including an SiC monocrystal that is constituted of a hexagonal crystal, having a first main surface as an element forming surface, a second main surface at a side opposite to the first main surface, a first side surface facing an a-plane of the SiC monocrystal, and a second side surface facing an m-plane of the SiC monocrystal, and having a laminated structure that includes an SiC semiconductor substrate forming the second main surface and an SiC epitaxial layer forming the first main surface, a first modified layer formed at a first occupying ratio in a portion of the SiC semiconductor substrate that forms the first side surface of the SiC semiconductor layer and modified to be of a property differing from the SiC monocrystal, and a second modified layer formed at a second occupying ratio less than the first occupying ratio in a portion of the SiC semiconductor substrate that forms the second side surface of the SiC semiconductor layer and modified to be of a property differing from the SiC monocrystal.

According to this SiC semiconductor device, reduction of the forming regions of the modified layers can be achieved and influences on the SiC semiconductor layer due to the modified layers can thus be reduced.

[B6] The SiC semiconductor device according to B5, wherein the SiC epitaxial layer has a thickness not more than a thickness of the SiC semiconductor substrate.

[B7] The SiC semiconductor device according to B5 or B6, wherein the SiC semiconductor substrate has a thickness not less than 40 μm and not more than 150 μm and the SiC epitaxial layer has a thickness not less than 1 μm and not more than 50 μm.

[B8] The SiC semiconductor device according to any one of B2 to B7, wherein the first modified layer has a first thickness in the normal direction to the first main surface and the second modified layer has a second thickness in the normal direction to the first main surface that is not more than the first thickness.

[B9] The SiC semiconductor device according to any one of B1 to B8, wherein a plurality of the first modified layers are formed at intervals along the normal direction to the first main surface at the first side surface of the SiC semiconductor layer, and one or a plurality of the second modified layers of a number less than a number of the first modified layers is or are formed at intervals along the normal direction to the first main surface at the second side surface of the SiC semiconductor layer.

[B10] An SiC semiconductor device including an SiC semiconductor layer including an SiC monocrystal that is constituted of a hexagonal crystal and having a first main surface as an element forming surface, a second main surface at a side opposite to the first main surface, a first side surface facing an a-plane of the SiC monocrystal, and a second side surface facing an m-plane of the SiC monocrystal, a plurality of first modified layers having a first thickness in a normal direction to the first main surface, formed at intervals along the normal direction to the first main surface at the first side surface of the SiC semiconductor layer, and modified to be of a property differing from the SiC monocrystal, and one or a plurality of second modified layers having a second thickness in the normal direction to the first main surface that is not more than the first thickness, formed at the second side surface of the SiC semiconductor layer in a number less than a number of the first modified layers, and modified to be of a property differing from the SiC monocrystal.

According to this SiC semiconductor device, reduction of the forming regions of the modified layers can be achieved and influences on the SiC semiconductor layer due to the modified layers can thus be reduced.

[B11] An SiC semiconductor device including an SiC semiconductor layer including an SiC monocrystal that is constituted of a hexagonal crystal and having a first main surface as an element forming surface, a second main surface constituted of a ground surface at a side opposite to the first main surface, a first side surface facing an a-plane of the SiC monocrystal, and a second side surface facing an m-plane of the SiC monocrystal, a plurality of first modified layers formed at intervals along a normal direction to the first main surface at the first side surface of the SiC semiconductor layer and modified to be of a property differing from the SiC monocrystal, and one or a plurality of second modified layers formed at the second side surface of the SiC semiconductor layer in a number less than a number of the first modified layers and modified to be of a property differing from the SiC monocrystal.

According to this SiC semiconductor device, reduction of the forming regions of the modified layers can be achieved and influences on the SiC semiconductor layer due to the modified layers can thus be reduced.

[B12] An SiC semiconductor device including an SiC semiconductor layer including an SiC monocrystal that is constituted of a hexagonal crystal and having a first main surface as an element forming surface, a second main surface at a side opposite to the first main surface, a first side surface facing an a-plane of the SiC monocrystal and is constituted of a cleavage surface, and a second side surface facing an m-plane of the SiC monocrystal and is constituted of a cleavage surface, a plurality of first modified layers formed at intervals along a normal direction to the first main surface at the first side surface of the SiC semiconductor layer and modified to be of a property differing from the SiC monocrystal, and one or a plurality of second modified layers formed at the second side surface of the SiC semiconductor layer in a number less than a number of the first modified layers and modified to be of a property differing from the SiC monocrystal.

According to this SiC semiconductor device, reduction of the forming regions of the modified layers can be achieved and influences on the SiC semiconductor layer due to the modified layers can thus be reduced.

[B13] An SiC semiconductor device including an SiC semiconductor layer including an SiC monocrystal that is constituted of a hexagonal crystal, having a first main surface as an element forming surface, a second main surface at a side opposite to the first main surface, a first side surface facing an a-plane of the SiC monocrystal, and a second side surface facing an m-plane of the SiC monocrystal, and having a thickness not less than 40 µm and not more than 200 µm, a plurality of first modified layers formed at intervals along a normal direction to the first main surface at the first side surface of the SiC semiconductor layer and modified to be of a property differing from the SiC monocrystal, and one or a plurality of second modified layers formed at the second side surface of the SiC semiconductor layer in a number less than a number of the first modified layers and modified to be of a property differing from the SiC monocrystal.

According to this SiC semiconductor device, reduction of the forming regions of the modified layers can be achieved and influences on the SiC semiconductor layer due to the modified layers can thus be reduced.

[B14] An SiC semiconductor device including an SiC semiconductor layer including an SiC monocrystal that is constituted of a hexagonal crystal, having a first main surface as an element forming surface, a second main surface at a side opposite to the first main surface, a first side surface facing an a-plane of the SiC monocrystal, and a second side surface facing an m-plane of the SiC monocrystal, and having a laminated structure that includes an SiC semiconductor substrate forming the second main surface and an SiC epitaxial layer forming the first main surface, a plurality of first modified layers formed at intervals along a normal direction to the first main surface in a portion of the SiC semiconductor substrate that forms the first side surface of the SiC semiconductor layer and modified to be of a property differing from the SiC monocrystal, and one or a plurality of second modified layers formed in a number less than a number of the first modified layers in a portion of the SiC semiconductor substrate that forms the second side surface of the SiC semiconductor layer and modified to be of a property differing from the SiC monocrystal.

According to this SiC semiconductor device, reduction of the forming regions of the modified layers can be achieved and influences on the SiC semiconductor layer due to the modified layers can thus be reduced.

[B15] The SiC semiconductor device according to B14, wherein the SiC epitaxial layer has a thickness not more than a thickness of the SiC semiconductor substrate.

[B16] The SiC semiconductor device according to B14 or B15, wherein the SiC semiconductor substrate has a thickness not less than 40 µm and not more than 150 µm and the SiC epitaxial layer has a thickness not less than 1 µm and not more than 50 µm.

[B17] The SiC semiconductor device according to any one of B11 to B16, wherein each first modified layer has a first thickness in the normal direction to the first main surface and each second modified layer has a second thickness in the normal direction to the first main surface that is not more than the first thickness.

[B18] The SiC semiconductor device according to any one of B1 to B17, wherein each first modified layer is formed at an interval toward the second main surface side from the first main surface of the SiC semiconductor layer.

[B19] The SiC semiconductor device according to any one of B1 to B18, wherein each second modified layer is formed at an interval toward the second main surface side from the first main surface of the SiC semiconductor layer.

[B20] The SiC semiconductor device according to any one of B1 to B19, wherein each first modified layer is formed at an interval toward the first main surface side from the second main surface of the SiC semiconductor layer.

[B21] The SiC semiconductor device according to any one of B1 to B20, wherein each second modified layer is formed at an interval toward the first main surface side from the second main surface of the SiC semiconductor layer.

[B22] The SiC semiconductor device according to any one of B1 to B21, wherein each first modified layer extends in a straight line, a curve, or a broken line along an m-axis direction of the SiC monocrystal and each second modified layer extends in a straight line, a curve, or a broken line along an a-axis direction of the SiC monocrystal.

[B23] The SiC semiconductor device according to any one of B1 to B22, wherein the first main surface of the SiC semiconductor layer faces a c-plane of the SiC monocrystal.

[B24] The SiC semiconductor device according to any one of B1 to B23, wherein the first main surface of the SiC semiconductor layer has an off angle inclined at an angle not less than 0° and not more than 10° with respect to a c-plane of the SiC monocrystal.

[B25] The SiC semiconductor device according to B24, wherein the off angle is an angle not more than 5°.

[B26] The SiC semiconductor device according to B24 or B25, wherein the off angle is an angle exceeding 0° and being less than 4°.

[B27] The SiC semiconductor device according to any one of B1 to B26, wherein the SiC monocrystal is constituted of a 2H (hexagonal) —SiC monocrystal, a 4H—SiC monocrystal, or a 6H—SiC monocrystal.

The present application corresponds to Japanese Patent Application No. 2018-151453 filed on Aug. 10, 2018 in the Japan Patent Office and Japanese Patent Application No. 2018-151454 filed on Aug. 10, 2018 in the Japan Patent Office, and the entire disclosures of these applications are incorporated herein by reference.

While preferred embodiments of the present invention have been described in detail, these are merely specific examples used to clarify the technical contents of the present invention and the present invention should not be interpreted as being limited to these specific examples and the scope of the present invention is to be limited only by the appended claims.

REFERENCE SIGNS LIST

1 SiC semiconductor device
2 SiC semiconductor layer
3 first main surface of SiC semiconductor layer 4 second main surface of SiC semiconductor layer
5A side surface of SiC semiconductor layer
5B side surface of SiC semiconductor layer
5C side surface of SiC semiconductor layer
5D side surface of SiC semiconductor layer
6 SiC semiconductor substrate
7 SiC epitaxial layer
22A modified line
22B modified line
22C modified line
22D modified line
81 SiC semiconductor device
101 SiC semiconductor device
102 SiC semiconductor layer
103 first main surface of SiC semiconductor layer
104 second main surface of SiC semiconductor layer
105A side surface of SiC semiconductor layer
105B side surface of SiC semiconductor layer
105C side surface of SiC semiconductor layer
105D side surface of SiC semiconductor layer
106 SiC semiconductor substrate
107 SiC epitaxial layer
θ off angle
Z normal direction
X first direction (m-axis direction)
Y second direction (a-axis direction)

The invention claimed is:

1. An SiC semiconductor device comprising:
an SiC semiconductor layer including an SiC epitaxial layer formed on an SiC substrate, the SiC epitaxial layer having a device forming surface facing a c-plane of an SiC monocrystal and having an off angle inclined to an off direction with respect to the c-plane, and a side surface in an orthogonal direction to the off direction, the side surface having an angle less than the off angle inclined with respect to a normal to the device forming surface, and
a plurality of modified layers formed at intervals in a thickness direction of the SiC semiconductor substrate to expose the SiC epitaxial layer at the side surface and modified to be of a property differing from the SiC semiconductor substrate.

2. The SiC semiconductor device according to claim 1, wherein the plurality of modified layers are shifted from each other in the off direction in sectional view.

3. The SiC semiconductor device according to claim 1, wherein the side surface of the SiC semiconductor layer has a raised portion having the plurality of modified layers as apex portions or base portions.

4. The SiC semiconductor device according to claim 1, wherein the SiC semiconductor substrate includes a first conductivity type of impurity, and the SiC epitaxial layer includes the first conductivity type of impurity in which the first conductivity type of impurity concentration is not more than the first conductivity type of impurity concentration of the SiC semiconductor substrate.

5. The SiC semiconductor device according to claim 1, wherein the SiC epitaxial layer has a thickness which is not more than a thickness of the SiC semiconductor substrate.

6. The SiC semiconductor device according to claim 1, wherein the side surface of the SiC semiconductor layer is constituted of a cleavage surface.

7. The SiC semiconductor device according to claim 1, wherein the plurality of modified layers are each formed to a band shape extending along with a boundary of the SiC semiconductor substrate and the SiC epitaxial layer.

8. The SiC semiconductor device according to claim 1, wherein the off direction sets along direction of arrangement of the nearest neighboring Si atoms based on a Si atom positioned at a center in a plan view of viewing a silicon plane from a c-axis.

9. The SiC semiconductor device according to claim 1, wherein the SiC semiconductor layer has a second side surface extending along with the off direction.

10. The SiC semiconductor device according to claim 9, further comprising:
a second modified layer forms at the second side surface in the thickness direction of the SiC semiconductor substrate at interval with the SiC epitaxial layer and modified to be of a property differing from the SiC semiconductor substrate.

11. The SiC semiconductor device according to claim 9, wherein the second side surface of the SiC semiconductor layer is constituted of a cleavage surface.

12. The SiC semiconductor device according to claim 1, further comprising:
an insulating layer covered over the surface of the SiC epitaxial layer; and
a first electrode formed on the insulating layer which is electrically connected to the SiC epitaxial layer.

13. The SiC semiconductor device according to claim 12, wherein the insulating layer has a insulating side surface connected to the side surface of the SiC semiconductor layer.

14. The SiC semiconductor device according to claim 13, wherein the insulating side surface of the insulating layer is constituted of a cleavage surface.

15. The SiC semiconductor device according to claim 12, wherein the first electrode forms on the insulating layer at interval with the side surface of the SiC semiconductor layer.

16. The SiC semiconductor device according to claim 12, further comprising:
a passivation layer formed on the insulating layer for partly covering the first electrode; and
a resin layer formed on the passivation layer.

17. The SiC semiconductor device according to claim 12, further comprising:
a second electrode formed on another side on the SiC semiconductor substrate which is opposite to the SiC epitaxial layer side, the second electrode electrically connected to the SiC semiconductor substrate.

18. The SiC semiconductor device according to claim 1, wherein the SiC monocrystal is constituted of a 2H (hexagonal)-SiC monocrystal, a 4H—SiC monocrystal, or a 6H—SiC monocrystal.

19. The SiC semiconductor device according to claim 1, wherein a diode or a field effective transistor is formed in the device forming surface.

* * * * *